"(12) United States Patent
Imoto et al.

(10) Patent No.: US 11,079,476 B2
(45) Date of Patent: Aug. 3, 2021

(54) LIGHT-RECEIVING ELEMENT AND DISTANCE MEASUREMENT MODULE

(71) Applicant: Sony Semiconductor Solutions Corporation, Kanagawa (JP)

(72) Inventors: Tsutomu Imoto, Kanagawa (JP); Yuji Isogai, Kanagawa (JP); Takuya Maruyama, Kanagawa (JP); Takuro Murase, Kanagawa (JP); Ryota Watanabe, Kanagawa (JP); Takeshi Yamazaki, Tokyo (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 83 days.

(21) Appl. No.: 16/504,875

(22) Filed: Jul. 8, 2019

(65) Prior Publication Data
US 2020/0028017 A1 Jan. 23, 2020

(30) Foreign Application Priority Data
Jul. 18, 2018 (JP) .................................. 2018-135401

(51) Int. Cl.
*G01S 7/481* (2006.01)
*H01L 31/02* (2006.01)
(Continued)

(52) U.S. Cl.
CPC ............ *G01S 7/4816* (2013.01); *G01S 17/89* (2013.01); *H01L 31/02002* (2013.01);
(Continued)

(58) Field of Classification Search
CPC ............. H01L 31/101; H01L 31/02002; H01L 31/02024; H01L 31/022408; H01L 31/02327; H01L 27/14603; H01L 27/14627; H01L 27/14623; H01L 27/1461; H01L 27/14643; G01S 15/08; G01S 17/89; G01S 17/32; G01S 7/4816; H04N 5/369; H04N 5/374
See application file for complete search history.

(56) References Cited

U.S. PATENT DOCUMENTS

2009/0295979 A1* 12/2009 Matsuo ............. H01L 27/14636
348/335
2013/0258311 A1* 10/2013 Mase .................... G01S 17/894
356/3
2017/0194367 A1* 7/2017 Fotopoulou ......... H01L 27/1461

FOREIGN PATENT DOCUMENTS

JP        2011-086904        4/2011

* cited by examiner

*Primary Examiner* — Karen Kusumakar
*Assistant Examiner* — Adam S Bowen
(74) *Attorney, Agent, or Firm* — Sheridan Ross P.C.

(57) ABSTRACT

A light-receiving element includes an on-chip lens; an interconnection layer; and a semiconductor layer that is disposed between the on-chip lens and the interconnection layer. The semiconductor layer includes a first voltage application unit to which a first voltage is applied, a second voltage application unit to which a second voltage different from the first voltage is applied, a first charge detection unit that is disposed at the periphery of the first voltage application unit, a second charge detection unit that is disposed at the periphery of the second voltage application unit, and a charge discharge region that is provided on an outer side of an effective pixel region. For example, the present technology is applicable to a light-receiving element that generates distance information in a ToF method, or the like.

14 Claims, 94 Drawing Sheets

(51) Int. Cl.
*H01L 31/0224* (2006.01)
*H01L 31/0232* (2014.01)
*H01L 31/101* (2006.01)
*G01S 17/89* (2020.01)
*G01S 15/08* (2006.01)

(52) U.S. Cl.
CPC .. *H01L 31/02024* (2013.01); *H01L 31/02327* (2013.01); *H01L 31/022408* (2013.01); *H01L 31/101* (2013.01); *G01S 15/08* (2013.01)

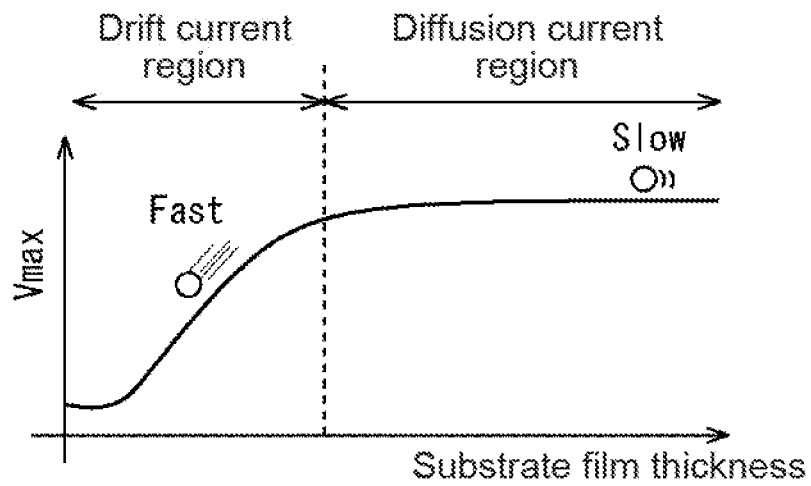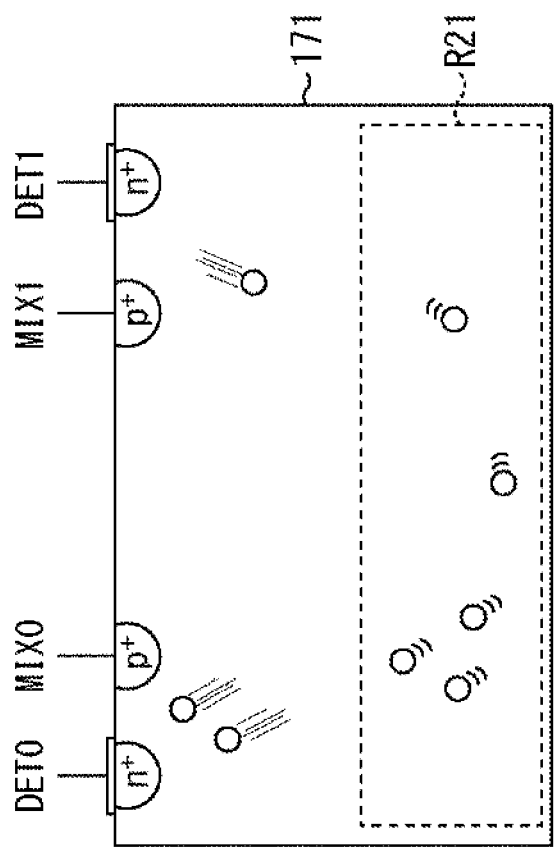
FIG.7

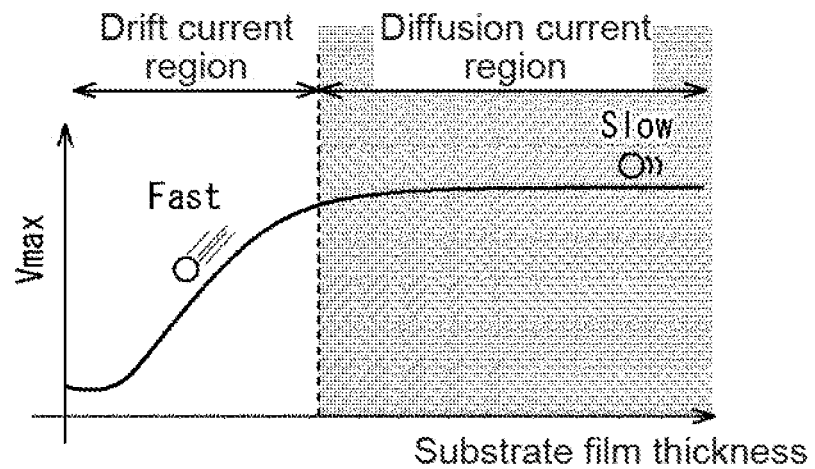
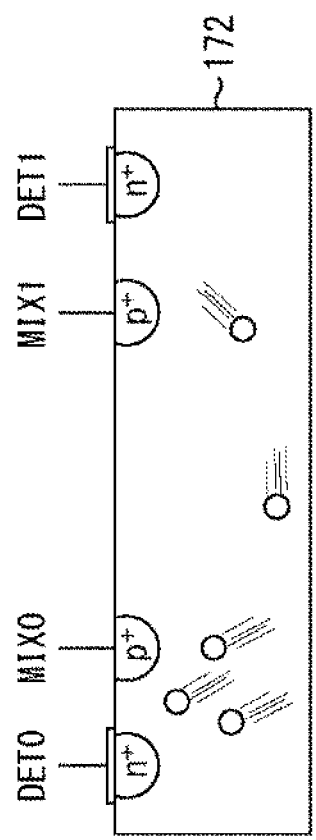
FIG. 8

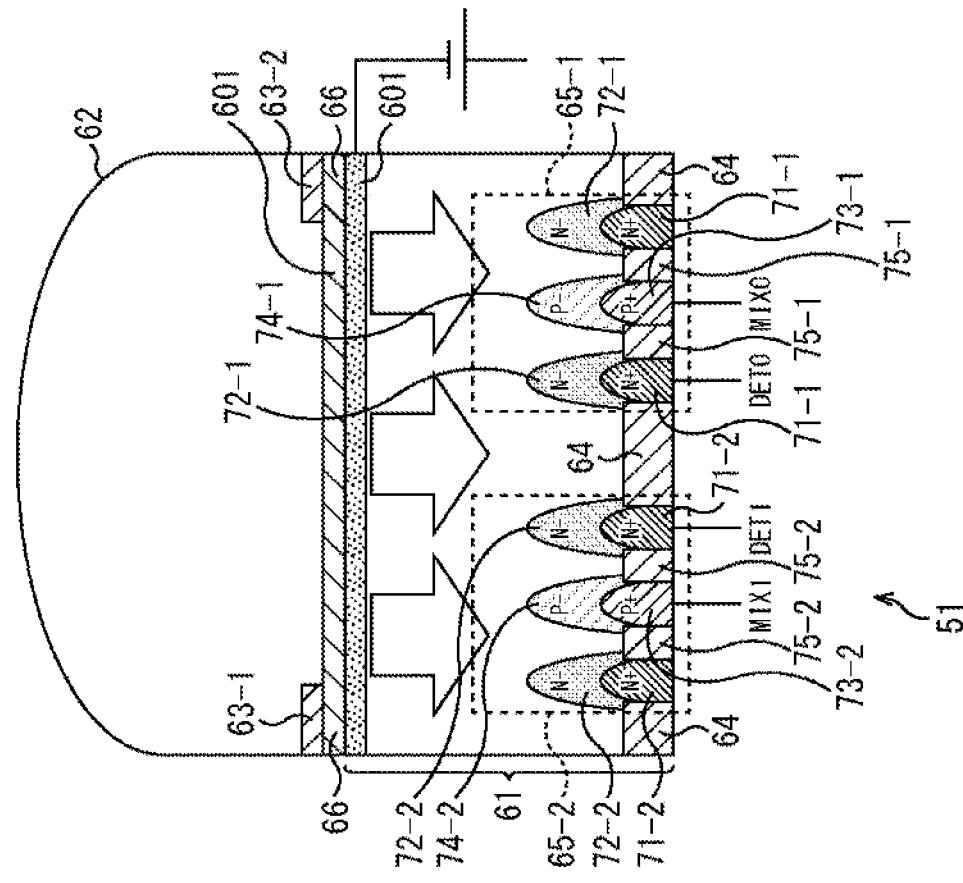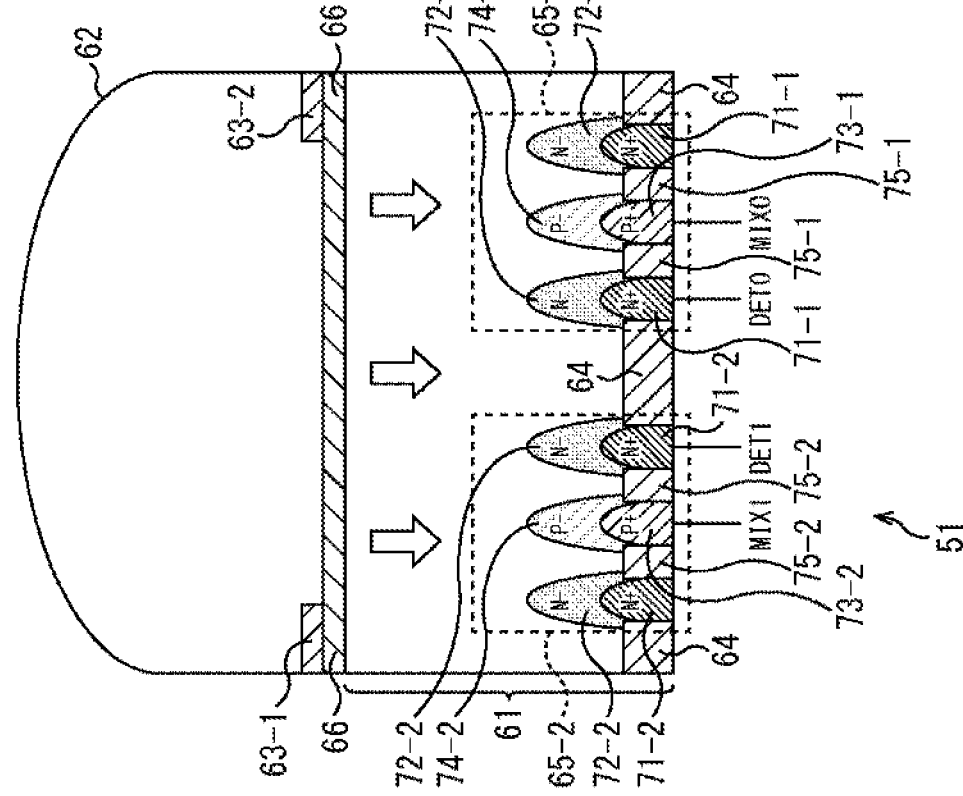

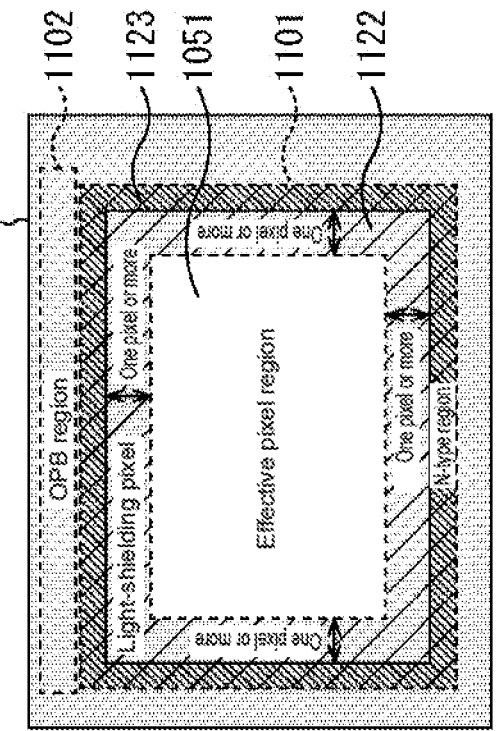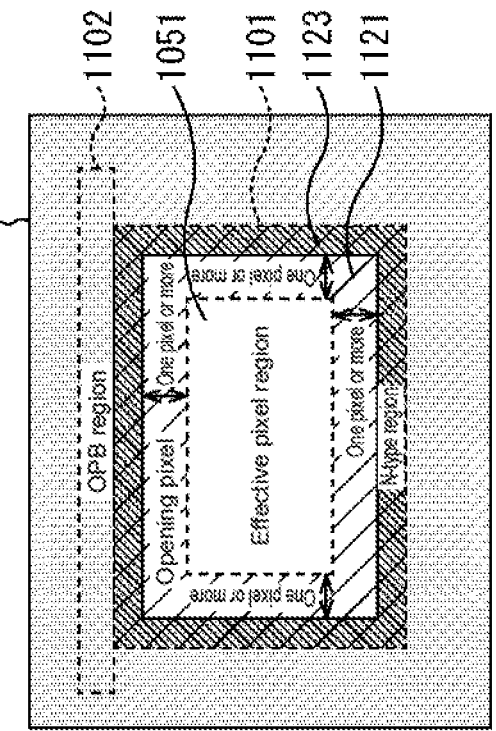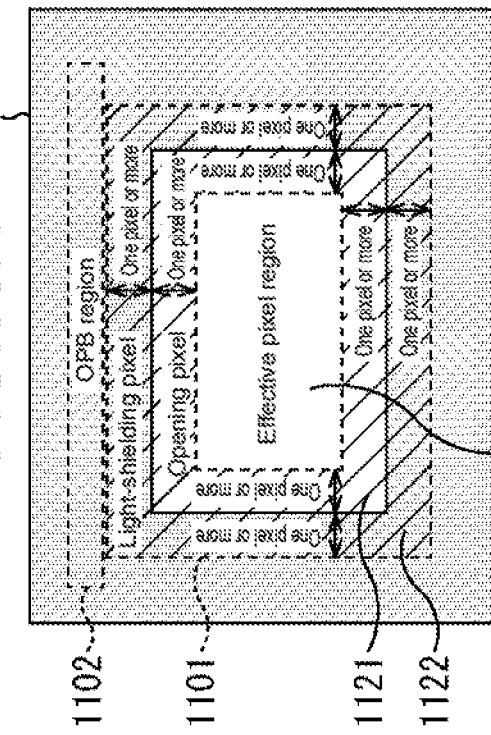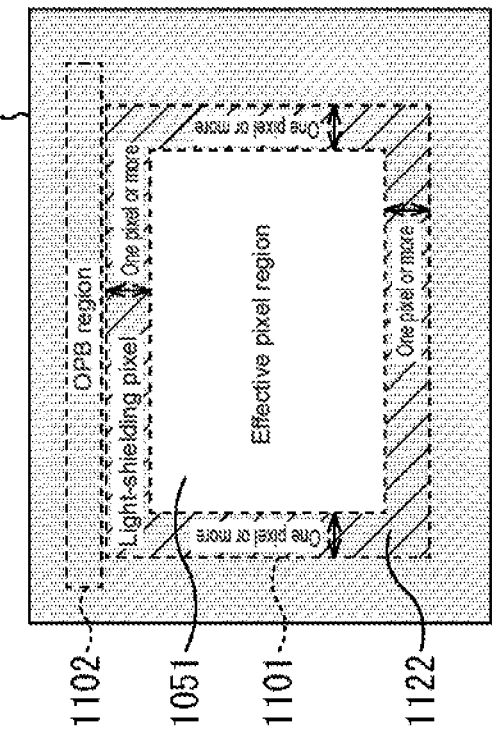

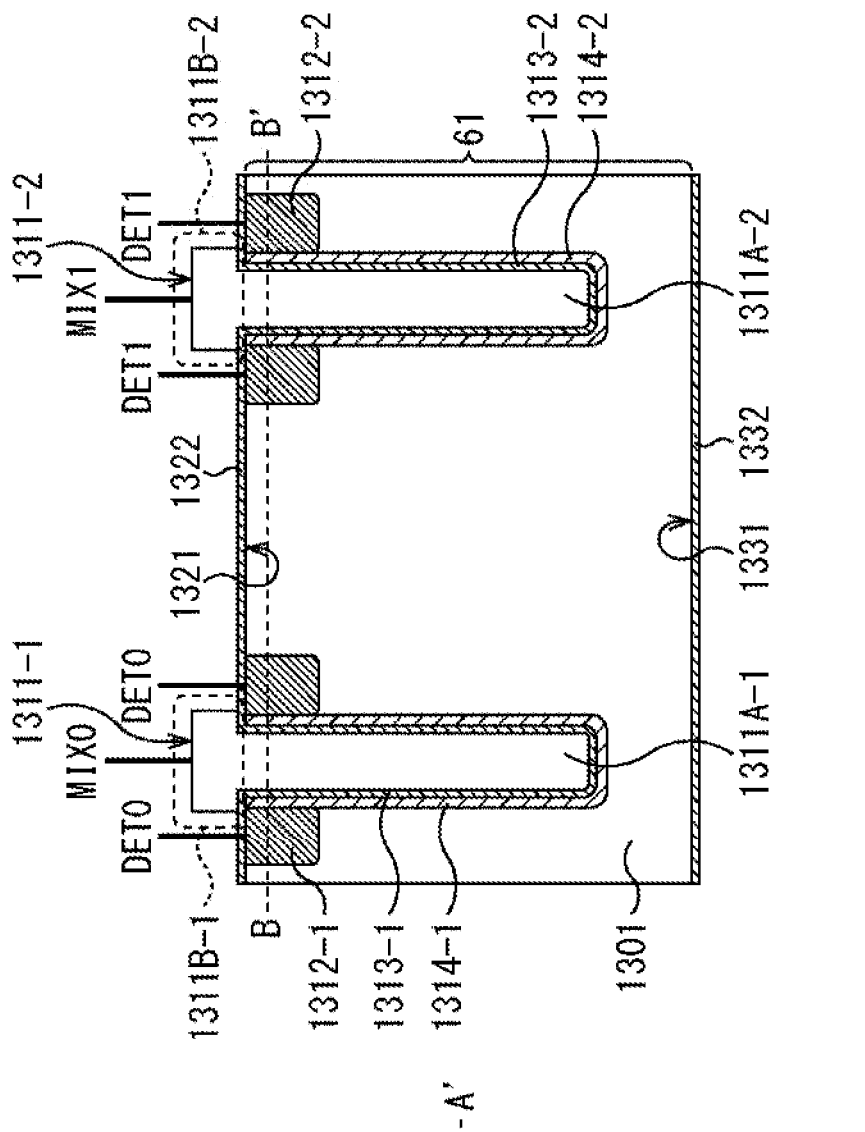
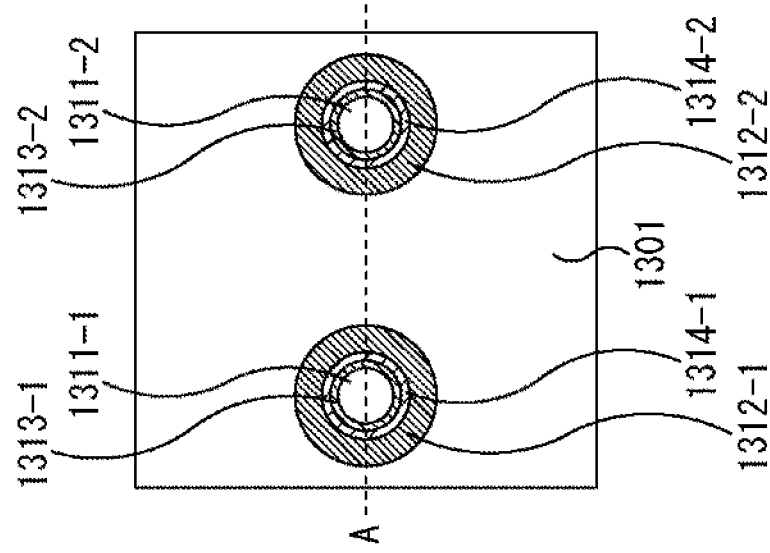

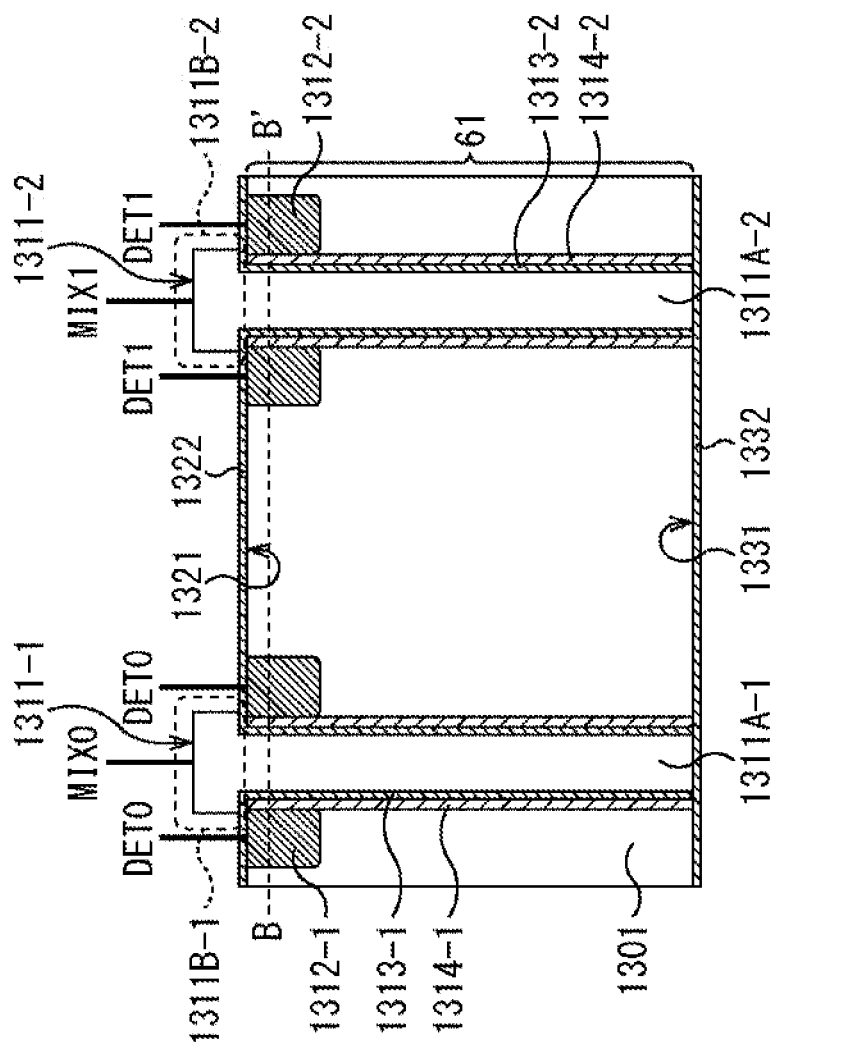
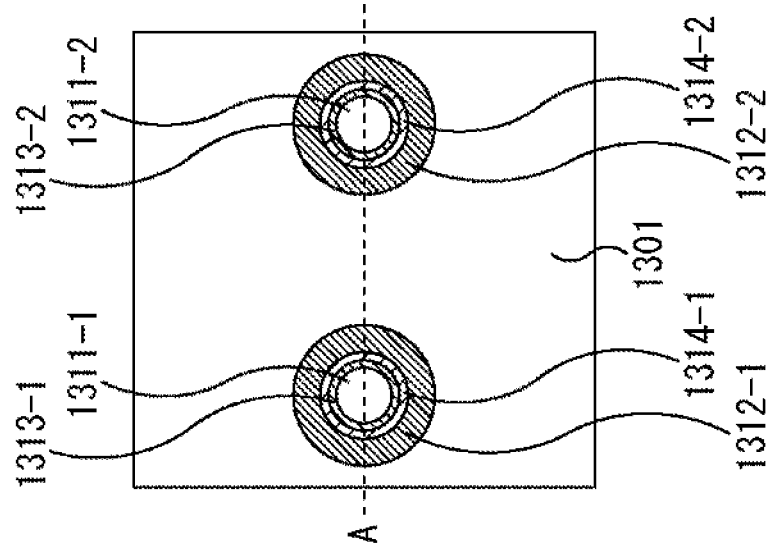

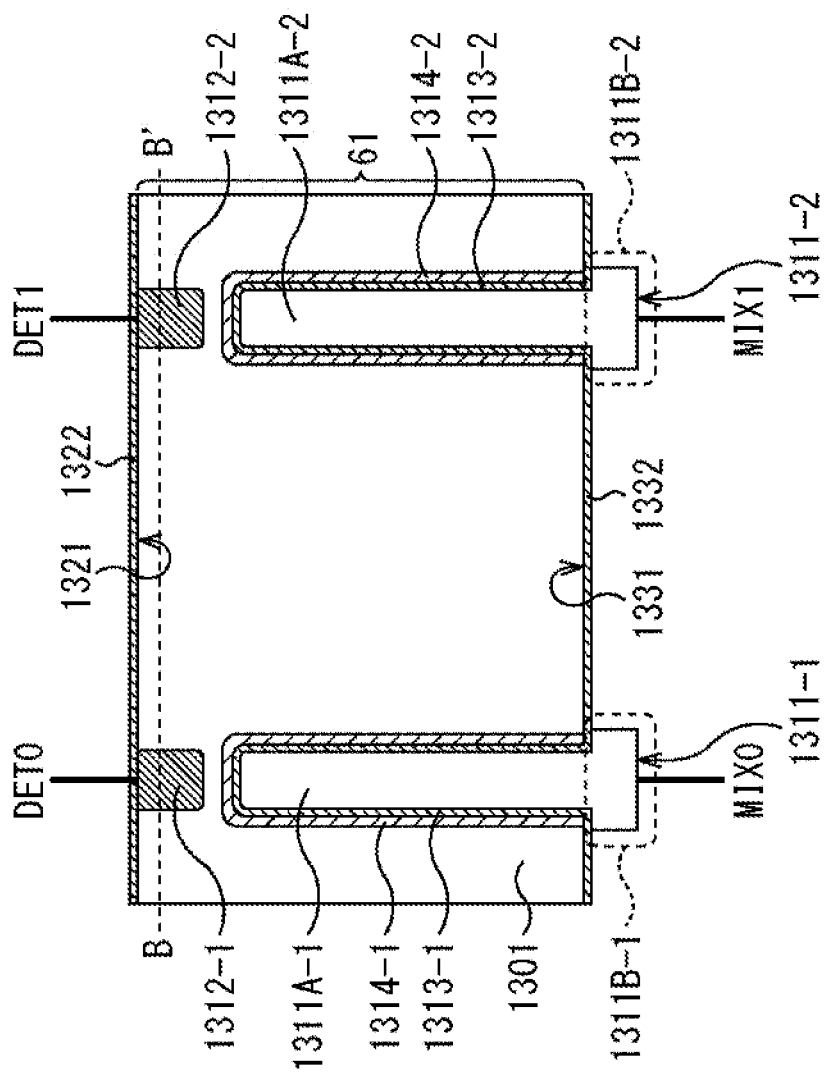
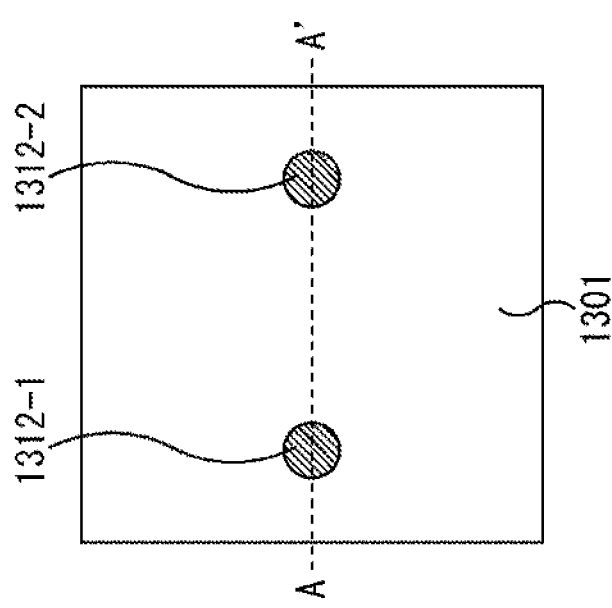

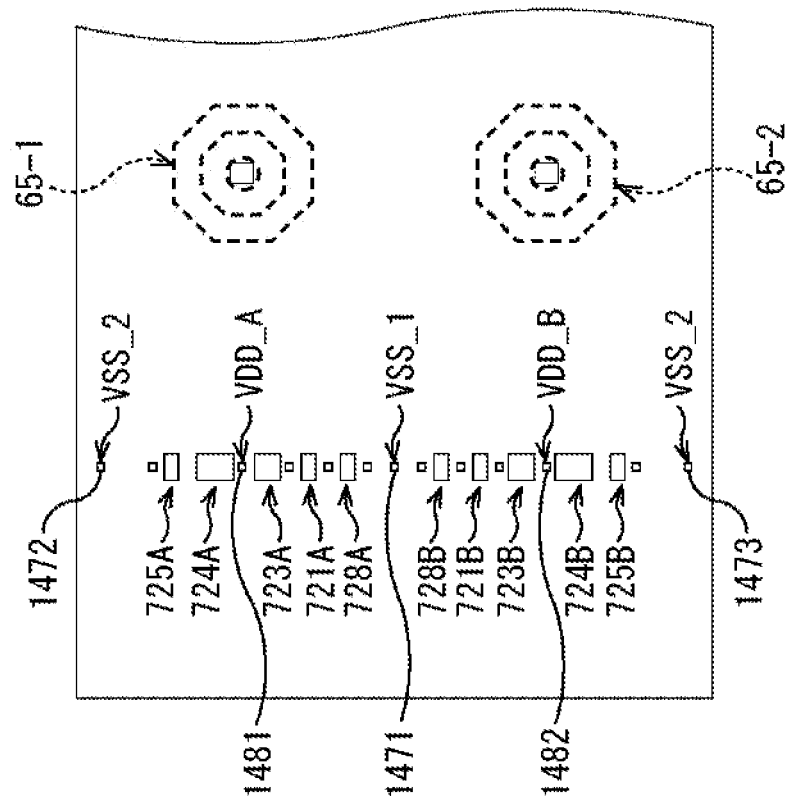
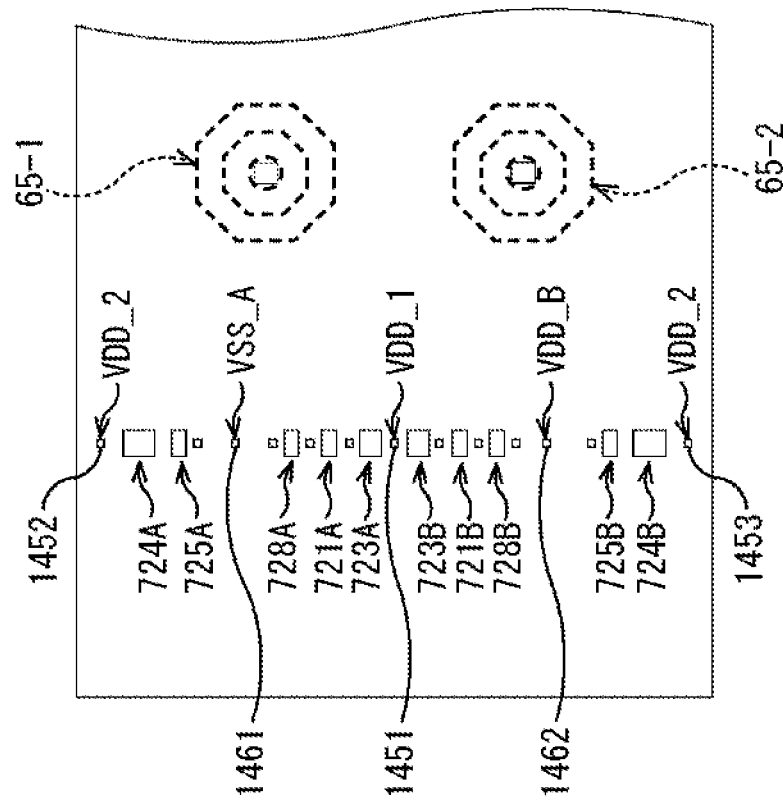

| Application voltage | mode1 | mode2 | mode3 | mode4 | mode5 |
|---|---|---|---|---|---|
| Tap TA | H | H | H (image height weighting) | H | H (image height weighting) |
| Tap TB | 0 | H | H (image height weighting) | H | H (image height weighting) |
| Pixel Tr | VSS | VSS | VSS | L | L |

H(High):1.5V, VSS:0V, L(Low)=−1.5V

FIG.88

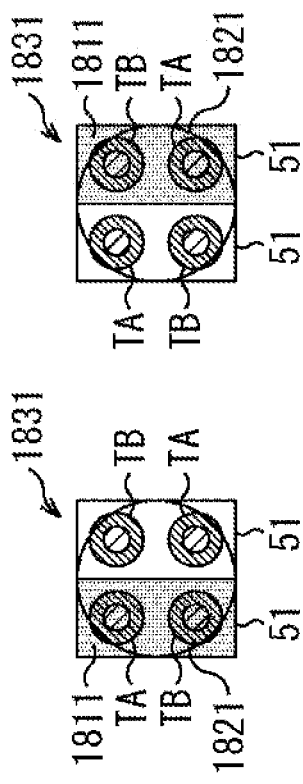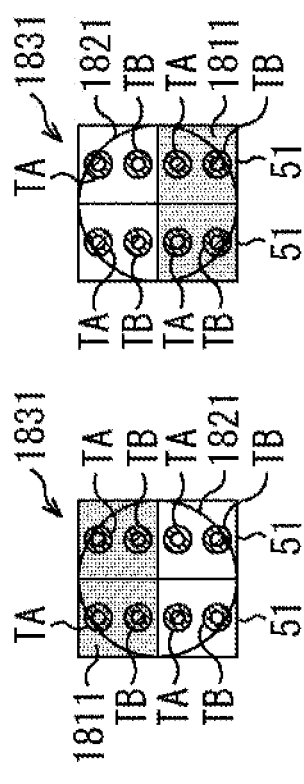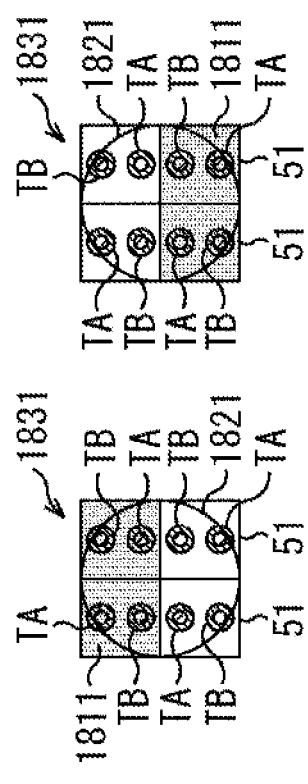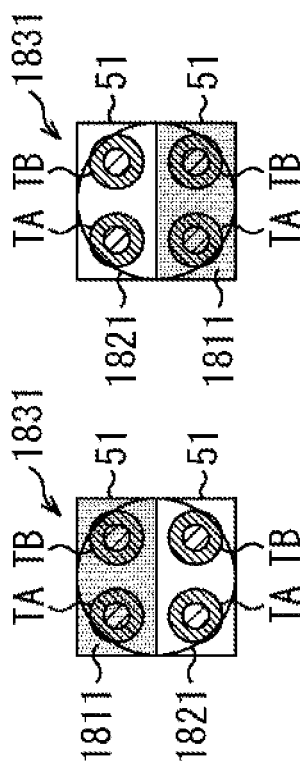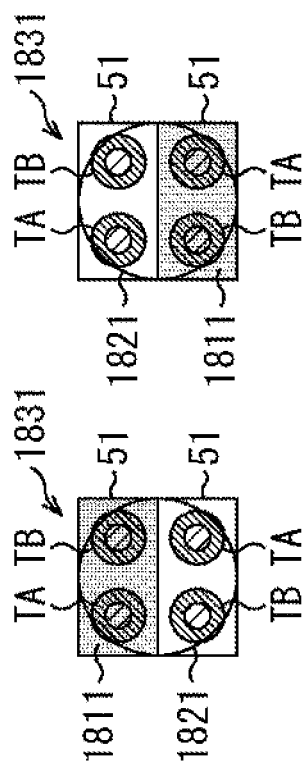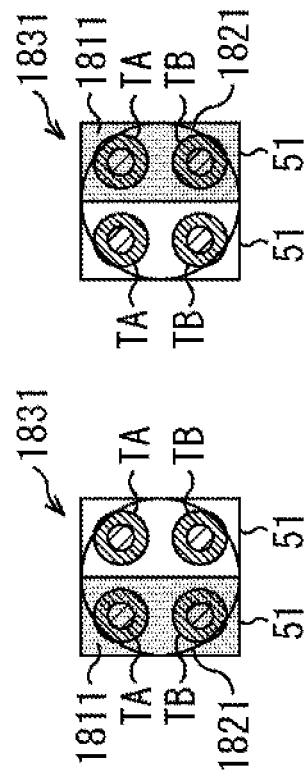

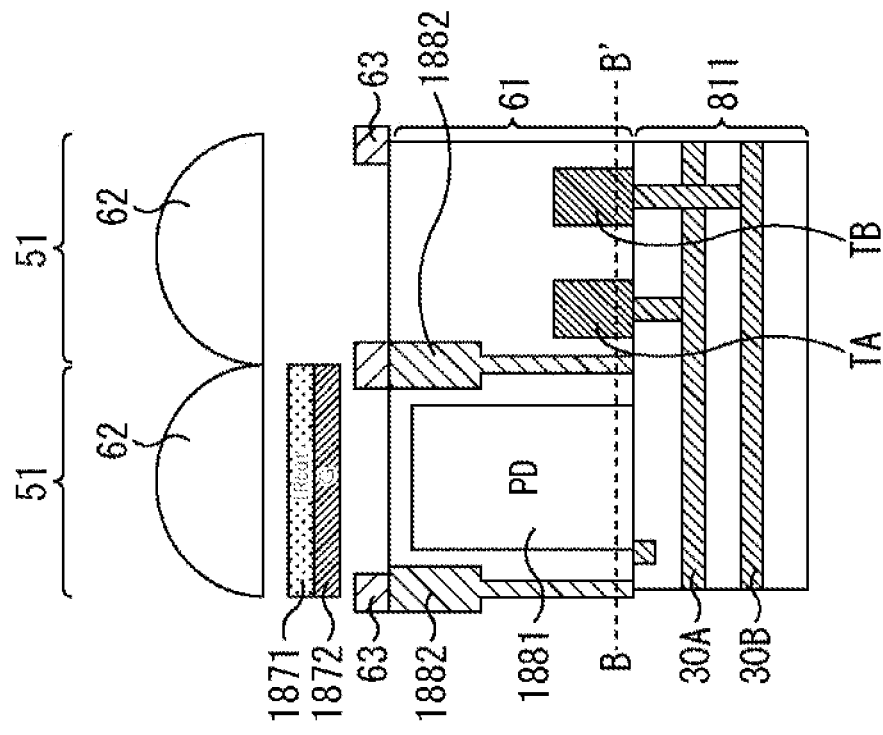
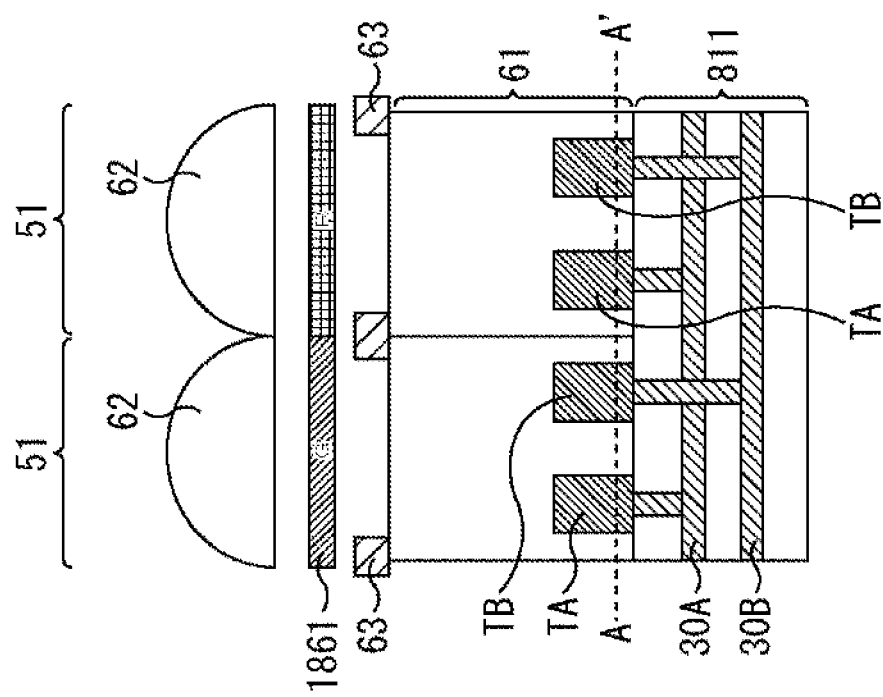

LIGHT-RECEIVING ELEMENT AND DISTANCE MEASUREMENT MODULE

CROSS REFERENCE TO RELATED APPLICATIONS

This application claims the benefit of Japanese Priority Patent Application JP 2018-135401 filed Jul. 18, 2018, the entire contents of which are incorporated herein by reference.

BACKGROUND

The present technology relates to a light-receiving element and a distance measurement module, and particularly to, a light-receiving element and a distance measurement module which are capable of improving characteristics.

In the related art, a distance measurement system using a time of flight (ToF) method is known. In the distance measurement system, there is necessity for a sensor capable of distributing signal charges, which are obtained by receiving reflected light of active light emitted by using a light emitting diode (LED) or a laser at an arbitrary phase to a target object, to another region at a high speed.

Here, for example, a technology in which a voltage is directly applied to a substrate of a sensor to generate currents in the substrate, and which can modulate a wide region inside the substrate at a high speed is suggested (for example, refer to JP-A-2011-86904). This sensor is also referred to as a current assisted photonic demodulator (CAPD) sensor.

SUMMARY

However, in the technology, it is difficult to obtain a CAPD sensor with sufficient characteristics.

For example, the CAPD sensor is a front-illuminated type sensor in which an interconnection or the like is disposed on a surface of the substrate on a side in which light is received from the outside.

It is desirable that an object such as an interconnection that blocks an optical path of incident light does not exist on a light-receiving surface side of a photodiode (PD), that is, a photoelectric conversion unit from the viewpoint of securement of a photoelectric conversion region. However, in the front-illuminated type CAPD sensor, it is necessary to dispose a charge extraction interconnection, various control lines, and signal lines on the light-receiving surface side of the PD in accordance with a structure, and thus the photoelectric conversion region is limited. That is, it is difficult to secure a sufficient photoelectric conversion region, and characteristics such as pixel sensitivity may deteriorate.

In addition, when considering that the CAPD sensor is used in a location in which external light exists, external light components become noise components in an indirect ToF method that performs distance measurement by using active light, and thus it is necessary to secure a sufficient saturation signal amount (Qs) to obtain distance information by securing a sufficient signal to noise ratio (SN ratio). However, in the front-illuminated type CAPD sensor, an interconnection layout is limited, and thus it is necessary to examine use of a method other than wiring capacitance, for example, a method in which an additional transistor is provided to secure capacitance.

In addition, in the front-illuminated type CAPD sensor, a signal extraction unit that is called a tap is disposed on a light incident side inside the substrate. On the other hand, when considering photoelectric conversion in a Si substrate, a difference of a reduction rate exists between wavelengths of light, but a ratio of occurrence of photoelectric conversion is higher on the light incident surface side. Accordingly, in the front-illuminated type CAPD sensor, there is a possibility that a probability of occurrence of photoelectric conversion in an inactive tap region that is a signal charge non-distribution tap region in a signal extraction unit provided tap region becomes higher. In the indirect ToF sensor, light measurement information is obtained by using signals which are distributed to respective charge accumulation regions in correspondence with a phase of active light, a component that is directly photoelectrically converted in the inactive tap region becomes noise, and as a result, there is a possibility that distance measurement accuracy deteriorates. That is, there is a possibility that characteristics of the CAPD sensor may deteriorate.

The present technology has been made in consideration of such circumstances, and an object thereof is to improve characteristics.

In accordance with a first aspect of the present technology, there is provided a light-receiving element including: an on-chip lens; an interconnection layer; and a semiconductor layer that is disposed between the on-chip lens and the interconnection layer. The semiconductor layer includes a first voltage application unit to which a first voltage is applied, a second voltage application unit to which a second voltage different from the first voltage is applied, a first charge detection unit that is disposed at the periphery of the first voltage application unit, a second charge detection unit that is disposed at the periphery of the second voltage application unit, and a charge discharge region that is provided on an outer side of an effective pixel region.

In the first aspect of the present technology, the on-chip lens, the interconnection layer, and the semiconductor layer disposed between the on-chip lens and the interconnection layer are provided. The first voltage application unit to which the first voltage is applied, the second voltage application unit to which the second voltage different from the first voltage is applied, the first charge detection unit disposed at the periphery of the first voltage application unit, the second charge detection unit disposed at the periphery of the second voltage application unit, and the charge discharge region provided on an outer side of an effective pixel region are provided in the semiconductor layer.

In accordance with a second aspect of the present technology, there is provided a distance measurement module including: a light-receiving element including an on-chip lens, an interconnection layer, and a semiconductor layer that is disposed between the on-chip lens and the interconnection layer, the semiconductor layer including a first voltage application unit to which a first voltage is applied, a second voltage application unit to which a second voltage different from the first voltage is applied, a first charge detection unit that is disposed at the periphery of the first voltage application unit, a second charge detection unit that is disposed at the periphery of the second voltage application unit, and a charge discharge region that is provided on an outer side of an effective pixel region; a light source that emits irradiation light of which brightness periodically fluctuates; and a light-emission control unit that controls an irradiation timing of the irradiation light.

In the second aspect of the present technology, the light-receiving element including the on-chip lens, the interconnection layer, and the semiconductor layer disposed between the on-chip lens and the interconnection layer, the semiconductor layer including a first voltage application unit to which the first voltage is applied, the second voltage application unit to which the second voltage different from the first voltage is applied, the first charge detection unit disposed at the periphery of the first voltage application unit, the second charge detection unit disposed at the periphery of the second voltage application unit, and a charge discharge region provided on an outer side of an effective pixel region; the light source that emits irradiation light of which brightness periodically fluctuates; and the light-emission control unit that controls an irradiation timing of the irradiation light are provided.

In accordance with the first and second aspects of the present technology, it is possible to improve characteristics.

It should be noted that the effect described here is not limited, and may be any one effect described in the present disclosure.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 7 is a view describing a movement speed of a signal carrier in a front-illuminated type;

FIG. 8 is a view describing a movement speed of a signal carrier in a back-illuminated type;

FIGS. 27A and 27B are views illustrating still another configuration example of the pixel;

FIGS. 53A to 53D are plan views illustrating a configuration example of a charge discharge region provided at an outer periphery of the effective pixel region.

FIGS. 62A and 62B are a plan view and a cross-sectional view of a pixel according to a first configuration example of a nineteenth embodiment;

FIGS. 63A and 63B are a plan view and a cross-sectional view of a pixel according to a second configuration example of the nineteenth embodiment;

FIGS. 66A and 66B are a plan view and a cross-sectional view of a pixel according to a third configuration example of the nineteenth embodiment;

FIGS. 73A and 73B are views illustrating a modification example of an arrangement example of the pixel transistors;

FIG. 88 is a view describing a drive mode of the first and second taps;

FIGS. 90A to 90F are views illustrating an arrangement example of a phase-difference light-shielding film and the on-chip lens;

FIGS. 93A and 93B are cross-sectional views of a pixel according to a twenty second embodiment;

DETAILED DESCRIPTION OF EMBODIMENTS

Hereinafter, an embodiment of the present technology will be described with reference to the drawings.

First Embodiment

<Configuration Example of Light-Receiving Element>

The present technology constructs a CAPD sensor in a back-illuminated type to improve characteristics such as pixel sensitivity.

For example, the present technology is applicable to a light-receiving element that constitutes a distance measurement system that performs distance measurement by an indirect ToF method, an imaging device that includes the light-receiving element, or the like.

For example, the distance measurement system is applicable to an in-vehicle system that is mounted on a vehicle and measures a distance up to a target object, a gesture recognition system in which a distance up to a target object such as hands of a user, and recognizes a user's gesture on the basis of the measurement result, or the like. In this case, a gesture recognition result can be used, for example, in an operation of a car navigation system.

Figure 1:
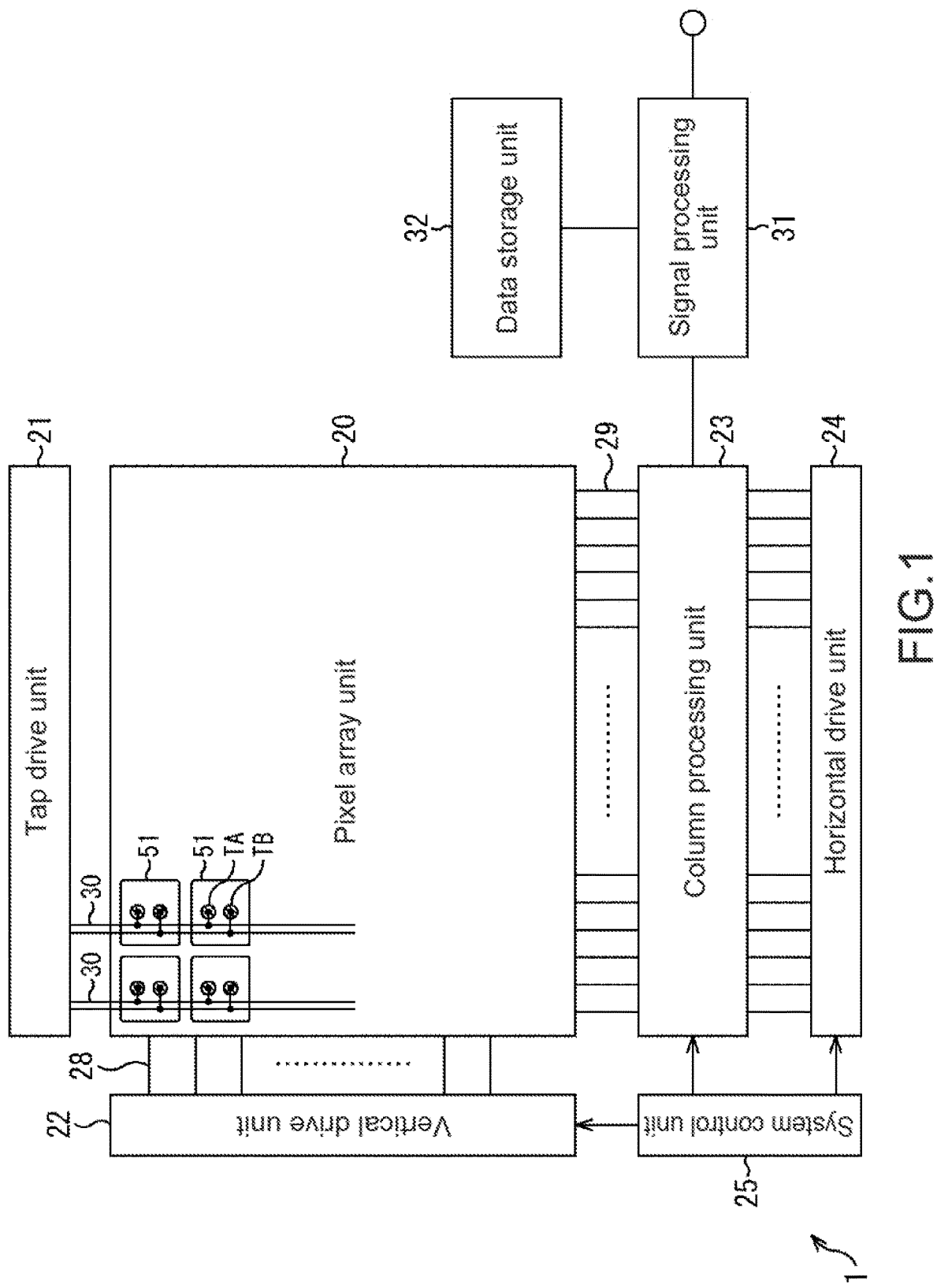
FIG. 1 is a block diagram illustrating a configuration example of a light-receiving element.

FIG. 1 is a block diagram illustrating a configuration example of an embodiment of the light-receiving element to which the present technology is applied.

A light-receiving element 1 illustrated in FIG. 1 is a back-illuminated type CAPD sensor, and is provided, for example, in an imaging device having a distance measurement function.

The light-receiving element 1 includes a pixel array unit 20 that is formed on a semiconductor substrate (not illustrated), and a peripheral circuit unit that is integrated on the same semiconductor substrate as in the pixel array unit 20. For example, the peripheral circuit unit includes a tap drive unit 21, a vertical drive unit 22, a column processing unit 23, a horizontal drive unit 24, and a system control unit 25.

A signal processing unit 31 and a data storage unit 32 are also provided in the light-receiving element 1. It should be noted that the signal processing unit 31 and the data storage unit 32 may be mounted on the same substrate as in the light-receiving element 1, or may be disposed on a substrate different from the substrate as in the light-receiving element 1 in an imaging device.

The pixel array unit 20 generates charges corresponding to the amount of light received, and has a configuration in which pixels 51 which output signals corresponding to the charges are two-dimensionally arranged in a matrix shape in a row direction and a column direction. That is, the pixel array unit 20 includes multiple pixels 51 which photoelectrically convert incident light and output signals corresponding to charges obtained as a result of the photoelectric conversion. Here, the row direction represents an arrangement direction of the pixels 51 in a horizontal direction, and the column direction represents an arrangement direction of the pixels 51 in a vertical direction. The row direction is the horizontal direction in the drawing and the column direction is the vertical direction in the drawing.

Each of the pixels 51 receives and photoelectrically converts incident light from the outside, particularly, infrared light and, and outputs pixel signals corresponding to charges obtained as a result of the photoelectric conversion. The pixel 51 includes a first tap TA that applies a predetermined voltage MIX0 (a first voltage) and detects photoelectrically converted charges, and a second tap TB that applies a predetermined voltage MIX1 (a second voltage) and detects photoelectrically converted charges.

The tap drive unit 21 supplies a predetermined voltage MIX0 to the first tap TA of the pixel 51 of the pixel array unit 20 through a predetermined voltage supply line 30, and supplies a predetermined voltage MIX1 to the second tap TB through a predetermined voltage supply line 30. Accordingly, two voltage supply lines 30 including the voltage supply line 30 that transfers the voltage MIX0 and the voltage supply line 30 that transfers the voltage MIX1 are wired in one pixel column of the pixel array unit 20.

In the pixel array unit 20, with respect to a matrix-shaped pixel arrangement, a pixel drive line 28 is wired in a row direction for every pixel row, and two vertical signal lines 29 are wired along a column direction for every pixel column. For example, the pixel drive line 28 transfers a drive signal for performing an operation when reading out a signal from a pixel. It should be noted that in FIG. 1, the pixel drive line 28 is illustrated as one interconnection, but there is no limitation to the one piece. One end of the pixel drive line 28 is connected to an output end corresponding to each row of the vertical drive unit 22.

The vertical drive unit 22 is constituted by a shift register, an address decoder, or the like, and drives pixels of the pixel array unit 20 simultaneously or in a row unit. That is, the vertical drive unit 22 constitutes a drive unit that controls an operation of each of the pixels of the pixel array unit 20 in combination with the system control unit 25 that controls the vertical drive unit 22.

A signal that is output from each of the pixels 51 in a pixel row in correspondence with drive control by the vertical drive unit 22 is input to the column processing unit 23 through the vertical signal line 29. The column processing unit 23 performs predetermined signal processing with respect to the pixel signal that is output from the pixel 51 through the vertical signal line 29, and temporarily stores the pixel signal after signal processing.

Specifically, the column processing unit 23 performs noise removal processing, analog to digital (AD) conversion processing, or the like as the signal processing.

The horizontal drive unit 24 is constituted by a shift register, an address decoder, or the like, and sequentially selects a unit circuit corresponding to a pixel column of the column processing unit 23. A pixel signal that is subjected to signal processing for every unit circuit in the column processing unit 23 is sequentially output due to selective scanning by the horizontal drive unit 24.

The system control unit 25 is constituted by a timing generator that generates various timing signals, or the like, and performs drive control of the tap drive unit 21, the vertical drive unit 22, the column processing unit 23, the horizontal drive unit 24, or the like on the basis of the various timing signals generated in the timing generator.

The signal processing unit 31 has at least a computation processing function, and performs various kinds of signal processing such as computation processing on the basis of the pixel signal output from the column processing unit 23. At the time of the signal processing in the signal processing unit 31, the data storage unit 32 temporarily stores data necessary for the processing.

<Configuration Example of Pixel>

Next, a configuration example of the pixels provided in the pixel array unit 20 will be described. For example, the pixels provided in the pixel array unit 20 have a configuration as illustrated in FIG. 2.

Figure 2:
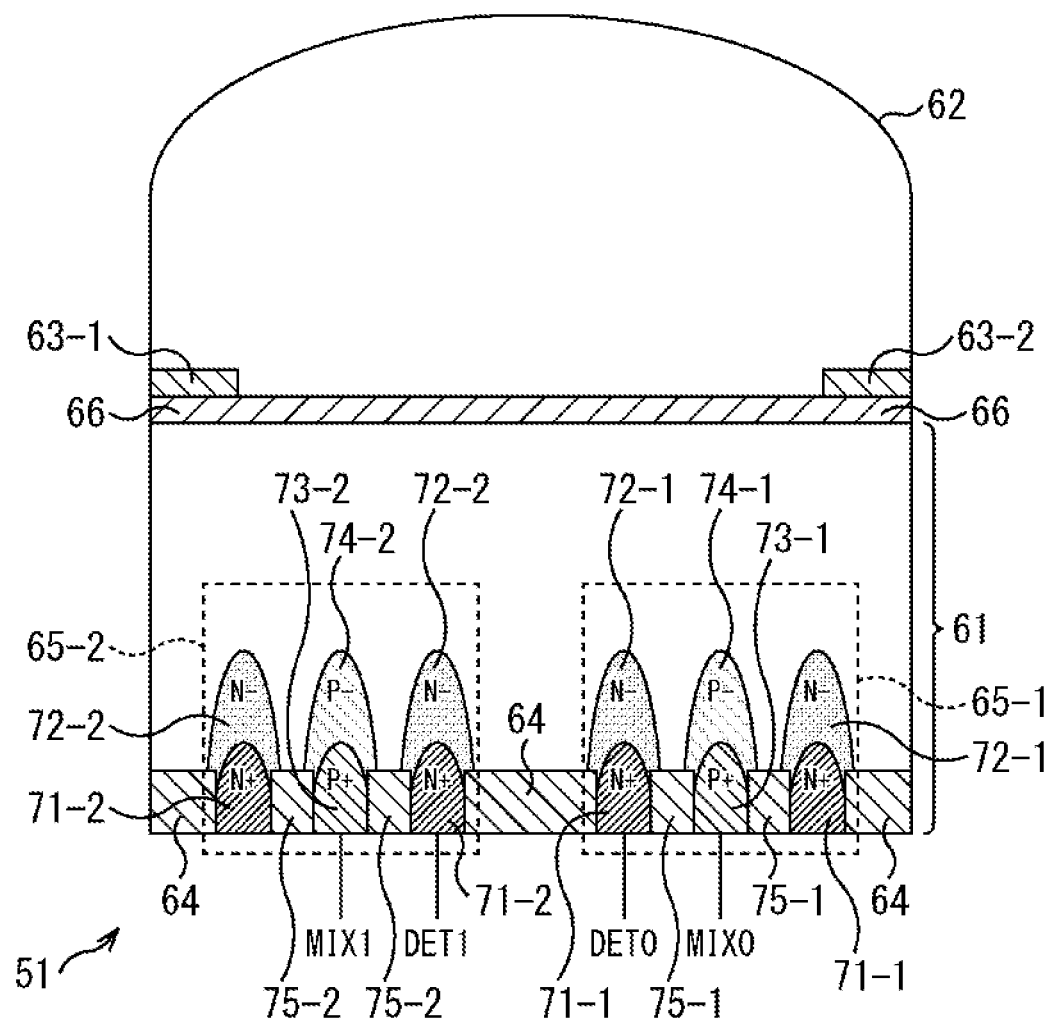
FIG. 2 is a view illustrating a configuration example of a pixel.

FIG. 2 illustrates a cross-section of one pixel 51 that is provided in the pixel array unit 20, and the pixel 51 photoelectrically receives and photoelectrically converts incident light from the outside, particularly, infrared light, and outputs signals corresponding to charges obtained as a result of the photoelectrical conversion.

For example, the pixel 51 includes a substrate 61 constituted by a P-type semiconductor layer such as a silicon substrate, and an on-chip lens 62 that is formed on the substrate 61.

For example, in the substrate 61, the thickness in a vertical direction in the drawing, that is, the thickness perpendicular to a surface of the substrate 61 is set to 20 μm or less. It should be noted that the thickness of the substrate 61 may be 20 μm or greater, and the thickness may be determined in correspondence with target characteristics of the light-receiving element 1, or the like.

In addition, for example, the substrate 61 is set to a high-resistance P-Epi substrate of which a substrate concentration is set to the order of 1 E+13 or less, and resistance (resistivity) of the substrate 61 is set to, for example, 500 [Ωcm] or greater.

Here, with regard to a relationship between the substrate concentration and the resistance of the substrate 61, for example, the resistance is set to 2000 [Ωcm] when the substrate concentration is 6.48 E+12 [cm$^3$], the resistance is set to 1000 [Ωcm] when the substrate concentration is 1.30 E+13 [cm$^3$], the resistance is set to 500 [Ωcm] when the substrate concentration is 2.59 E+13 [cm$^3$], and the resistance is set to 100 [Ωcm] when the substrate concentration is 1.30 E+14 [cm$^3$].

In FIG. 2, an upper surface of the substrate 61 is a rear surface of the substrate 61, and is a light incident surface when light is incident to the substrate 61 from the outside. On the other hand, a lower surface of the substrate 61 is a front surface of the substrate 61, and a multilayer interconnection layer (not illustrated) is formed in the front surface. A fixed charge film 66 constituted by a single film or a laminated film which has a positive fixed charge is formed on the light incident surface of the substrate 61, and an on-chip lens 62 that condenses the incident light from the outside and allows the incident light to be incident into the substrate 61 is formed on an upper surface of the fixed charge film 66. The fixed charge film 66 sets the light incident surface side of the substrate 61 to a hole accumulation state, and suppress occurrence of a dark current.

In addition, in the pixel 51, an interpixel light-shielding film 63-1 and an interpixel light-shielding film 63-2 for preventing cross-talk between adjacent pixels are respectively formed at end portions of the pixel 51 on an upper side of the fixed charge film 66. Hereinafter, in a case where it is not necessary to particularly distinguish the interpixel light-shielding film 63-1 and the interpixel light-shielding film 63-2, the films are also referred to simply as interpixel light-shielding film 63.

In this example, light incident from the outside is incident into the substrate 61 through the on-chip lens 62, but the interpixel light-shielding film 63 is formed not to allow the light incident from the outside to be incident to a region of another pixel that is provided adjacently to the pixel 51 in the substrate 61. That is, light that is incident to the on-chip lens 62 from the outside and propagates toward the inside of the other pixel that is adjacent to the pixel 51 is shielded by the interpixel light-shielding film 63-1 or the interpixel light-shielding film 63-2, and is prevented from being incident into the adjacent other pixel.

The light-receiving element 1 is the back-illuminated type CAPD sensor, and thus the light incident surface of the substrate 61 becomes a so-called rear surface, and an interconnection layer including an interconnection or the like is not formed on the rear surface. In addition, an interconnection layer, in which an interconnection for driving a transistor or the like that is formed in the pixel 51, an interconnection for reading out a signal from the pixel 51, and the like are formed, is formed on a portion of a surface opposite to the light incident surface in the substrate 61 through lamination.

In the substrate 61, at a portion on an inner side of the surface opposite to the light incident surface, that is, the lower surface in the drawing, an oxide film 64, a signal extraction unit 65-1, and a signal extraction unit 65-2 are formed. The signal extraction unit 65-1 corresponds to the first tap TA described in FIG. 1, and the signal extraction unit 65-2 corresponds to the second tap TB described in FIG. 1.

In this example, the oxide film 64 is formed at the central portion of the pixel 51 in the vicinity of the surface opposite to the light incident surface of the substrate 61, and the signal extraction unit 65-1 and the signal extraction unit 65-2 are respectively formed on both ends of the oxide film 64.

Here, the signal extraction unit 65-1 includes an N+ semiconductor region 71-1 that is an N-type semiconductor region, an N− semiconductor region 72-1 in which a concentration of donor impurities is lower in comparison to the N+ semiconductor region 71-1, a P+ semiconductor region 73-1 that is a P-type semiconductor region, and a P− semiconductor region 74-1 in which a concentration of acceptor impurities is lower in comparison to the P+ semiconductor region 73-1. Here, with regard to Si, examples of the donor impurities include elements such as phosphorous (P) and arsenic (As) which pertain to Group 5 in the periodic table of elements. With regard to Si, examples of the acceptor impurities include elements such as boron (B) that pertains to Group 3 in the periodic table of elements. An element that becomes a donor impurity is referred to as a donor element, and an element that becomes an acceptor impurity is referred to as an acceptor element.

In FIG. 2, the N+ semiconductor region 71-1 is formed at a location adjacent to the right side of the oxide film 64 at a portion on an inner side of the surface opposite to the light incident surface of the substrate 61. In addition, the N− semiconductor region 72-1 is formed on an upper side of the N+ semiconductor region 71-1 in the drawing to cover (to surround) the N+ semiconductor region 71-1.

In addition, the P+ semiconductor region 73-1 is formed on the right side of the N+ semiconductor region 71-1. In addition, the P− semiconductor region 74-1 is formed on an upper side of the P+ semiconductor region 73-1 in the drawing to cover (to surround) the P+ semiconductor region 73-1.

In addition, the N+ semiconductor region 71-1 is formed on the right side of the P+ semiconductor region 73-1. In addition, the N− semiconductor region 72-1 is formed on an upper side of the N+ semiconductor region 71-1 in the drawing to cover (to surround) the N+ semiconductor region 71-1.

Similarly, the signal extraction unit 65-2 includes an N+ semiconductor region 71-2 that is an N-type semiconductor region, an N− semiconductor region 72-2 in which a concentration of donor impurities is lower than in comparison to the N+ semiconductor region 71-2, a P+ semiconductor region 73-2 that is a P-type semiconductor region, and a P− semiconductor region 74-2 in which a concentration of acceptor impurities is lower in comparison to the P+ semiconductor region 73-2.

In FIG. 2, the N+ semiconductor region 71-2 is formed at a location adjacent to the left side of the oxide film 64 at the portion on the inner side of the surface opposite to the light incident surface of the substrate 61. In addition, the N− semiconductor region 72-2 is formed on an upper side of the N+ semiconductor region 71-2 in the drawing to cover (to surround) the N+ semiconductor region 71-2.

In addition, the P+ semiconductor region 73-2 is formed on the left side of the N+ semiconductor region 71-2. In addition, the P− semiconductor region 74-2 is formed on an upper side of the P+ semiconductor region 73-2 in the drawing to cover (to surround) the P+ semiconductor region 73-2.

In addition, the N+ semiconductor region 71-2 is formed on the left side of the P+ semiconductor region 73-2. In addition, the N− semiconductor region 72-2 is formed on an upper side of the N+ semiconductor region 71-2 in the drawing to cover (to surround) the N+ semiconductor region 71-2.

The same oxide film 64 as in the central portion of the pixel 51 is formed at an end portion of the pixel 51 in a portion on an inner side of the surface opposite to the light incident surface of the substrate 61.

Hereinafter, in a case where it is not necessary to particularly distinguish the signal extraction unit 65-1 and the signal extraction unit 65-2, the units are also referred to simply as a signal extraction unit 65.

In addition, hereinafter, in a case where it is not necessary to particularly distinguish the N+ semiconductor region 71-1 and the N+ semiconductor region 71-2, the regions are also referred to simply as an N+ semiconductor region 71, and in a case where it is not necessary to particularly distinguish the N− semiconductor region 72-1 and the N− semiconductor region 72-2, the regions are also referred to simply as an N− semiconductor region 72.

In addition, in a case where it is not necessary to particularly distinguish the P+ semiconductor region 73-1 and the P+ semiconductor region 73-2, the regions are also referred to simply as a P+ semiconductor region 73, and in a case where it is not necessary to particularly distinguish the P− semiconductor region 74-1 and the P− semiconductor region 74-2, the regions are referred to simply as a P− semiconductor region 74.

In addition, in the substrate 61, an isolation portion 75-1 constituted by an oxide film or the like is provided between the N+ semiconductor region 71-1 and the P+ semiconductor region 73-1 to isolate the regions from each other. Similarly, an isolation portion 75-2 constituted by an oxide film or the like is also provided between the N+ semiconductor region 71-2 and the P+ semiconductor region 73-2 to isolate the regions from each other. Hereinafter, in a case where it is not necessary to particularly distinguish the isolation portion 75-1 and the isolation portion 75-2, the portions also referred to simply as an isolation portion 75.

The N+ semiconductor region 71 formed in the substrate 61 functions as a charge detection unit that detects a light amount of light incident to the pixel 51 from the outside, that is, the amount of signal carriers generated due to photoelectric conversion by the substrate 61. It should be noted that in addition to the N+ semiconductor region 71, the N− semiconductor region 72 in which the concentration of the donor impurities is low may also be recognized as the charge detection unit. In addition, the P+ semiconductor region 73 functions as a voltage application unit that injects a lot of carrier currents to the substrate 61, that is, generates an electric field in the substrate 61 by directly applying a voltage to the substrate 61. It should be noted that in addition to the P+ semiconductor region 73, the P− semiconductor region 74 in which the concentration of the acceptor impurities is low may also be recognized as the voltage application unit.

In the pixel 51, a floating diffusion (FD) portion that is a floating diffusion region (not illustrated) (hereinafter, also referred to as an FD portion A) is directly connected to the N+ semiconductor region 71-1, and the FD portion A is connected to the vertical signal line 29 through an amplification transistor (not illustrated) or the like.

Similarly, another FD portion (hereinafter, also referred to particularly as an FD portion B) different from the FD portion A is directly connected to the N+ semiconductor region 71-2, and the FD portion B is connected to the vertical signal line 29 through an amplification transistor (not illustrated) or the like. Here, the FD portion A and the FD portion B are respectively connected to vertical signal lines 29 different from each other.

For example, in the case of measuring a distance up to a target object by the indirect ToF method, infrared light is emitted toward the target object from an imaging device in which the light-receiving element 1 is provided. In addition, when the infrared light is reflected from the target object, and returns to the imaging device as reflected light, the substrate 61 of the light-receiving element 1 receives and photoelectrically converts the incident reflected light (infrared light). The tap drive unit 21 drives the first tap TA and the second tap TB of the pixel 51, and distributes signals corresponding to charges DET obtained through the photoelectric conversion to the FD portion A and the FD portion B.

For example, at an arbitrary timing, the tap drive unit 21 applies a voltage to two pieces of the P+ semiconductor regions 73 through a contact or the like. Specifically, for example, the tap drive unit 21 applies a voltage of MIX0=1.5 V to the P+ semiconductor region 73-1 that is the first TAP TA, and applies a voltage of MIX1=0 V to the P+ semiconductor region 73-2 that is the second tap TB.

In this state, an electric field occurs between the two pieces of P+ semiconductor regions 73 in the substrate, and currents flow from the P+ semiconductor region 73-1 to the P+ semiconductor region 73-2. In this case, holes inside the substrate 61 migrate in a direction of the P+ semiconductor region 73-2, and electrons migrate in a direction of the P+ semiconductor region 73-1.

Accordingly, in this state, when infrared light (reflected light) from the outside is incident to the substrate 61 from the outside through the on-chip lens 62, and the infrared light is photoelectrically converted into pairs of an electron and a hole at the inside of the substrate 61, obtained electrons are guided in the direction of the P+ semiconductor region 73-1 due to the electric field between the P+ semiconductor regions 73, and migrate into the N+ semiconductor region 71-1.

In this case, electrons generated in the photoelectric conversion can be used as signal carriers for detecting signals corresponding to the amount of infrared light incident to the pixel 51, that is, a light amount of infrared light received.

Accordingly, charges corresponding to electrons which migrate into the N+ semiconductor region 71-1 are accumulated in the N+ semiconductor region 71-1, and the charges are detected by the column processing unit 23 through the FD portion A, the amplification transistor, the vertical signal line 29, and the like.

That is, accumulated charges DET0 of the N+ semiconductor region 71-1 are transferred to the FD portion A that is directly connected to the N+ semiconductor region 71-1, and signals corresponding to the charges DET0 transferred to the FD portion A are read out by the column processing unit 23 through the amplification transistor or the vertical signal line 29. In addition, processing such as AD conversion processing is performed in the column processing unit 23 with respect to the read out signals, and pixel signals obtained as a result thereof are supplied to the signal processing unit 31.

The pixel signals become signals indicating a charge amount corresponding to electrons detected in the N+ semiconductor region 71-1, that is, the amount of charges DET0 accumulated in the FD portion A. In other words, the pixel signals may also referred to as signals indicating a light amount of infrared light received by the pixel 51.

It should be noted that in a same manner as in the case of the N+ semiconductor region 71-1, pixel signals corresponding to electrons detected in the N+ semiconductor region 71-2 may be used in distance measurement in an appropriate manner.

In addition, at a next timing, a voltage is applied to two pieces of the P+ semiconductor regions 73 by the tap drive unit 21 through a contact or the like so that an electric field in a direction opposite to that of the electric field occurred in the substrate 61 up to now occurs. Specifically, for example, a voltage of MIX0=0 V is applied to the P+ semiconductor region 73-1 that is the first tap TA, and a voltage of MIX1=1.5 V is applied to the P+ semiconductor region 73-2 that is the second tap TB.

Accordingly, an electric field occurs between the two pieces of P+ semiconductor regions 73 in the substrate 61, and currents flow from the P+ semiconductor region 73-2 to the P+ semiconductor region 73-1.

In this state, when infrared light (reflected light) is incident into the substrate 61 from the outside through the on-chip lens 62, and the infrared light is photoelectrically converted into pairs of an electron and a hole at the inside of the substrate 61, obtained electrons are guided in a direction of the P+ semiconductor region 73-2 due to the electric field between the P+ semiconductor regions 73, and migrate into the N+ semiconductor region 71-2.

Accordingly, charges corresponding to electrons which migrate into the N+ semiconductor region 71-2 are accumulated in the N+ semiconductor region 71-2, and the charges are detected by the column processing unit 23 through the FD portion B, the amplification transistor, the vertical signal line 29, and the like.

That is, accumulated charges DET1 in the N+ semiconductor region 71-2 are transferred to the FD portion B that is directly connected to the N+ semiconductor region 71-2, and signals corresponding to the charges DET1 transferred to the FD portion B are read out by the column processing unit 23 through the amplification transistor or the vertical signal line 29. In addition, processing such as AD conversion processing is performed in the column processing unit 23 with respect to the read out signals, and pixel signals obtained as a result thereof are supplied to the signal processing unit 31.

It should be noted that in a similar manner as in the case of the N+ semiconductor region 71-2, pixel signals corresponding to electrons detected in the N+ semiconductor region 71-1 may be used in distance measurement in an appropriate manner.

As described above, when pixel signals obtained in photoelectric conversion in periods different from each other in the same pixel 51 are obtained, the signal processing unit 31 calculates distance information indicating a distance to a target object on the basis of the pixel signals, and outputs the distance information to a rear stage.

As described above, a method in which the signal carriers are distributed to the N+ semiconductor regions 71 different from each other, and the distance information is calculated on the basis of signals corresponding to the signal carriers is referred to as the indirect ToF method.

Figure 3:
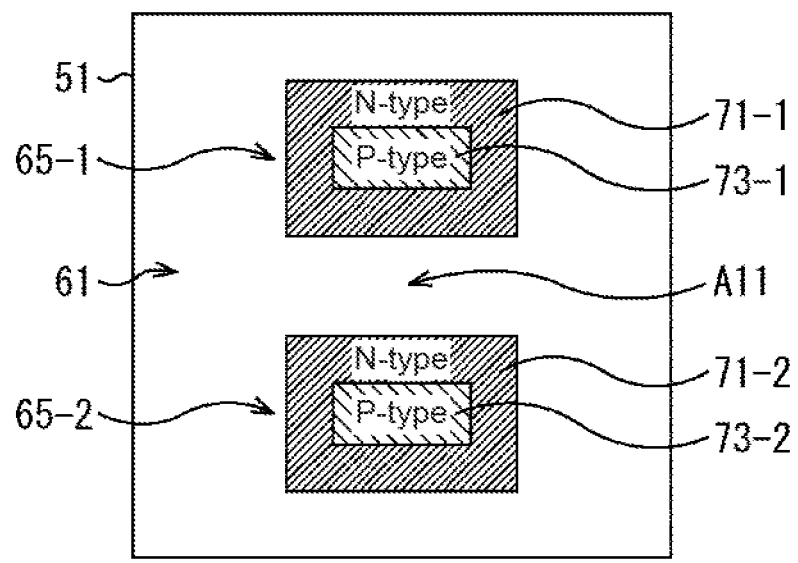
FIG. 3 is a view illustrating a configuration example of a portion of a signal extraction unit of the pixel.

When the portion of the signal extraction unit 65 in the pixel 51 is viewed from an upper side toward a downward side in FIG. 2, that is, in a direction perpendicular to the surface of the substrate 61, for example, as illustrated in FIG. 3, the periphery of the P+ semiconductor region 73 has a structure surrounded by the N+ semiconductor region 71. It should be noted that in FIG. 3, the same reference numeral will be given to a portion corresponding to the case of FIG. 2, and description thereof will be appropriately omitted.

In an example illustrated in FIG. 3, the oxide film (not illustrated) is formed at the central portion of the pixel 51, and the signal extraction unit 65 is formed at a portion on a slightly end side from the center of the pixel 51. Particularly, here, two pieces of the signal extraction units 65 are formed in the pixel 51.

In addition, in the signal extraction units 65, the P+ semiconductor region 73 is formed in a rectangular shape at the central position, and in a state in which the P+ semiconductor region 73 is set as the center, the periphery of the P+ semiconductor region 73 is surrounded by the N+ semiconductor region 71 in a rectangular shape, more specifically, a rectangular frame shape. That is, the N+ semiconductor region 71 is formed to surround the periphery of the P+ semiconductor region 73.

In addition, in the pixel 51, the on-chip lens 62 is formed at the central portion of the pixel 51, that is, at a portion indicated by an arrow A11 so that infrared light incident from the outside is condensed. In other words, infrared light incident to the on-chip lens 62 from the outside is condensed by the on-chip lens 62 to a position indicated by the arrow A11, that is, at a position on an upper side of the oxide film 64 in FIG. 2.

Accordingly, infrared light is condensed to a position between the signal extraction unit 65-1 and the signal extraction unit 65-2. Accordingly, occurrence of cross-talk due to incidence of the infrared light to a pixel adjacent to the pixel 51 is suppressed, and direct incidence of the infrared light into the signal extraction unit 65 is also suppressed.

For example, when the infrared light is incident to the signal extraction unit 65, charge separation efficiency, that is, contrast between active and inactive taps (Cmod) or modulation contrast deteriorates.

Here, it is assumed that the signal extraction unit 65 on a side in which read-out of signals corresponding to the charges DET obtained in the photoelectric conversion is performed, that is, the signal extraction unit 65 in which the charges DET obtained in the photoelectric conversion are to be detected is also referred to as an active tap.

In contrast, basically, it is assumed that the signal extraction unit 65 in which read-out of signals corresponding to the charges DET obtained in the photoelectric conversion is not performed, that is, the signal extraction unit 65 that is not the active tap is also referred to as an inactive tap.

In the above-described example, the signal extraction unit 65 on a side in which a voltage of 1.5 V is applied to the P+ semiconductor region 73 is the active tap, and the signal extraction unit 65 on a side in which a voltage of 0 V is applied to the P+ semiconductor region 73 is the inactive tap.

The Cmod is an index that is calculated in accordance with the following Expression (1) and indicates that charges of how many percentages among charges generated in the photoelectric conversion of incident infrared light can be detected in the N+ semiconductor region 71 of the signal extraction unit 65 that is the active tap, that is, signals corresponding to the charges are extracted, and indicates charge separation efficiency. In Expression (1), I0 represents a signal that is detected on one side between two charge detection units (P+ semiconductor regions 73), and I1 represents a signal that is detected on the other side.

$$Cmod=\{|I0-I1|/|I0+I1|\}\times 100 \qquad (1)$$

Accordingly, for example, when infrared light incident from the outside is incident to the region of the inactive tap, and photoelectric conversion is performed in the inactive tap, there is a high possibility that electrons which are signal carriers generated through the photoelectric conversion migrate to the N+ semiconductor region 71 inside the inactive tap. In this case, charges of partial electrons obtained through the photoelectric conversion are not detected in the N+ semiconductor region 71 in the active tap, and the Cmod, that is, the charge separation efficiency deteriorates.

Here, in the pixel 51, infrared light is condensed to the vicinity of the center of the pixel 51 which is located at approximately the same distance from two pieces of the signal extraction units 65, and thus a probability that infrared light incident from the outside is photoelectrically converted the region of the inactive tap is reduced. As a result, it is possible to improve the charge separation efficiency. In addition, in the pixel 51, it is also possible to improve the modulation contrast. In other words, it is possible to allow electrons obtained through the photoelectric conversion to be easily guided to the N+ semiconductor region 71 inside the active tap.

In accordance with the above-described light-receiving element 1, it is possible to obtain the following effect.

Specifically, first, the light-receiving element 1 is a back-illuminated type, and thus it is possible to maximize quantum efficiency (QE)×opening rate (fill factor) (FF), and thus it is possible to improve distance measurement characteristics by the light-receiving element 1.

Figure 4:
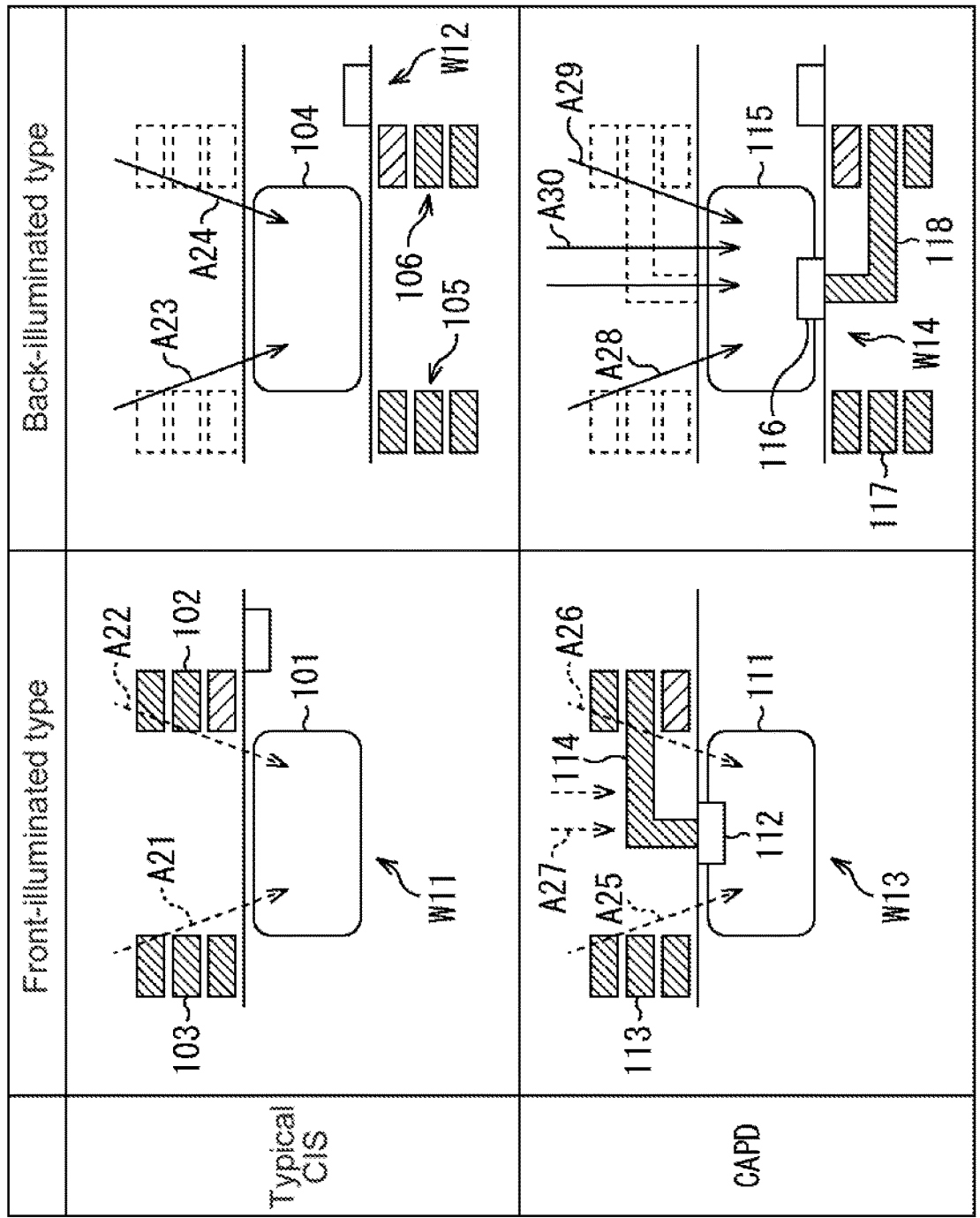
FIG. 4 is a view describing sensitivity improvement.

For example, as illustrated by an arrow W11 in FIG. 4, a typical front-illuminated type image sensor has a structure in which an interconnection 102 and an interconnection 103 are formed on a light incident surface side, to which light is incident from the outside, in a PD 101 that is a photoelectric conversion unit.

Accordingly, for example, a part of light that is obliquely incident to the PD 101 from the outside at an angle of a certain extent as illustrated by an arrow A21 or an arrow A22 is blocked by the interconnection 102 or the interconnection 103, and is not incident to the PD 101.

In contrast, for example, as indicated by an arrow W12, a back-illuminated type image sensor has a structure in which the interconnection 105 and the interconnection 106 are formed on a surface on a side opposite to the light incident surface, to which light is incident from the outside, in a PD 104 that is a photoelectric conversion unit.

Accordingly, it is possible to secure a sufficient opening rate in comparison to a case in the front-illuminated type. That is, for example, a part of light that is obliquely incident to the PD 104 from the outside at an angle of a certain extent as illustrated by an arrow A23 or an arrow A24 is not blocked by an interconnection, and is not incident to the PD 104. Accordingly, a lot of light beams are received and thus it is possible to improve sensitivity of a pixel.

The effect of improving the pixel sensitivity due to the back-illuminated type can also be obtained in the light-receiving element 1 that is a back-illuminated type CAPD sensor.

In addition, for example, in the front-illuminated type CAPD sensor, as indicated by an arrow W13, a signal extraction unit 112 that is called a tap, more specifically, a P+ semiconductor region or a N+ semiconductor region of a tap is formed on a light incident surface side to which light is incident from the outside at the inside of a PD 111 that is a photoelectric conversion unit. In addition, the front-illuminated type CAPD sensor has a structure in which an interconnection 113, and an interconnection 114 such as a contact and a metal that is connected to the signal extraction unit 112 are formed on a light incident surface side.

Accordingly, for example, a part of light that is obliquely incident from the outside to the PD 111 at an angle of a certain extent as indicated by an arrow A25 or an arrow A26 is blocked by the interconnection 113 or the like, and is not incident to the PD 111, and light that is vertically incident to the PD 111 as indicated by an arrow A27 is blocked by the interconnection 114 and is not incident to the PD 111.

In contrast, for example, as indicated by an arrow W14, the back-illuminated type CAPD sensor has a structure in which a signal extraction unit 116 is formed in a portion of a surface opposite to a light incident surface to which light is incident from the outside in a PD 115 that is a photoelectric conversion unit. In addition, an interconnection 117 and an interconnection 118 such as a contact and a metal that is connected to the signal extraction unit 116 are formed on a surface opposite to the light incident surface in the PD 115.

Here, the PD 115 corresponds to the substrate 61 illustrated in FIG. 2, and the signal extraction unit 116 corresponds to the signal extraction unit 65 illustrated in FIG. 2.

In the back-illuminated type CAPD sensor having the above-described structure, it is possible to secure a sufficient opening rate in comparison to the front-illuminated type. Accordingly, it is possible to maximize quantum efficiency (QE)×opening rate (FF), and thus it is possible to improve distance measurement characteristics.

That is, for example, light that is obliquely incident from the outside to the PD 115 at an angle of a certain extent as indicated by an arrow A28 or an arrow A29 is not blocked by an interconnection, and is incident to the PD 115. Similarly, as light that is vertically incident to the PD 115 as indicated by an arrow A30 is not also blocked by an interconnection or the like, and is incident to the PD 115.

As described above, the back-illuminated type CAPD sensor can receive not only light that is incident at an angle of a certain extent but also light that is vertically incident to the PD 115 and was reflected by an interconnection or the like that is connected to a signal extraction unit (tap) in the front-illuminated type. Accordingly, a lot of light beams are received and thus it is possible to improve sensitivity of a pixel. In other words, it is possible to maximize quantum efficiency (QE)×opening rate (FF), and as a result, it is possible to improve distance measurement characteristics.

Particularly, in a case where a tap is disposed in the vicinity of the center of a pixel instead of an outer edge of the pixel, in the front-illuminated type CAPD sensor, it is difficult to secure a sufficient opening rate, and sensitivity of the pixel deteriorates. However, in the light-receiving element 1 that is the back-illuminated type CAPD sensor, it is possible to secure a sufficient opening rate regardless of a disposition position of the tap, and it is possible to improve sensitivity of the pixel.

In addition, in the back-illuminated type light-receiving element 1, the signal extraction unit 65 is formed in the vicinity of a surface opposite to a light incident surface, to which infrared light is incident from the outside, in the substrate 61, and thus it is possible to reduce occurrence of photoelectric conversion of the infrared light in the region of the inactive tap. Accordingly, it is possible to improve the Cmod, that is, the charge separation efficiency.

Figure 5:
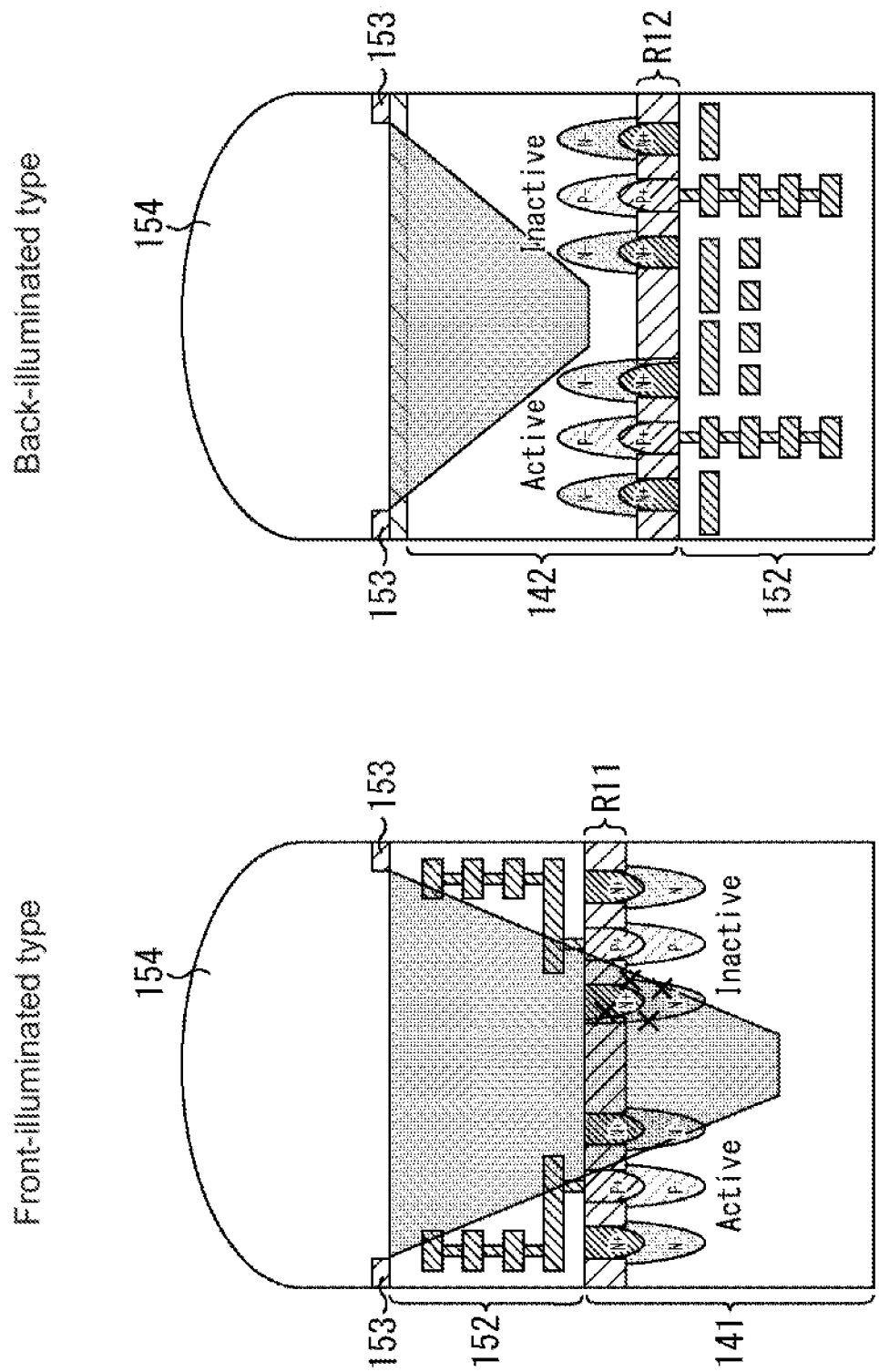
FIG. 5 is a view describing an improvement of charge separation efficiency.

FIG. 5 illustrates a pixel cross-sectional view of the front-illuminated type and the back-illuminated type CAPD sensors.

In the front-illuminated type CAPD sensor on the left side in FIG. 5, an upper side of a substrate 141 in the drawing is a light incident surface, and an interconnection layer 152 including a multilayer interconnection, an interpixel light-shielding portion 153, and an on-chip lens 154 are laminated on the light incident surface side of the substrate 141.

In the back-illuminated type CAPD sensor on the right side of FIG. 5, the interconnection layer 152 including the multilayer interconnection is formed on a lower side of the substrate 142 which is opposite to the light incident surface, and the interpixel light-shielding portion 153 and the on-chip lens 154 are laminated on an upper side of the substrate 142 that is a light incident surface side.

It should be noted that a gray trapezoidal shape in FIG. 5 represents a region in which optical intensity is strong when infrared light is condensed by the on-chip lens 154.

For example, in the front-illuminated type CAPD sensor, a region R11 in which an inactive tap and an active tap exist is located on the light incident surface side of the substrate 141. Accordingly, a lot of components are directly incident to the inactive tap, and when photoelectric conversion is performed in a region of the inactive tap, signal carriers obtained through the photoelectric conversion are not detected in an N+semiconductor region of the active tap.

In the front-illuminated type CAPD sensor, in the region R11 in the vicinity of the light incident surface of the substrate 141, intensity of infrared light is strong, and thus there is a high probability that photoelectric conversion of infrared light is performed in the region R11. That is, a light amount of infrared light incident to the vicinity of the inactive tap is large, and thus signal carriers which cannot be detected by the active tap increase, and thus charge separation efficiency deteriorate.

In contrast, in the back-illuminated type CAPD sensor, a region R12 in which an inactive tap and an active tap exist is located at a position that is distant from a light incident surface of a substrate 142, that is, at a position near a surface opposite to the light incident surface side. Here, the substrate 142 corresponds to the substrate 61 illustrated in FIG. 2.

In this example, the region R12 exists in a portion of the surface opposite to the light incident surface side of the substrate 142, and the region R12 is located at a position distant from the light incident surface, and thus the intensity of infrared light that is incident is relatively weak in the vicinity of the region R12.

In a region such as the vicinity of the center of the substrate 142 and the vicinity of the light incident surface in which the intensity of infrared light is strong, signal carriers obtained through photoelectric conversion are guided to the active tap due to an electric field that occurs within the substrate 142, and are detected in an N+ semiconductor region of the active tap.

On the other hand, in the vicinity of the region R12 including the inactive tap, the intensity of incident infrared light is relatively weak, and thus there is a low probability that photoelectric conversion of infrared light is performed in the region R12. That is, a light amount of infrared light incident to the vicinity of the inactive tap is small, and thus the number of signal carriers which are generated due to photoelectric conversion in the vicinity of the inactive tap and migrate to the N+ semiconductor region of the inactive tap decreases. Accordingly, it is possible to improve charge separation efficiency. As a result, it is possible to improve distance measurement characteristics.

In addition, in the back-illuminated type light-receiving element 1, it is possible to realize a reduction in thickness of the substrate 61, and thus it is possible to improve electron extraction efficiency of electrons (charges) which are signal carriers.

Figure 6:
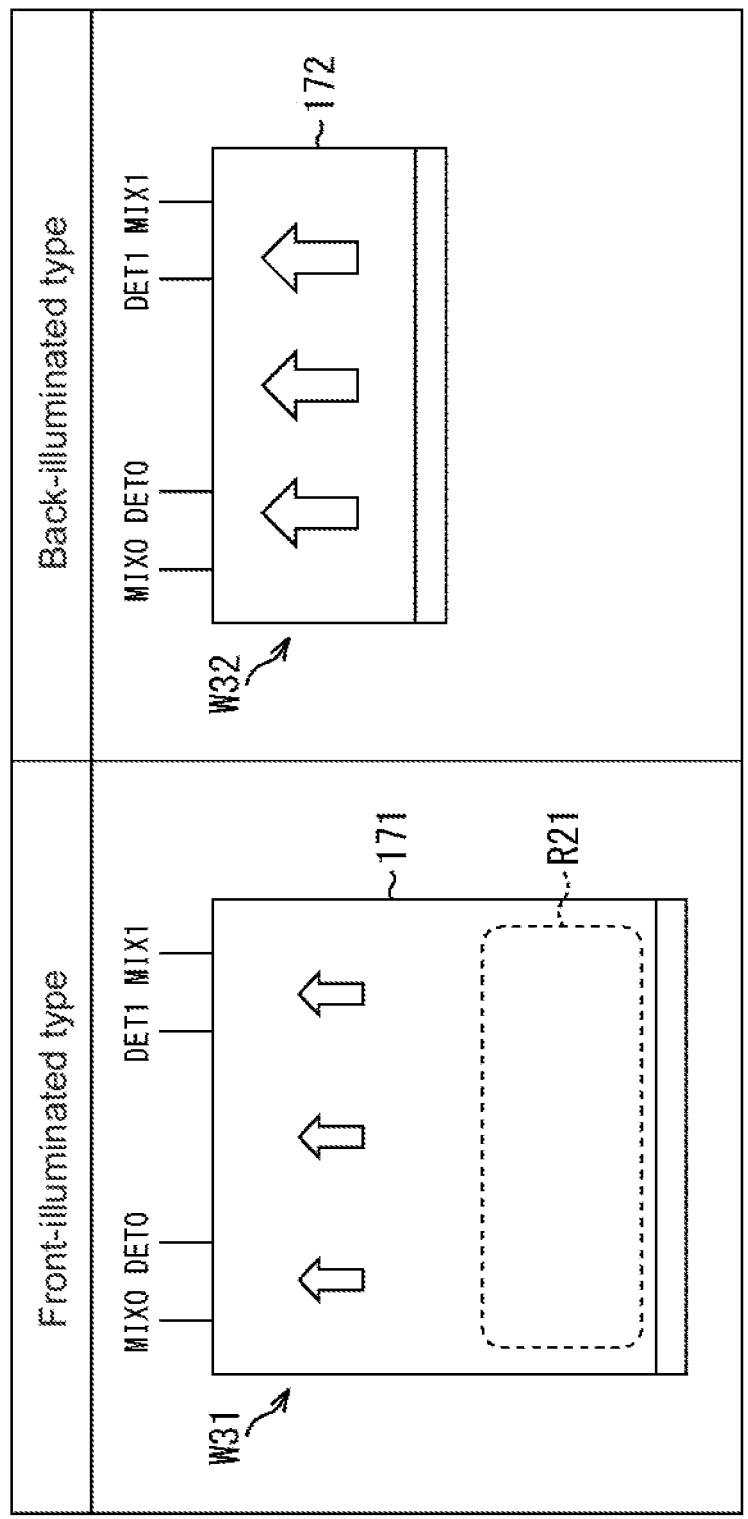
FIG. 6 is a view describing an improvement of electron extraction efficiency.

For example, in the front-illuminated type CAPD sensor, it is difficult to secure a sufficient opening rate, and thus it is necessary to enlarge the thickness of a substrate 171 to a certain extent to secure high quantum efficiency and to suppress a decrease in quantum efficiency×opening rate as indicated by an arrow W31 in FIG. 6.

In this case, an inclination of a potential becomes gentle in a region near a surface opposite to a light incident surface at the inside of the substrate 171, for example, at a portion of a region R21, and thus an electric field in a direction perpendicular to the substrate 171 substantially becomes weak. In this case, a migration speed of signal carriers becomes slow, and thus a time taken until the signal carriers are detected in the N+ semiconductor region of the active tap after photoelectric conversion is performed is lengthened. It should be noted that in FIG. 6, an arrow inside the substrate 171 indicates the electric field in the substrate 171 in a direction perpendicular to the substrate 171.

In addition, when the substrate 171 is thick, a migration distance of the signal carriers from a position distant from the active tap inside the substrate 171 to the N+ semiconductor region inside the active tap is lengthened. Accordingly, at a position distant from the active tap, a time taken until the signal carriers are detected in the N+ semiconductor region of the active tap after photoelectric conversion is performed is also lengthened.

FIG. 7 illustrates a relationship between a position in a thickness direction of the substrate 171, and the migration speed of the signal carriers. A region R21 corresponds to a diffusion current region.

As described above, if the thickness of the substrate 171 is large, for example, when a drive frequency is high, that is, when switching between active and inactive of the tap (signal extraction unit) is performed at a high speed, it is difficult to completely inject electrons generated at a position such as the region R21 distant from the active tap into the N+ semiconductor region of the active tap. That is, in a case where a time for which the tap is active is short, it may be difficult to detect electrons (charges) generated inside the region R21 in the N+ semiconductor region of the active tap, and thus electron extraction efficiency deteriorates.

In contrast, in the back-illuminated type CAPD sensor, it is possible to secure a sufficiently opening rate. Accordingly, for example, when the substrate 172 is made to be thin as indicated by an arrow W32 in FIG. 6, it is possible to secure sufficient quantum efficiency×opening rate. Here, the substrate 172 corresponds to the substrate 61 in FIG. 2, and an arrow inside the substrate 172 indicates an electric field in a direction perpendicular to the substrate 172.

FIG. 8 illustrates a relationship between a position in a thickness direction of the substrate 172 and the migration speed of the signal carriers.

As described above, when the thickness of the substrate 172 in a direction perpendicular to the substrate 172 is made to be small, an electric field in the direction perpendicular to the substrate 172 substantially becomes strong, only electrons (charges) only in a drift current region in which the migration speed of the signal carriers is fast is used, and electrons in a diffusion current region in which the migration speed of the signal carriers is slow is not used. Since only the electrons (charges) only in the drift current region are used, a time taken until the signal carriers are detected in the N+ semiconductor region of the active tap after photoelectric conversion is performed is shortened. In addition, when the thickness of the substrate 172 becomes small, a migration distance of the signal carriers up to the N+ semiconductor region inside the active tap is also shortened.

Accordingly, in the back-illuminated type CAPD sensor, even when the drive frequency is high, the signal carriers (electrons) generated in each region inside the substrate 172 can be sufficiently injected into the N+ semiconductor region of the active tap, and thus it is possible to improve electron extraction efficiency.

In addition, it is possible to secure sufficient electron extraction efficiency due to a reduction in the thickness of the substrate 172 even in a high drive frequency, and it is possible to improve high-speed drive tolerance.

Particularly, in the back-illuminated type CAPD sensor, it is possible to directly apply a voltage to the substrate 172, that is, the substrate 61, and thus a response speed for switching between active and inactive of the tap is fast, and thus it is possible to drive the sensor at a high drive frequency. In addition, since it is possible to directly apply a voltage to the substrate 61, a modulation possible region inside the substrate 61 is widened.

In addition, in the back-illuminated type light-receiving element 1 (CAPD sensor), it is possible to obtain a sufficient opening rate, and thus it is possible to miniaturize a pixel in proportion to the opening rate, and it is possible to improve miniaturization tolerance of the pixel.

In addition, in the light-receiving element 1, the freedom of back end of line (BEOL) capacity design is possible due to the back-illuminated type, and thus it is possible to improve the degree of freedom in design of a saturation signal amount (Qs).

MODIFICATION EXAMPLE 1 OF FIRST EMBODIMENT

<Configuration Example of Pixel>

It should be noted that description has been given of a case where in a portion of the signal extraction unit 65 inside the substrate 61, the N+ semiconductor region 771 and the P+ semiconductor region 73 are set to rectangular regions as illustrated in FIG. 3 as an example. However, the shape of the N+ semiconductor region 71 and the P+ semiconductor region 73 when viewed from a direction perpendicular to the substrate 61 may be an arbitrary shape.

Figure 9:
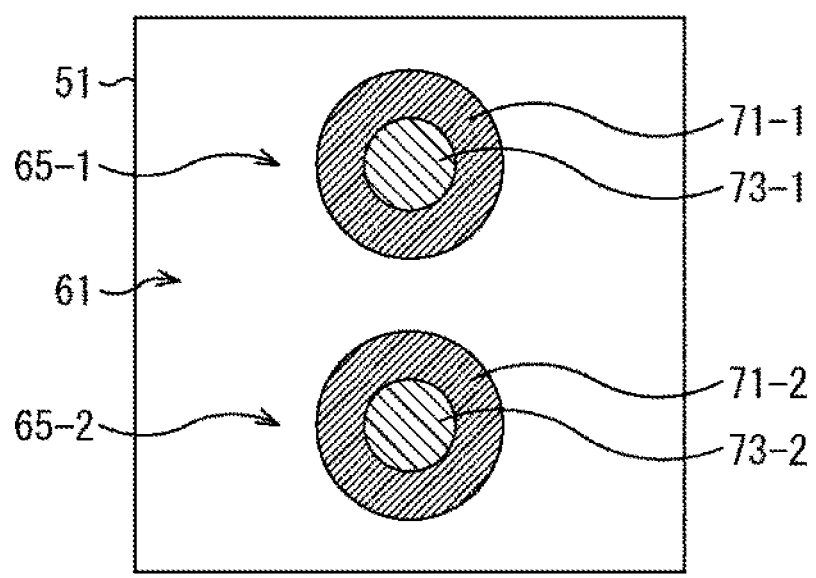
FIG. 9 is a view illustrating another configuration example of the portion of the signal extraction unit of the pixel.

Specifically, for example, as illustrated in FIG. 9, the N+ semiconductor region 71 and the P+ semiconductor region 73 may be set to a circular shape. It should be noted that in FIG. 9, the same reference numeral will be given to a portion corresponding to the case in FIG. 3, and description thereof will be appropriately omitted.

FIG. 9 illustrates the N+ semiconductor region 71 and the P+ semiconductor region 73 when a portion of the signal extraction unit 65 in the pixel 51 is viewed from a direction perpendicular to the substrate 61.

In this example, the oxide film 64 (not illustrated) is formed at the central portion of the pixel 51, and the signal extraction unit 65 is formed at a portion on a slightly end side from the center of the pixel 51. Particularly, here, two pieces of the signal extraction units 65 are formed in the pixel 51.

In addition, in the signal extraction units 65, the P+ semiconductor region 73 having a circular shape is formed at the central position, and in a state in which the P+ semiconductor region 73 is set as the center, the periphery of the P+ semiconductor region 73 is surrounded by the N+ semiconductor region 71 having a circular shape, more specifically, an annular shape.

Figure 10:
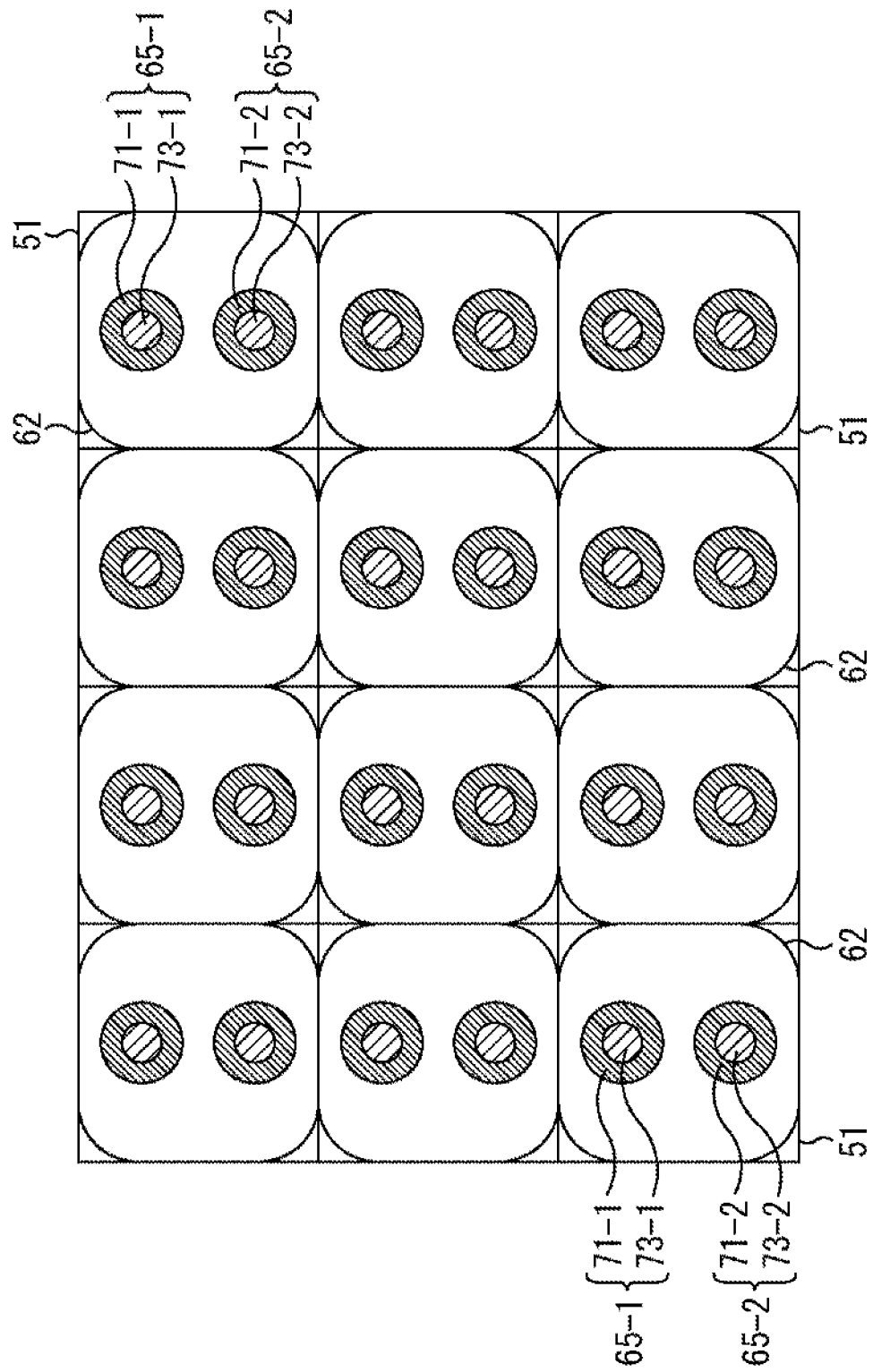
FIG. 10 is a view describing a relationship between the pixel and an on-chip lens.

FIG. 10 is a plan view in which the on-chip lens 62 is superimposed on a part of the pixel array unit 20 in which the pixels 51 including the signal extraction unit 65 illustrated in FIG. 9 are two-dimensionally arranged in a matrix shape.

The on-chip lens 62 is formed in a pixel unit as illustrated in FIG. 10. In other words, a unit region in which one piece of the on-chip lens 62 is formed corresponds to one pixel.

It should be noted that in FIG. 2, the isolation portion 75 constituted by an oxide film or the like is disposed between the N+ semiconductor region 71 and the P+ semiconductor region 73, but the isolation portion 75 may be present or absent.

MODIFICATION EXAMPLE 2 OF FIRST EMBODIMENT

<Configuration Example of Pixel>

Figure 11:
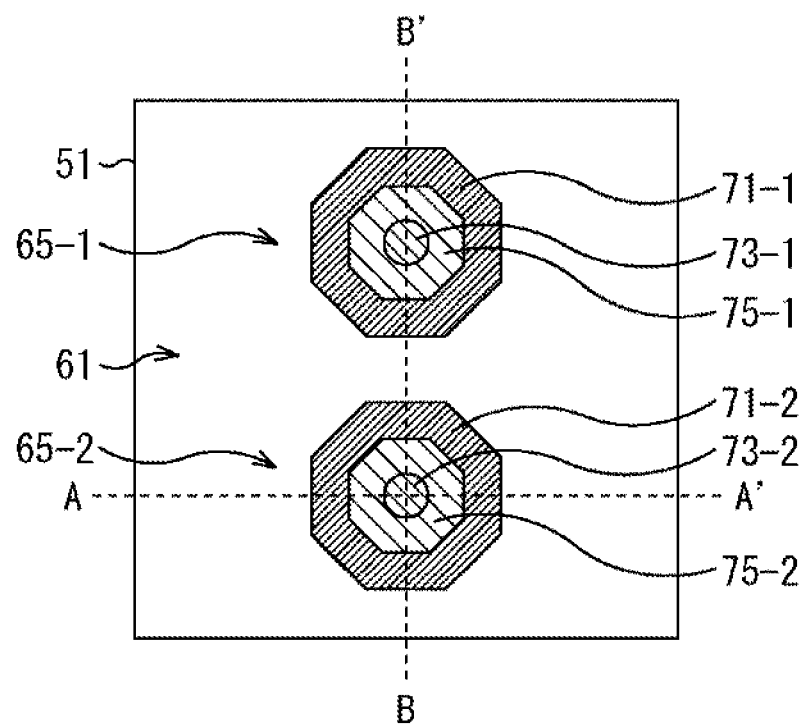
FIG. 11 is a view illustrating still another configuration example of the portion of the signal extraction unit of the pixel.

FIG. 11 is a plan view illustrating a modification example of a planar shape of the signal extraction unit 65 in the pixel 51.

The planar shape of the signal extraction unit 65 may be set to a shape other than the rectangular shape illustrated in FIG. 3 and the circular shape illustrated in FIG. 9, for example, an octagonal shape as illustrated in FIG. 11.

In addition, FIG. 11 illustrates a plan view in a case where the isolation portion 75 constituted by an oxide film or the like is formed between the N+ semiconductor region 71 and the P+ semiconductor region 73.

A line A-A' illustrated in FIG. 11 represents a cross-sectional line in FIG. 37 to be described later, and a line B-B' represents a cross-sectional line in FIG. 36 to be described later.

Second Embodiment

<Configuration Example of Pixel>

In addition, description has been given of a configuration in which in the signal extraction unit 65, the periphery of the P+ semiconductor region 73 is surrounded by the N+ semiconductor region 71 as an example, but the periphery of the N+ semiconductor region may be surrounded by the P+ semiconductor region.

Figure 12:
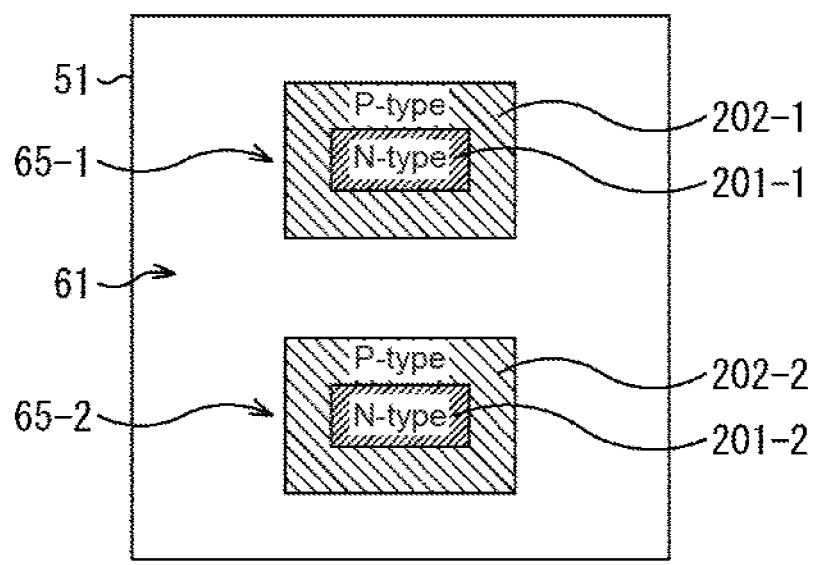
FIG. 12 is a view illustrating still another configuration example of the portion of the signal extraction unit of the pixel.

In this case, for example, the pixel 51 is configured as illustrated in FIG. 12. It should be noted that in FIG. 12, the same reference numeral will be given to a portion corresponding to the case in FIG. 3, and description thereof will be appropriately omitted.

FIG. 12 illustrates an arrangement of the N+ semiconductor region and the P+ semiconductor region when a portion of the signal extraction unit 65 is viewed from a direction perpendicular to the substrate 61.

In this example, the oxide film 64 (not illustrated) is formed at the central portion of the pixel 51, and the signal extraction unit 65-1 is formed at a portion on a slightly upper side from the center of the pixel 51 in the drawing, and the signal extraction unit 65-2 is formed at a portion on a slightly lower side from the center of the pixel 51 in the drawing. Particularly, in this example, a formation position of the signal extraction unit 65 in the pixel 51 is set to the same position as in the case of FIG. 3.

In the signal extraction unit 65-1, a rectangular N+semiconductor region 201-1 corresponding to the N+semiconductor region 71-1 illustrated in FIG. 3 is formed at the center of the signal extraction unit 65-1. In addition, the periphery of the N+ semiconductor region 201-1 is surrounded by a P+ semiconductor region 202-1 that corresponds to the P+ semiconductor region 73-1 illustrated in FIG. 3 and has a rectangular shape, more specifically, a rectangular frame shape. That is, the P+ semiconductor region 202-1 is formed to surround the periphery of the N+ semiconductor region 201-1.

Similarly, In the signal extraction unit 65-2, a rectangular N+ semiconductor region 201-2 corresponding to the N+ semiconductor region 71-2 illustrated in FIG. 3 is formed at the center of the signal extraction unit 65-2. In addition, the periphery of the N+ semiconductor region 201-2 is surrounded by a P+ semiconductor region 202-2 that corresponds to the P+ semiconductor region 73-2 illustrated in FIG. 3 and has a rectangular shape, more specifically, a rectangular frame shape.

It should be noted that hereinafter, in a case where it is not necessary to particularly distinguish the N+ semiconductor region 201-1 and the N+ semiconductor region 201-2, the regions are simply referred to as an N+ semiconductor region 201. In addition, hereinafter, in a case where it is not necessary to distinguish the P+ semiconductor region 202-1 and the P+ semiconductor region 202-2, the regions are simply referred to as a P+ semiconductor region 202.

Even in a case where the signal extraction unit 65 has the configuration illustrated in FIG. 12, as in the case of the configuration illustrated in FIG. 3, the N+ semiconductor region 201 functions as a charge detection unit that detects the amount of signal carriers, and the P+ semiconductor region 202 functions a voltage application unit that generates an electric field by directly applying a voltage to the substrate 61.

MODIFICATION EXAMPLE 1 OF SECOND EMBODIMENT

<Configuration Example of Pixel>

In addition, as in the example illustrated in FIG. 9, even in an arrangement in which the periphery of the N+ semiconductor region 201 is surrounded by the P+ semiconductor region 202, the shape of the N+ semiconductor region 201 and the P+ semiconductor region 202 may be set to an arbitrary shape.

Figure 13:
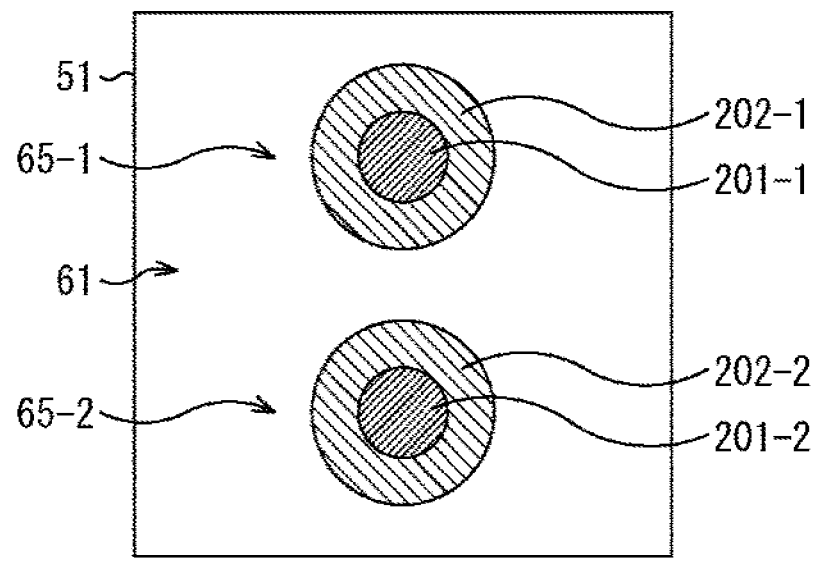
FIG. 13 is a view illustrating still another configuration example of the portion of the signal extraction unit of the pixel.

That is, for example, as illustrated in FIG. 13, the N+ semiconductor region 201 and the P+ semiconductor region 202 may be set to a circular shape. It should be noted that in FIG. 13, the same reference numeral will be given to a portion corresponding to the case in FIG. 12, and description thereof will be appropriately omitted.

FIG. 13 illustrates the N+ semiconductor region 201 and the P+ semiconductor region 202 when a portion of the signal extraction unit 65 in the pixel 51 is viewed from a direction perpendicular to the substrate 61.

In this example, the oxide film 64 (not illustrated) is formed at the central portion of the pixel 51, and the signal extraction unit 65 is formed at a portion on a slightly end side from the center of the pixel 51. Particularly, here, two pieces of the signal extraction units 65 are formed in the pixel 51.

In addition, in the signal extraction unit 65, the N+ semiconductor region 201 having a circular shape is formed at the central position, and in a state in which the N+ semiconductor region 201 is set as the center, the periphery of the N+ semiconductor region 201 is surrounded by the P+ semiconductor region 202 having a circular shape, more specifically, an annular shape.

Third Embodiment

<Configuration Example of Pixel>

In addition, the N+ semiconductor region and the P+ semiconductor region which are formed inside the signal extraction unit 65 may be set to a line shape (rectangular shape).

Figure 14:
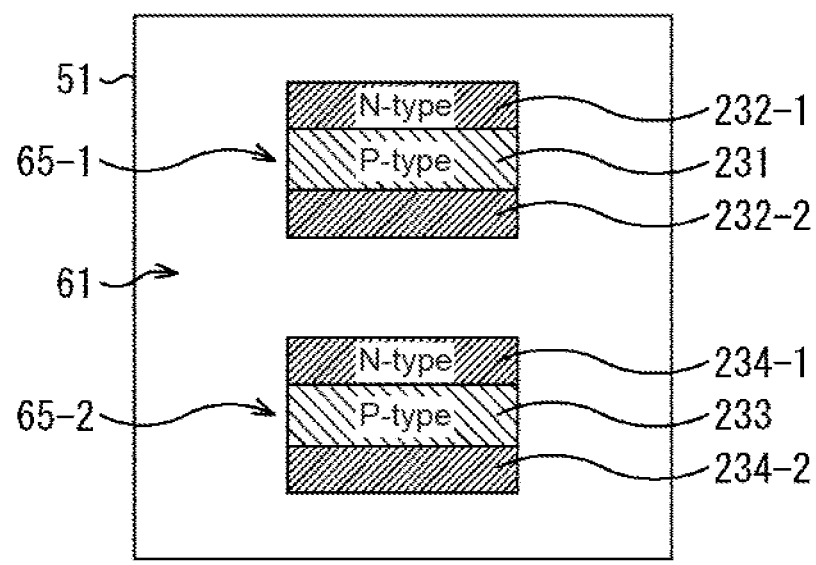
FIG. 14 is a view illustrating still another configuration example of the portion of the signal extraction unit of the pixel.

In this case, for example, the pixel 51 is configured as illustrated in FIG. 14. It should be noted that in FIG. 14, the same reference number is given to a portion corresponding to the case in FIG. 3, and description thereof will be appropriately omitted.

FIG. 14 illustrates an arrangement of the N+ semiconductor region and the P+ semiconductor region when a portion of the signal extraction unit 65 in the pixel 51 is viewed from a direction perpendicular to the substrate 61.

In this example, the oxide film 64 (not illustrated) is formed at the central portion of the pixel 51, and the signal extraction unit 65-1 is formed at a portion on a slightly upper side from the center of the pixel 51 in the drawing, and the signal extraction unit 65-2 is formed at a portion on a slightly lower side from the center of the pixel 51 in the drawing. Particularly, in this example, a formation position of the signal extraction unit 65 in the pixel 51 is the same position as in the case of FIG. 3.

In the signal extraction unit 65-1, a line-shaped P+ semiconductor region 231 corresponding to the P+ semiconductor region 73-1 illustrated in FIG. 3 is formed at the center of the signal extraction unit 65-1. In addition, a line-shaped N+ semiconductor region 232-1 and a line-shaped N+ semiconductor region 232-2 which correspond to the N+ semiconductor region 71-1 illustrated in FIG. 3 are formed at the periphery of the P+ semiconductor region 231 with the P+ semiconductor region 231 interposed therebetween. That is, the P+semiconductor region 231 is formed at a position that is interposed between the N+ semiconductor region 232-1 and the N+ semiconductor region 232-2.

It should be noted that hereinafter, in a case where it is not necessary to particularly distinguish the N+ semiconductor region 232-1 and the N+ semiconductor region 232-2, the regions are also referred to simply as an N+ semiconductor region 232.

The example illustrated in FIG. 3 has a structure in which the P+ semiconductor region 73 is surrounded by the N+ semiconductor region 71, but the example illustrated in FIG. 14 has a structure in which the P+ semiconductor region 231 is interposed between two N+ semiconductor regions 232 which are provided to be adjacent to the P+ semiconductor region 231.

Similarly, in the signal extraction unit 65-2, a line-shaped P+ semiconductor region 233 corresponding to the P+ semiconductor region 73-2 illustrated in FIG. 3 is formed at the center of the signal extraction unit 65-2. In addition, a line-shaped N+ semiconductor region 234-1 and a line-shaped N+ semiconductor region 234-2 which correspond to the N+ semiconductor region 71-2 illustrated in FIG. 3 are formed at the periphery of the P+ semiconductor region 233 with the P+ semiconductor region 233 interposed therebetween.

It should be noted that hereinafter, in a case where it is not necessary to particularly distinguish the N+ semiconductor region 234-1 and the N+ semiconductor region 234-2, the regions are also referred to simply as an N+ semiconductor region 234.

In the signal extraction unit 65 illustrated in FIG. 14, the P+ semiconductor region 231 and the P+ semiconductor region 233 function as a voltage application unit that corresponds to the P+ semiconductor region 73 illustrated in FIG. 3, and the N+ semiconductor region 232 and the N+ semiconductor region 234 function as a charge detection unit corresponding to the N+ semiconductor region 71 illustrated in FIG. 3. In this case, for example, both regions of the N+ semiconductor region 232-1 and the N+ semiconductor region 232-2 are connected to the FD portion A.

In addition, the length of each of the P+ semiconductor region 231, the N+ semiconductor region 232, the P+ semiconductor region 233, and the N+ semiconductor region 234, which have a line shape, in a horizontal direction in the drawing may be set to an arbitrary length, and the respective regions may not have the same length.

Fourth Embodiment

<Configuration Example of Pixel>

In addition, in the example illustrated in FIG. 14, description has been given of a structure in which the P+ semiconductor region 231 or the P+ semiconductor region 233 is inserted between the N+ semiconductor regions 232 or the N+ semiconductor regions 234 as an example, but a shape in which an N+ semiconductor region is interposed between P+ semiconductor regions may be employed.

Figure 15:
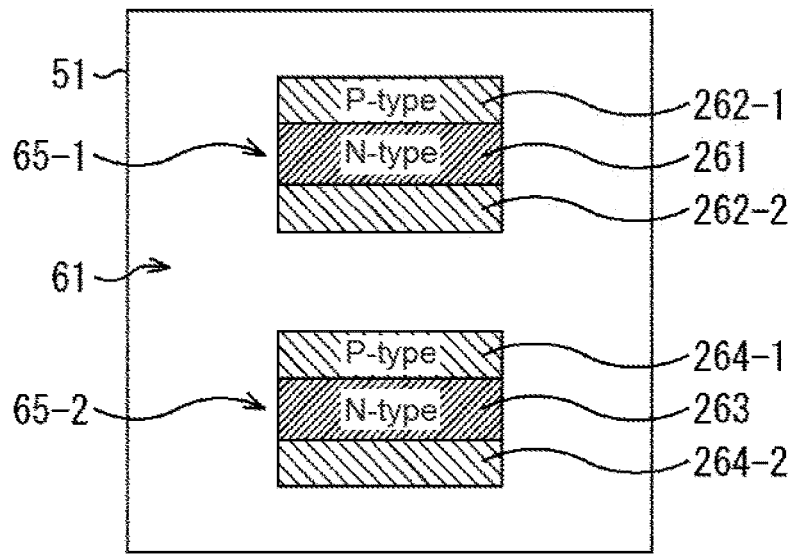
FIG. 15 is a view illustrating still another configuration example of the portion of the signal extraction unit of the pixel.

In this case, for example, the pixel 51 is configured as illustrated in FIG. 15. It should be noted that in FIG. 15, the same reference numeral will be given to a portion corresponding to the case in FIG. 3, and description thereof will be appropriately omitted.

FIG. 15 illustrates an arrangement of the N+ semiconductor region and the P+ semiconductor region when a portion of the signal extraction unit 65 in the pixel 51 is viewed from a direction perpendicular to the substrate 61.

In this example, the oxide film 64 (not illustrated) is formed at the central portion of the pixel 51, and the signal extraction unit 65 is formed at a portion on a slightly end side from the center of the pixel 51. Particularly, in this example, a formation position of two pieces of the signal extraction units 65 in the pixel 51 is the same position as in the case of FIG. 3.

In the signal extraction unit 65-1, a line-shaped N+ semiconductor region 261 corresponding to the N+ semiconductor region 71-1 illustrated in FIG. 3 is formed at the center of the signal extraction unit 65-1. In addition, a line-shaped P+ semiconductor region 262-1 and a line-shaped P+ semiconductor region 262-2 which correspond to the P+ semiconductor region 73-1 illustrated in FIG. 3 are formed at the periphery of the N+ semiconductor region 261 with the N+ semiconductor region 261 interposed therebetween. That is, the N+ semiconductor region 261 is formed at a position that is interposed between the P+ semiconductor region 262-1 and the P+ semiconductor region 262-2.

It should be noted that in a case where it is not necessary to particularly distinguish the P+ semiconductor region 262-1 and the P+ semiconductor region 262-2, the regions are also referred to simply as a P+ semiconductor region 262.

Similarly, in the signal extraction unit 65-2, a line-shaped N+ semiconductor region 263 corresponding to the N+ semiconductor region 71-2 illustrated in FIG. 3 is formed at the center of the signal extraction unit 65-2. In addition, a line-shaped P+ semiconductor region 264-1 and a line-shaped P+ semiconductor region 264-2 which correspond to the P+ semiconductor region 73-2 illustrated in FIG. 3 are formed at the periphery of the N+ semiconductor region 263 with the N+ semiconductor region 263 interposed therebetween.

It should be noted that hereinafter, in a case where it is not necessary to particularly distinguish the P+semiconductor region 264-1 and the P+ semiconductor region 264-2, the regions are also referred to simply as a P+ semiconductor region 264.

In the signal extraction unit 65 illustrated in FIG. 15, the P+ semiconductor region 262 and the P+ semiconductor region 264 function as a voltage application unit corresponding to the P+ semiconductor region 73 illustrated in FIG. 3, and the N+ semiconductor region 261 and the N+ semiconductor region 263 function as a charge detection unit corresponding to the N+ semiconductor region 71 illustrated in FIG. 3. It should be noted that the length of each of the N+ semiconductor region 261, the P+ semiconductor region 262, the N+ semiconductor region 263, and the P+ semiconductor region 264, which have a line shape, in a horizontal direction in the drawing may be set to an arbitrary length, and the respective regions may not have the same length.

Fifth Embodiment

<Configuration Example of Pixel>

In addition, description has been given of an example in which two pieces of the signal extraction units 65 are provided in each pixel that constitutes the pixel array unit 20, but the number of the signal extraction units provided in the pixel may be one or three or more.

Figure 16:
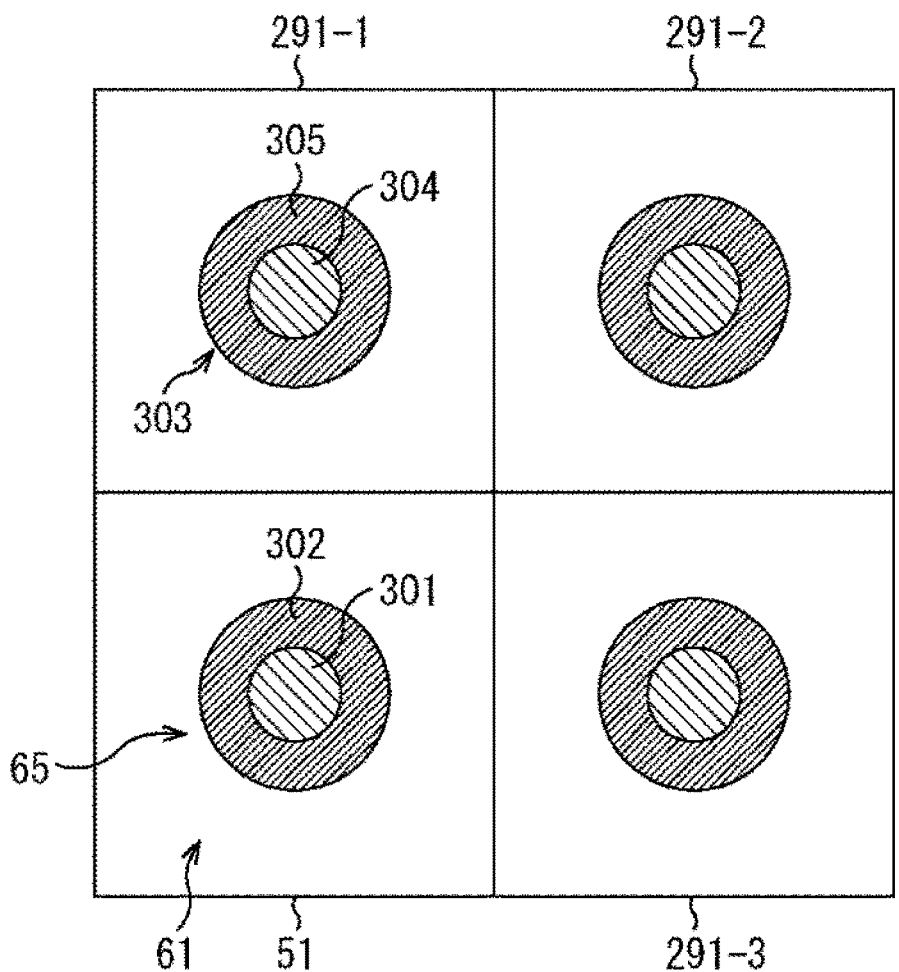
FIG. 16 is a view illustrating another configuration example of the pixel.

For example, in a case where one signal extraction unit is formed in the pixel 51, for example, the pixel has a configuration as illustrated in FIG. 16. It should be noted that in FIG. 16, the same reference numeral will be given to a portion corresponding to the case in FIG. 3, and description thereof will be appropriately omitted.

FIG. 16 illustrates an arrangement of the N+ semiconductor region and the P+ semiconductor region when a portion of the signal extraction unit in partial pixels provided in the pixel array unit 20 is viewed from a direction perpendicular to the substrate.

In this example, the pixel 51 provided in the pixel array unit 20, and as pixels 51 adjacent to the pixel 51, a pixel 291-1 to a pixel 291-3 to which different reference numerals are given are illustrated, and one piece of the signal extraction unit is formed in each of the pixels.

That is, one piece of the signal extraction unit 65 is formed at the central portion of the pixel 51. In addition, in the signal extraction unit 65, a P+ semiconductor region 301 having a circular shape is formed at the central position, and in a state in which the P+ semiconductor region 301 is set as the center, the periphery of the P+ semiconductor region 301 is surrounded by an N+ semiconductor region 302 having a circular shape, more specifically, an annular shape.

Here, the P+ semiconductor region 301 corresponds to the P+ semiconductor region 73 illustrated in FIG. 3, and functions as a voltage application unit. In addition, the N+ semiconductor region 302 corresponds to the N+ semiconductor region 71 illustrated in FIG. 3, and functions as a charge detection unit. It should be noted that the P+ semiconductor region 301 and the N+ semiconductor region 302 may have an arbitrary shape.

In addition, the pixel 291-1 to the pixel 291-3 located at the periphery of the pixel 51 have the same structure as in the pixel 51.

That is, for example, one signal extraction unit 303 is formed at the central portion of the pixel 291-1. In addition, in the signal extraction unit 303, a P+ semiconductor region 304 having a circular shape is formed at the central position, and in a state in which the P+ semiconductor region 304 is set as the center, the periphery of the P+ semiconductor region 304 is surrounded by an N+ semiconductor region 305 having a circular shape, more specifically, an annular shape.

The P+ semiconductor region 304 and the N+ semiconductor region 305 respectively correspond to the P+ semiconductor region 301 and the N+ semiconductor region 302.

It should be noted that in a case where it is not necessary to particularly distinguish the pixel 291-1 to the pixel 291-3, the pixels are also referred to simply as a pixel 291.

As described above, in a case where in one signal extraction unit (tap) is formed in each pixel, when measuring a distance up to a target object by the indirect ToF method, several pixels adjacent to each other are used, and distance information is calculated on the basis of pixel signals obtained with respect to the pixels.

For example, when focus is given to the pixel 51, in a state in which the signal extraction unit 65 of the pixel 51 is set as an active tap, for example, pixels are driven so that multiple signal extraction units 303 of several pixels 291 which include the pixel 291-1 and are adjacent to the pixel 51 become an inactive tap.

As an example, for example, signal extraction units of pixels such as the pixel 291-1 and the pixel 291-3, which are adjacent to the pixel 51 on upper and lower sides and right and left sides in the drawing, are driven to become an inactive tap.

Then, when an application voltage is switched so that the signal extraction unit 65 of the pixel 51 becomes the inactive tap, at this time, the signal extraction units 303 of several pieces of the pixels 291 which include the pixel 291-1 and are adjacent to the pixel 51 are set to be the active tap.

In addition, distance information is calculated on the basis of a pixel signal read out from the signal extraction unit 65 in a state in which the signal extraction unit 65 is set to the active tap, and a pixel signal read out from the signal extraction unit 303 in a state in which the signal extraction unit 303 is set to the active tap.

As described above, even in a case where one piece of the signal extraction unit (tap) is provided in a pixel, it is possible to perform distance measurement in accordance with the indirect ToF method by using pixels adjacent to each other.

Sixth Embodiment

<Configuration Example of Pixel>

In addition, as described above, three or more signal extraction units (taps) may be provided in each pixel.

Figure 17:
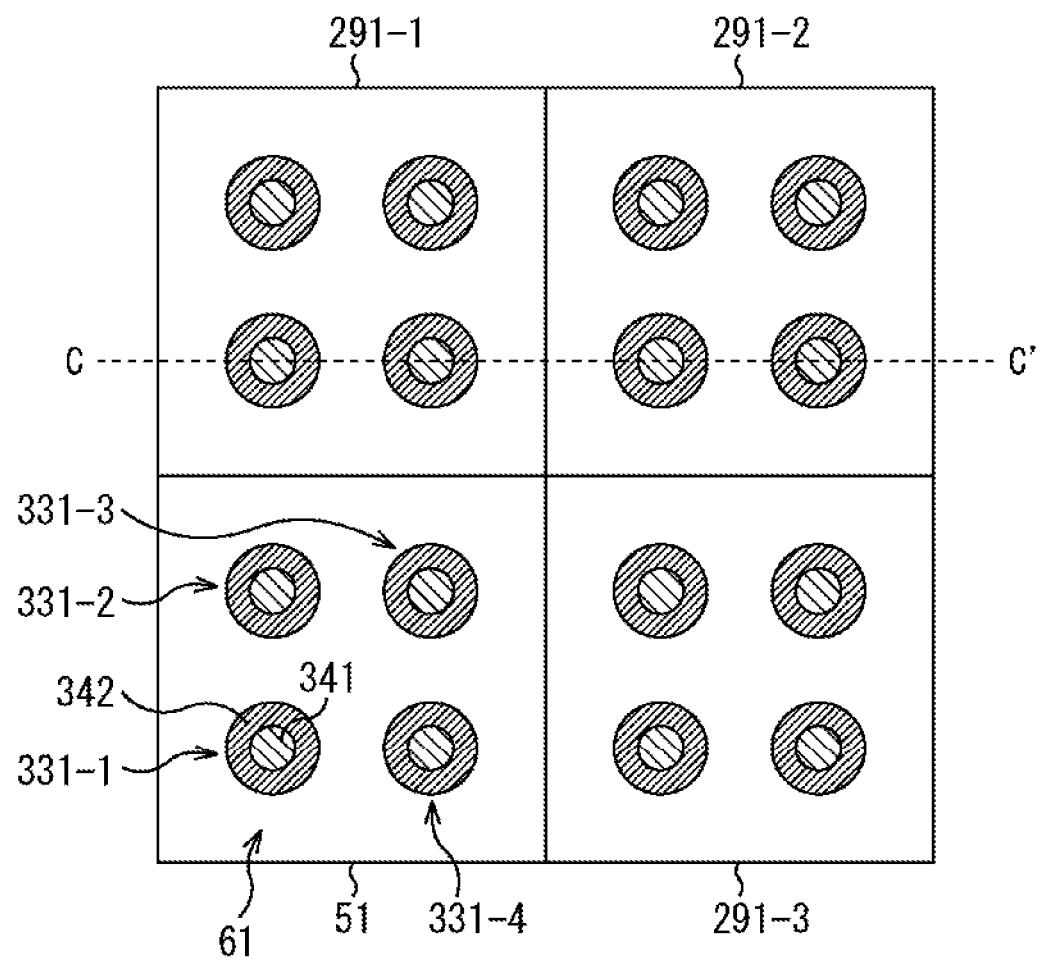
FIG. 17 is a view illustrating still another configuration example of the pixel.

For example, in a case where four signal extraction units (taps) are provided in the pixel, each pixel of the pixel array unit 20 is configured as illustrated in FIG. 17. It should be noted that in FIG. 17, the same reference numeral will be given to a portion corresponding to the case in FIG. 16, and description thereof will be appropriately omitted.

FIG. 17 illustrates an arrangement of the N+ semiconductor region and the P+ semiconductor region when a portion of the signal extraction unit in partial pixels provided in the pixel array unit 20 is viewed from a direction perpendicular to the substrate.

A cross-sectional view taken along line C-C' in FIG. 17 becomes FIG. 36 to be described later.

In this example, the pixel 51 and the pixels 291 which are provided in the pixel array unit 20 are illustrated, and four signal extraction units are formed in each of the pixels.

That is, in the pixel 51, a signal extraction unit 331-1, a signal extraction unit 331-2, a signal extraction unit 331-3, and a signal extraction unit 331-4 are respectively formed at positions between the center of the pixel 51 and end portions of the pixel 51, that is, a position on a lower left side, a position on upper left side, a position on an upper and right side, and a position on a lower right side of the center of the pixel 51 in the drawing.

The signal extraction unit 331-1 to the signal extraction unit 331-4 correspond to the signal extraction unit 65 illustrated in FIG. 16.

For example, in the signal extraction unit 331-1, a P+ semiconductor region 341 having a circular shape is formed at the central position, and in a state in which the P+ semiconductor region 341 is set as the center, the periphery of the P+ semiconductor region 341 is surrounded by an N+ semiconductor region 342 having a circular shape, more specifically, an annular shape.

Here, the P+ semiconductor region 341 corresponds to the P+ semiconductor region 301 illustrated in FIG. 16, and functions as a voltage application unit. In addition, the N+ semiconductor region 342 corresponds to the N+ semiconductor region 302 illustrated in FIG. 16, and functions as a charge detection unit. It should be noted that the P+ semiconductor region 341 and the N+ semiconductor region 342 may have an arbitrary shape.

In addition, the signal extraction unit 331-2 to the signal extraction unit 331-4 have the same configuration as in the signal extraction unit 333-1, and include the P+ semiconductor region that functions as a voltage application unit and the N+ semiconductor region that functions as a charge detection unit. In addition, the pixels 291 formed at the periphery of the pixel 51 have the same structure as in the pixel 51.

It should be noted that in a case where it is not necessary to particularly distinguish the signal extraction unit 331-1 to the signal extraction unit 331-4, the units are also referred to simply as a signal extraction unit 331.

As described above, in a case where the four signal extraction units are provided in each pixel, when performing distance measurement, for example, according to the indirect ToF method, the four signal extraction units in the pixel are used, and distance information is calculated.

As an example, when focus is given to the pixel 51, for example, in a state in which the signal extraction unit 331-1 and the signal extraction unit 331-3 are set to an active tap, the pixel 51 is driven so that the signal extraction unit 331-2 and the signal extraction unit 331-4 become an inactive tap.

Then, a voltage that is applied to the signal extraction unit 331 is switched. That is, the pixel 51 is driven so that the signal extraction unit 331-1 and the signal extraction unit 331-3 become the inactive tap, and the signal extraction unit 331-2 and the signal extraction unit 331-4 become the active tap.

In addition, distance information is calculated on the basis of pixel signals which are read out from the signal extraction unit 331-1 and the signal extraction unit 331-3 in a state in which the signal extraction unit 331-1 and the signal extraction unit 331-3 are set to the active tap, and pixel signals which are read out from the signal extraction unit 331-2 and the signal extraction unit 331-4 in a state in which the signal extraction unit 331-2 and the signal extraction unit 331-4 are set to the active tap.

Seventh Embodiment

<Configuration Example of Pixel>

In addition, the signal extraction unit (tap) may be shared by adjacent pixels of the pixel array unit 20.

Figure 18:
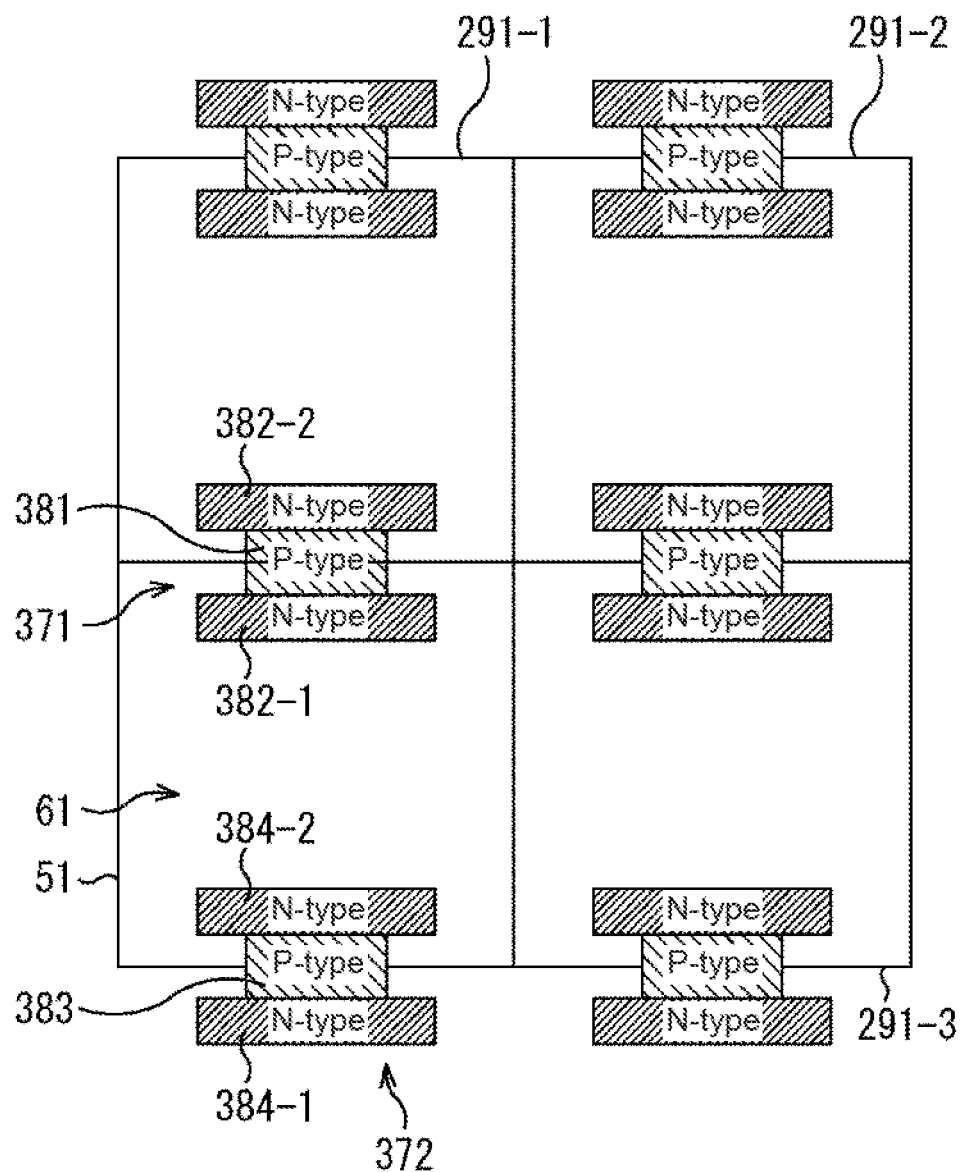
FIG. 18 is a view illustrating still another configuration example of the pixel.

In this case, for example, each pixel of the pixel array unit 20 has a configuration as illustrated in FIG. 18. It should be noted that in FIG. 18, the same reference numeral will be given to a portion corresponding to the case in FIG. 16, and description thereof will be appropriately omitted.

FIG. 18 illustrates an arrangement of the N+ semiconductor region and the P+ semiconductor region when a portion of the signal extraction unit in partial pixels provided in the pixel array unit 20 is viewed from a direction perpendicular to the substrate.

In this example, the pixel 51 and the pixel 291 which are provided in the pixel array unit 20, and two signal extraction units are formed in each of the pixels.

For example, in the pixel 51, a signal extraction unit 371 is formed at an end portion on an upper side of the pixel 51 in the drawing, and a signal extraction unit 372 is formed at an end portion on a lower side of the pixel 51 in the drawing.

The signal extraction unit 371 is shared by the pixel 51 and a pixel 291-1. That is, the signal extraction unit 371 is used as a tap of the pixel 51 and is used as a tap of the pixel 291-1. In addition, the signal extraction unit 372 is shared by the pixel 51, and a pixel (not illustrated) that is adjacent to a lower side of the pixel 51 in the drawing.

In the signal extraction unit 371, a line-shaped P+ semiconductor region 381 corresponding to the P+ semiconductor region 231 illustrated in FIG. 14 is formed at the central position. In addition, line-shaped N+ semiconductor region 382-1 and N+ semiconductor region 382-2 which correspond to the N+ semiconductor region 232 illustrated in FIG. 14 are formed at upper and lower positions of the P+ semiconductor region 381 in the drawing with the P+ semiconductor region 381 interposed therebetween.

Particularly, in this example, the P+ semiconductor region 381 is formed at a boundary portion between the pixel 51 and the pixel 291-1. In addition, the N+ semiconductor region 382-1 is formed in a region inside the pixel 51, and the N+ semiconductor region 382-2 is formed in a region inside the pixel 291-1.

Here, the P+ semiconductor region 381 functions as a voltage application unit, and the N+ semiconductor region 382-1 and the N+ semiconductor region 382-2 function as a charge detection unit. It should be noted that hereinafter, in a case where it is not necessary to particularly distinguish the N+ semiconductor region 382-1 and the N+ semiconductor region 382-2, the regions are also referred to simply as an N+ semiconductor region 382.

In addition, the P+ semiconductor region 381 or the N+ semiconductor region 382 may have an arbitrary shape. In addition, the N+ semiconductor region 382-1 and the N+ semiconductor region 382-2 may be connected to the same FD portion, or may be connected to FD portions different from each other.

In the signal extraction unit 372, line-shaped P+ semiconductor region 383, N+ semiconductor region 384-1, and N+ semiconductor region 384-2 are formed.

The P+ semiconductor region 383, the N+ semiconductor region 384-1, and the N+ semiconductor region 384-2 respectively correspond to the P+ semiconductor region 381, the N+ semiconductor region 382-1, and the N+ semiconductor region 382-2, and are set to the same arrangement, the same shape, and the same function as in the regions. It should be noted that in a case where it is not necessary to particularly distinguish the N+ semiconductor region 384-1 and the N+ semiconductor region 384-2, the regions are also referred to simply as an N+ semiconductor region 384.

As described above, even in a case where the signal extraction unit (tap) is shared between adjacent pixels, it is possible to perform distance measurement according to the indirect ToF method by the same operation as in the example illustrated in FIG. 3.

As illustrated in FIG. 18, in a case where the signal extraction unit is shared between pixels, for example, a distance between the P+ semiconductor region 381 and the P+ semiconductor region 383 or the like, that is, a distance between a pair of P+ semiconductor regions for generating an electric field, that is, a current is lengthened. In other words, when the signal extraction unit is shared between pixels, it is possible to lengthen the distance between the P+ semiconductor regions to the maximum.

Accordingly, a current is less likely to flow between the P+ semiconductor regions, and thus it is possible to reduce power consumption in the pixels. In addition, the above-described configuration is advantageous for miniaturization of the pixels.

It should be noted that description has been given of an example in which one signal extraction unit is shared by two pixels adjacent to each other, but one signal extraction unit may be shared by three or more pixels adjacent to each other. In addition, in a case where the signal extraction unit is shared by two or more pixels adjacent to each other, in the signal extraction unit, only a charge detection unit that detects signal carriers may be shared, or only a voltage application unit that generates an electric field may be shared.

Eighth Embodiment

<Configuration Example of Pixel>

In addition, the on-chip lens or the interpixel light-shielding portion which are provided in each pixel such as the pixel 51 of the pixel array unit 20 may not be particularly provided.

Figure 19:
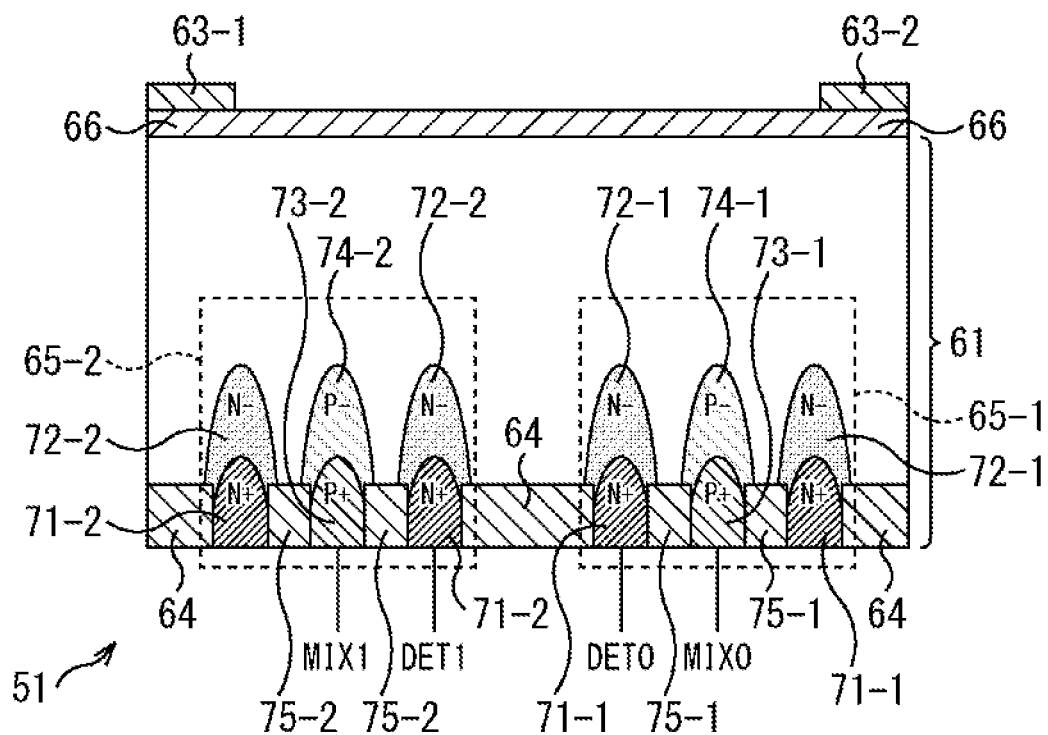
FIG. 19 is a view illustrating still another configuration example of the pixel.

Specifically, for example, the pixel 51 can be set to a configuration illustrated in FIG. 19. It should be noted that in FIG. 19, the same reference numeral will be given to a portion corresponding to the case in FIG. 2, and description thereof will be appropriately omitted.

A configuration of the pixel 51 illustrated in FIG. 19 is different from that of the pixel 51 illustrated in FIG. 2 in that the on-chip lens 62 is not provided, and the other configurations are the same as those of the pixel 51 in FIG. 2.

In the pixel 51 illustrated in FIG. 19, since the on-chip lens 62 is not provided on a light incident surface side of the substrate 61, attenuation of infrared light incident to the substrate 61 from the outside can be made to be smaller. Accordingly, a light amount of infrared light capable of being received by the substrate 61 increases, and thus it is possible to improve sensitivity of the pixel 51.

MODIFICATION EXAMPLE 1 OF EIGHTH EMBODIMENT

<Configuration Example of Pixel>

Figure 20:
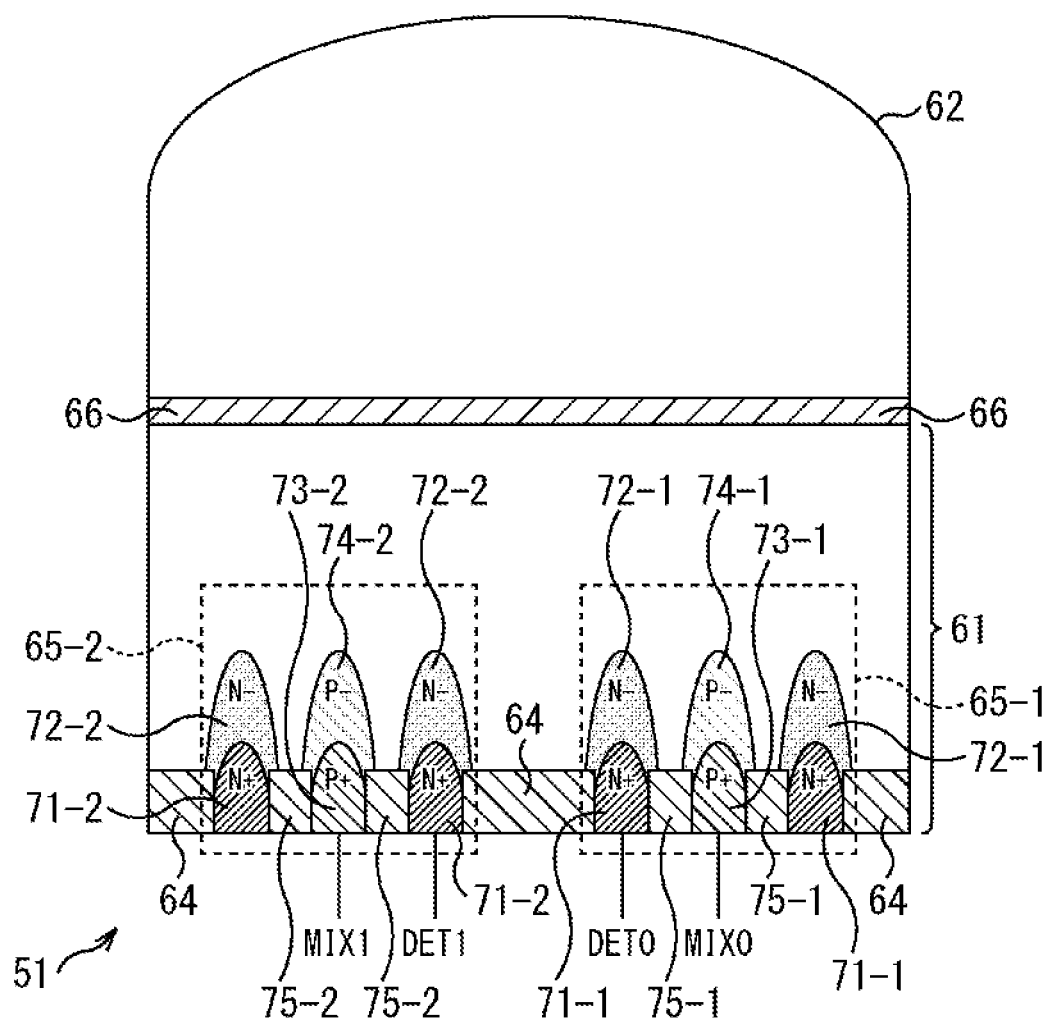
FIG. 20 is a view illustrating still another configuration example of the pixel.

In addition, the configuration of the pixel 51 may be set to, for example, a configuration illustrated in FIG. 20. It should be noted that in FIG. 20, the same reference numeral will be given to a portion corresponding to the case in FIG. 2, and description thereof will be appropriately omitted.

A configuration of the pixel 51 illustrated in FIG. 20 is different from that of the pixel 51 illustrated in FIG. 2 in that the interpixel light-shielding film 63-1 and the interpixel light-shielding film 63-2 are not provided, and the other configurations are the same as those of the pixel 51 in FIG. 2.

In the example illustrated in FIG. 20, since the interpixel light-shielding film 63 is not provided on the light incident surface side of the substrate 61, a cross-talk suppressing effect decreases, but infrared light that is shielded by the interpixel light-shielding film 63 is also incident into the substrate 61, and thus it is possible to improve sensitivity of the pixel 51.

It should be noted that not only the on-chip lens 62 and but also the interpixel light-shielding film 63 may not be provided in the pixel 51.

MODIFICATION EXAMPLE 2 OF EIGHTH EMBODIMENT

<Configuration Example of Pixel>

Figure 21:
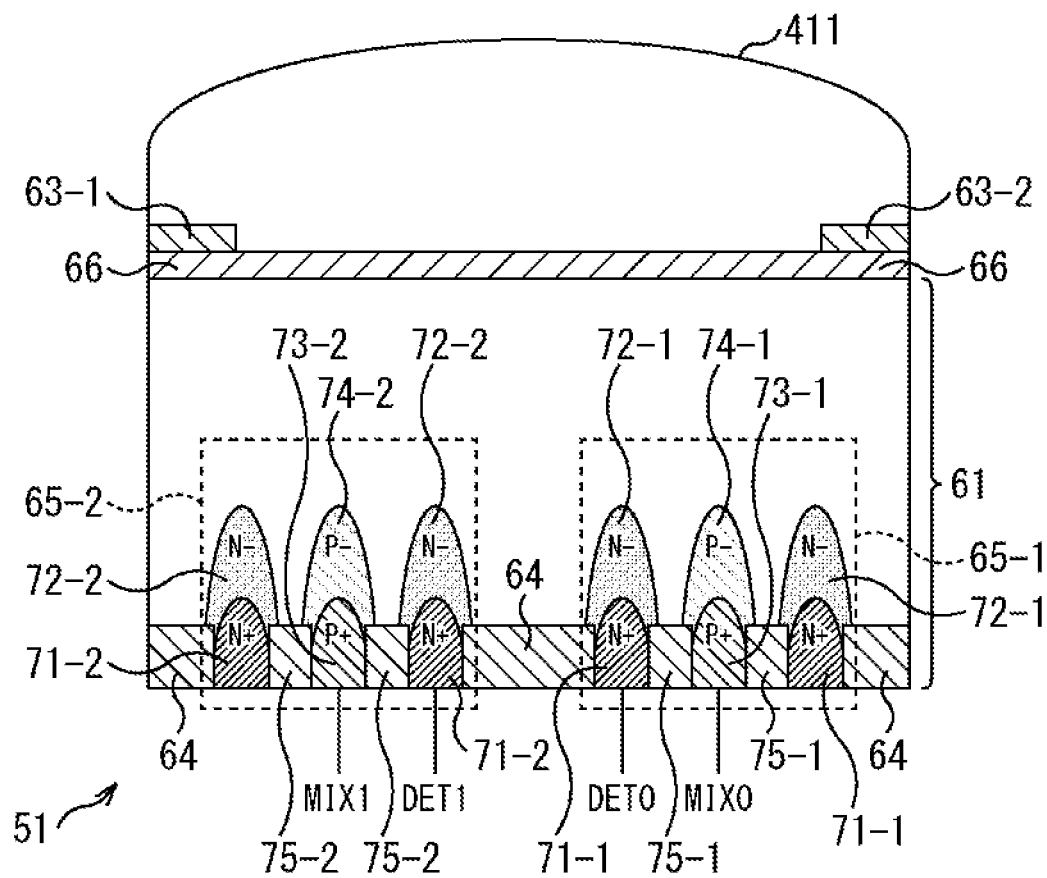
FIG. 21 is a view illustrating still another configuration example of the pixel.

In addition, for example, as illustrated in FIG. 21, the thickness of the on-chip lens in an optical axial direction may also be optimized. It should be noted that in FIG. 21, the same reference numeral will be given to a portion corresponding to the case in FIG. 2, and description thereof will be appropriately omitted.

A configuration of the pixel 51 illustrated in FIG. 21 is different from that of the pixel 51 illustrated in FIG. 2 in that an on-chip lens 411 is provided instead of the on-chip lens 62, and the other configurations are the same as those of the pixel 51 in FIG. 2.

In the pixel 51 illustrated in FIG. 21, the on-chip lens 411 is formed on the light incident surface side of the substrate 61, that is, on an upper side in the drawing. The thickness of the on-chip lens 411 in an optical axial direction, that is, the thickness in a vertical direction in the drawing is made to be smaller in comparison to the on-chip lens 62 illustrated in FIG. 2.

Generally, when the thickness of an on-chip lens provided on a front surface of the substrate 61 is larger, it is more advantageous for condensing of light that is incident to the on-chip lens. However, when the thickness of on-chip lens 411 is reduced, a transmittance becomes higher in proportion to the reduction, and thus it is possible to improve sensitivity of the pixel 51. Accordingly, the thickness of the on-chip lens 411 may be appropriately determined in correspondence with the thickness of the substrate 61, a condensing position of infrared light, or the like.

Ninth Embodiment

<Configuration Example of Pixel>

In addition, an isolation region may be provided between pixels formed in the pixel array unit 20 to suppress cross-talk by improving isolation characteristics between adjacent pixels.

Figure 22:
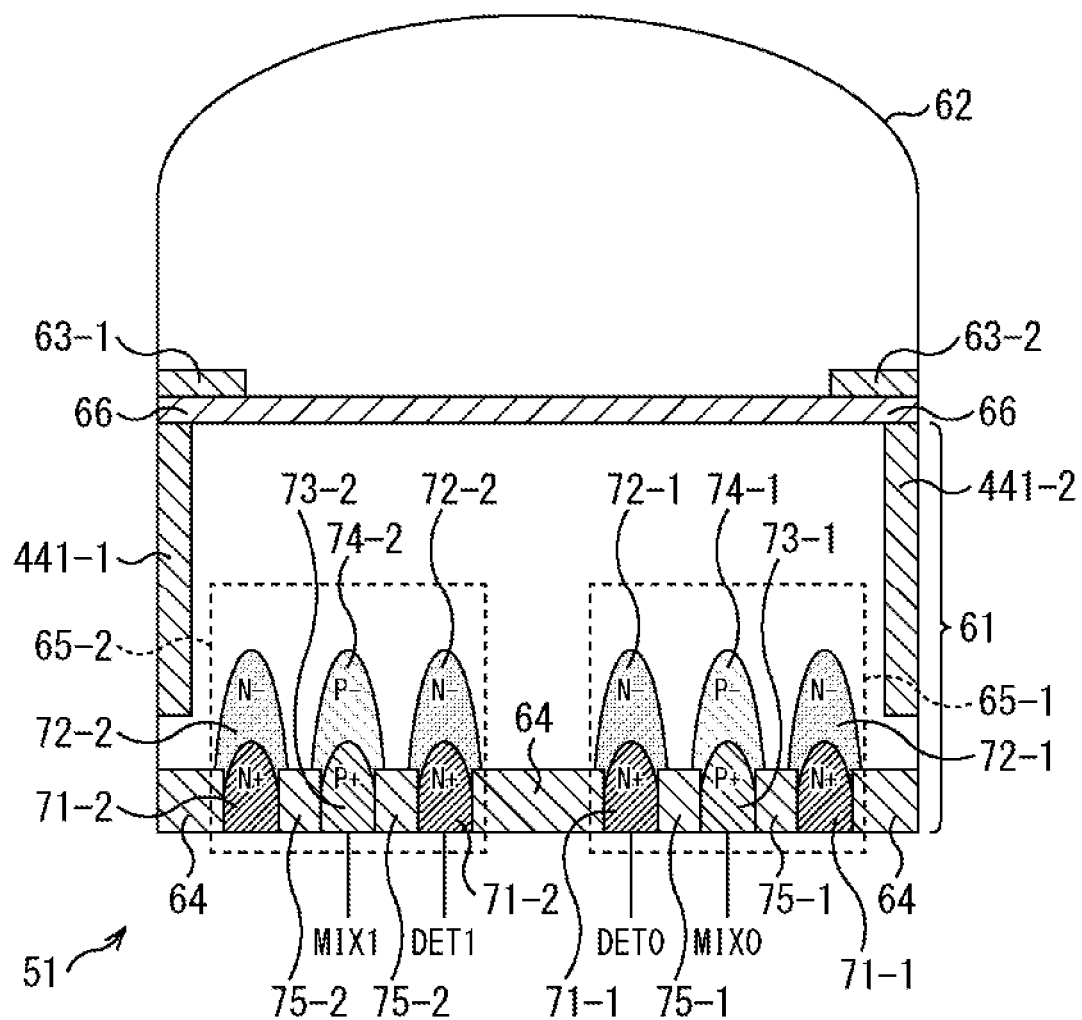
FIG. 22 is a view illustrating still another configuration example of the pixel.

In this case, for example, the pixel 51 is configured as illustrated in FIG. 22. It should be noted that in FIG. 22, the same reference numeral will be given to a portion corresponding to the case in FIG. 2, and description thereof will be appropriately omitted.

A configuration of the pixel 51 illustrated in FIG. 22 is different from that of the pixel 51 illustrated in FIG. 2 in that an isolation region 441-1 and an isolation region 441-2 are provided inside the substrate 61, and the other configurations are the same as those of the pixel 51 in FIG. 2.

In the pixel 51 illustrated in FIG. 22, the isolation region 441-1 and the isolation region 441-2 which isolate adjacent pixels are formed at a boundary portion between the pixel 51 and other pixels adjacent to the pixel 51 at the inside of the substrate 61, that is, end portions on the right and left sides of the pixel 51 in the drawing by a light-shielding film or the like. It should be noted that in a case where it is not necessary to particularly distinguish the isolation region 441-1 and the isolation region 441-2, the regions are also referred to simply as an isolation region 441.

For example, when forming the isolation region 441, an elongated groove (trench) is formed in the substrate 61 at a predetermined depth from the light-incident surface side of the substrate 61, that is, an upper side surface in the drawing to a downward side (in a direction perpendicular to a surface of the substrate 61) in the drawing. Then, a light-shielding film is formed in the groove portion through embedding and becomes the isolation region 441. The isolation region 441 functions as a pixel isolation region that shields infrared light that is incident into the substrate 61 from the light incident surface and propagates toward the other pixels adjacent to the pixel 51.

As described above, when the embedding-type isolation region 441 is formed, it is possible to improve infrared light separation characteristics between pixels, and thus it is possible to suppress occurrence of cross-talk.

MODIFICATION EXAMPLE 1 OF NINTH EMBODIMENT

<Configuration Example of Pixel>

Figure 23:
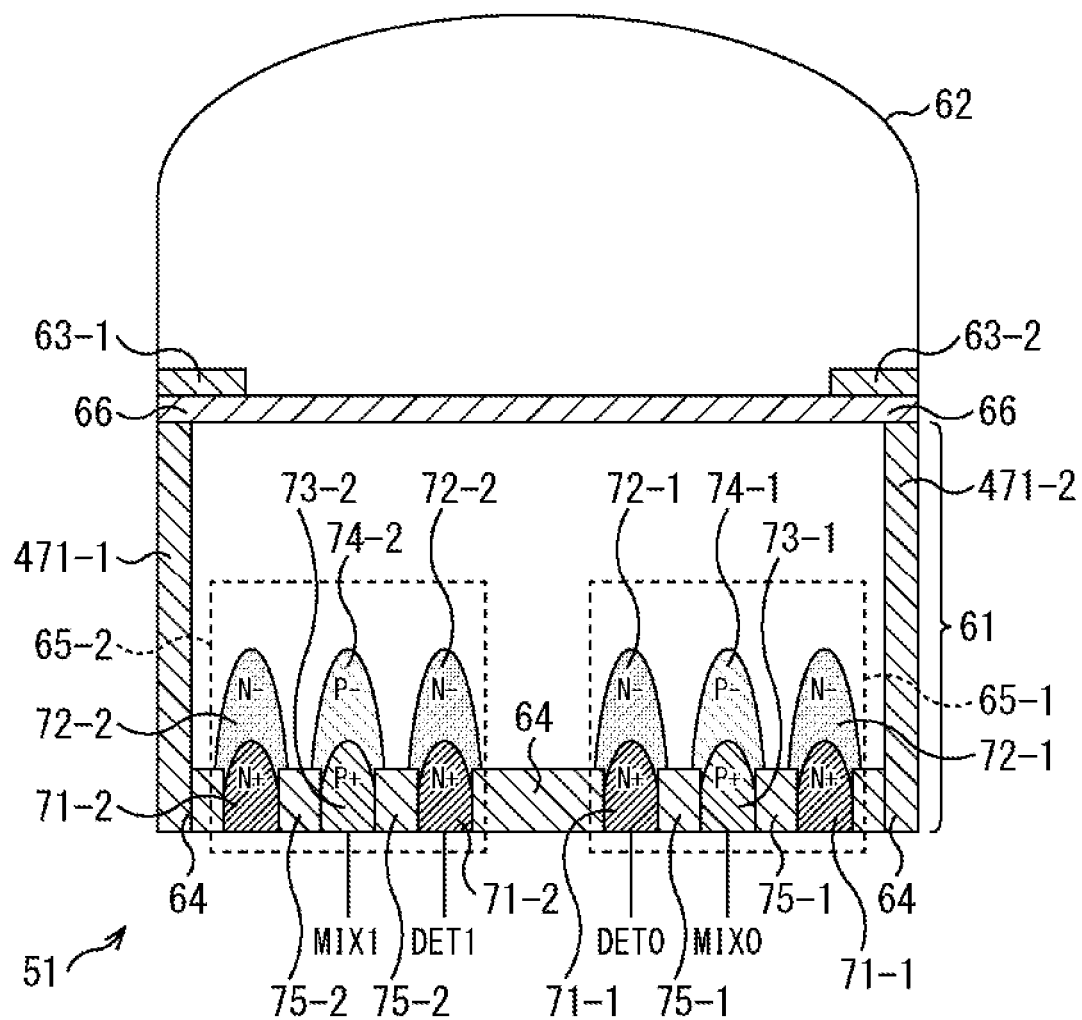
FIG. 23 is a view illustrating still another configuration example of the pixel.

In addition, in the case of forming the embedding-type isolation region in the pixel 51, for example, an isolation region 471-1 and an isolation region 471-2 may be provided to penetrate through the entirety of the substrate 61 as illustrated in FIG. 23. It should be noted that in FIG. 23, the same reference numeral will be given to a portion corresponding to the case in FIG. 2, and description thereof will be appropriately omitted.

A configuration of the pixel 51 illustrated in FIG. 23 is different from that of the pixel 51 illustrated in FIG. 2 in that the isolation region 471-1 and the isolation region 471-2 are provide inside the substrate 61, and the other configurations are the same as those of the pixel 51 in FIG. 2. That is, the pixel 51 illustrated in FIG. 23 has a configuration in which the isolation region 471-1 and the isolation region 471-2 are provided instead of the isolation region 441 of the pixel 51 illustrated in FIG. 22.

In the pixel 51 illustrated in FIG. 23, the isolation region 471-1 and the isolation region 471-2 which penetrate the entirety of the substrate 61 are formed at a boundary portion between the pixel 51 and other pixels adjacent to the pixel 51 at the inside of the substrate 61, that is, end portions on the right and left sides of the pixel 51 in the drawing by a light-shielding film or the like. It should be noted that in a case where it is not necessary to particularly distinguish the isolation region 471-1 and the isolation region 471-2, the regions are also referred to simply as an isolation region 471.

For example, when forming the isolation region 471, an elongated groove (trench) is formed in a surface opposite to the light incident surface side of the substrate 61, that is, from a lower side surface in the drawing to an upward side in the drawing. At this time, the groove is formed until reaching the light incident surface of the substrate 61 to penetrate through the substrate 61. In addition, a light-shielding film is formed in the groove portion formed as described above through embedding, and becomes the isolation region 471.

In accordance with the embedding-type isolation region 471, it is also possible to improve the infrared light separation characteristics between pixels, and thus it is possible to suppress occurrence of cross-talk.

Tenth Embodiment

<Configuration Example of Pixel>

In addition, the thickness of the substrate in which the signal extraction unit 65 is formed may be determined in correspondence with various characteristics of pixels and the like.

Figure 24:
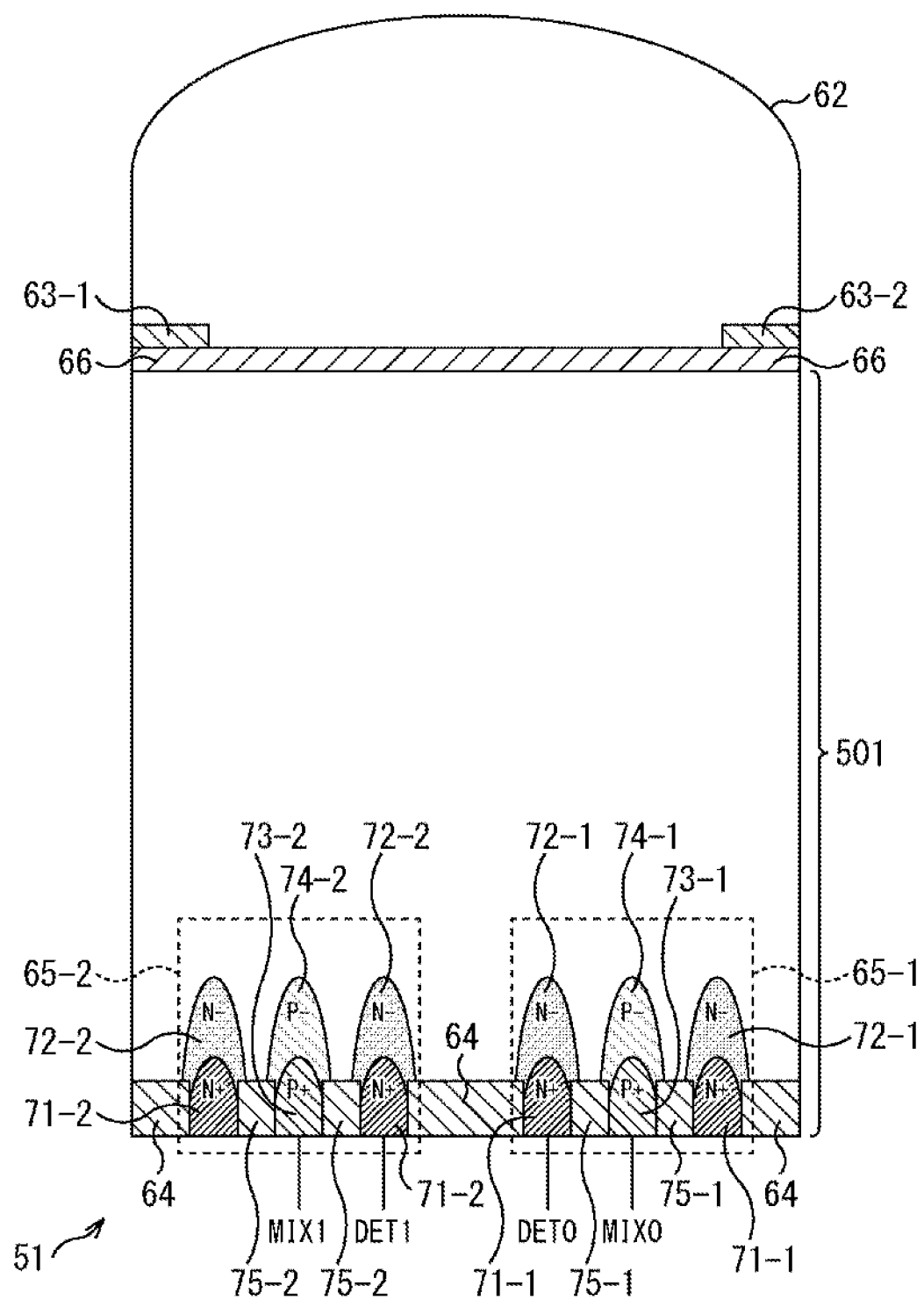
FIG. 24 is a view illustrating still another configuration example of the pixel.

Accordingly, for example, as illustrated in FIG. 24, a substrate 501 that constitutes the pixel 51 may be set to be thicker in comparison to the substrate 61 illustrated in FIG. 2. It should be noted that in FIG. 24, the same reference numeral will be given to a portion corresponding to the case in FIG. 2, and description thereof will be appropriately omitted.

A configuration of the pixel 51 illustrated in FIG. 24 is different from that of the pixel 51 illustrated in FIG. 2 in that the substrate 501 is provided instead of the substrate 61, and the other configurations are the same as those of the pixel 51 in FIG. 2.

That is, in the pixel 51 illustrated in FIG. 24, the on-chip lens 62, the fixed charge film 66, and the interpixel light-shielding film 63 are formed on a light incident surface side of the substrate 501. In addition, the oxide film 64, the signal extraction unit 65, and the isolation portion 75 are formed in the vicinity of a front surface opposite to the light incident surface side of the substrate 501.

For example, the substrate 501 is constituted by a P-type semiconductor substrate having a thickness of 20 or greater. The substrate 501 and the substrate 61 are different only in the substrate thickness, and positions at which the oxide film 64, the signal extraction unit 65, and the isolation portion 75 are formed are the same between the substrate 501 and the substrate 61.

It should be noted that a film thickness of various layers (films) which are appropriately formed on the light incident surface side or the like of the substrate 501 or the substrate 61 may be optimized in correspondence with characteristics of the pixel 51 or the like.

Eleventh Embodiment

<Configuration Example of Pixel>

Figure 25:
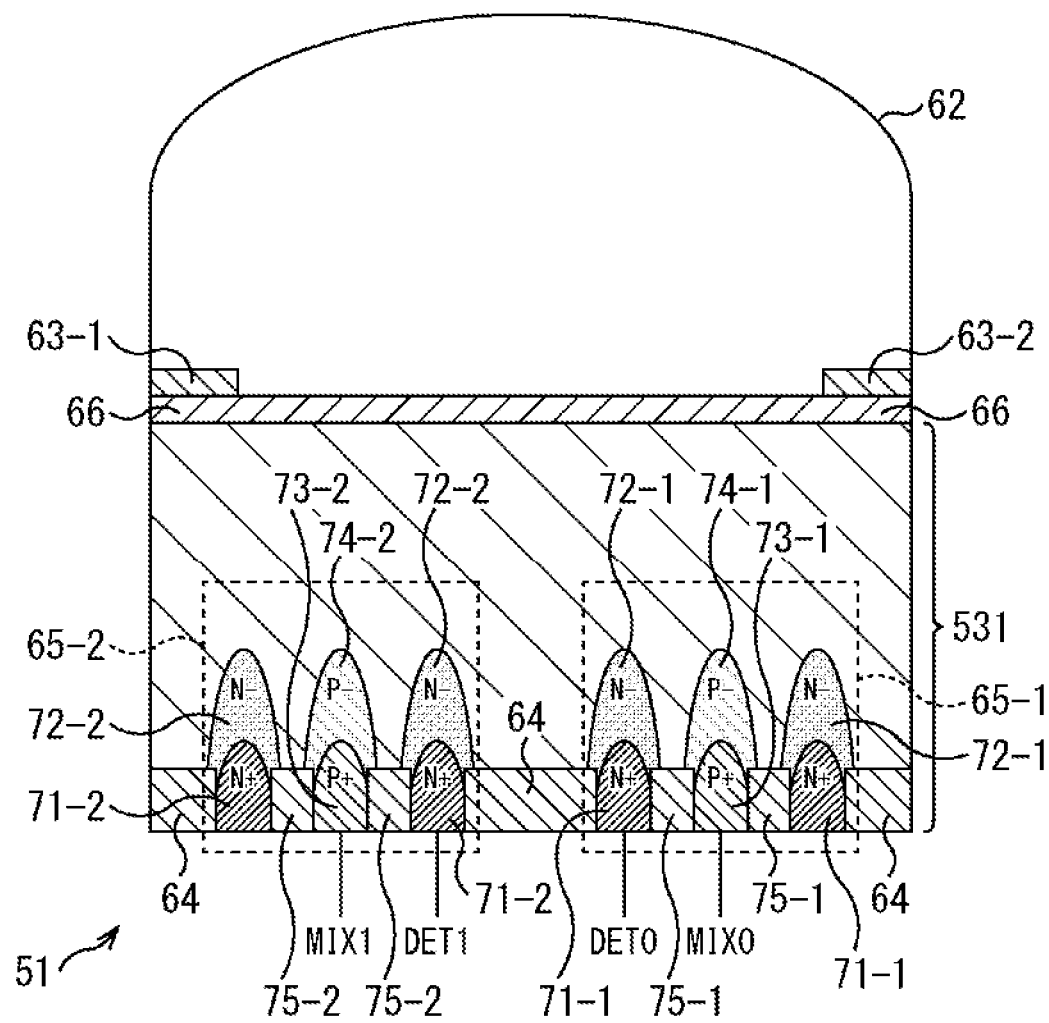
FIG. 25 is a view illustrating still another configuration example of the pixel.

In addition, description has been given of an example in which the substrate that constitutes the pixel 51 is formed form the P-type semiconductor substrate, but the substrate may be constituted by, for example, an N-type semiconductor substrate as illustrated in FIG. 25. It should be noted that in FIG. 25, the same reference numeral will be given to a portion corresponding to the case in FIG. 2, and description thereof will be appropriately omitted.

A configuration of the pixel 51 illustrated in FIG. 25 is different from that of the pixel 51 illustrated in FIG. 2 in that a substrate 531 is provided instead of the substrate 61, and the other configurations are the same as those of the pixel 51 in FIG. 2.

In the pixel 51 illustrated in FIG. 25, for example, the on-chip lens 62, the fixed charge film 66, and the interpixel light-shielding film 63 are formed on a light incident surface side in the substrate 531 constituted by an N-type semiconductor layer such as a silicon substrate.

In addition, the oxide film 64, the signal extraction unit 65, and the isolation portion 75 are formed in the vicinity of a surface opposite to the light incident surface side of the substrate 531. Formation positions of the oxide film 64, the signal extraction unit 65, and the isolation portion 75 are the same between the substrate 531 and the substrate 61, and the configuration of the signal extraction unit 65 is also the same between the substrate 531 and the substrate 61.

For example, the thickness of the substrate 531 in a vertical direction in the drawing, that is, the thickness in a direction perpendicular to a surface of the substrate 531 is set to 20 μm or less.

In addition, for example, the substrate 531 is set to a high-resistance N-Epi substrate of which a substrate concentration is set to the order of 1 E+13 or less, and resistance (resistivity) of the substrate 531 is set to, for example, 500 [Ωcm] or greater. Accordingly, it is possible to reduce power consumption in the pixel 51.

Here, with regard to a relationship between the substrate concentration and the resistance of the substrate 531, for example, the resistance is set to 2000 [Ωcm] when the substrate concentration is 2.15 E+12 [cm$^3$], the resistance is set to 1000 [Ωcm] when the substrate concentration is 4.30 E+12 [cm$^3$], the resistance is set to 500 [Ωcm] when the substrate concentration is 8.61 E+12 [cm$^3$], and the resistance is set to 100 [Ωcm] when the substrate concentration is 4.32 E+13 [cm$^3$].

As described above, even when the substrate 531 of the pixel 51 is set to the N-type semiconductor substrate, it is possible to obtain the same effect by the same operation as in the example illustrated in FIG. 2.

Twelfth Embodiment

<Configuration Example of Pixel>

In addition, as in the example described with reference to FIG. 24, the thickness of the N-type semiconductor substrate can also be determined in correspondence with various characteristics of pixels, or the like.

Figure 26:
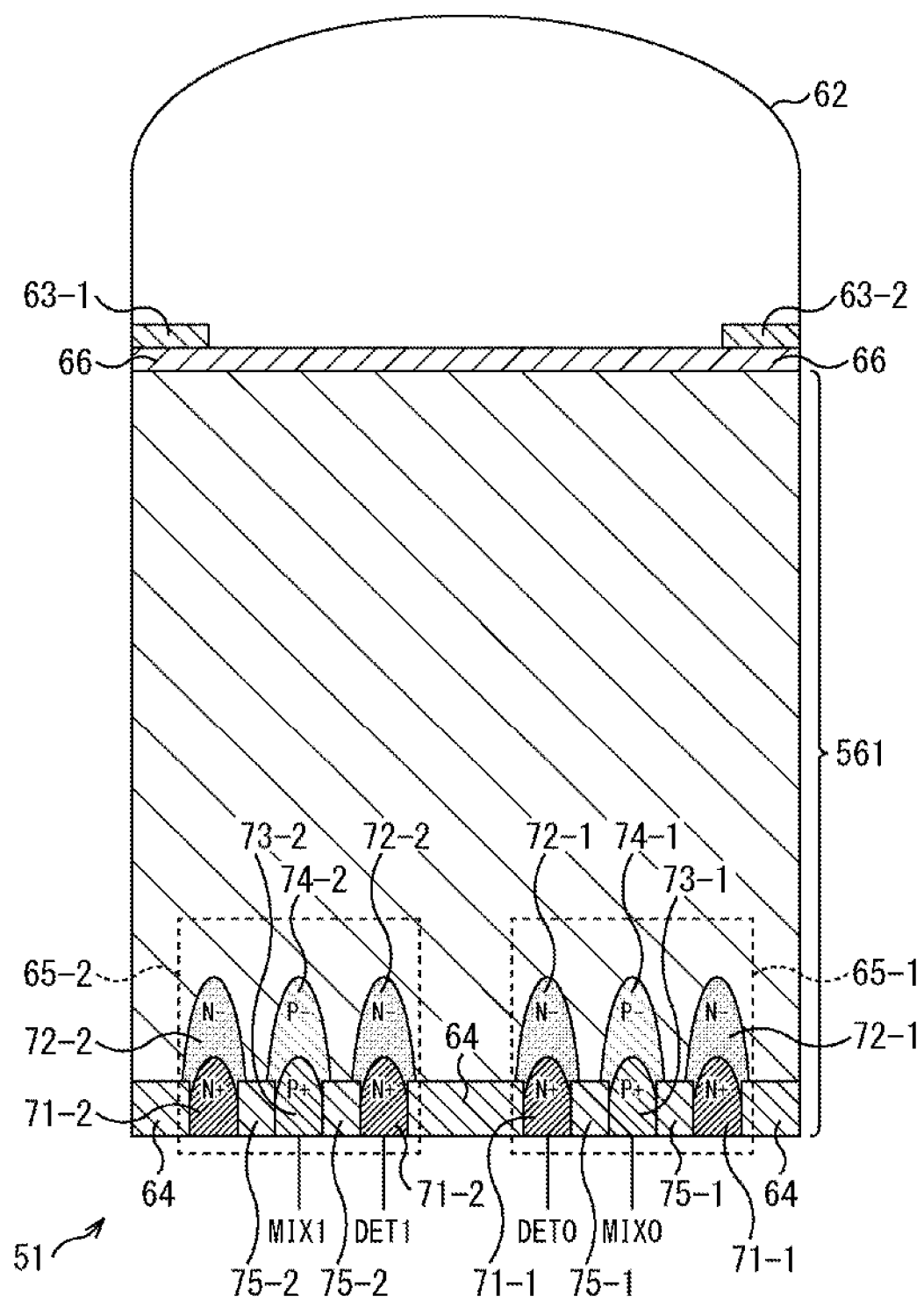
FIG. 26 is a view illustrating still another configuration example of the pixel.

Accordingly, for example, as illustrated in FIG. 26, a substrate 561 that constitutes the pixel 51 may be set to be thicker in comparison to the substrate 531 illustrated in FIG. 25. It should be noted that in FIG. 26, the same reference numeral will be given to a portion corresponding to the case in FIG. 25, and description thereof will be appropriately omitted.

A configuration of the pixel 51 illustrated in FIG. 26 is different from that of the pixel 51 illustrated in FIG. 25 in that the substrate 561 is provided instead of the substrate 531, and the other configurations are the same as those of the pixel 51 in FIG. 25.

That is, in the pixel 51 illustrated in FIG. 26, the on-chip lens 62, the fixed charge film 66, and the interpixel light-shielding film 63 are formed on a light incident surface side in the substrate 561. In addition, the oxide film 64, the signal extraction unit 65, and the isolation portion 75 are formed in the vicinity of a front surface that is a surface opposite to the light incident surface side of the substrate 561.

For example, the substrate 561 is constituted by an N-type semiconductor substrate having a thickness of 20 or greater. The substrate 561 and the substrate 531 are different only in a substrate thickness, and formation positions of the oxide film 64, the signal extraction unit 65, and the isolation portion 75 are the same between the substrate 561 and the 531.

Thirteenth Embodiment

<Configuration Example of Pixel>

In addition, for example, an electric field inside the substrate 61 in a direction perpendicular to a surface of the substrate 61 (hereinafter, may also be referred to as a Z direction) may be strengthened by applying a bias to the light incident surface side of the substrate 61.

In this case, for example, the pixel 51 has a configuration illustrated in FIGS. 27A and 27B. It should be noted that in FIGS. 27A and 27B, the same reference numeral will be given to a portion corresponding to the case in FIG. 2, and description thereof will be appropriately omitted.

FIG. 27A illustrates the pixel 51 illustrated in FIG. 2, and an arrow inside the substrate 61 of the pixel 51 indicates the intensity of the electric field in the Z direction at the inside of the substrate 61.

In contrast, FIG. 27B illustrates a configuration of the pixel 51 in the case of applying the bias (voltage) to the light incident surface of the substrate 61. The configuration of the pixel 51 in FIG. 27B is basically the same as the configuration of the pixel 51 illustrated in FIG. 2, but a P+ semiconductor region 601 is newly added to an interface on the light incident surface side of the substrate 61.

In the P+ semiconductor region 601 formed at the light incident surface side interface of the substrate 61, a voltage of 0 V or less (negative bias) is applied from the inside or the outside of the pixel array unit 20, and thus the electric field in the Z direction is strengthened. An arrow inside the substrate 61 of the pixel 51 in FIG. 27B indicates the intensity of the electric field inside the substrate 61 in the Z direction. Boldness of the arrow drawn inside the substrate 61 in FIG. 27B is greater than that of the arrow in the pixel 51 in FIG. 27A, and the electric field in the Z direction becomes stronger. As described above, when the negative bias is applied to the P+ semiconductor region 601 formed on the light incident surface side of the substrate 61, the electric field in the Z direction is strengthened, and thus it is possible to improve electron extraction efficiency in the signal extraction unit 65.

It should be noted that the configuration for applying a voltage to the light incident surface side of the substrate 61 Is not limited to the configuration in which the P+ semiconductor region 601 is provided, and may be other arbitrary configurations. For example, a transparent electrode film may be formed between the light incident surface of the substrate 61 and the on-chip lens 62 through lamination, and a negative bias may be applied by applying a voltage to the transparent electrode film.

Fourteenth Embodiment

<Configuration Example of Pixel>

In addition, a large-area reflection member may be provided on a surface opposite to the light incident surface of the substrate 61 to improve sensitivity of the pixel 51 with respect to infrared lays.

Figure 28:
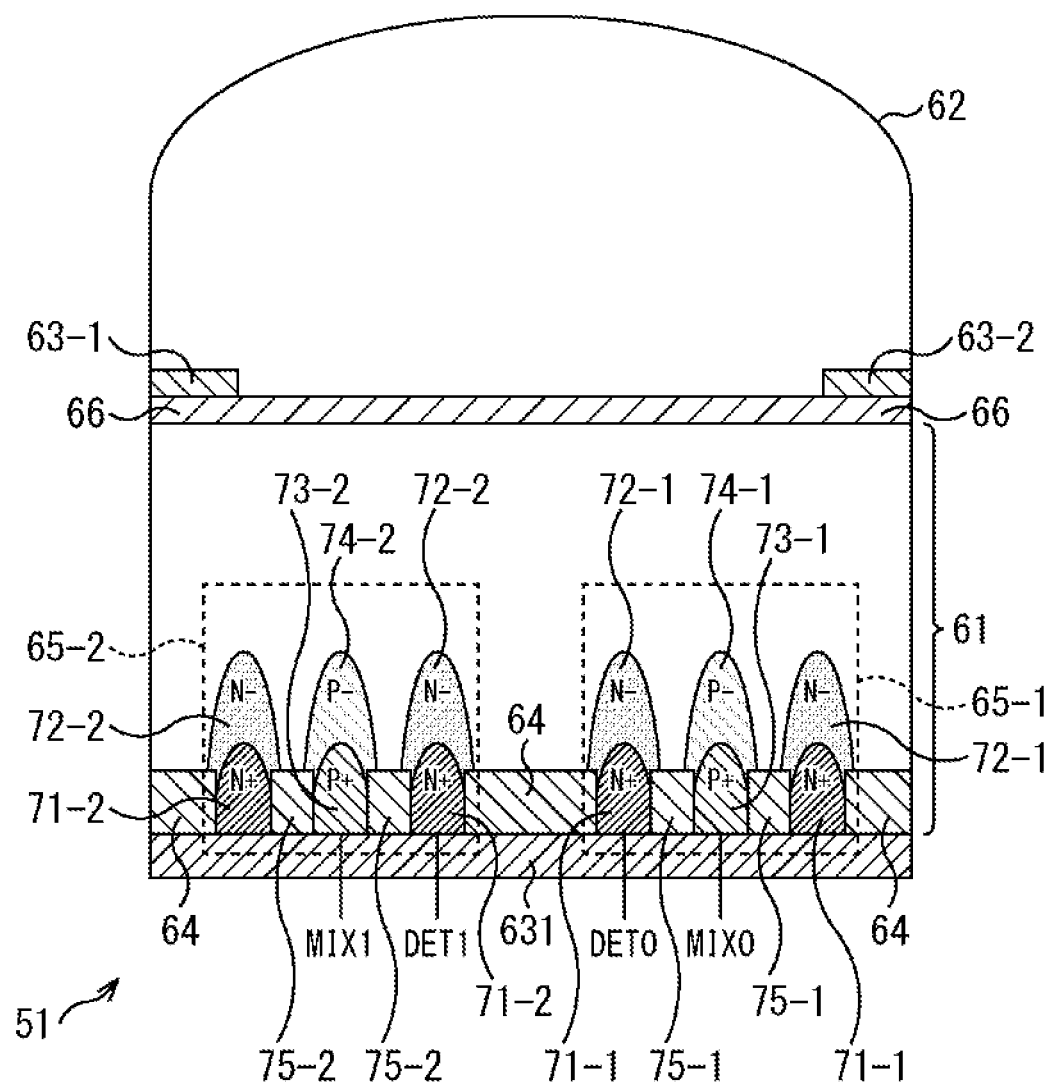
FIG. 28 is a view illustrating still another configuration example of the pixel.

In this case, for example, the pixel 51 is configured as illustrated in FIG. 28. It should be noted that in FIG. 28, the same reference numeral will be given to a portion corresponding to the case in FIG. 2, and description thereof will be appropriately omitted.

A configuration of the pixel 51 illustrated in FIG. 28 is different from that of the pixel 51 in FIG. 2 in that a reflection member 631 is provided on a surface opposite to the light incident surface of the substrate 61, and the other configurations are the same as those of the pixel 51 in FIG. 2.

In an example illustrated in FIG. 28, the reflection member 631 that reflects infrared light is provided to cover the entirety of a surface opposite to the light incident surface of the substrate 61.

The reflection member 631 may be any member as long as a reflectance with respect to infrared light is high. For example, a metal such as copper or aluminum that is provided inside a multilayer interconnection layer laminated on the surface opposite to the light incident surface of the substrate 61 may be used as the reflection member 631, or a reflection structure such as polysilicon and an oxide film may be formed on the surface opposite to the light incident surface of the substrate 61 as the reflection member 631.

As described above, when the reflection member 631 is provided in the pixel 51, infrared light, which is incident into the substrate 61 from the light incident surface through the on-chip lens 62 and is transmitted through the substrate 61 without being photoelectrically converted, is reflected by the reflection member 631 and is caused to be incident into the substrate 61 again. Accordingly, it is possible to increase the amount of infrared light that is photoelectrically converted at the inside of the substrate 61, and thus it is possible to improve quantum efficiency (QE), that is, sensitivity of the pixel 51 with respect to infrared light.

Fifteenth Embodiment

<Configuration Example of Pixel>

In addition, a large-area light-shielding member may be provided on the surface opposite to the light incident surface of the substrate 61 to suppress erroneous detection of light in nearby pixels.

In this case, for example, the pixel 51 may have a configuration in which the reflection member 631 illustrated in FIG. 28 is substituted with a light-shielding member. That is, in the pixel 51 illustrated in FIG. 28, the reflection member 631 that covers the entirety of a surface opposite to the light incident surface of the substrate 61 is set as a light-shielding member 631' that shields infrared light. The light-shielding member 631' substitutes for the reflection member 631 of the pixel 51 in FIG. 28.

The light-shielding member 631' may be any member as long as a light-shielding rate with respect to infrared light is high. For example, a metal such as copper or aluminum that is provided inside a multilayer interconnection layer laminated on the surface opposite to the light incident surface of the substrate 61 may be used as the light-shielding member 631', or a light-shielding structure such as polysilicon and an oxide film may be formed on the surface opposite to the light incident surface of the substrate 61 as the light-shielding member 631'.

As described above, when the light-shielding member 631' is provided in the pixel 51, it is possible to suppress infrared light, which is incident into the substrate 61 from the light incident surface through the on-chip lens 62 and is transmitted through the substrate 61 without being photoelectrically converted at the inside of the substrate 61, from being scattered in an interconnection layer and being incident to nearby pixels. Accordingly, it is possible to prevent light from being erroneously detected in the nearby pixels.

It should be noted that for example, when the light-shielding member 631' is constituted by a material including a metal, the light-shielding member 631' can also function as the reflection member 631.

Sixteenth Embodiment

<Configuration Example of Pixel>

In addition, a P-well region constituted by a P-type semiconductor region may be provided instead of the oxide film 64 in the substrate 61 of the pixel 51.

Figure 29:
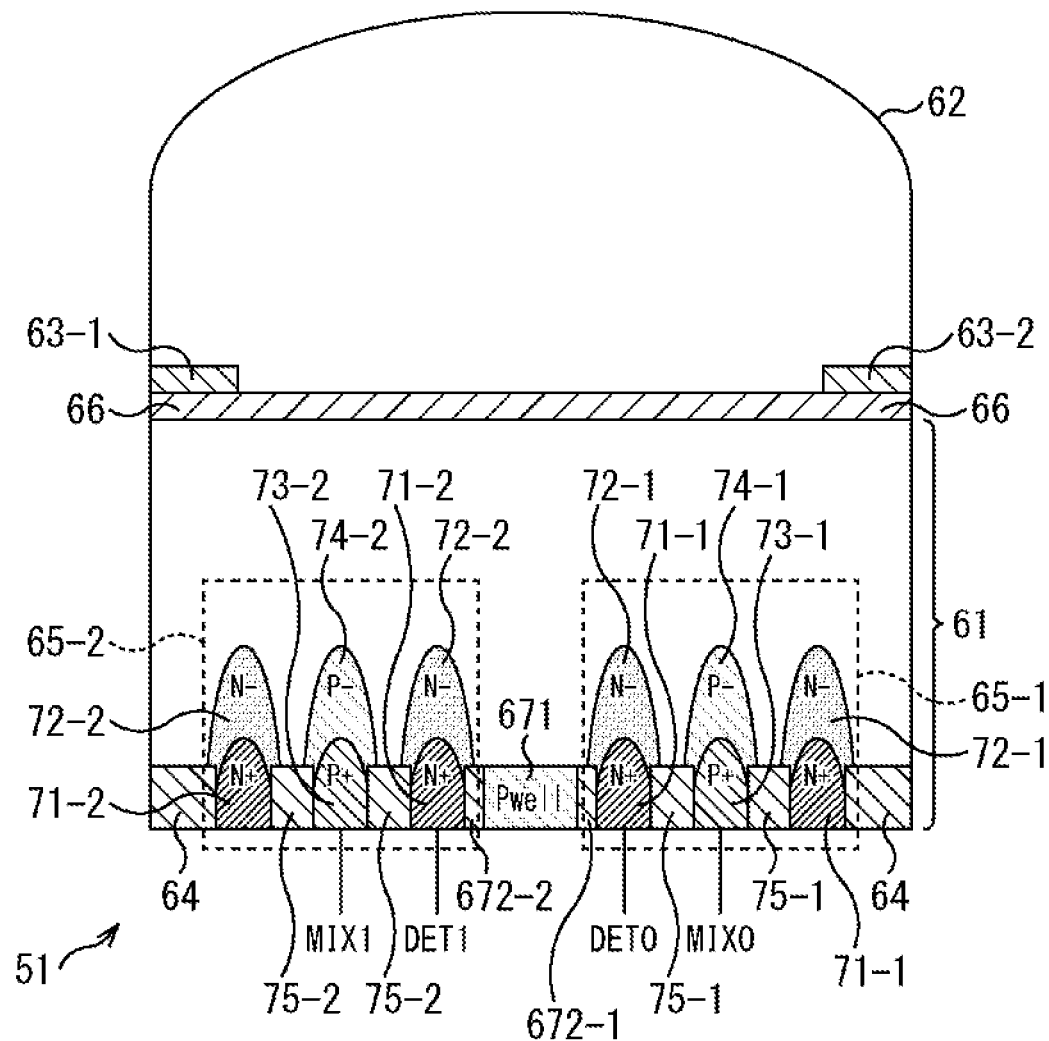
FIG. 29 is a view illustrating still another configuration example of the pixel.

In this case, for example, the pixel 51 is configured as illustrated in FIG. 29. It should be noted that in FIG. 29, the same reference numeral will be given to a portion corresponding to the case in FIG. 2, and description thereof will be appropriately omitted.

A configuration of the pixel 51 illustrated in FIG. 29 is different from that of the pixel 51 illustrated in FIG. 2 in that a P-well region 671, an isolation portion 672-1, and an isolation portion 672-2 are provided instead of the oxide film 64, and the other configurations are the same as those of the pixel 51 in FIG. 2.

In an example illustrated in FIG. 29, the P-well region 671 constituted by a P-type semiconductor region is formed at the central portion on a surface side opposite to the light incident surface at the inside of the substrate 61, that is, on an inner side of a lower surface in the drawing. In addition, the isolation portion 672-1 that isolates the P-well region 671 and the N+ semiconductor region 71-1 from each other is formed between the regions with an oxide film or the like. Similarly, the isolation portion 672-2 that isolates the P-well region 671 and the N+ semiconductor region 71-2 from each other is also formed between the regions with an oxide film or the like. In the pixel 51 illustrated in FIG. 29, the P− semiconductor region 74 is a wider region in an upward direction in the drawing in comparison to the N− semiconductor region 72.

Seventeenth Embodiment

<Configuration Example of Pixel>

In addition, a P-well region constituted by a P-type semiconductor region may also be provided in addition to the oxide film 64 in the substrate 61 of the pixel 51.

Figure 30:
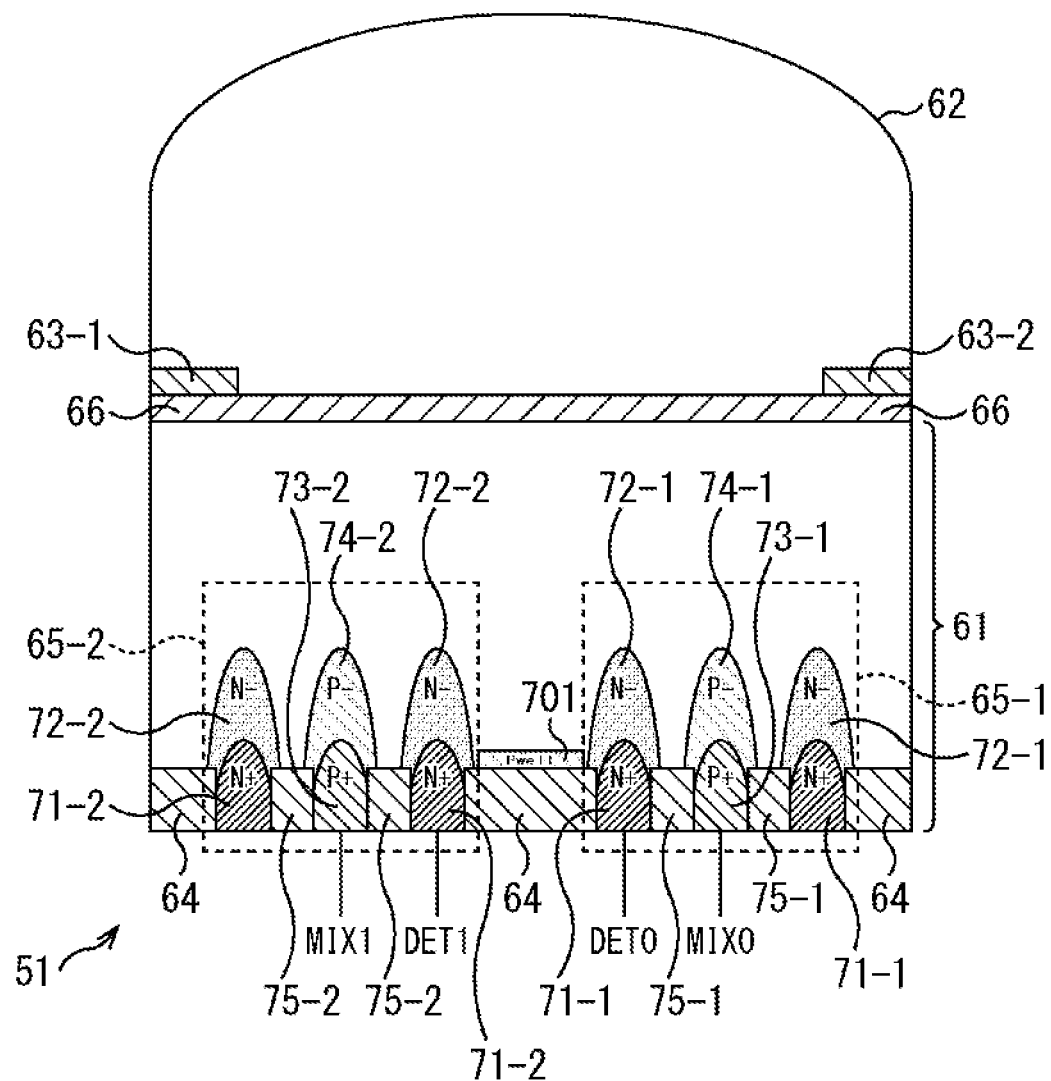
FIG. 30 is a view illustrating still another configuration example of the pixel.

In this case, for example, the pixel 51 is configured as illustrated in FIG. 30. It should be noted that in FIG. 30, the same reference numeral will be given to a portion corresponding to the case in FIG. 2, and description thereof will be appropriately omitted.

A configuration of the pixel 51 illustrated in FIG. 30 is different from that of the pixel 51 illustrated in FIG. 2 in that a P-well region 701 is newly provided, and the other configurations are the same as those of the pixel 51 in FIG. 2. That is, in an example illustrated in FIG. 30, the P-well region 701 constituted by a P-type semiconductor region is formed on an upper side of the oxide film 64 at the inside of the substrate 61.

As described above, according to the present technology, since the CAPD sensor is configured as the back-illuminated type, and thus it is possible to improve characteristics such as pixel sensitivity.

<Configuration Example of Equivalent Circuit of Pixel>

Figure 31:
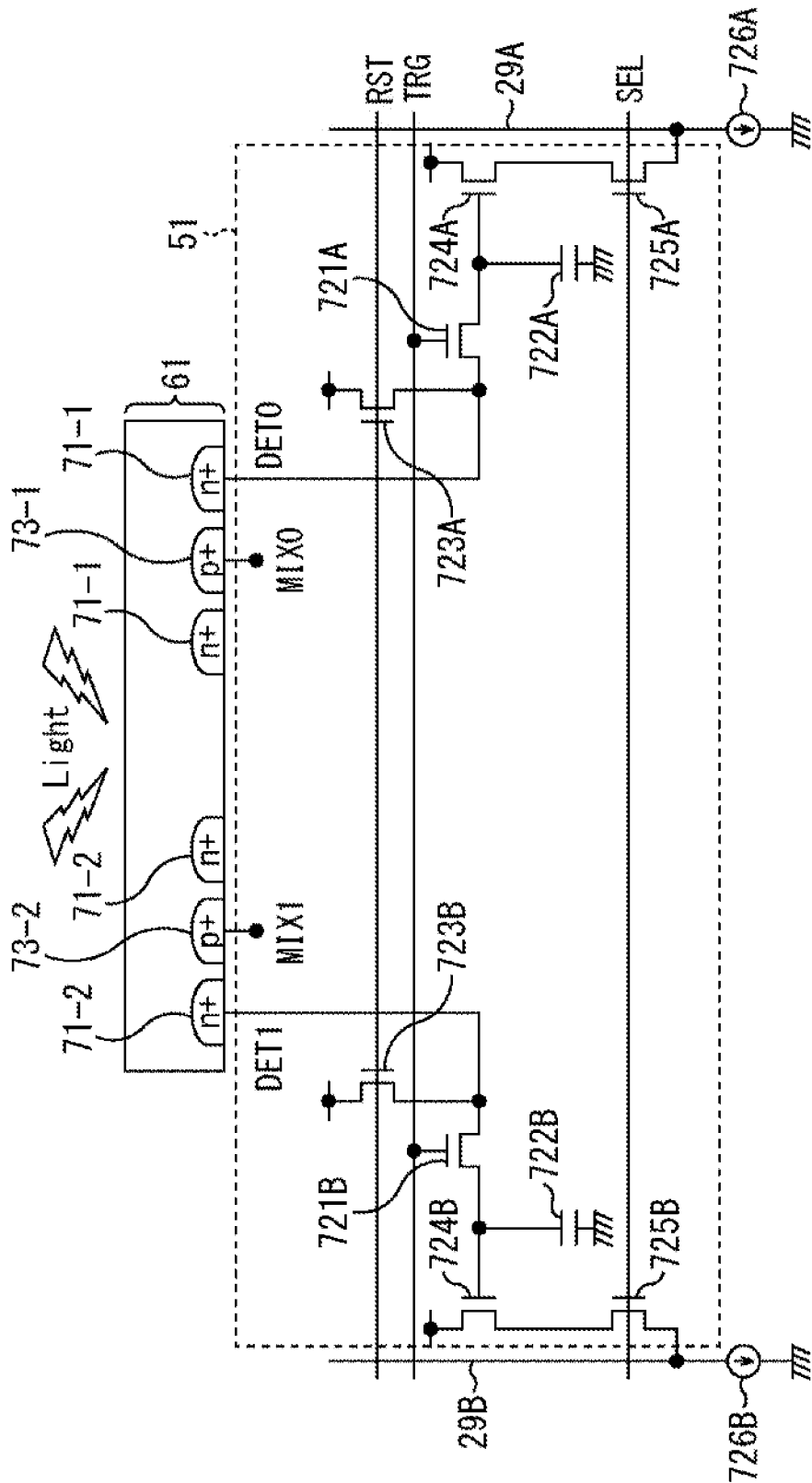
FIG. 31 is a view illustrating an equivalent circuit of the pixel.

FIG. 31 illustrates an equivalent circuit of the pixel 51.

The pixel 51 includes a transfer transistor 721A, an FD 722A, a reset transistor 723A, an amplification transistor 724A, and a selection transistor 725A with respect to the signal extraction unit 65-1 including the N+ semiconductor region 71-1, the P+ semiconductor region 73-1, and the like.

In addition, the pixel 51 includes a transfer transistor 721B, an FD 722B, a reset transistor 723B, an amplification transistor 724B, and a selection transistor 725B with respect to the signal extraction unit 65-2 including the N+ semiconductor region 71-2, the P+ semiconductor region 73-2, and the like.

The tap drive unit 21 applies a predetermined voltage MIX0 (first voltage) to the P+ semiconductor region 73-1, and applies a predetermined voltage MIX1 (second voltage) to the P+ semiconductor region 73-2. In the above-described example, one voltage of the voltage MIX0 and the voltage MIX1 is 1.5 V, and the other voltage is 0 V. The P+ semiconductor regions 73-1 and 73-2 are voltage application units to which the first voltage or the second voltage is applied.

The N+ semiconductor regions 71-1 and 71-2 are charge detection units which detect charges generated through photoelectric conversion of light incident to the substrate 61 and accumulate the charges.

When a drive signal TRG that is supplied to a gate electrode enters an active state, the transfer transistor 721A enters a conduction state in response to the active state, and transfers charges accumulated in the N+ semiconductor region 71-1 to the FD 722A. When the drive signal TRG that is applied to a gate electrode enters an active state, the transfer transistor 721B enters a conduction state in response to the active state, and transfers charges accumulated in the N+ semiconductor region 71-2 to the FD 722B.

The FD 722A temporarily retains a charge DET0 that is supplied from the N+ semiconductor region 71-1. The FD 722B temporarily retains a charge DET1 that is supplied from the N+ semiconductor region 71-2. The FD 722A corresponds to the FD portion A described with reference to FIG. 2, and the FD 722B corresponds to the FD portion B described with reference to FIG. 2.

When a drive signal RST that is supplied to a gate electrode enters an active state, the reset transistor 723A enters a conduction state in response to the active state, and resets a potential of the FD 722A to a predetermined level (power supply voltage VDD). When the drive signal RST that is supplied to a gate electrode enters an active state, the reset transistor 723B enters a conduction state in response to the active state, and resets a potential of the FD 722B to a predetermined level (power supply voltage VDD). It should be noted that when the reset transistors 723A and 723B enter the active state, the transfer transistors 721A and 721B simultaneously enter the active state.

In the amplification transistor 724A, a source electrode is connected to a vertical signal line 29A through the selection transistor 725A, and the amplification transistor 724A constitutes a source follower circuit in combination with a load MOS of a constant current source circuit unit 726A that is connected to one end of the vertical signal line 29A. In the amplification transistor 724B, a source electrode is connected to a vertical signal line 29B through the selection transistor 725B, and the amplification transistor 724B constitutes a source follower circuit in combination with a load MOS of a constant current source circuit unit 726B that is connected to one end of the vertical signal line 29B.

The selection transistor 725A is connected to between the source electrode of the amplification transistor 724A and the vertical signal line 29A. When a selection signal SEL that is applied to a gate electrode enters an active state, the selection transistor 725A enters a conduction state in response to the active state, and outputs pixel signals output from the amplification transistor 724A to the vertical signal line 29A.

The selection transistor 725B is connected to between the source electrode of the amplification transistor 724B and a vertical signal line 29B. When the selection signal SEL that is supplied to a gate electrode enters an active state, the selection transistor 725B enters a conduction state in response to the active state, and outputs pixel signals output from the amplification transistor 724B to the vertical signal line 29B.

The transfer transistors 721A and 721B, the reset transistors 723A and 723B, the amplification transistors 724A and 724B, and the selection transistors 725A and 725B of the pixel 51 are controlled, for example, by the vertical drive unit 22.

<Configuration Example of Another Equivalent Circuit of Pixel>

Figure 32:
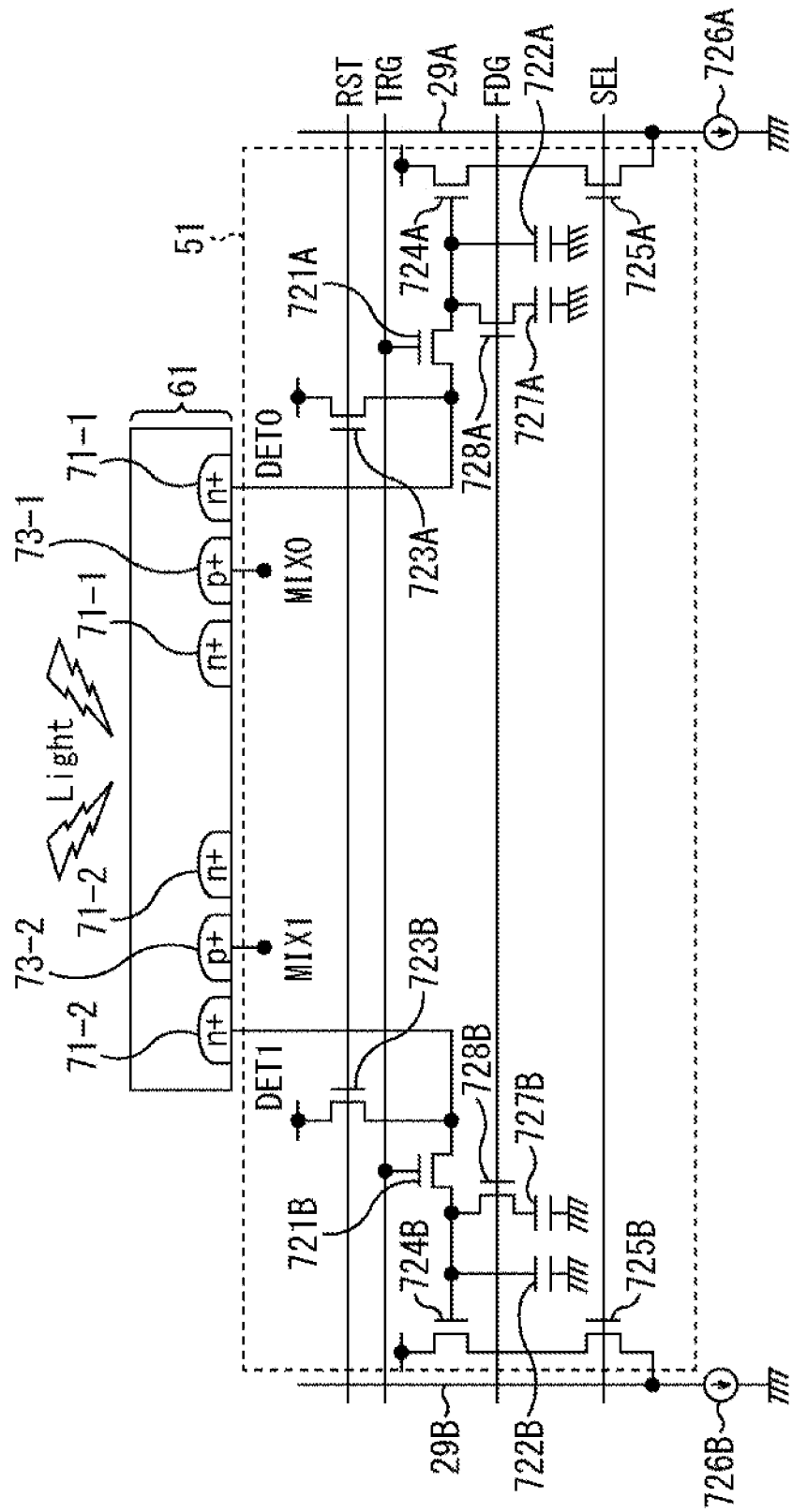
FIG. 32 is a view illustrating another equivalent circuit of the pixel.

FIG. 32 illustrates other equivalent circuit of the pixel 51.

In FIG. 32, the same reference numeral will be given to a portion corresponding to FIG. 31, and description thereof will be appropriately omitted.

In the equivalent circuit in FIG. 32, an additional capacitor 727 and a switching transistor 728 that controls connection of the additional capacitor 727 are added to both of the signal extraction units 65-1 and 65-2 in comparison to the equivalent circuit in FIG. 31.

Specifically, the additional capacitor 727A is connected to between the transfer transistor 721A and the FD 722A through a switching transistor 728A, and an additional capacitor 727B is connected to between the transfer transistor 721B and the FD 722B through a switching transistor 728B.

When a drive signal FDG that is supplied to a gate electrode enters an active state, the switching transistor 728A enters a conduction state in response to the active state, and connects the additional capacitor 727A to the FD 722A. When the drive signal FDG that is supplied to a gate electrode enters an active state, the switching transistor 728B enters a conduction state in response to the active state, and connects the additional capacitor 727B to the FD 722B.

For example, in a high-illuminance state in which a light amount of incident light is great, the vertical drive unit 22 sets the switching transistors 728A and 728B to the active state to connect the FD 722A and the additional capacitor 727A to each other, and to connect the FD 722B and the additional capacitor 727B to each other. Accordingly, it is possible to accumulate relatively many charges in the high-illumination state.

On the other hand, in a low-illumination state in which the light amount of incident light is small, the vertical drive unit 22 sets the switching transistors 728A and 728B to an inactive state to separate the additional capacitors 727A and 727B from the FD 722A and FD 722B, respectively.

As in the equivalent circuit in FIG. 31, the additional capacitor 727 may be omitted, but when the additional capacitor 727 is provided and is selectively and appropriately used in correspondence with an incident light amount, it is possible to secure a high dynamic range.

<Arrangement Example of Voltage Supply Line>

Next, description will be given of an arrangement of voltage supply lines for applying the predetermined voltage MIX0 or MIX1 to the P+ semiconductor regions 73-1 and 73-2 which are voltage application units of the signal extraction unit 65 of the pixel 51 with reference to FIG. 33A to FIG. 35B. Voltage supply lines 741 illustrated in FIGS. 33A and 33B, and FIGS. 34A and 34B correspond to the voltage supply lines 30 illustrated in FIG. 1.

It should be noted that with regard to FIGS. 33A and 33B and FIGS. 34A and 34B, description will be given by employing a circular configuration illustrated in FIG. 9 as a configuration of the signal extraction unit 65 of the pixel 51, but it is needless to say that other configurations can be employed.

Figure 33A:
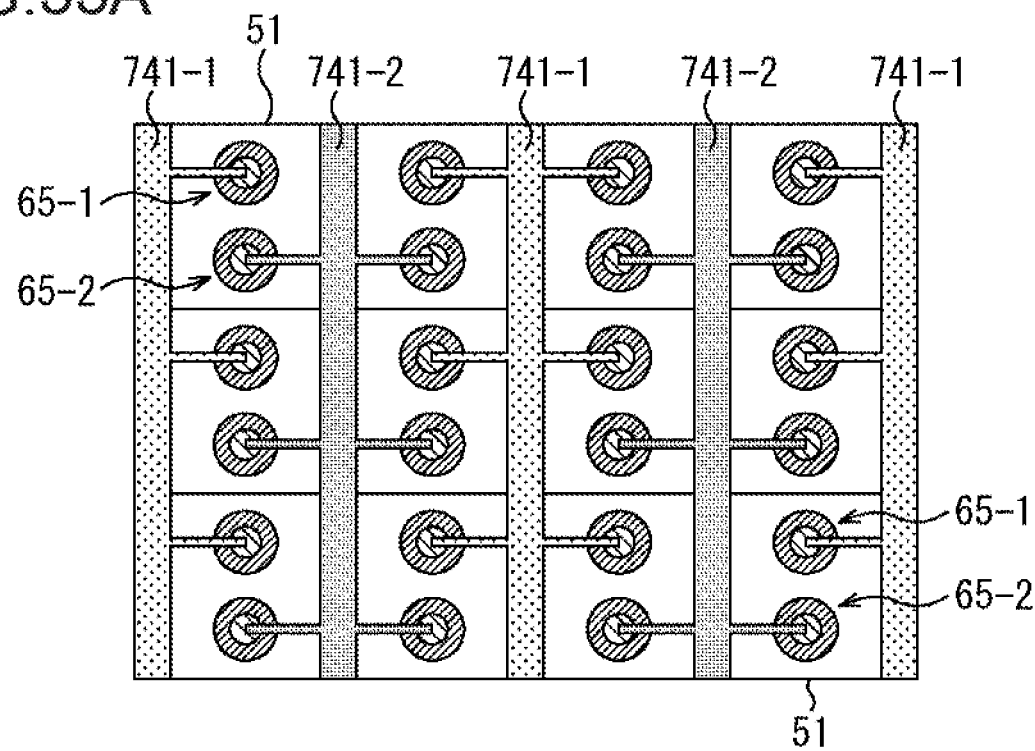
FIGS. 33A and 33B are views illustrating an arrangement example of voltage supply lines employing a periodic arrangement.

FIG. 33A is a plan view illustrating a first arrangement example of the voltage supply lines.

In the first arrangement example, with respect to multiple pixels 51 which are two-dimensionally arranged in a matrix shape, a voltage supply line 741-1 or 741-2 is wired between two pixels adjacent to each other in a horizontal direction (at a boundary thereof) along a vertical direction.

The voltage supply line 741-1 is connected to the P+ semiconductor region 73-1 of the signal extraction unit 65-1 on one side between two pieces of the signal extraction units 65 in each of the pixels 51. The voltage supply line 741-2 is connected to the P+ semiconductor region 73-2 of the signal extraction unit 65-2 on the other side between two pieces of the signal extraction units 65 in the pixel 51.

In the first arrangement example, two pieces of the voltage supply lines 741-1 and 741-2 are disposed with respect to two pixel columns, and thus the number of voltage supply lines 741 which are arranged in the pixel array unit 20 becomes substantially the same as the number of columns of the pixels 51.

Figure 33B:
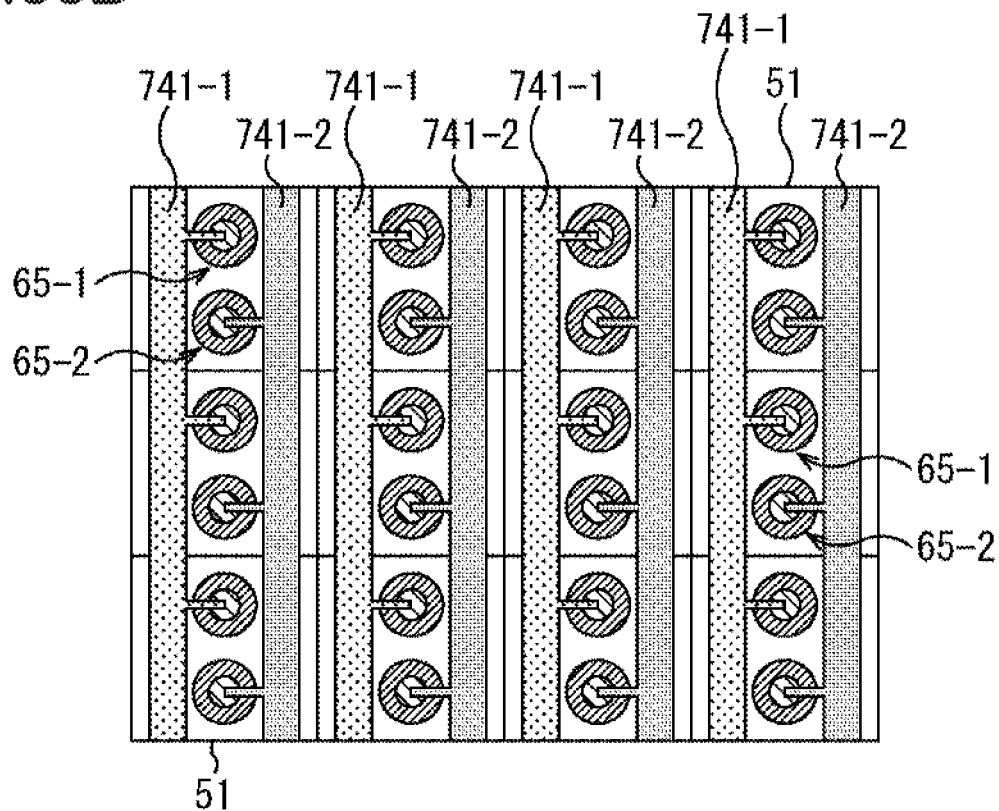

FIG. 33B is a plan view illustrating a second arrangement example of the voltage supply lines.

In the second arrangement example, with respect to one pixel column of the multiple pixels 51 which are two-dimensionally arranged in a matrix shape, two pieces of the voltage supply lines 741-1 and 741-2 are wired along the vertical direction.

The voltage supply line 741-1 is connected to the P+ semiconductor region 73-1 of the signal extraction unit 65-1 on one side between two pieces of the signal extraction units 65 in each of the pixels 51. The voltage supply line 741-2 is connected to the P+ semiconductor region 73-2 of the signal extraction unit 65-2 on the other side between two pieces of the signal extraction units 65 in the pixel 51.

In the second arrangement example, two pieces of the voltage supply lines 741-1 and 741-2 are wired with respect to one pixel column, and thus four pieces of the voltage supply lines 741 are disposed with respect to two pixel columns. Accordingly, the number of the voltage supply lines 741 which are arranged becomes approximately two times the number of columns of the pixels 51.

Any one of the arrangement examples in FIG. 33A and FIG. 33B is a periodic arrangement. In the periodic arrangement, the configuration, in which the voltage supply line 741-1 is connected to the P+ semiconductor region 73-1 of the signal extraction unit 65-1, and the voltage supply line 741-2 is connected to the P+ semiconductor region 73-2, is periodically repeated with respect to pixels arranged in a vertical direction.

In the first arrangement example illustrated in FIG. 33A, it is possible to reduce the number of the voltage supply lines 741-1 and 741-2 which are wired with respect to the pixel array unit 20.

In the second arrangement example illustrated in FIG. 33B, the number of wired pieces further increases in comparison to the first arrangement example, but the number of the signal extraction units 65 which are connected to one piece of the voltage supply line 741 becomes the half, and thus it is possible to reduce a load of an interconnection, and thus the second arrangement example is effective for high-speed drive or a case where a total number of pixels in the pixel array unit 20 is great.

Figure 34A:
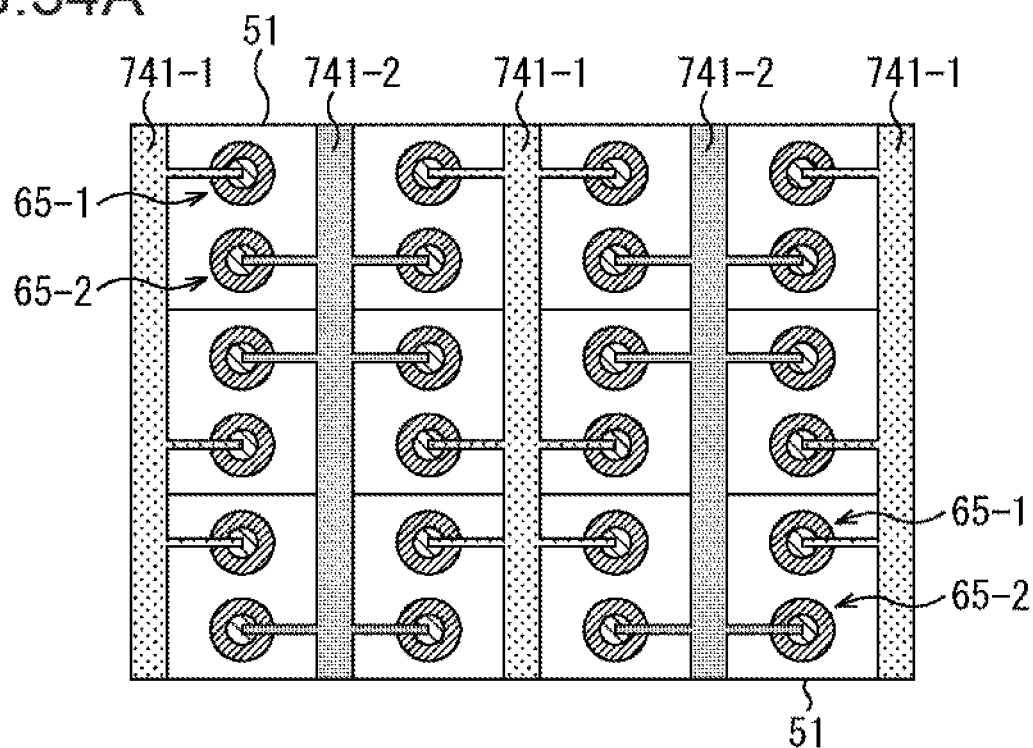
FIGS. 34A and 34B are views illustrating an arrangement example of voltage supply lines employing a mirror arrangement.

FIG. 34A is a plan view illustrating a third arrangement example of the voltage supply lines.

The third arrangement example is an example in which two pieces of the voltage supply lines 741-1 and 741-2 are disposed with respect to two pixel columns as in the first arrangement example in FIG. 33A.

The third arrangement example is different from the first arrangement example in FIG. 33A in that connection destinations of the signal extraction units 65-1 and 65-2 are different from each other between two pixels which are arranged in a vertical direction.

Specifically, for example, in the pixel 51, the voltage supply line 741-1 is connected to the P+ semiconductor region 73-1 of the signal extraction unit 65-1, and the voltage supply line 741-2 is connected to the P+ semiconductor region 73-2 of the signal extraction unit 65-2, but in a pixel 51 on a lower side or on an upper side of the pixel 51, the voltage supply line 741-1 is connected to the P+ semiconductor region 73-2 of the signal extraction unit 65-2, and the voltage supply line 741-2 is connected to the P+ semiconductor region 73-1 of the signal extraction unit 65-1.

Figure 34B:
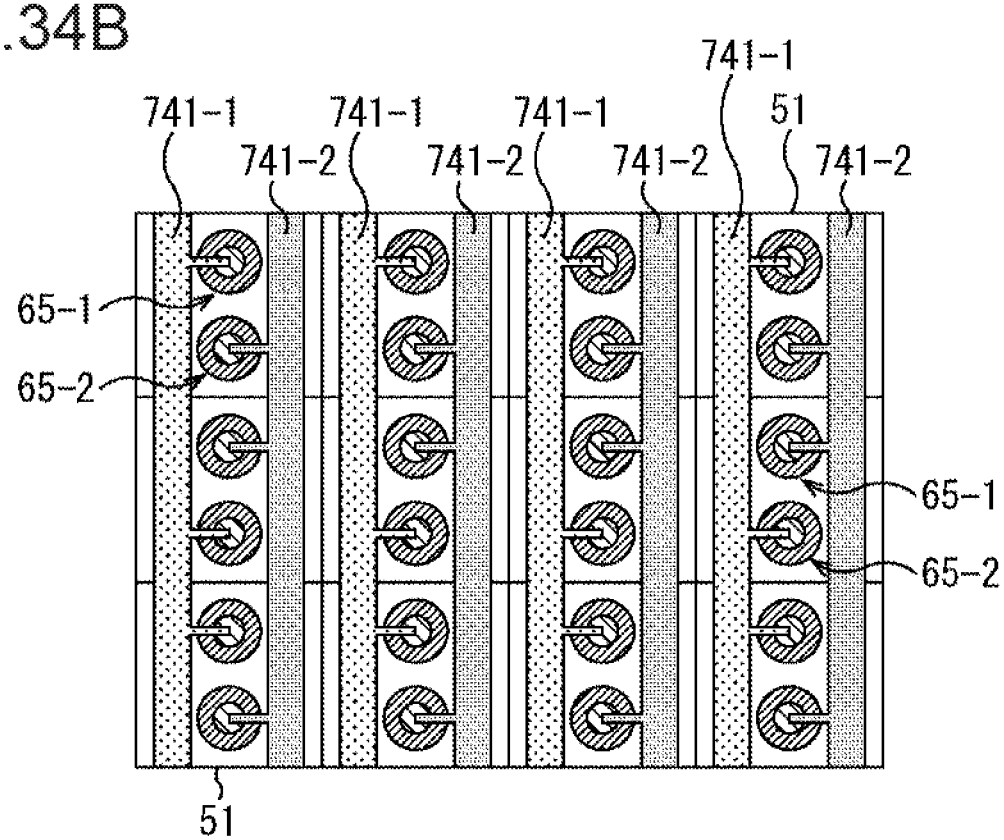

FIG. 34B is a plan view illustrating a fourth arrangement example of the voltage supply lines.

The fourth arrangement example is an example in which two pieces of the voltage supply lines 741-1 and 741-2 are disposed with respect to two pixel columns as in the second arrangement example in FIG. 33B.

The fourth arrangement example is different from the second arrangement example in FIG. 33B in that connection destinations of the signal extraction units 65-1 and 65-2 are different from each other between two pixels which are arranged in a vertical direction.

Specifically, for example, in the pixel 51, the voltage supply line 741-1 is connected to the P+ semiconductor region 73-1 of the signal extraction unit 65-1, and the voltage supply line 741-2 is connected to the P+ semiconductor region 73-2 of the signal extraction unit 65-2, but in a pixel 51 on a lower side or on an upper side of the pixel 51, the voltage supply line 741-1 is connected to the P+ semiconductor region 73-2 of the signal extraction unit 65-2, and the voltage supply line 741-2 is connected to the P+ semiconductor region 73-1 of the signal extraction unit 65-1.

In the third arrangement example illustrated in FIG. 34A, it is possible to reduce the number of the voltage supply lines 741-1 and 741-2 which are wired with respect to the pixel array unit 20.

In the fourth arrangement example illustrated in FIG. 34B, the number of wired pieces further increases in comparison to the third arrangement example, but the number of the signal extraction units 65 which are connected to one piece of the voltage supply line 741 becomes the half, and thus it is possible to reduce a load of an interconnection, and thus the fourth arrangement example is effective for high-speed drive or a case where a total number of pixels in the pixel array unit 20 is great.

Any of the arrangement examples in FIGS. 34A and 34B is a mirror arrangement in which connection destinations with respect to two pixels adjacent to each other in an upper and lower direction (vertical direction) are mirror-inverted.

Figure 35A:
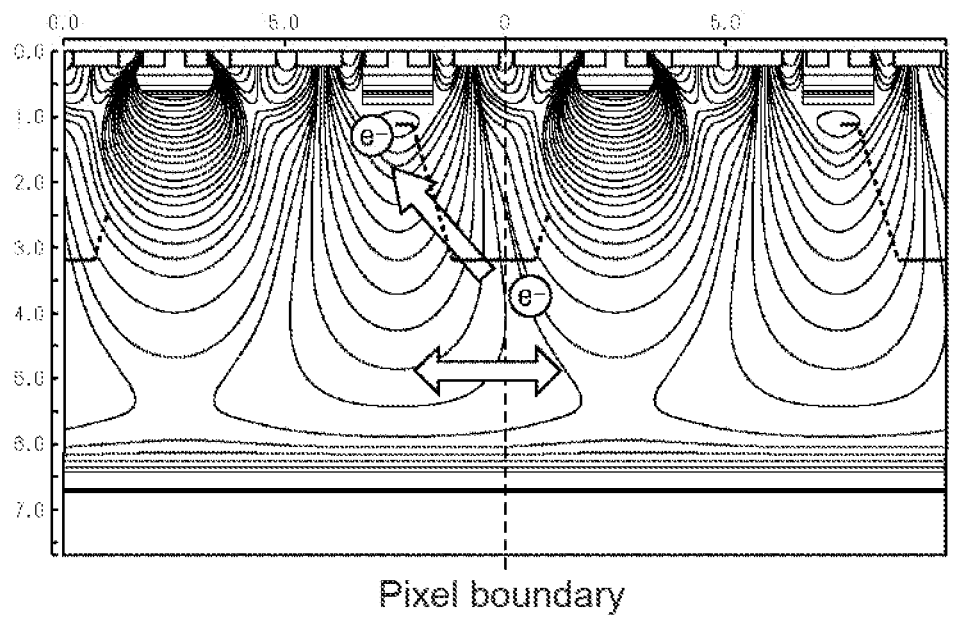
FIGS. 35A and 35B are views describing characteristics of the periodic arrangement and the mirror arrangement.

As illustrated in FIG. 35A, in the periodic arrangement, voltages which are applied to two pieces of the signal extraction units 65 adjacent to each other with a pixel boundary interposed therebetween become different from each other, and thus charge exchange occurs between the adjacent pixels. Accordingly, charge transfer efficiency is superior to the mirror arrangement, but cross-talk characteristics of adjacent pixels are inferior to the mirror arrangement.

Figure 35B:
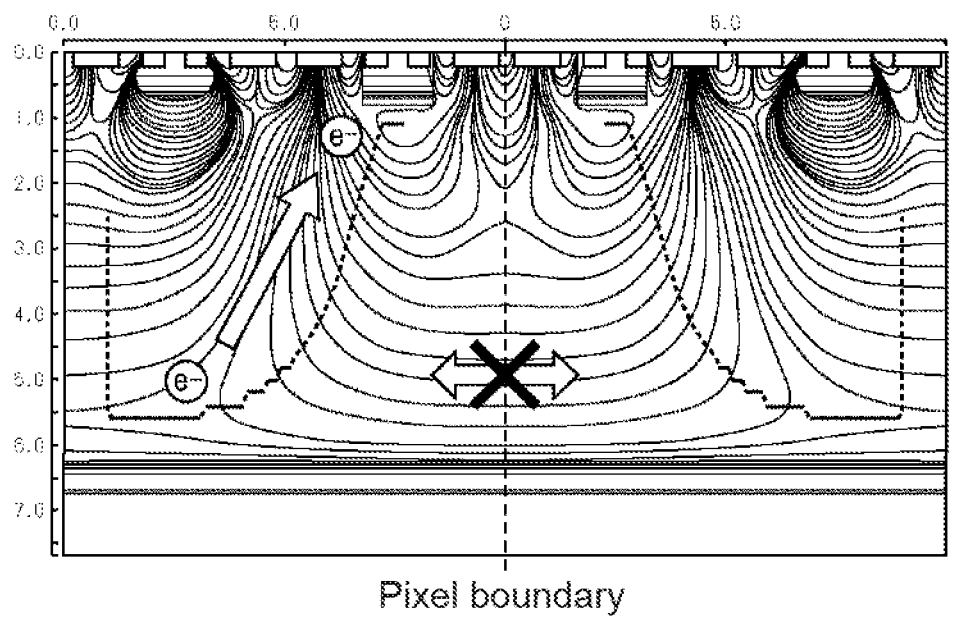

On the other hand, as illustrated in FIG. 35B, in the mirror arrangement, voltages which are applied to two pieces of the signal extraction units 65 adjacent to each other with a pixel boundary interposed therebetween are the same as each other, and thus charge exchange between the adjacent pixels is suppressed. Accordingly, the charge transfer efficiency is inferior to the periodic arrangement, but the cross-talk characteristics of the adjacent pixels are superior to the periodic arrangement.

<Cross-Sectional Configuration of Multiple Pixels in Fourteenth Embodiment>

In a cross-sectional configuration of pixels as illustrated in FIG. 2 or the like, illustration of the multilayer interconnection layer formed on the front surface side opposite to the light incident surface of the substrate 61 is omitted.

Hereinafter, with regard to several embodiments described above, a cross-sectional view of multiple pixels adjacent to each other is illustrated in a state in which the multilayer interconnection layer is not omitted.

Figure 36:
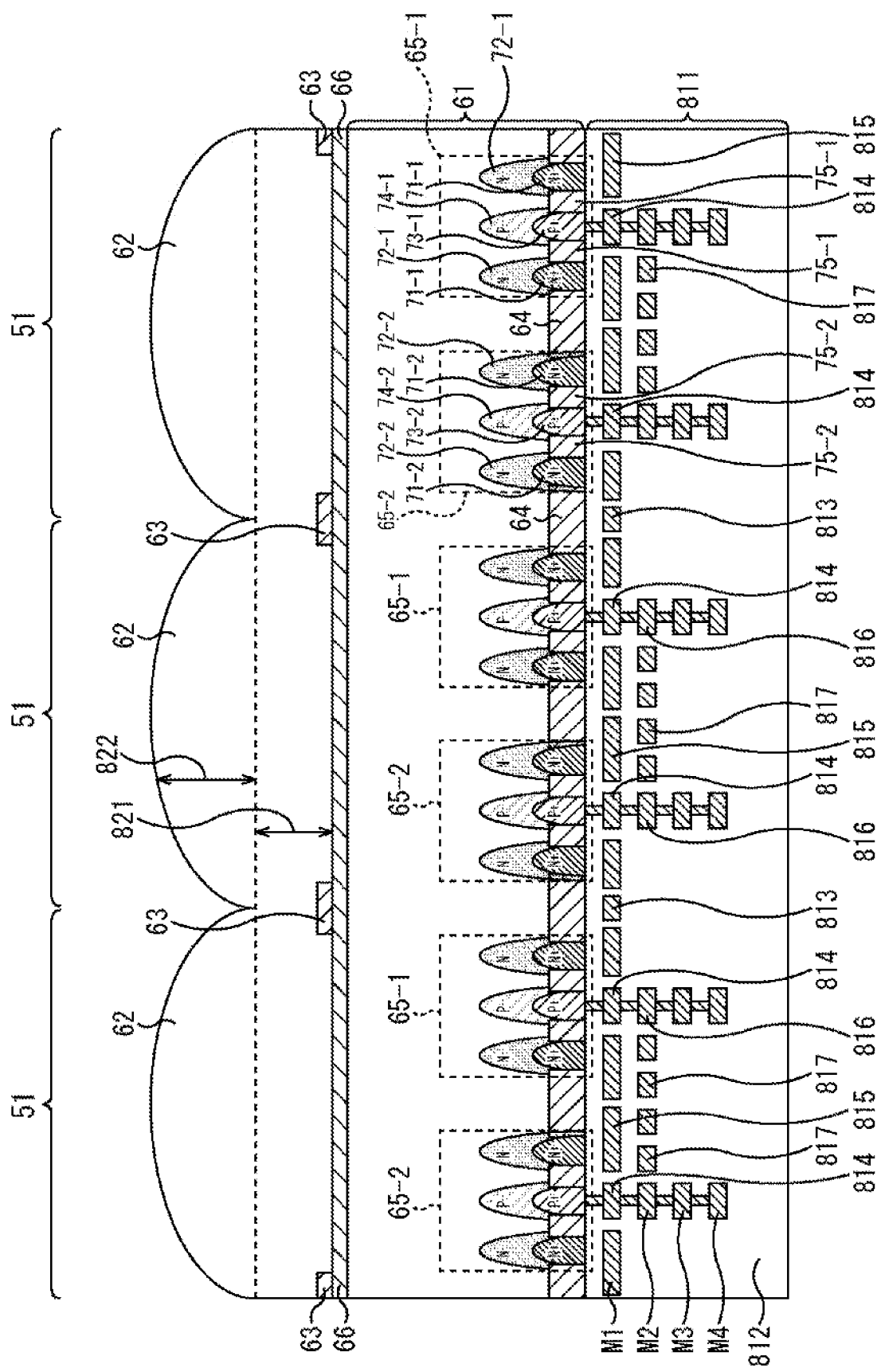
FIG. 36 is a cross-sectional view of multiple pixels in a fourteenth embodiment.
Figure 37:
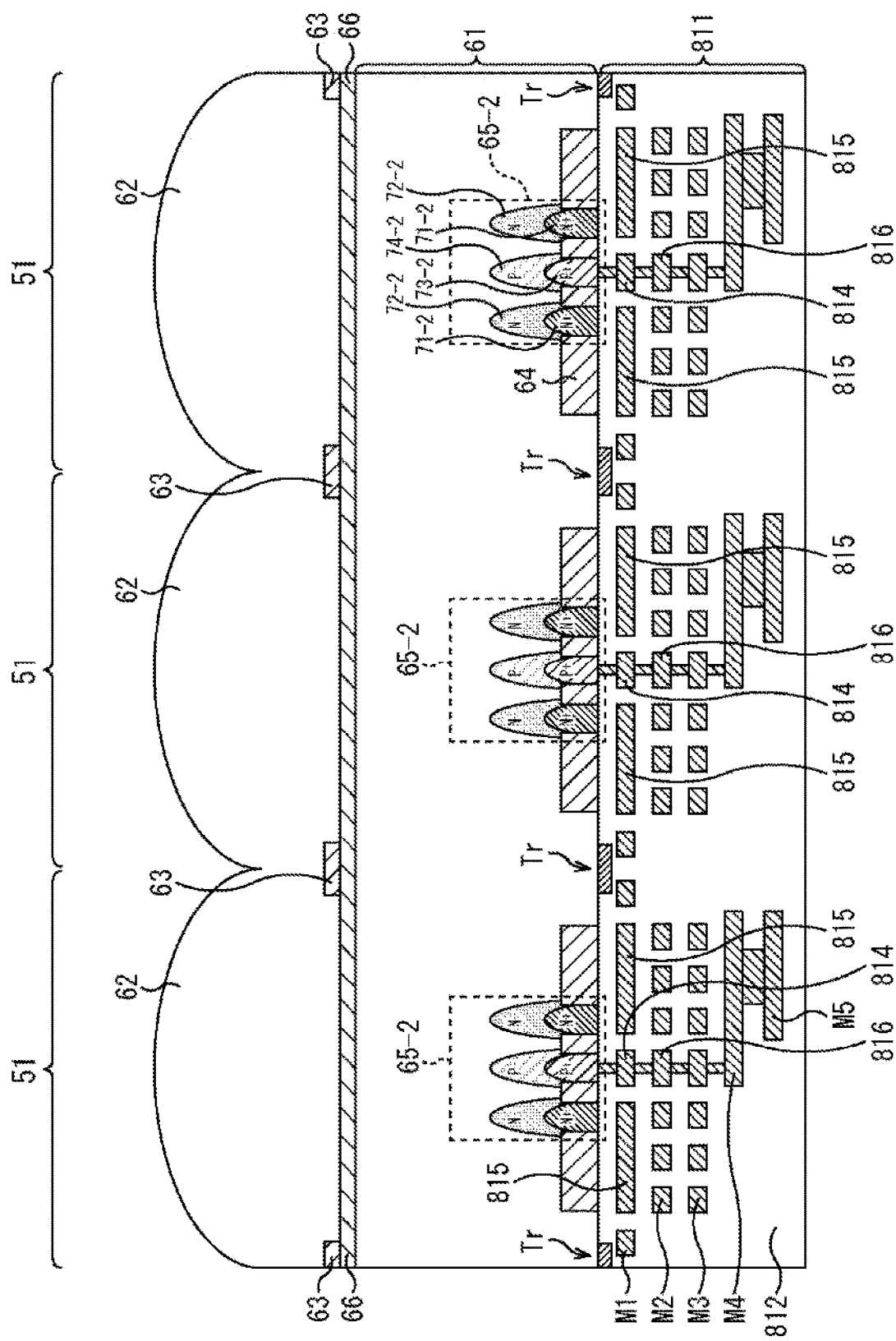
FIG. 37 is a cross-sectional view of the multiple pixels in the fourteenth embodiment.

First, a cross-sectional view of multiple pixels in the fourteenth embodiment illustrated in FIG. 28 is illustrated in FIG. 36 and FIG. 37.

The fourteenth embodiment illustrated in FIG. 28 relates to a configuration of pixels including the large-area reflection member 631 on a side opposite to the light incident surface of the substrate 61.

FIG. 36 corresponds to a cross-sectional view taken along line B-B' in FIG. 11, and FIG. 37 corresponds to a cross-sectional view taken along line A-A'. In addition, a cross-sectional view taken along line C-C' in FIG. 17 can be shown like FIG. 36.

As illustrated in FIG. 36, in the pixel 51, the oxide film 64 is formed at the central portion, and the signal extraction unit 65-1 and the signal extraction unit 65-2 are respectively formed on both sides of the oxide film 64.

In the signal extraction unit 65-1, in a state in which the P+ semiconductor region 73-1 and the P− semiconductor region 74-1 are set as the center, the N+ semiconductor region 71-1 and the N− semiconductor region 72-1 are formed to surround the periphery of the P+ semiconductor region 73-1 and the P− semiconductor region 74-1. The P+ semiconductor region 73-1 and the N+ semiconductor region 71-1 are in contact with a multilayer interconnection layer 811. The P− semiconductor region 74-1 is disposed on an upward side (on the on-chip lens 62 side) of the P+ semiconductor region 73-1 to cover the P+ semiconductor region 73-1, and the N− semiconductor region 72-1 is disposed on an upward side (on the on-chip lens 62 side) of the N+ semiconductor region 71-1 to cover the N+ semiconductor region 71-1. In other words, the P+ semiconductor region 73-1 and the N+ semiconductor region 71-1 are disposed on the multilayer interconnection layer 811 side at the inside of the substrate 61, and the N− semiconductor region 72-1 and the P− semiconductor region 74-1 are disposed on the on-chip lens 62 side at the inside of the substrate 61. In addition, the isolation portion 75-1 that isolates the N+ semiconductor region 71-1 and the P+ semiconductor region 73-1 from each other is formed between the regions with an oxide film or the like.

In the signal extraction unit 65-2, in a state in which the P+ semiconductor region 73-2 and the P− semiconductor region 74-2 are set as the center, the N+ semiconductor region 71-2 and the N− semiconductor region 72-2 are formed to surround the periphery of the P+ semiconductor region 73-2 and the P− semiconductor region 74-2. The P+ semiconductor region 73-2 and the N+ semiconductor region 71-2 are in contact with the multilayer interconnection layer 811. The P− semiconductor region 74-2 is disposed on an upward side (on the on-chip lens 62 side) of the P+ semiconductor region 73-2 to cover the P+ semiconductor region 73-2, and the N− semiconductor region 72-2 is disposed on an upward side (on the on-chip lens 62 side) of the N+ semiconductor region 71-2 to cover the N+ semiconductor region 71-2. In other words, the P+ semiconductor region 73-2 and the N+ semiconductor region 71-2 are disposed on the multilayer interconnection layer 811 side at the inside of the substrate 61, and the N− semiconductor region 72-2 and the P− semiconductor region 74-2 are disposed on the on-chip lens 62 side at the inside of the substrate 61. In addition, the isolation portion 75-2 that isolates the N+ semiconductor region 71-2 and the P+ semiconductor region 73-2 from each other is also formed between the regions with an oxide film or the like.

The oxide film 64 is also formed in a boundary region between adjacent pixels 51, that is, between the N+ semiconductor region 71-1 of the signal extraction unit 65-1 of a predetermined pixel 51 and the N+ semiconductor region 71-2 of the signal extraction unit 65-2 of a pixel 51 adjacent to the predetermined pixel 51.

The fixed charge film 66 is formed at an interface on the light incident surface side of the substrate 61 (upper surface in FIG. 36 and FIG. 37).

As illustrated in FIG. 36, when dividing the on-chip lens 62 formed for every pixel on the light incident surface side of the substrate 61 into a rising portion 821 of which the thickness is evenly raised over the entire surface of a region inside a pixel, and a curved surface portion 822 of which the thickness is different depending on a position inside the pixel in a height direction, the thickness of the rising portion 821 is set to be smaller than the thickness of the curved surface portion 822. The larger the thickness of the rising portion 821 is, the more oblique incident light is likely to be reflected by the interpixel light-shielding film 63. Accordingly, when the thickness of the rising portion 821 is set to be smaller, it is possible to receive the oblique incident light into the substrate 61. In addition, the larger the thickness of the curved surface portion 822 is, the further incident light is condensed to the center of a pixel.

The multilayer interconnection layer 811 is formed on a side opposite to the light incident surface side of the substrate 61 in which the on-chip lens 62 is formed for every pixel. In other words, the substrate 61 that is a semiconductor layer is disposed between the on-chip lens 62 and the multilayer interconnection layer 811. The multilayer interconnection layer 811 includes five layers of metal films M1 to M5, and an interlayer insulating film 812 disposed between the metal films. It should be noted that in FIG. 36, among the five layers of metal films M1 to M5 of the multilayer interconnection layer 811, the metal film M5 on the outermost side exists at a location at which the metal film M5 is not viewed, and thus the metal film M5 is not illustrated in the cross-sectional view of FIG. 36. However, the metal film M5 is illustrated in a cross-sectional view of FIG. 37 that is a cross-sectional view seen from a direction different from a direction in FIG. 36.

As illustrated in FIG. 37, a pixel transistor Tr is formed in a pixel boundary region of an interface portion between the multilayer interconnection layer 811 and the substrate 61. The pixel transistor Tr is any one of the transfer transistor 721, the reset transistor 723, the amplification transistor 724, and the selection transistor 725 illustrated in FIG. 31 and FIG. 32.

A power supply line 813 that supplies a power supply voltage, a voltage application interconnection 814 that supplies a predetermined voltage to the P+ semiconductor region 73-1 or 73-2, and a reflection member 815 that is a member reflecting incident light are included in the metal film M1 that is closest to the substrate 61 among the five layers of metal films M1 to M5 of the multilayer interconnection layer 811. In the metal film M1 illustrated in FIG. 36, an interconnection other than the power supply line 813 and the voltage application interconnection 814 becomes the reflection member 815, but a partial reference numeral is omitted for preventing complication of the drawing. The reflection member 815 is a dummy interconnection that is provided to reflect incident light, and corresponds to the reflection member 631 illustrated in FIG. 28. The reflection member 815 is disposed on a downward side of the N+ semiconductor regions 71-1 and 71-2 to overlap the N+ semiconductor regions 71-1 and 71-2 which are charge detection units in a plan view. It should be noted that in a case where the light-shielding member 631' of the fifteenth embodiment is provided instead of the reflection member 631 of the fourteenth embodiment illustrated in FIG. 28, a portion of the reflection member 815 in FIG. 36 becomes the light-shielding portion 631'.

In addition, in the metal film M1, a charge extraction interconnection (not illustrated in FIG. 36) that connects the N+ semiconductor region 71 and the transfer transistor 721 is formed to transfer charges accumulated in the N+ semiconductor region 71 to the FD 722.

It should be noted that in the example, the reflection member 815 (reflection member 631) and the charge extraction interconnection are set to be disposed in the same layer of the metal film M1, but there is no limitation to the disposition at the same layer.

In the metal film M2 that is a second layer from the substrate 61 side, for example, a voltage application interconnection 816 that is connected to the voltage application interconnection 814 of the metal film M1, a control line 817 that transfers the drive signal TRG, the drive signal RST, the selection signal SEL, the drive signal FDG, and the like, a ground line, and the like are formed. In addition, the FD 722B and the additional capacitor 727A are formed in the metal film M2.

In the metal film M3 that is a third layer from the substrate 61 side, for example, the vertical signal line 29, a VSS interconnection for shielding, and the like are formed.

In the metal film M4 and the metal film M5 which are fourth and fifth layers from the substrate 61 side, for example, the voltage supply lines 741-1 and 741-2 (FIGS. 33A and 33B and FIGS. 34A and 34B) that applies a predetermined voltage MIX0 or MIX1 to the P+ semiconductor regions 73-1 and 73-2 which are voltage application units of the signal extraction unit 65 are formed.

It should be noted that a planar arrangement of the five layers of metal films M1 to M5 of the multilayer interconnection layer 811 will be described later with reference to FIG. 42 and FIG. 43.

<Cross-Sectional Configuration of Multiple Pixels of Ninth Embodiment>

Figure 38:
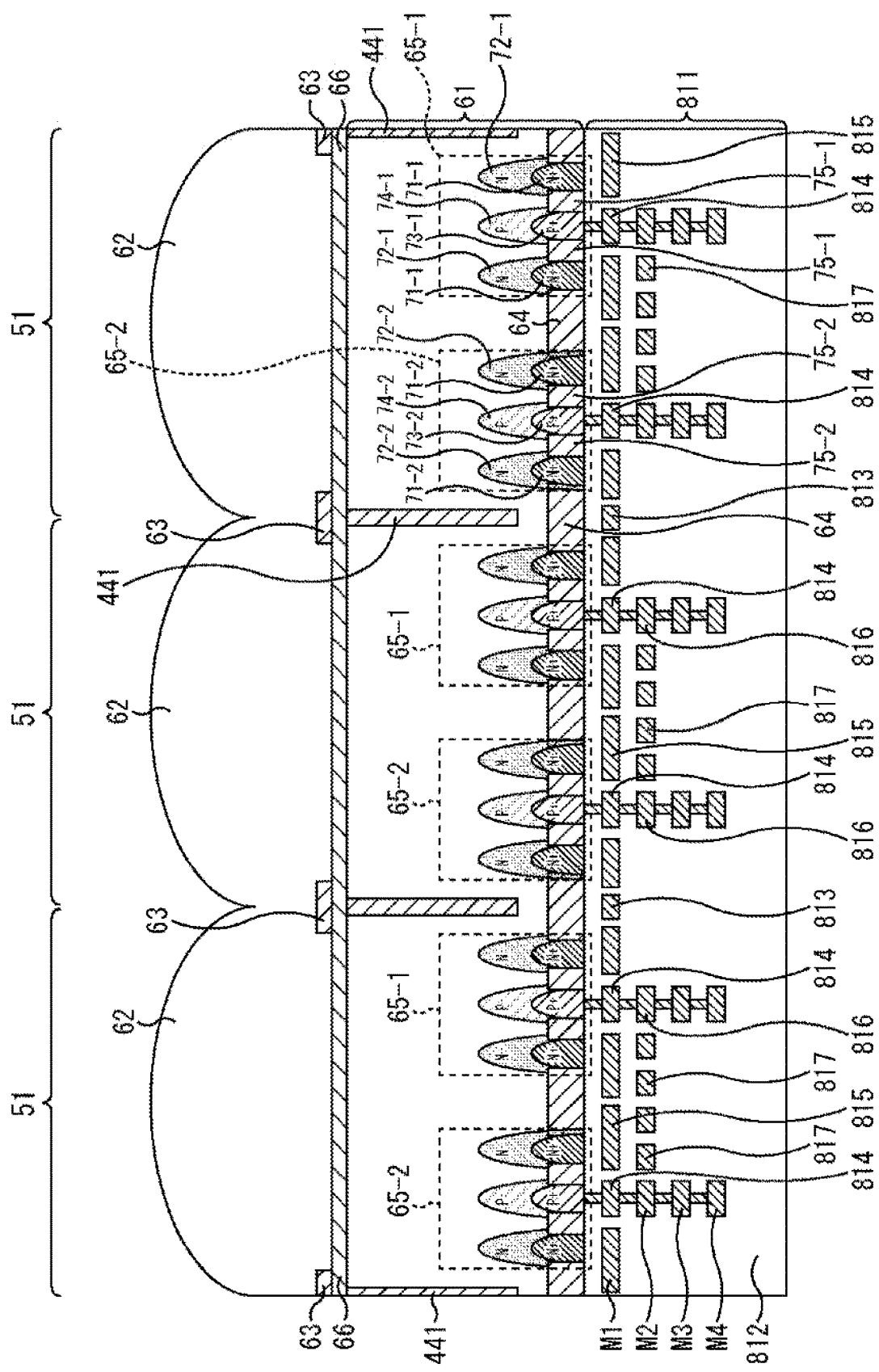
FIG. 38 is a cross-sectional view of multiple pixels in a ninth embodiment.

FIG. 38 is a cross-sectional view illustrating a pixel structure of the ninth embodiment illustrated in FIG. 22 with respect to multiple pixels in an aspect in which the multilayer interconnection layer is not omitted.

The ninth embodiment illustrated in FIG. 22 is a pixel configuration including the isolation region 441 obtained by forming an elongated groove (trench) to a predetermined depth from the rear surface (light incident surface) side of the substrate 61 at a pixel boundary portion inside the substrate 61, and by embedding a light-shielding film in the groove.

The other configurations including the signal extraction units 65-1 and 65-2, the five layers of metal films M1 to M5 of the multilayer interconnection layer 811, and the like are similar to the configurations illustrated in FIG. 36.

<Cross-Sectional Configuration of Multiple Pixels of Modification Example 1 of Ninth Embodiment>

Figure 39:
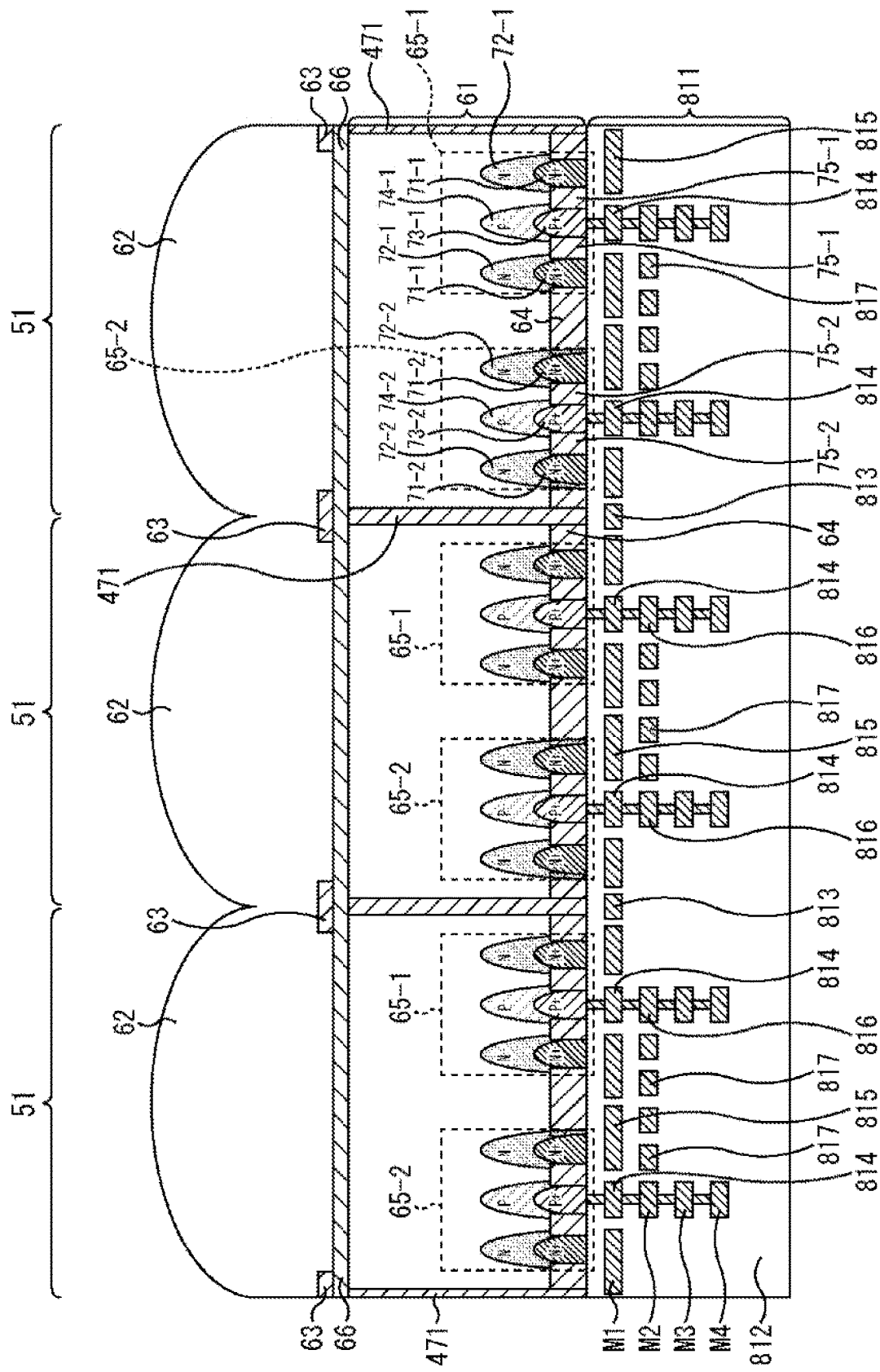
FIG. 39 is a cross-sectional view of multiple pixels in Modification Example 1 of the ninth embodiment.

FIG. 39 is a cross-sectional view illustrating a pixel structure of the Modification Example 1 of the ninth embodiment illustrated in FIG. 23 with respect to multiple pixels in an aspect in which the multilayer interconnection layer is not omitted.

The Modification Example 1 of the ninth embodiment illustrated in FIG. 23 is a pixel configuration including the isolation region 471 that penetrates through the entirety of the substrate 61 at a pixel boundary portion inside the substrate 61.

The other configurations including the signal extraction units 65-1 and 65-2, the five layers of metal films M1 to M5 of the multilayer interconnection layer 811, and the like are similar to the configurations illustrated in FIG. 36.

<Cross-Sectional Configuration of Multiple Pixels of Sixteenth Embodiment>

Figure 40:
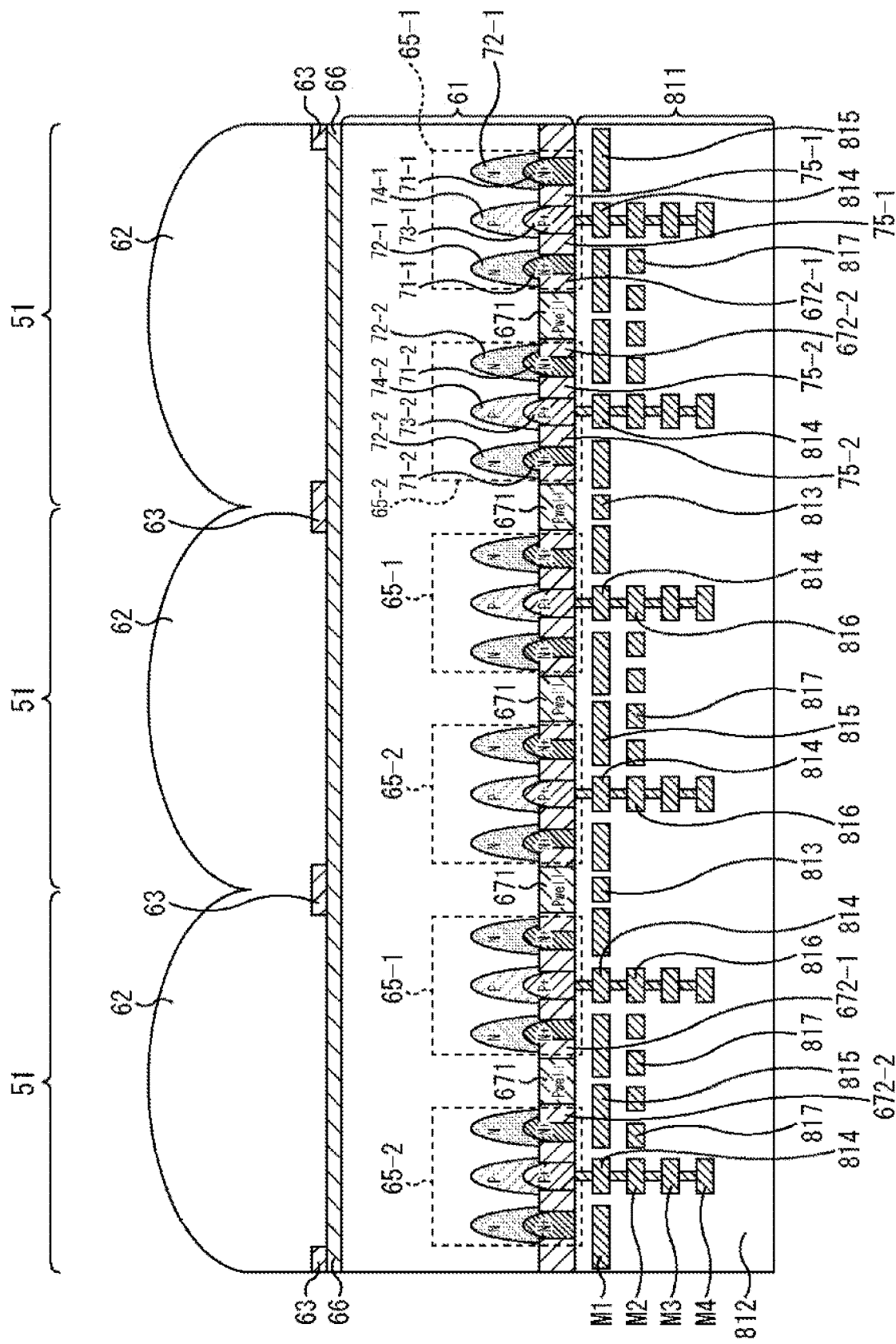
FIG. 40 is a cross-sectional view of multiple pixels in a fifteenth embodiment.

FIG. 40 is a cross-sectional view illustrating a pixel structure of the sixteenth embodiment illustrated in FIG. 29 with respect to multiple pixels in an aspect in which the multilayer interconnection layer is not omitted.

The sixteenth embodiment illustrated in FIG. 29 is a configuration including the P-well region 671 at the central portion on a surface side opposite to the light incident surface at the inside of the substrate 61, that is, on an inner side of the lower surface in the drawing. In addition, the separation portion 672-1 is formed between the P-well region 671 and the N+ semiconductor region 71-1 with an oxide film or the like. Similarly, the separation portion 672-2 is formed between the P-well region 671 and the N+ semiconductor region 71-2 with an oxide film or the like. The P-well region 671 is also formed at a pixel boundary portion a lower surface of the substrate 61.

The other configurations including the signal extraction units 65-1 and 65-2, the five layers of metal films M1 to M5 of the multilayer interconnection layer 811, and the like are similar to the configurations illustrated in FIG. 36.

<Cross-Sectional Configuration of Multiple Pixels of Tenth Embodiment>

Figure 41:
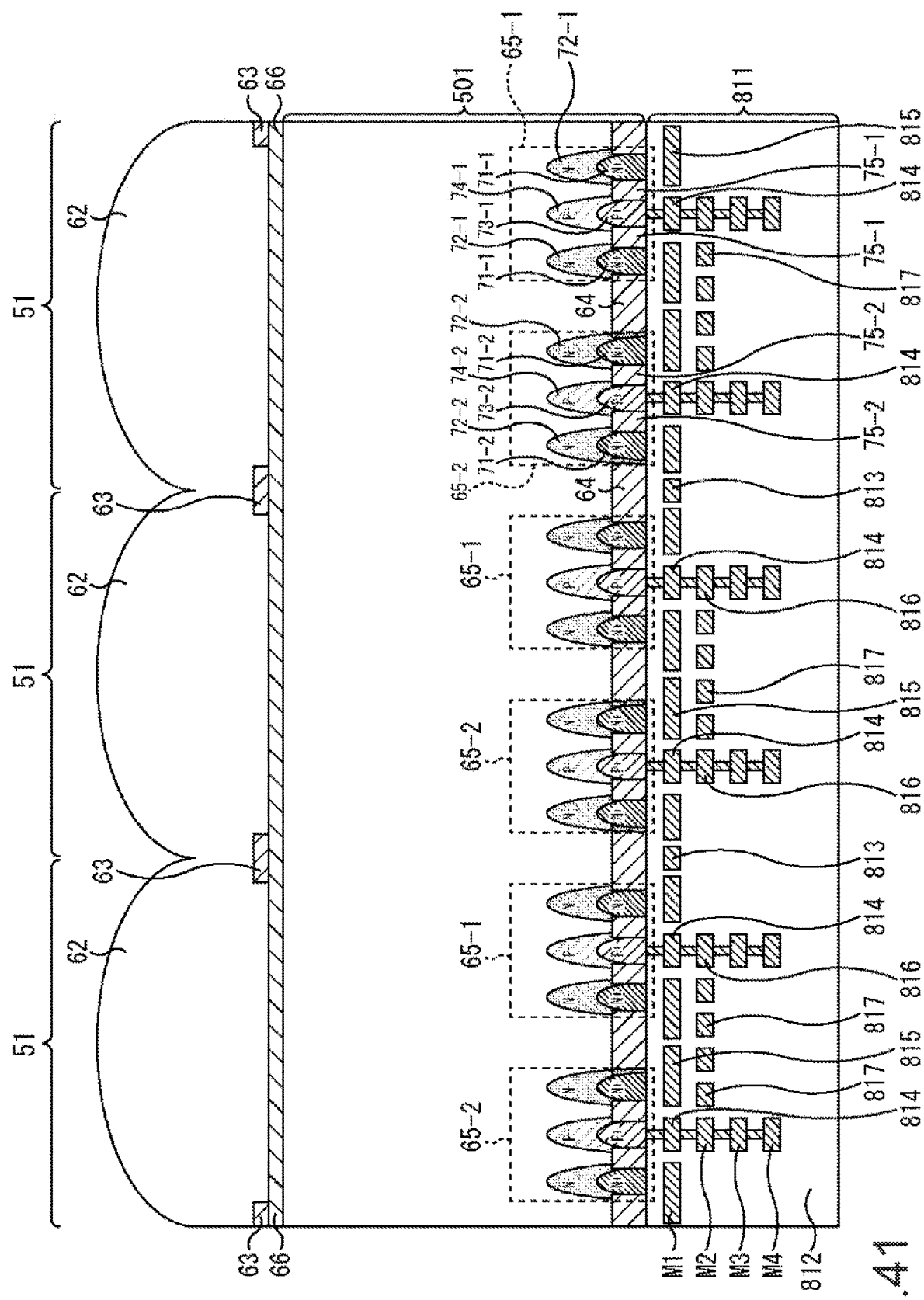
FIG. 41 is a cross-sectional view of multiple pixels in a tenth embodiment.

FIG. 41 is a cross-sectional view illustrating a pixel structure of the tenth embodiment illustrated in FIG. 24 with respect to multiple pixels in an aspect in which the multilayer interconnection layer is not omitted.

The tenth embodiment illustrated in FIG. 24 is a pixel configuration in which the substrate 501 of which a substrate thickness is larger is provided instead of the substrate 61.

The other configurations including the signal extraction units 65-1 and 65-2, the five layers of metal films M1 to M5 of the multilayer interconnection layer 811, and the like are similar to the configurations illustrated in FIG. 36.

<Planar Arrangement Example of Five Layers of Metal Films M1 to M5>

Next, description will be given of a planar arrangement example of the five layers of metal films M1 to M5 of the multilayer interconnection layer 811 illustrated in FIG. 36 to FIG. 41 with reference to FIGS. 42A to 42C, and FIGS. 43A and 43B.

Figure 42A:
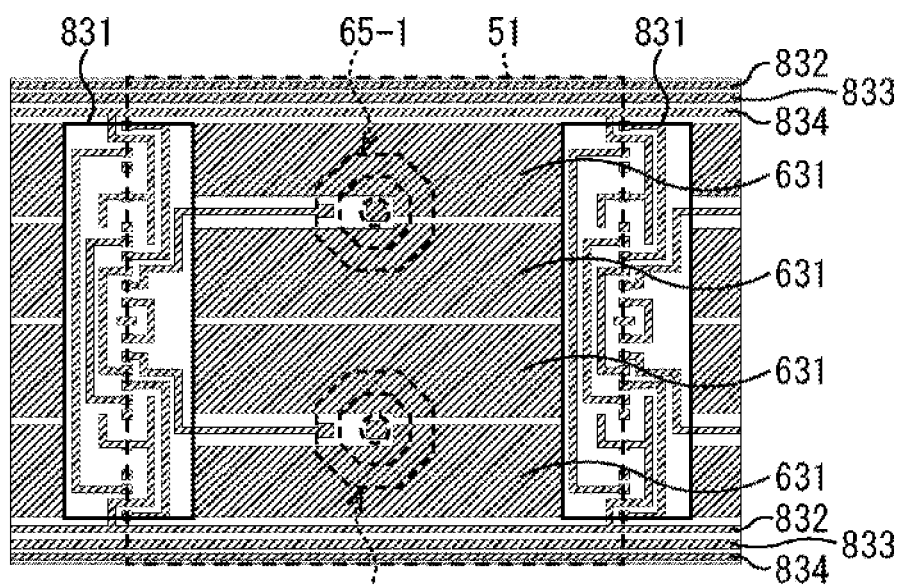
FIGS. 42A to 42C are views describing five layers metal films of a multilayer interconnection layer.

FIG. 42A illustrates a planar arrangement example of the first-layer metal film M1 among the five layers of metal films M1 to M5 of the multilayer interconnection layer 811.

Figure 42B:
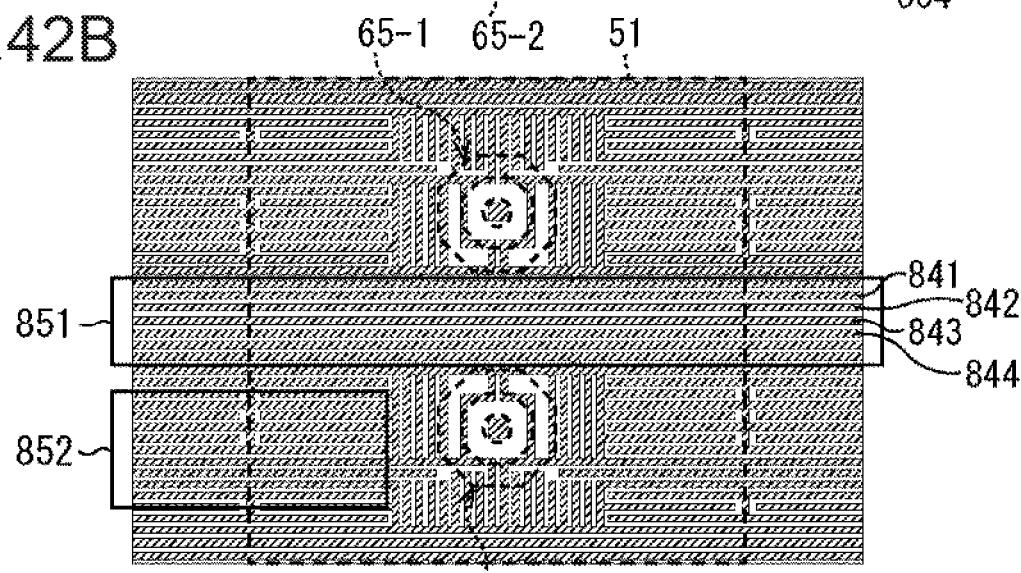

FIG. 42B illustrates a planar arrangement example of the second-layer metal film M2 among the five layers of metal films M1 to M5 of the multilayer interconnection layer 811.

Figure 42C:
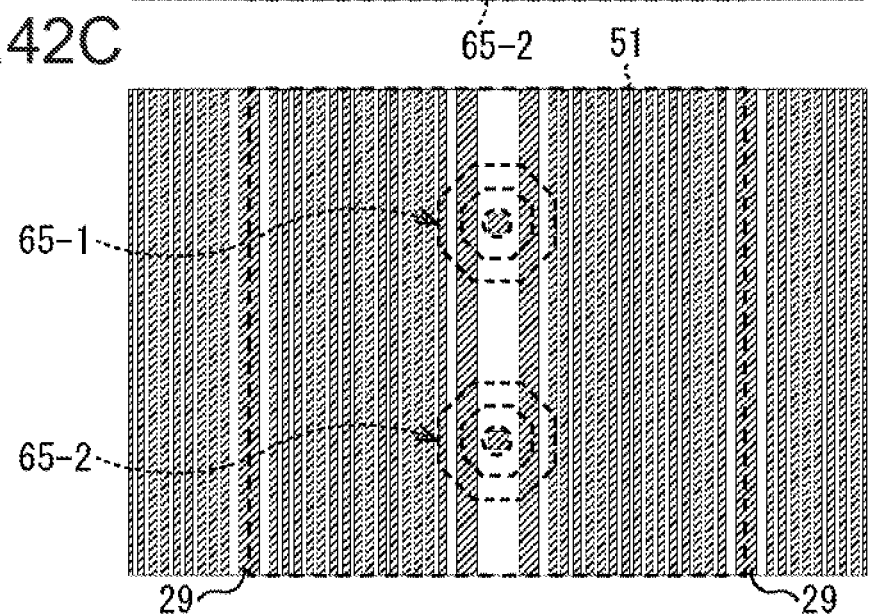

FIG. 42C illustrates a planar arrangement example of the third-layer metal film M3 among the five layers of metal films M1 to M5 of the multilayer interconnection layer 811.

Figure 43A:
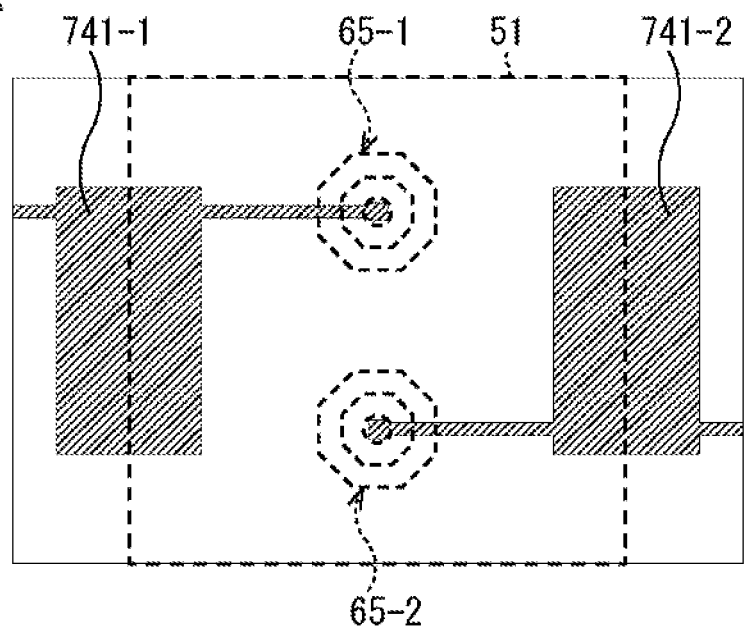
FIGS. 43A and 43B are views describing the five layers metal films of the multilayer interconnection layer.

FIG. 43A illustrates a planar arrangement example of the fourth-layer metal film M4 among the five layers of metal films M1 to M5 of the multilayer interconnection layer 811.

Figure 43B:
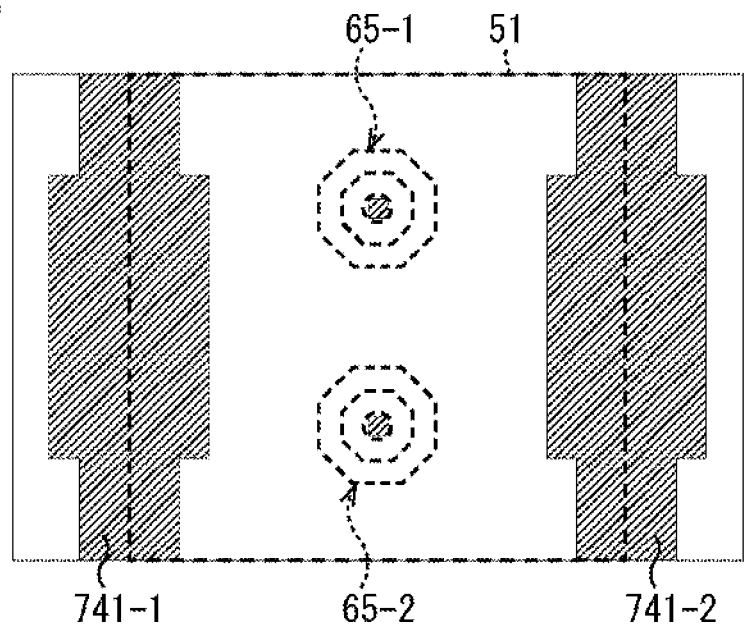

FIG. 43B illustrates a planar arrangement example of the fifth-layer metal film M5 among the five layers of metal films M1 to M5 of the multilayer interconnection layer 811.

It should be noted that a region of the pixel 51 in FIGS. 42A to 42C and FIGS. 43A and 43B, and a region of the signal extraction units 65-1 and 65-2 which have the octagonal shape illustrated in FIG. 11 are indicated by a broken line.

In FIGS. 42A to 42C, and FIGS. 43A and 43B, a vertical direction in the drawing is a vertical direction of the pixel array unit 20, and a horizontal direction in the drawing is a horizontal direction of the pixel array unit 20.

In the first-layer metal film M1 of the multilayer interconnection layer 811, as illustrated in FIG. 42A, the reflection member 631 that reflects infrared light is formed. In a region of the pixel 51, two sheets of the reflection members 631 are formed with respect to each of the signal extraction units 65-1 and 65-2, and the two sheets of reflection member 631 of the signal extraction unit 65-1 and the two sheets of reflection members 631 of the signal extraction unit 65-2 are formed in symmetry in the vertical direction.

In addition, in the horizontal direction, a pixel transistor interconnection region 831 is disposed between the reflection members 631 of adjacent pixels 51. In the pixel transistor interconnection region 831, an interconnection that connects pixel transistors Tr of the transfer transistor 721, the reset transistor 723, the amplification transistor 724, or the selection transistor 725 is formed. The interconnections for the pixel transistor Tr are formed in symmetry in the vertical direction on the basis of an intermediate line (not illustrated) of two pieces of the signal extraction unit 65-1 and 65-2.

In addition, interconnections such as a ground line 832, a power supply line 833, and a ground line 834 are formed between the reflection members 631 of the adjacent pixels 51. The interconnections are formed in symmetry in the vertical direction on the basis of the central line of the two pieces of signal extraction units 65-1 and 65-2.

As described above, in the first-layer metal film M1, since a region on the signal extraction unit 65-1 side and a region on the signal extraction unit 65-2 side at the inside of the pixel are disposed in symmetry, an interconnection load is adjusted evenly between the signal extraction units 65-1 and 65-2. Accordingly, a drive variation of the signal extraction units 65-1 and 65-2 is reduced.

In the first-layer metal film M1, since the large-area reflection member 631 is formed on a lower side of the signal extraction units 65-1 and 65-2 formed in the substrate 61, infrared light, which is incident into the substrate 61 through the on-chip lens 62 and is transmitted through the substrate 61 without being photoelectrically converted in the substrate 61, is reflected by the reflection member 631 and is caused to be incident into the substrate 61 again. Accordingly, it is possible to increase the amount of infrared light that is photoelectrically converted at the inside of the substrate 61, and thus it is possible to improve quantum efficiency (QE), that is, sensitivity of the pixel 51 with respect to infrared light.

On the other hand, in the first-layer metal film M1, in a case where the light-shielding member 631' is disposed in the same region as in the reflection member 631 instead of the reflection member 631, it is possible to suppress infrared light, which is incident into the substrate 61 from the light incident surface through the on-chip lens 62 and is transmitted through the substrate 61 without being photoelectrically converted at the inside of the substrate 61, from being scattered in the interconnection layer and being incident to nearby pixels. Accordingly, it is possible to prevent light from being erroneously detected in the nearby pixels.

In the second-layer metal film M2 of the multilayer interconnection layer 811, as illustrated in FIG. 42B, a control line region 851 in which control lines 841 to 844 which transfer a predetermined signal in a horizontal direction, and the like are formed is disposed at a position between the signal extraction units 65-1 and 65-2. For example, the control lines 841 to 844 are lines which transfer the drive signal TRG, the drive signal RST, the selection signal SEL, or the drive signal FDG.

When the control line region 851 is disposed between the two pieces of signal extraction units 65, an influence on each of the signal extraction units 65-1 and 65-2 becomes even, and thus it is possible to reduce a drive variation between the signal extraction units 65-1 and 65-2.

In addition, a capacitor region 852 in which the FD 722B or the additional capacitor 727A is formed is disposed in a predetermined region different from the control line region 851 of the second-layer metal film M2. In the capacitor region 852, the metal film M2 is patterned and formed in a comb-tooth shape to construct the FD 722B or the additional capacitor 727A.

When the FD 722B or the additional capacitor 727A is disposed in the second-layer metal film M2, it is possible to freely dispose a pattern of the FD 722B or the additional capacitor 727A in correspondence with a desired interconnection capacity in design, and thus it is possible to improve the degree of freedom in design.

In the third-layer metal film M3 of the multilayer interconnection layer 811, as illustrated in FIG. 42C, at least the vertical signal line 29 that transfers pixel signal output from each pixel 51 to the column processing unit 23 is formed. Three or more pieces of the vertical signal lines 29 may be disposed with respect to one pixel column to improve a read-out speed of pixel signals. In addition, in addition to the vertical signal line 29, a shield interconnection may be disposed to reduce coupling capacitance.

In the fourth-layer metal film M4 and the fifth-layer metal film M5 of the multilayer interconnection layer 811, the voltage supply lines 741-1 and 741-2, which apply the predetermined voltage MIX0 or MIX1 to the P+ semiconductor regions 73-1 and 73-2 of the signal extraction unit 65 in the pixel 51, are formed.

The metal film M4 and metal film M5 illustrated in FIGS. 43A and 43B represent an example in the case of employing the voltage supply line 741 in the first arrangement example illustrated in FIG. 33A.

The voltage supply line 741-1 of the metal film M4 is connected to the voltage application interconnection 814 (for example, FIG. 36) of the metal film M1 through the metal films M3 and M2, and the voltage application interconnection 814 is connected to the P+ semiconductor region 73-1 of the signal extraction unit 65-1 of the pixel 51. Similarly, the voltage supply line 741-2 of the metal film M4 is connected the voltage application interconnection 814 (for example, FIG. 36) of the metal film M1 through the metal films M3 and M2, and the voltage application interconnection 814 is connected to the P+ semiconductor region 73-2 of the signal extraction unit 65-2 of the pixel 51.

The voltage supply lines 741-1 and 741-2 of the metal film M5 are connected to the tap drive unit 21 at the periphery of the pixel array unit 20. The voltage supply line 741-1 of the metal film M4 and the voltage supply line 741-1 of the metal film M5 are connected to each other by a via (not illustrated) or the like at a predetermined position in a planar region at which both of the metal films exist. The predetermined voltage MIX0 or MIX1 from the tap drive unit 21 is supplied to the voltage supply lines 741-1 and 741-2 of the metal film M4 after being transferred through the voltage supply lines 741-1 and 741-2 of the metal film M5 and is supplied from the voltage supply lines 741-1 and 741-2 to the voltage application interconnection 814 of the metal film M1 through the metal films M3 and M2.

When the light-receiving element 1 is set as the back-illuminated type CAPD sensor, for example, as illustrated in FIG. 43A and FIG. 43B, for example, it is possible to wire the voltage supply lines 741-1 and 741-2 for applying the predetermined voltage MIX0 or MIX1 to the signal extraction unit 65 of the pixel 51 in the vertical direction, that is, it is possible to freely design a wiring width and a layout of drive interconnections. In addition, it is possible to realize wiring suitable for a high-speed drive or wiring in consideration of load reduction.

<Planar Arrangement Example of Pixel Transistor>

Figure 44A:
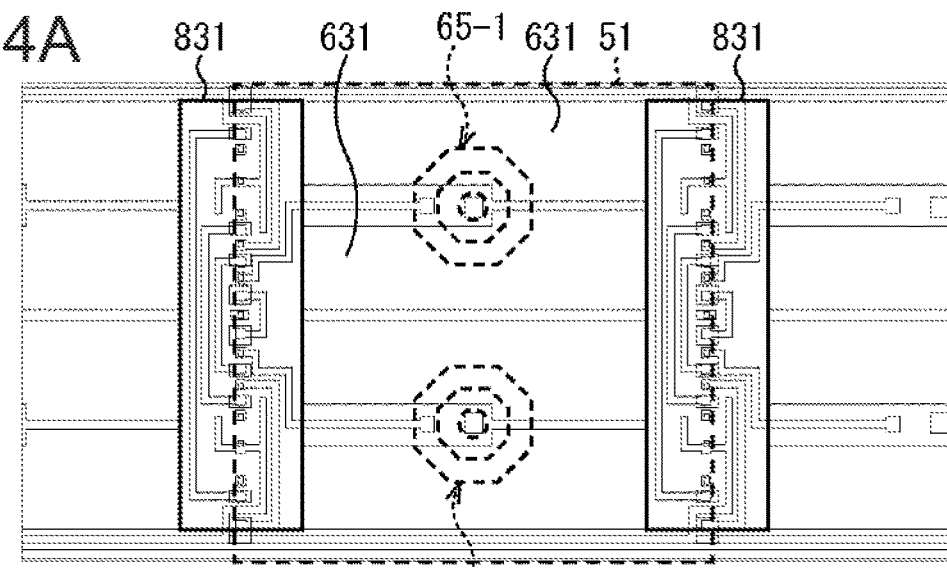
FIGS. 44A to 44C are views describing a polysilicon layer.
Figure 44B:
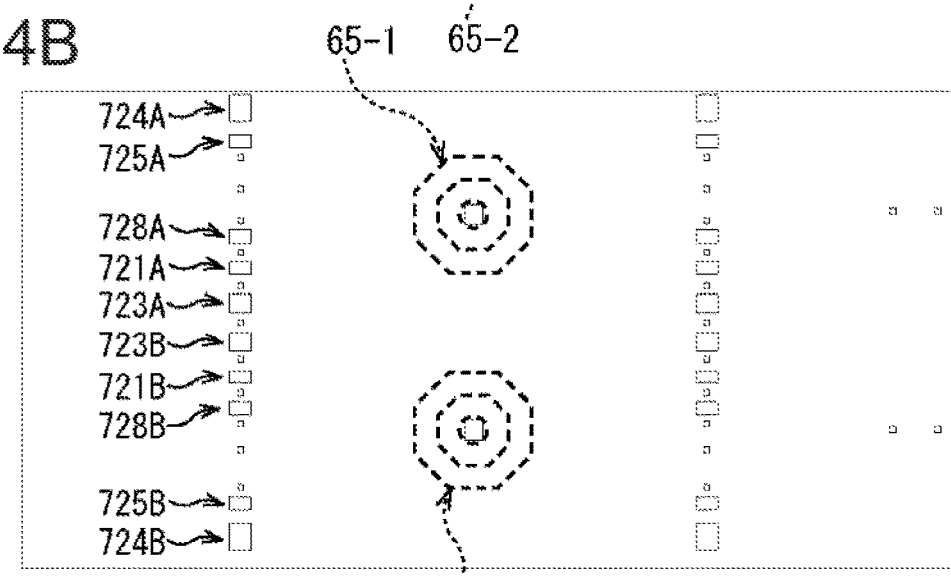
Figure 44C:
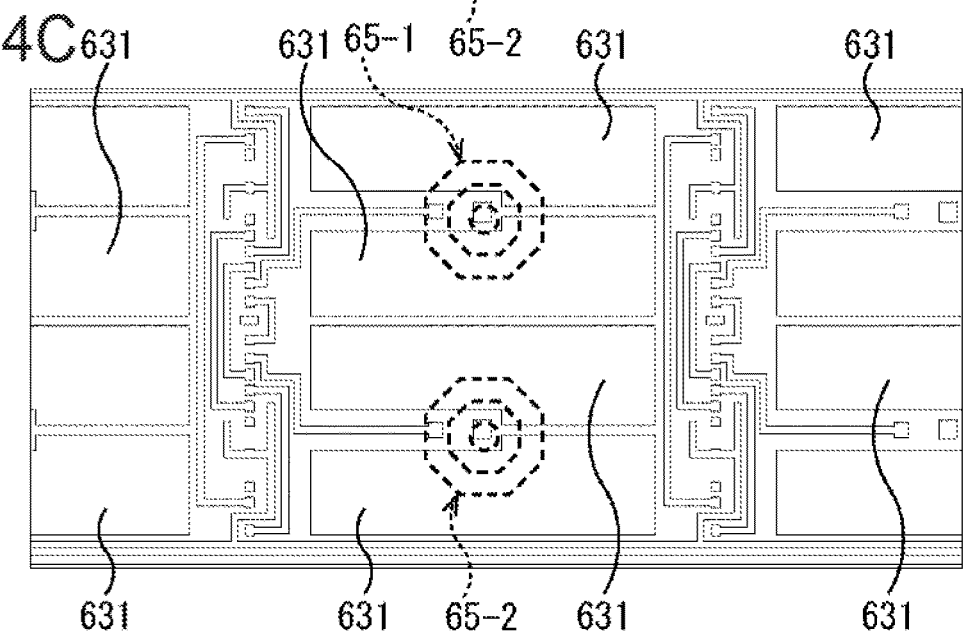

FIGS. 44A to 44C are plan views illustrating an overlapping structure between the first-layer metal film M1 illustrated in FIG. 42A, and a polysilicon layer which is formed on the metal film M1 and in which a gate electrode of the pixel transistor Tr and the like are formed.

FIG. 44A is a plan view obtained by overlapping the metal film M1 in FIG. 44C and the polysilicon layer in FIG. 44B, FIG. 44B is a plan view of only the polysilicon layer, and FIG. 44C is a plan view of only the metal film M1. The plan view of the metal film M1 in FIG. 44C is the same as the plan view illustrated in FIG. 42A, but hatching is omitted.

As described above with reference to FIG. 42A, the pixel transistor interconnection region 831 is formed between the reflection members 631 of respective pixels.

The pixel transistor Tr corresponding to each of the signal extraction units 65-1 and 65-2 is formed in the pixel transistor interconnection region 831, for example, as illustrated in FIG. 44B.

In FIG. 44B, on the basis of an intermediate line (not illustrated) of two pieces of the signal extraction units 65-1 and 65-2, gate electrodes of the reset transistors 723A and 723B, the transfer transistors 721A and 721B, the switching transistors 728A and 728B, the selection transistors 725A and 725B, and the amplification transistors 724A and 724B are formed in this order from a side closer to the intermediate line.

Interconnection which connect pixel transistors Tr of the metal film M1 illustrated in FIG. 44C are formed in symmetry in the vertical direction on the basis of the intermediate line (not illustrated) of the two pieces of signal extraction units 65-1 and 65-2.

As described above, multiple pixel transistors Tr inside the pixel transistor interconnection region 831 are disposed in a region on the signal extraction unit 65-1 side and a region on the signal extraction unit 65-2 side in a symmetrical manner. Accordingly, it is possible to reduce a drive variation of the signal extraction units 65-1 and 65-2.

<Modification Example of Reflection Member 631>

Next, a modification example of the reflection member 631 formed in the metal film M1 will be described with reference to FIGS. 45A to 45C and FIGS. 46A and 46B.

In the above-described example, as illustrated in FIG. 42A, the large-area reflection member 631 is disposed in a region at the periphery of the signal extraction unit 65 inside the pixel 51.

Figure 45A:
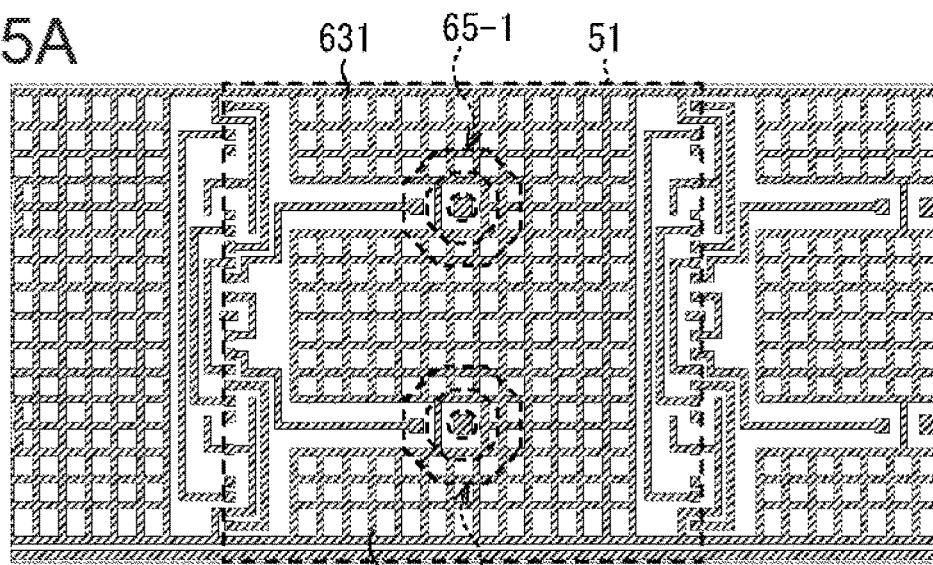
FIGS. 45A to 45C are views illustrating a modification example of a reflection member that is formed on a metal film.

In contrast, for example, as illustrated in FIG. 45A, the reflection member 631 may be disposed in a lattice-shaped pattern. In this manner, when the reflection member 631 is formed in the lattice-shaped pattern, it is possible to remove pattern anisotropy, and it is possible to reduce XY anisotropy in reflection capability. In other words, when the reflection member 631 is formed in the lattice-shaped pattern, reflection of incident light to a partial biased region is reduced, and incident light is likely to be equally reflected. Accordingly, distance measurement accuracy is improved.

Figure 45B:
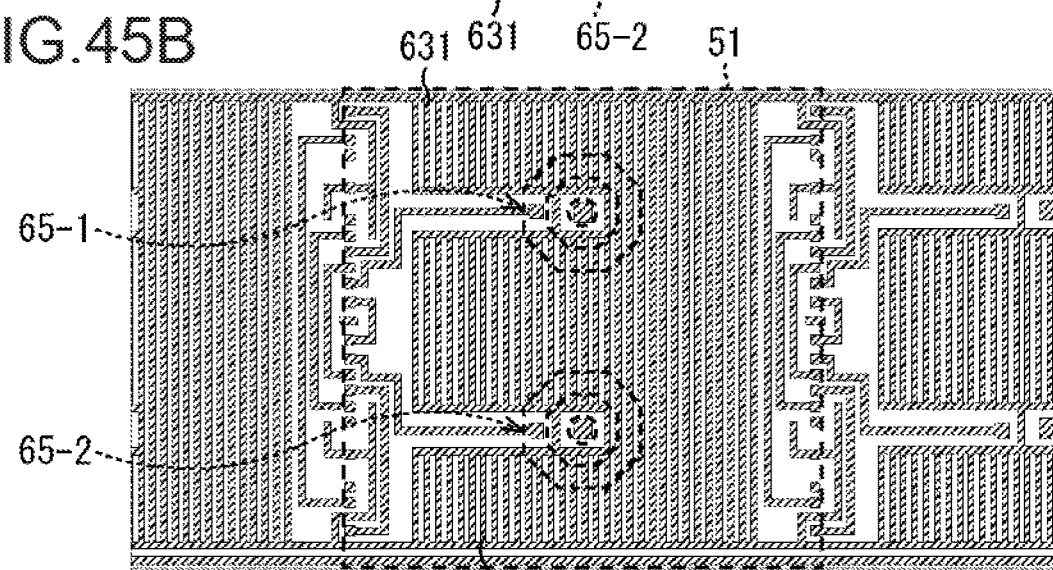

Alternatively, for example, as illustrated in FIG. 45B, the reflection member 631 may be disposed in a stripe-shaped pattern. In this manner, when the reflection member 631 is formed in the stripe-shaped pattern, the pattern of the reflection member 631 may be used as an interconnection capacitor, and thus it is possible to realize a configuration in which a dynamic range is expanded to the maximum.

It should be noted that FIG. 45B illustrates an example of a vertical stripe shape, but a horizontal stripe shape is also possible.

Figure 45C:
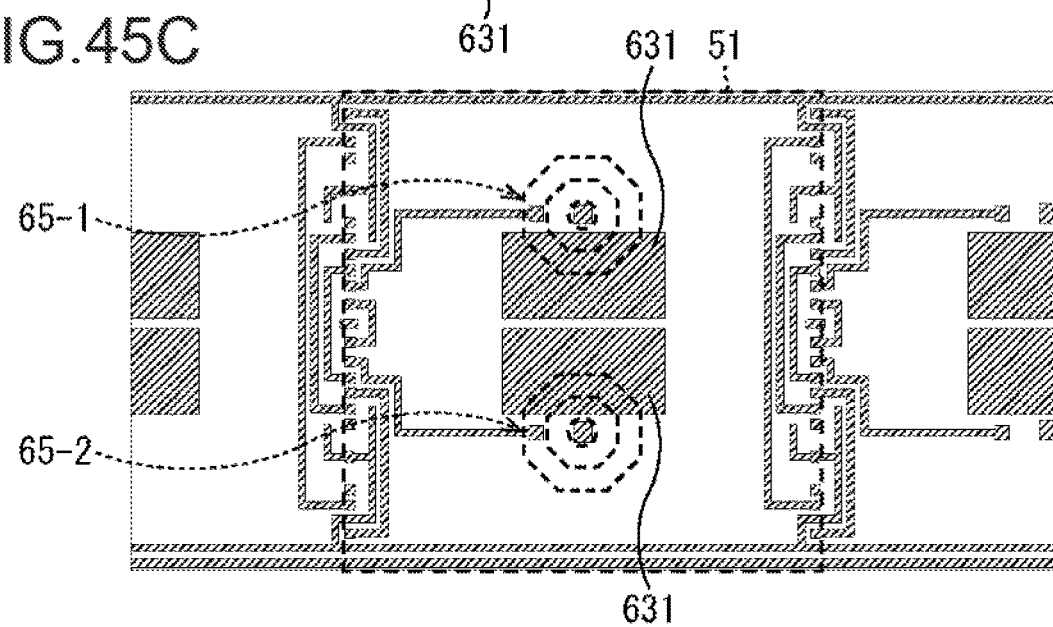

Alternatively, for example, as illustrated in FIG. 45C, the reflection member 631 may be disposed only in a pixel central region, more specifically, only between the two pieces of signal extraction units 65. In this manner, when the reflection member 631 is formed in the pixel central region, and is not formed at a pixel end, it is possible to suppress components which are reflected to adjacent pixels in a case where oblique light is incident while obtaining a sensitivity improving effect due to the reflection member 631 with respect to the pixel central region, and thus it is possible to realize a configuration in which suppression of cross-talk is emphasized.

Figure 46A:
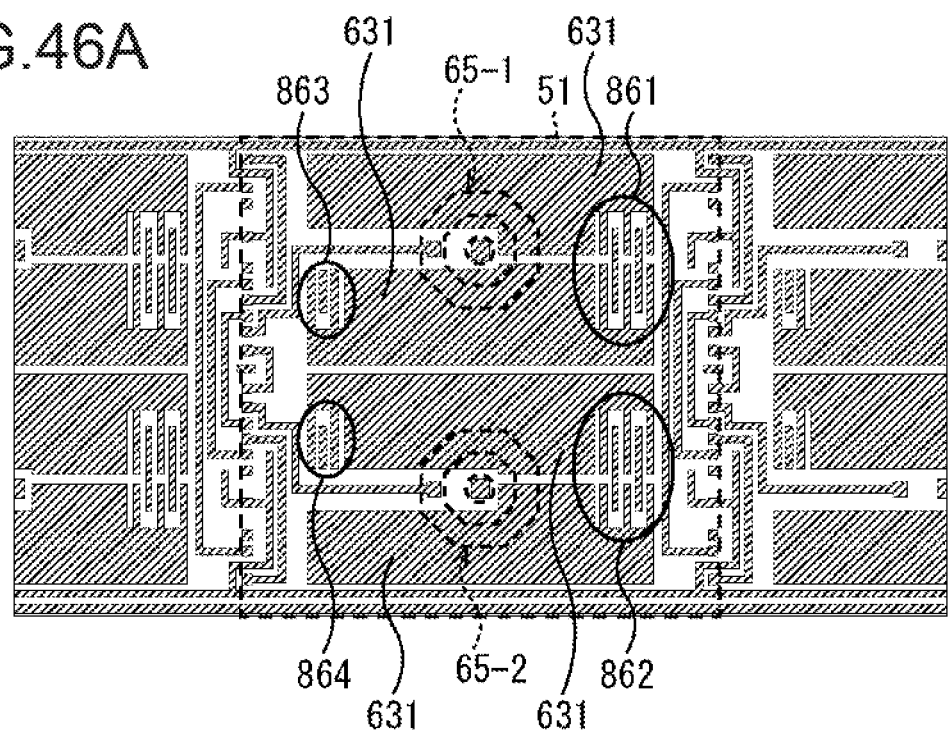
FIGS. 46A and 46B are views illustrating a modification example of the reflection member that is formed on the metal film.

In addition, for example, as illustrated in FIG. 46A, when a part of the reflection member 631 is pattern-disposed in a comb-tooth shape, a part of the metal film M1 may be allocated to interconnection capacitance of the FD 722 or the additional capacitor 727. In FIG. 46A, comb-teeth shapes inside regions 861 to 864 surrounded by a solid line constitute at least a part of the FD 722 or the additional capacitor 727. The FD 722 or the additional capacitor 727 may be disposed to be appropriately distributed to the metal film M1 and the metal film M2. A pattern of the metal film M1 can be disposed for the reflection member 631, and capacitance of the FD 722 or the additional capacitor 727 with valance.

Figure 46B:
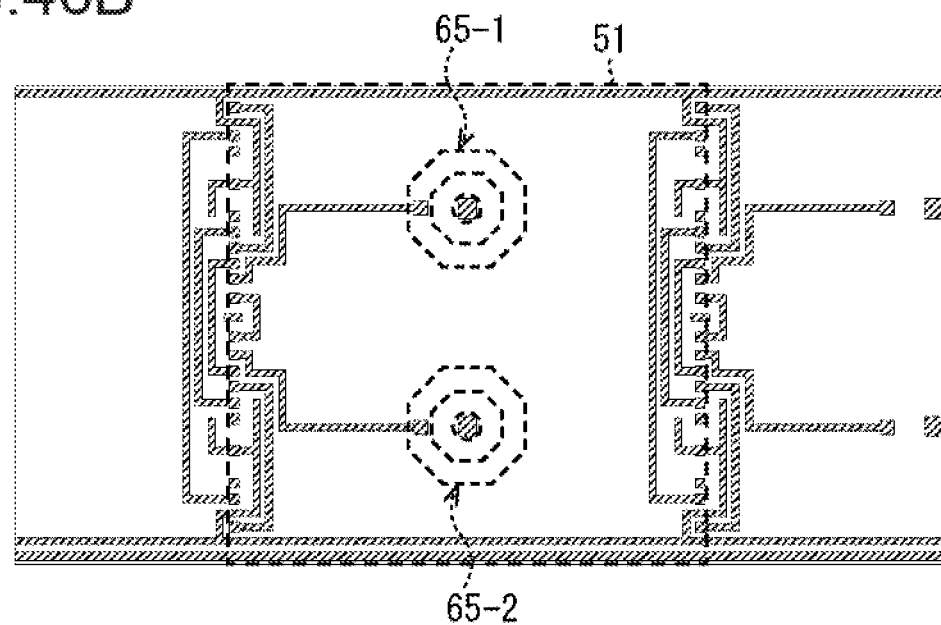

FIG. 46B illustrates a pattern of the metal film M1 in a case where the reflection member 631 is not disposed. It is desirable to dispose the reflection member 631 to increase the amount of infrared light that is photoelectrically converted at the inside of the substrate 61 and to improve sensitivity of the pixel 51, but it is also possible to employ a configuration in which the reflection member 631 is not disposed.

The arrangement example of the reflection member 631 illustrated in FIGS. 45A to 45C and FIGS. 46A and 46B is also applicable to the light-shielding member 631' in a similar manner.

<Substrate Configuration Example of Light-Receiving Element>

Figure 47A:
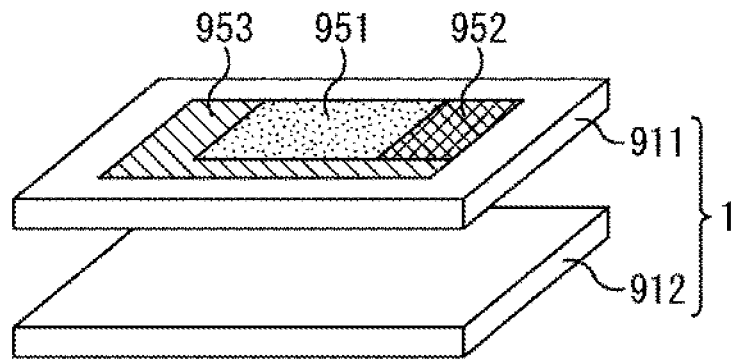
FIGS. 47A to 47C are views describing a substrate configuration of the light-receiving element.
Figure 47B:
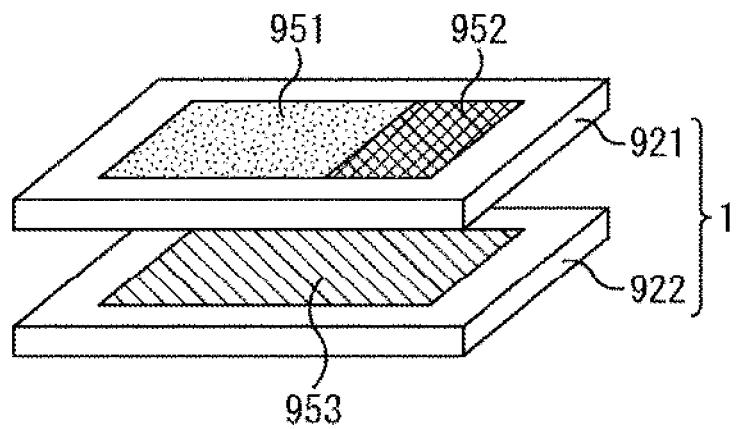
Figure 47C:
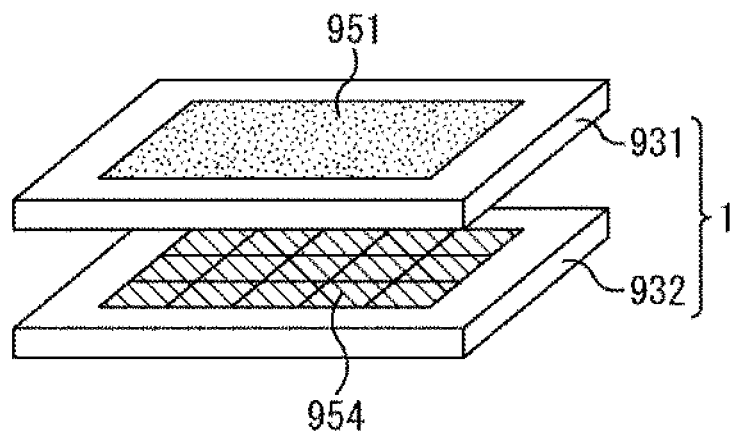

The light-receiving element 1 in FIG. 1 can employ a substrate configuration in any one of FIG. 47A to FIG. 47C.

FIG. 47A illustrates an example in which the light-receiving element 1 is constituted by one sheet of semiconductor substrate 911 and a support substrate 912 located on a lower side of the semiconductor substrate 911.

In this case, a pixel array region 951 corresponding to the pixel array unit 20, a control circuit 952 that controls respective pixels of the pixel array region 951, and a logic circuit 953 including a signal processing circuit that processes pixel signals are formed in the semiconductor substrate 911 on an upper side.

The tap drive unit 21, the vertical drive unit 22, the horizontal drive unit 24, and the like are included in the control circuit 952. The column processing unit 23 that performs AD conversion processing of pixel signals, and the signal processing unit 31 that performs distance calculation processing of calculating a distance from a ratio of pixel signals acquired from two or more pieces of signal extraction units 65 inside a pixel, calibration processing, and the like are included in the logic circuit 953.

Alternatively, as illustrated in FIG. 47B, the light-receiving element 1 may be set to a configuration in which a first semiconductor substrate 921 in which the pixel array region 951 and the control circuit 952 are formed and a second semiconductor substrate 922 in which the logic circuit 953 is formed are laminated. It should be noted that the first semiconductor substrate 921 and the second semiconductor substrate 922 are electrically connected to each other, for example, by a through-via or a metallic bond of Cu—Cu.

Alternatively, as illustrated in FIG. 47C, the light-receiving element 1 may be set to a lamination structure of a first semiconductor substrate 931 in which only the pixel array region 951 is formed, and a second semiconductor substrate 932 in which an area control circuit 954 including a control circuit that controls each pixel and a signal processing circuit that processes pixel signals, the control circuit and the signal processing circuit being provided in a one-pixel unit or an area unit of multiple pixels. The first semiconductor substrate 931 and the second semiconductor substrate 932 are electrically connected to each other, for example, by a through-via or a metallic bond of Cu—Cu.

As in the light-receiving element 1 in FIG. 47C, according to the configuration in which the control circuit and the signal processing circuit are provided in the one-pixel unit or the area unit, it is possible to set an optimal drive timing or gain for every division control unit, and it is possible to acquire optimized distance information regardless of a distance or a reflectance. In addition, it is possible to calculate distance information by driving only a partial region instead of the entirety of the pixel array region 951, and thus it is also possible to suppress power consumption in correspondence with an operation mode.

<Countermeasure Example of Noise at Periphery of Pixel Transistor>

However, at a boundary portion of pixels 51 which are arranged in a horizontal direction in the pixel array unit 20, as illustrated in the cross-sectional view in FIG. 37, pixel transistors Tr such as the reset transistor 723, the amplification transistor 724, and the selection transistor 725 are disposed.

Figure 48:
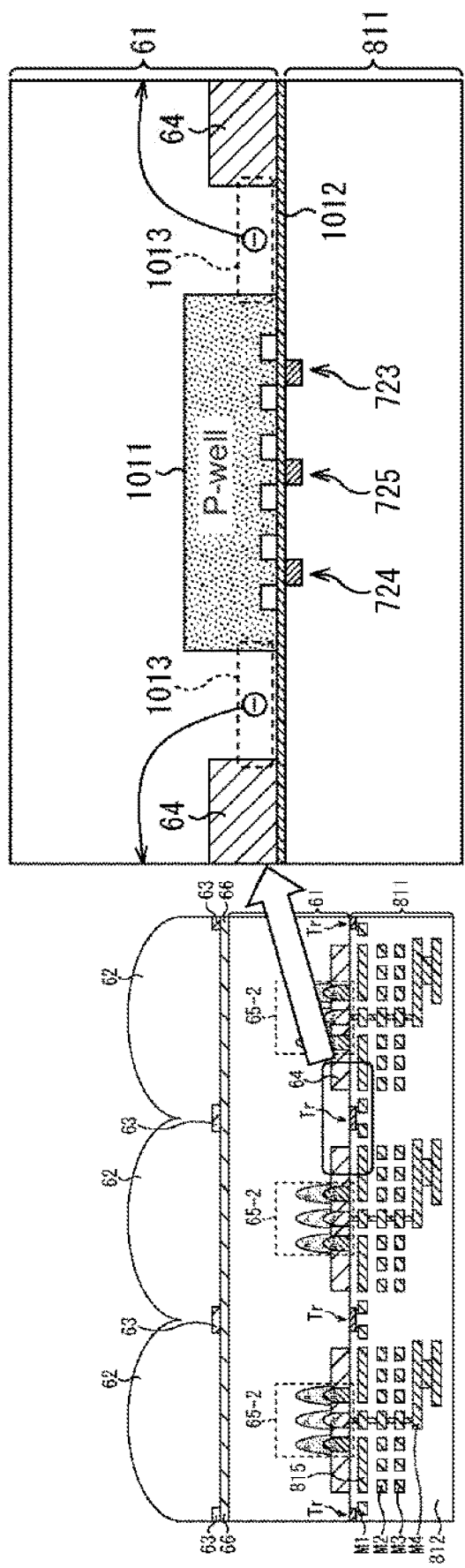
FIG. 48 is a view describing noise at the periphery of a pixel transistor region.

When illustrating a pixel transistor arrangement region of the pixel boundary portion illustrated in FIG. 37 in more detail, as illustrated in FIG. 48, the pixel transistors Tr such as the reset transistor 723, the amplification transistor 724, and the selection transistor 725 are formed in a P-well region 1011 that is formed on a front surface side of the substrate 61.

The P-well region 1011 is formed to be spaced away from the oxide film 64 such as a shallow trench isolation (STI) formed at the periphery of the N+ semiconductor region 71 of the signal extraction unit 65 with predetermined intervals in a plane direction. In addition, an oxide film 1012 that also functions as a gate insulating film of the pixel transistors Tr is formed at an interface on a rear surface side of the substrate 61.

At this time, at the rear-surface side interface of the substrate 61, electrons are likely to be accumulated in a gap region 1013 between the oxide film 64 and the P-well region 1011 due to a potential obtained by positive charges in the oxide film 1012. Accordingly, in a case where an electron discharge mechanism is not present, electrons overflow and diffuse, and thus the electrons are collected in an N-type semiconductor region and become noise.

Figure 49A:
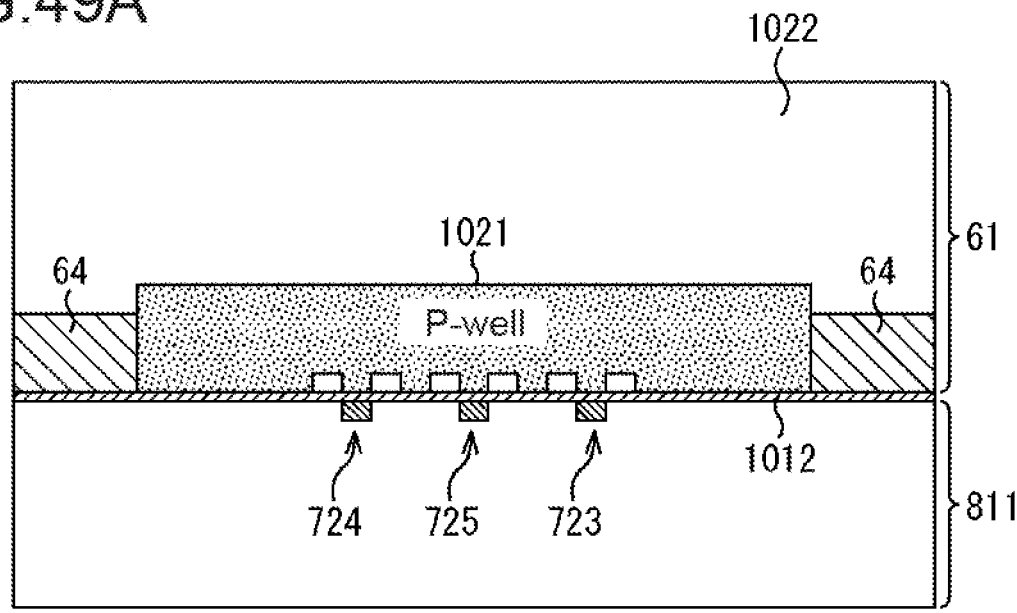
FIGS. 49A and 49B are views describing the noise suppression structure at the periphery of the pixel transistor region.

Here, as illustrated in FIG. 49A, a P-well region 1021 may be formed to extend until coming into contact with oxide films 64 adjacent to the P-well region 1021 in a plane direction so that the gap region 1013 does not exist at the rear-surface side interface of the substrate 61. Accordingly, it is possible to prevent electrons from being accumulated in the gap region 1013 illustrated in FIG. 48, and thus it is possible to suppress noise. An impurity concentration of the P-well region 1021 is set to be higher in comparison to a P-type semiconductor region 1022 that is a photoelectric conversion region in the substrate 61.

Figure 49B:
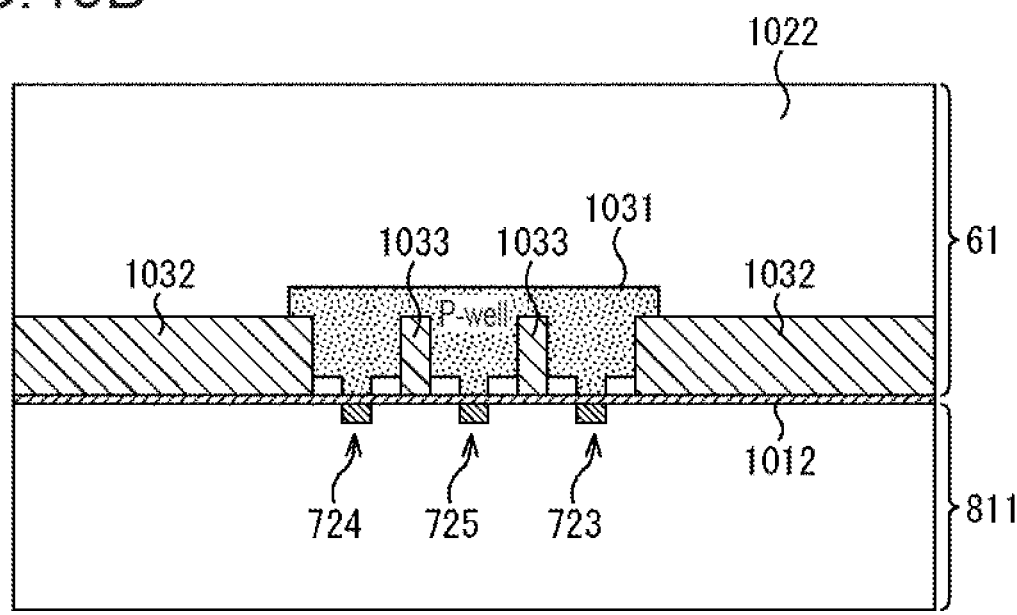

Alternatively, as illustrated in FIG. 49B, when an oxide film 1032 formed at the periphery of the N+ semiconductor region 71 of the signal extraction unit 65 can be formed to extend up to a P-well region 1031 in a plane direction so that the gap region 1013 does not exist at the rear-surface side interface of the substrate 61. In this case, the pixel transistors Tr such as the reset transistor 723, the amplification transistor 724, and the selection transistor 725 in the P-well region 1031 are element-isolated by an oxide film 1033. For example, the oxide film 1033 is formed with the STI, and can be formed in the same process as in the oxide film 1032.

In accordance with the configuration in FIGS. 49A and 49B, at the rear-surface side interface of the substrate 61, the insulating film (the oxide film 64 and the oxide film 1032) in the boundary portion of pixels and the P-well region (the P-well region 1021 and the P-well region 1031) are in contact with each other, and thus it is possible to remove the gap region 1013. Accordingly, it is possible to prevent electron accumulation and it is possible to suppress noise. The configurations in FIG. 49A or FIG. 49B are applicable to any embodiment described in this specification.

Figure 50:
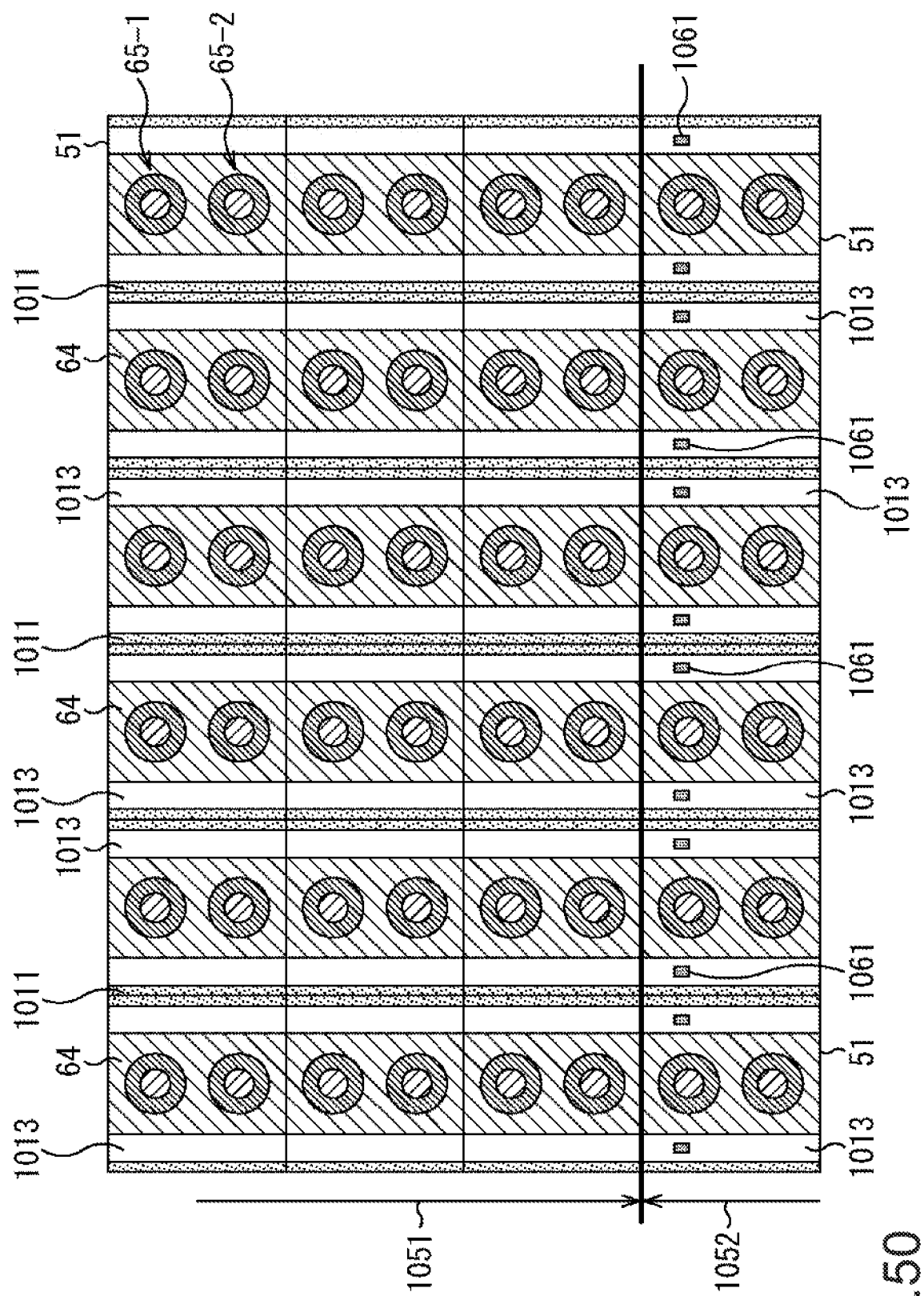
FIG. 50 is a view describing a charge discharge structure at the periphery of the pixel transistor region.
Figure 51:
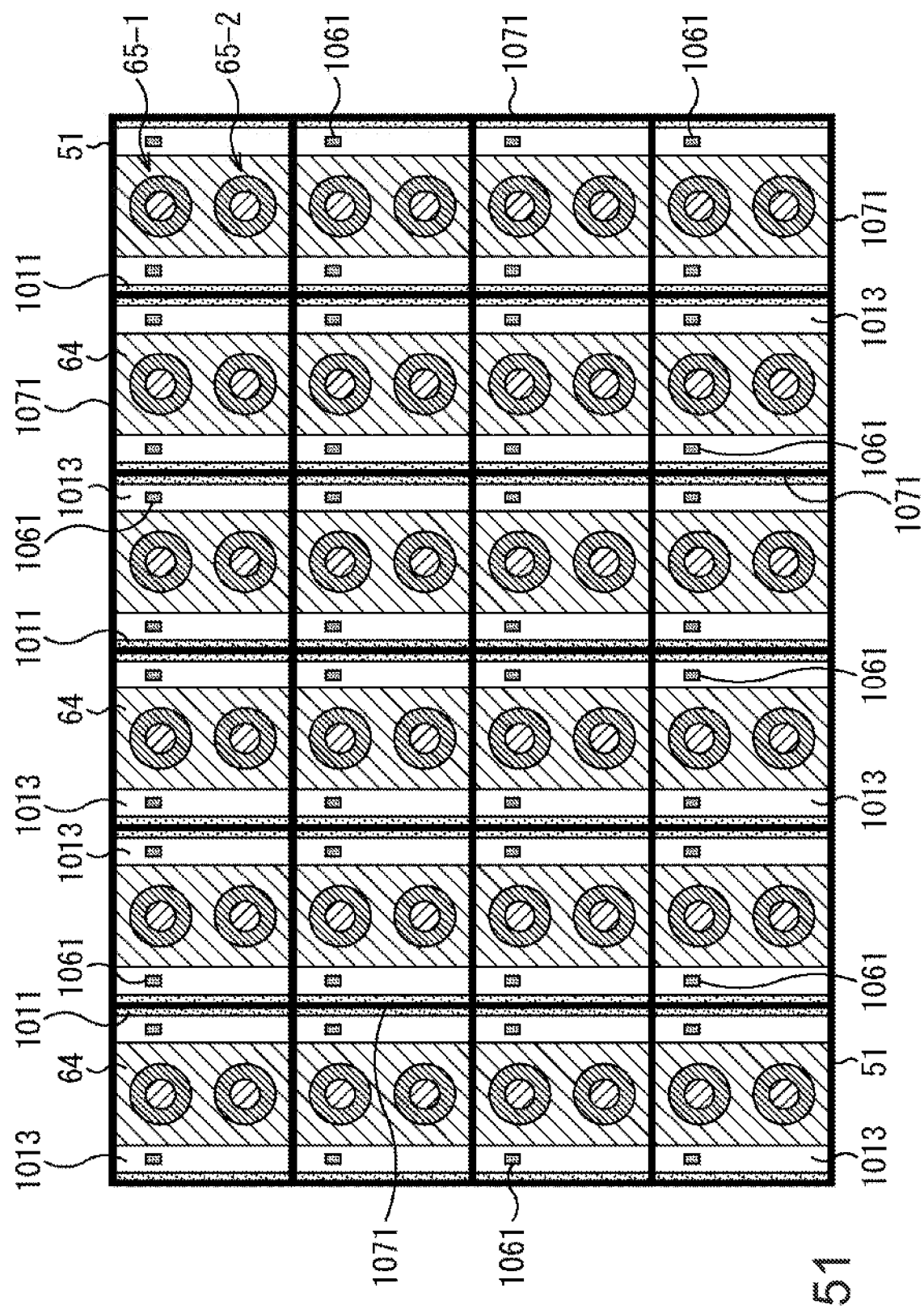
FIG. 51 is a view describing a charge discharge structure at the periphery of the pixel transistor region.

Alternatively, in the case of employing a configuration in which the gap region 1013 is left as is, it is possible to suppress electron accumulation that occurs in the gap region 1013 by employing a configuration illustrated in FIG. 50 or FIG. 51.

FIG. 50 illustrates an arrangement of the oxide film 64, the P-well region 1011, and the gap region 1013 in a plan view in which two-tap pixels 51 including two pieces of the signal extraction units 65-1 and 65-2 for every pixel are two-dimensionally arranged.

In a case where two-dimensionally arranged pixels are not isolated by the STI or deep trench isolation (DTI), as illustrated in FIG. 50, multiple P-well regions 1011 are formed in a column shape that is continuous to multiple pixels arranged in a column direction.

As a drain for discharging charges, an N-type diffusion layer 1061 is provided in the gap region 1013 of the pixel 51 in an ineffective pixel region 1052 disposed on an outer side of an effective pixel region 1051 of the pixel array unit 20, and electrons can be discharged to the N-type diffusion layer 1061. The N-type diffusion layer 1061 is formed on a rear-surface side interface of the substrate 61, and GND (0 V) or a positive voltage is applied to the N-type diffusion layer 1061. Electrons generated in the gap region 1013 of the pixel 51 migrate to the N-type diffusion layer 1061 in the ineffective pixel region 1052 in a vertical direction (column direction), and are collected in the N-type diffusion layer 1061 that is shared by pixel columns, and thus it is possible to suppress noise.

On the other hand, as illustrated in FIG. 51, in a case where pixels are isolated by a pixel isolation portion 1071 using the STI, the DTI, or the like, the N-type diffusion layer 1061 can be provided in the gap region 1013 of the pixel 51. Accordingly, electrons generated in the gap region 1013 of the pixel 51 are discharged from the N-type diffusion layer 1061, and thus it is possible to suppress noise. The configurations in FIG. 50 and FIG. 51 are applicable to any embodiment described in this specification.

<Noise at Periphery of Effective Pixel Region>

Next, discharging of charges at the periphery of the effective pixel region will be described.

For example, a light-shielding pixel region in which a light-shielding pixel is disposed exists at an outer peripheral portion adjacent to the effective pixel region.

Figure 52:
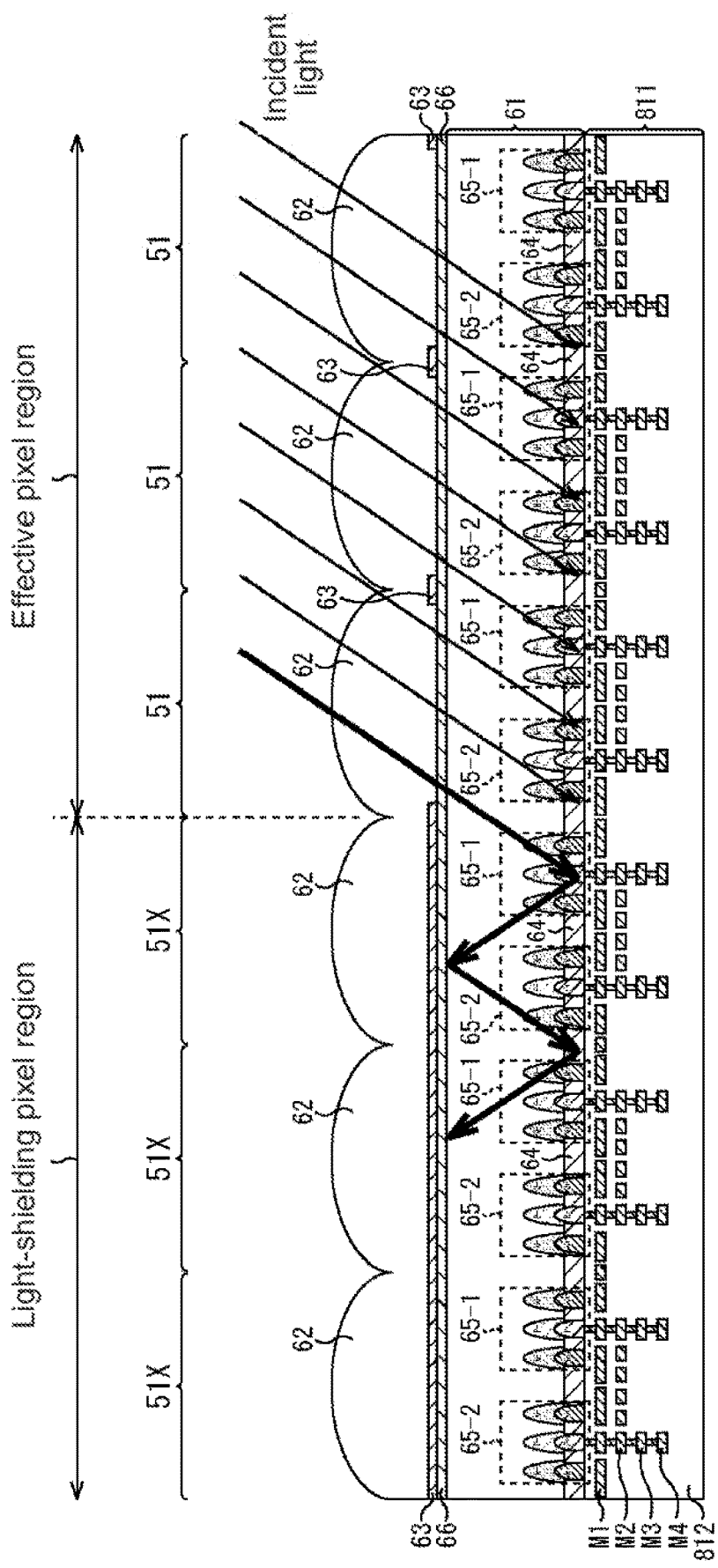
FIG. 52 is a view describing charge discharge at the periphery of an effective pixel region.

As illustrated in FIG. 52, in a light-shielding pixel 51X in a light-shielding pixel region, the signal extraction unit 65 and the like are formed in a similar manner as in the pixel 51 in the effective pixel region. In addition, the light-shielding pixel 51X in the light-shielding pixel region has a structure in which the interpixel light-shielding film 63 is formed on an entire surface of a pixel region, and thus light is not incident. In addition, in the light-shielding pixel 51X, a drive signal may not be applied.

On the other hand, in the light-shielding pixel region adjacent to the effective pixel region, oblique light from a lens, diffracted light from the interpixel light-shielding film 63, and reflected light form the multilayer interconnection layer 811 are incident, and photoelectrons are generated. Because a discharge destination is not present, the generated photoelectrons are accumulated in the light-shielding pixel region, are diffused to the effective pixel region due to a concentration gradient, and are mixed with signal charges. Accordingly, the photoelectrons become noise. The noise at the periphery of the effective pixel region becomes so-called frame unevenness.

Here, as a countermeasure for the nose that occurs at the periphery of the effective pixel region, in the light-receiving element 1, a charge discharge region 1101 in any one of FIGS. 53A to 53D can be provided at the outer periphery of the effective pixel region 1051.

FIGS. 53A to 53D are plan views illustrating a configuration example of the charge discharge region 1101 provided at the outer periphery of the effective pixel region 1051.

In any of FIGS. 53A to 53D, the charge discharge region 1101 is provided at the outer periphery of the effective pixel region 1051 disposed at the central portion of the substrate 61, and an OPB region 1102 is provided on an outer side of the charge discharge region 1101. The charge discharge region 1101 is a hatched region between an inner broken-line rectangular region and an outer broke-line rectangular region. The OPB region 1102 is a region in which the interpixel light-shielding film 63 is formed on the entire surface of the region, and an OPB pixel that operates in a similar manner as in the pixel 51 in the effective pixel region to detect a black level signal is disposed. In FIGS. 53A to 53D, a gray region represents a region in which the interpixel light-shielding film 63 is formed and thus light is shielded.

The charge discharge region 1101 in FIG. 53A includes an opening pixel region 1121 in which an opening pixel is disposed, and a light-shielding pixel region 1122 in which the light-shielding pixel 51X is disposed. The opening pixel in the opening pixel region 1121 is a pixel that has the same pixel structure as in the pixel 51 in the effective pixel region 1051, and performs a predetermined operation. The light-shielding pixel 51X of the light-shielding pixel region 1122 is a pixel that has the same pixel structure as in the pixel 51 of in the effective pixel region 1051 and performs a predetermined operation except that the interpixel light-shielding film 63 is formed on the entire surface of the pixel region.

The opening pixel region 1121 includes a pixel column or a pixel row of one or more pixels in each column or each row of four sides of the outer periphery of the effective pixel region 1051. The light-shielding pixel region 1122 also includes a pixel column or a pixel row of one or more pixels in each column or each row of four sides of the outer periphery of the opening pixel region 1121.

The charge discharge region 1101 in FIG. 53B includes the light-shielding pixel region 1122 in which the light-shielding pixel 51X is disposed, and an N-type region 1123 in which an N-type diffusion layer is disposed.

Figure 54:
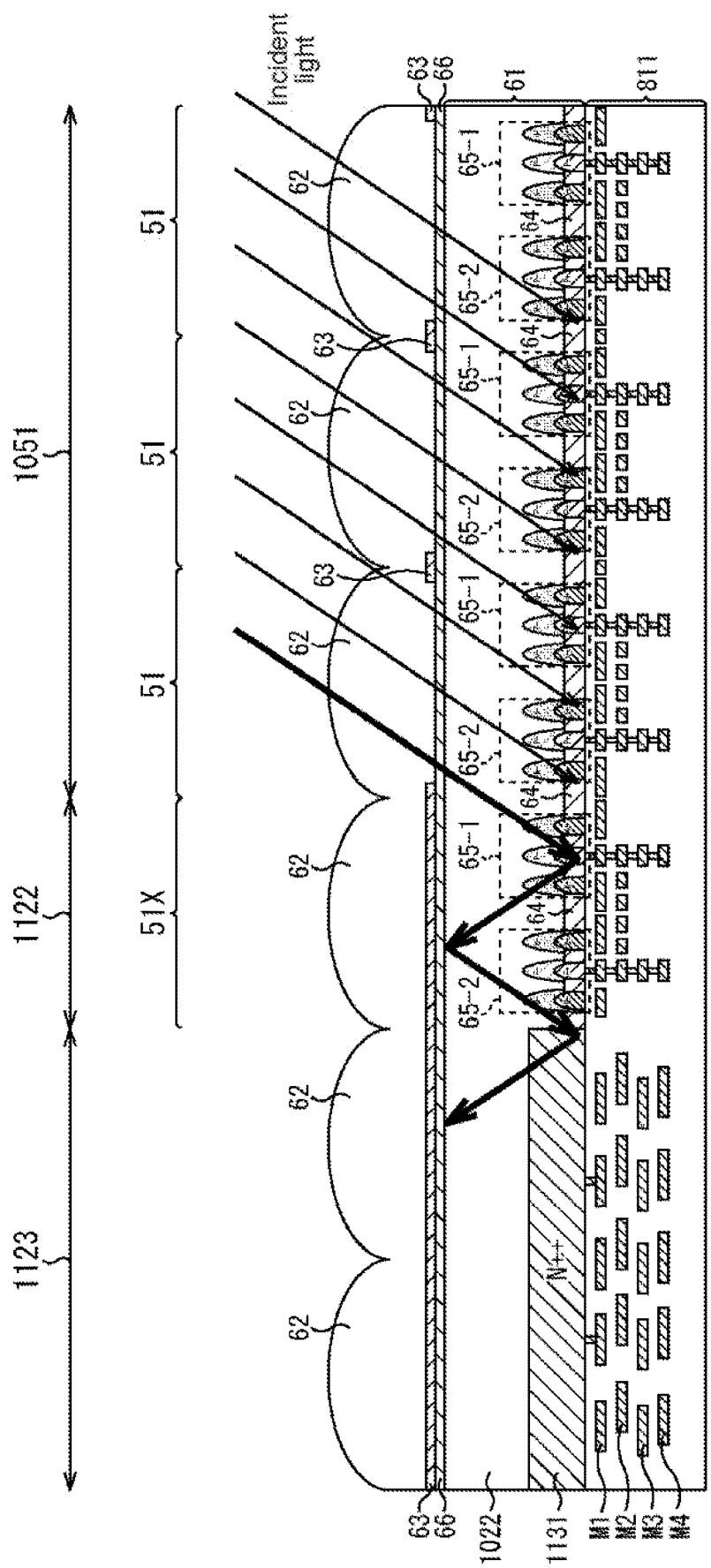
FIG. 54 is a cross-sectional view in a case where the charge discharge region includes a light-shielding pixel region and an N-type region.

FIG. 54 is a cross-sectional view when the charge discharge region 1101 includes the light-shielding pixel region 1122 and the N-type region 1123.

The N-type region 1123 is a region in which the entire surface of the region is shielded with the interpixel light-shielding film 63, and an N-type diffusion layer 1131 that is a high-concentration N-type semiconductor region is formed in the P-type semiconductor region 1022 of the substrate 61 instead of the signal extraction unit 65. A voltage of 0 V or a positive voltage is always or intermittently applied to the N-type diffusion layer 1131 from the metal film M1 of the multilayer interconnection layer 811. For example, the N-type diffusion layer 1131 may be formed at the entirety of the P-type semiconductor region 1022 in the N-type region 1123 in an approximately continuous annular shape in a plan view. Alternatively, the N-type diffusion layer 1131 may be formed partially at the P-type semiconductor region 1022 in the N-type region 1123, and multiple N-type diffusion layers 1131 may be arranged to be scattered in an approximately annular shape in a plan view.

Returning back to FIG. 53B, the light-shielding pixel region 1122 includes a pixel column or a pixel row of one or more pixels in each column or in each row of four sides of the outer periphery of the effective pixel region 1051. The N-type region 1123 has a predetermined column width or row width in each column or in each row of four sides of the outer periphery of the light-shielding pixel region 1122.

The charge discharge region 1101 in FIG. 53C includes the light-shielding pixel region 1122 in which a light-shielding pixel is disposed. The light-shielding pixel region 1122 includes a pixel column or pixel row of one or more pixels in each column or in each row of four sides of the outer periphery of the effective pixel region 1051.

The charge discharge region 1101 in FIG. 53D includes the opening pixel region 1121 in which an opening pixel is disposed, and the N-type region 1123 in which an N-type diffusion layer is disposed.

A predetermined operation that is performed by an opening pixel in the opening pixel region 1121 and a light-shielding pixel 51X in the light-shielding pixel region 1122 may include an operation in which a positive voltage is always or intermittently applied to an N-type semiconductor region of a pixel, and it is desirable that the operation is an operation in which a drive signal is applied to a pixel transistor, a P-type semiconductor region, or an N-type semiconductor region at a timing confirming to the pixel 51 of the effective pixel region 1051 as in the operation in the pixel 51.

The configuration examples of the charge discharge region 1101 illustrated in FIGS. 53A to 53D are illustrative only, and there is no limitation thereto. The charge discharge region 1101 may have a configuration including any one of an opening pixel that performs a predetermined operation, a light-shielding pixel that performs a predetermined operation, an N-type region including an N-type diffusion layer to which a voltage of 0 V or a positive voltage is always or intermittently applied. Accordingly, for example, the opening pixel, the light-shielding pixel, and the N-type region may be mixed in one pixel column or pixel row, or different kinds of the opening pixel, the light-shielding pixel, and the N-type region may be disposed in a pixel row or a pixel column of four sides at the periphery of the effective pixel region.

As described above, when the charge discharge region 1101 is provided at the outer periphery of the effective pixel region 1051, it is possible to suppress electron accumulation in a region other than the effective pixel region 1051. Accordingly, it is possible to suppress occurrence of noise when optical charges diffused from an outer side of the effective pixel region 1051 to the effective pixel region 1051 are added to signal charges.

In addition, when the charge discharge region 1101 is provided in front of the OPB region 1102, it is possible to prevent photoelectrons generated in a light-shielding region on an outer side of the effective pixel region 1051 from being diffused to the OPB region 1102, and thus it is possible to prevent noise from being added to the black level signal. The configurations illustrated in FIGS. 53A to 53D are applicable to any embodiments described in this specification.

Eighteenth Embodiment

Figure 55A:
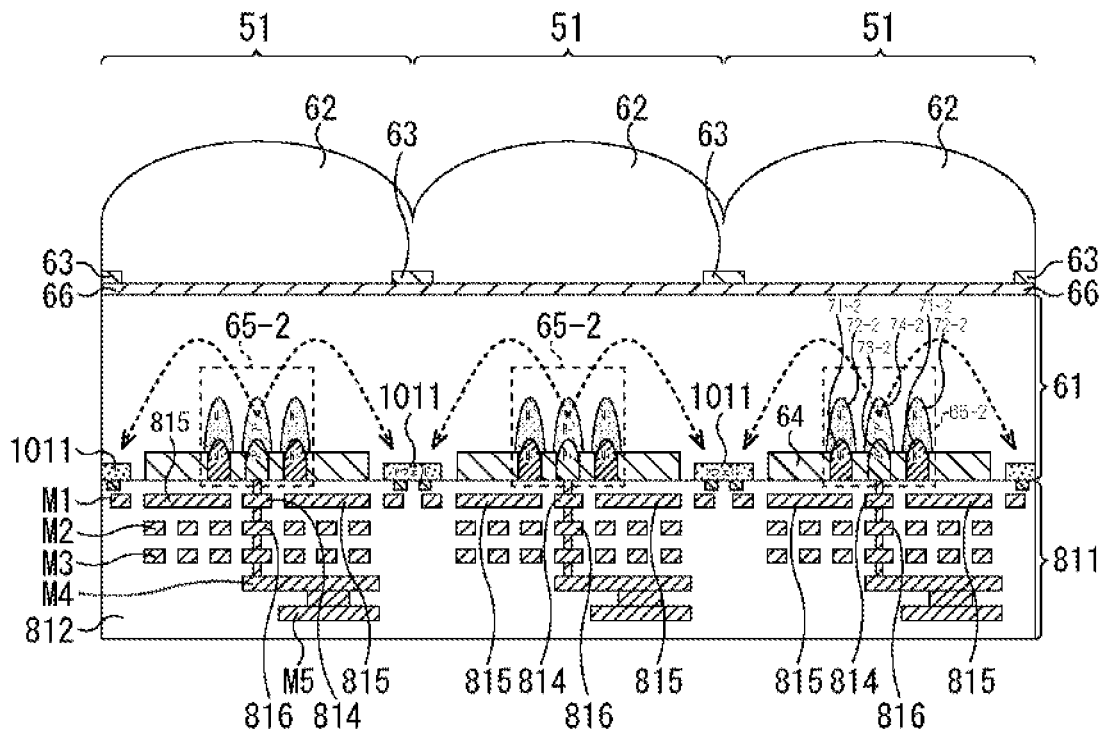
FIGS. 55A and 55B are views describing a current flow in a case where the pixel transistors are disposed in a substrate including a photoelectric conversion region.

Next, description will be given of a current flow in a case where the pixel transistors are disposed in the substrate 61 including a photoelectric conversion region with reference to FIGS. 55A and 55B.

In the pixel 51, for example, when a positive voltage of 1.5 V and a voltage of 0 V are respectively applied to the P+ semiconductor region 73 of two pieces of the signal extraction unit 65, an electric field occurs between the two pieces of P+ semiconductor regions 73, and a current flows from the P+ semiconductor region 73 to which 1.5 V is applied to the P+ semiconductor region 73 to which 0 V is applied. However, the P-well region 1011 formed at the pixel boundary portion is also set to GND (0 V), and thus a current also flows from the P+ semiconductor region 73 to which 1.5 V is applied to the P-well region 1011 as illustrated in FIG. 55A in addition to the current flow between the two pieces of signal extraction units 65.

Figure 55B:
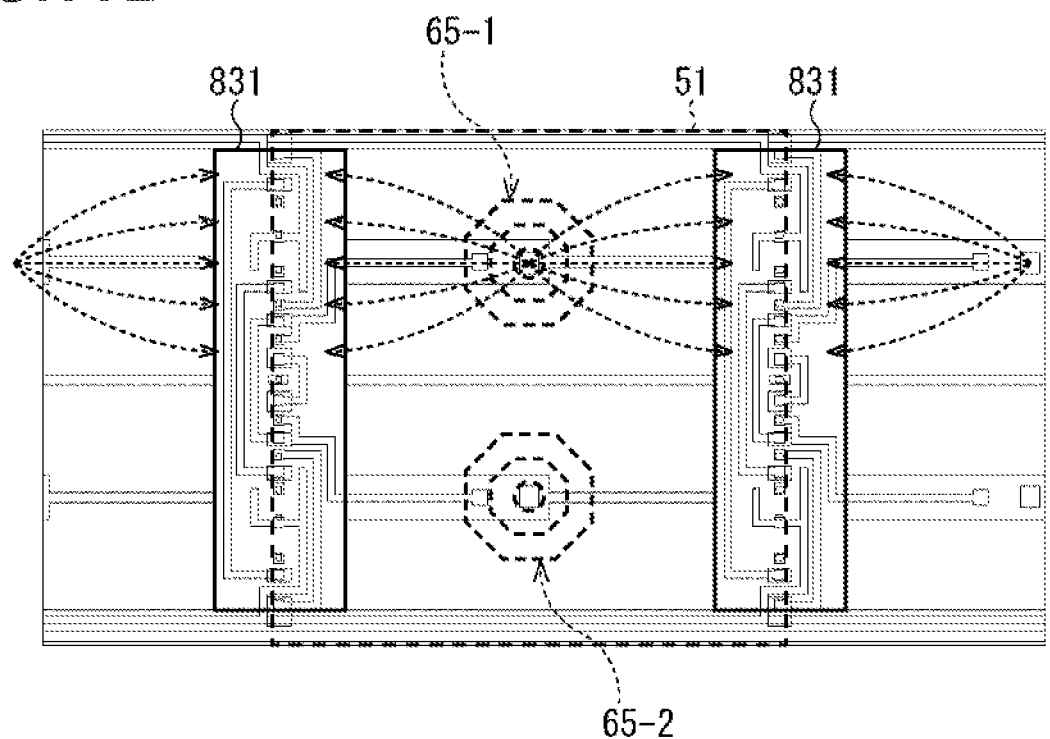

FIG. 55B is a plan view illustrating an arrangement of the pixel transistor interconnection region 831 illustrated in FIG. 42A.

An area of the signal extraction unit 65 can be reduced through layout change. In contrast, an area of the pixel transistor interconnection region 831 is determined by an occupied area of one pixel transistor, the number of pixel transistors, and an interconnection area, and thus it is difficult to reduce the area only by research on layout design. Accordingly, when desiring to reduce an area of the pixel 51, the area of the pixel transistor interconnection region 831 becomes main constraint factor. It is necessary to reduce a pixel size to realize high resolution while maintaining an optical size of a sensor, but the area of the pixel transistor interconnection region 831 becomes constraint. In addition, when reducing the area of the pixel 51 while maintaining the area of the pixel transistor interconnection region 831, a route of a current flowing to the pixel transistor interconnection region 831 as indicated by a broken-line arrow in FIG. 55B is shortened, and thus resistance is lowered and currents increase. According, a reduction in the area of the pixel 51 leads to an increase of power consumption.

<Configuration Example of Pixel>

Figure 56:
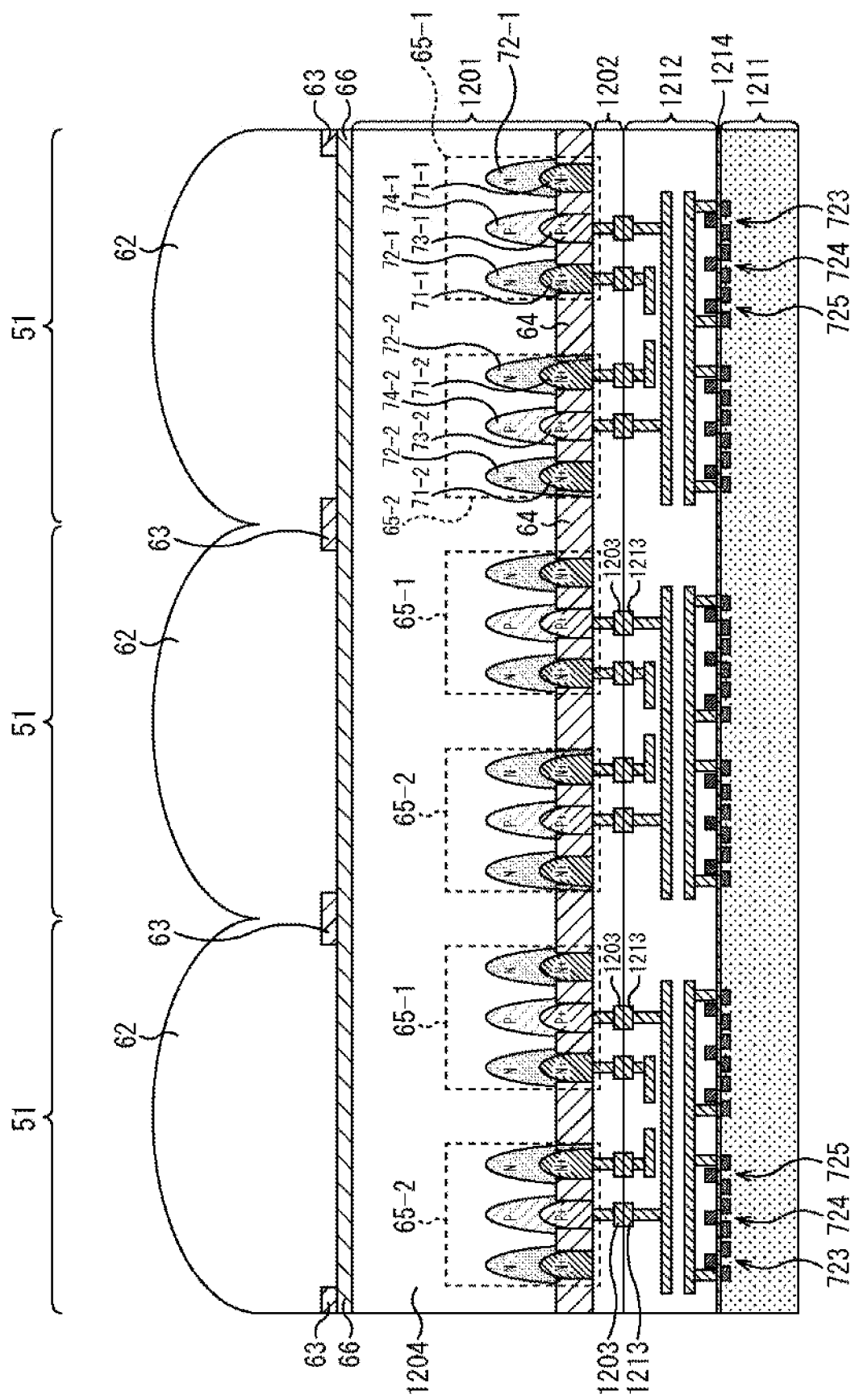
FIG. 56 is a cross-sectional view of multiple pixels according to an eighteenth embodiment.

Here, as illustrated in FIG. 56, it is possible to employ a configuration in which the light-receiving element 1 is set to a lamination structure in which two sheets of substrates are laminated, and all pixel transistors are disposed in a substrate different from a substrate including a photoelectric conversion region.

FIG. 56 is a cross-sectional view of a pixel according to an eighteenth embodiment.

FIG. 56 illustrates a cross-sectional view of multiple pixels and corresponds to line B-B' in FIG. 11 as in the case of FIG. 36 and the like.

In FIG. 56, the same reference numeral will be given of a portion corresponding to the cross-sectional view of multiple pixels according to the fourteenth embodiment illustrated in FIG. 36, and description thereof will be appropriately omitted.

In the eighteenth embodiment illustrated in FIG. 56, the light-receiving element 1 is constituted by laminating two sheets of substrates including a substrate 1201 and a substrate 1211. The substrate 1201 corresponds to the substrate 61 in the fourteenth embodiment illustrated in FIG. 36, and is constituted, for example, by a silicon substrate including a P-type semiconductor region 1204 as a photoelectric conversion region, or the like. The substrate 1211 is also constituted by a silicon substrate or the like.

It should be noted that the substrate 1201 including the photoelectric conversion region may be constituted, for example, by a compound semiconductor such as GaAs, InP, and GaSb, a narrow bandgap semiconductor such as Ge, or a glass substrate or a plastic substrate that is applied with an organic photoelectric conversion film in addition to the silicon substrate or the like. In a case where the substrate 1201 is constituted by the compound semiconductor, it is possible to expect an improvement of quantum efficiency due to a direct transition type band structure, an improvement of sensitivity, and a reduction in height of a sensor due to a reduction in a substrate thickness. In addition, mobility of electrons is high, and thus it is possible to improve electron collection efficiency. In addition, a mobility of holes is low, and thus it is possible to reduce power consumption. In a case where the substrate 1201 is constituted by the narrow bandgap semiconductor, it is possible to expect an improvement of quantum efficiency in a near infrared region, and an improvement of sensitivity due to the narrow bandgap.

The substrate 1201 and the substrate 1211 are joined in a state in which an interconnection layer 1202 of the substrate 1201 and an interconnection layer 1212 of the substrate 1211 face each other. In addition, a metal interconnection 1203 of the interconnection layer 1202 on the substrate 1201 side, and a metal interconnection 1213 of the interconnection layer 1212 on the substrate 1211 side are electrically connected to each other, for example, by Cu—Cu bonding. It should be noted that electrical connection between the interconnection layers is not limited to the Cu—Cu bonding, and examples thereof include similar metal bonding such as Au—Au bonding and Al—Al bonding, a dissimilar metal bonding such as Cu—Au bonding, Cu—Al bonding, and Au—Al bonding, and the like. In addition, the reflection member 631 of the fourteenth embodiment or the light-shielding member 631' of the fifteenth embodiment may also be provided in any one of the interconnection layer 1202 of the substrate 1201, and the interconnection layer 1212 of the substrate 1211.

The substrate 1201 including the photoelectric conversion region is different from the substrate 61 of the first to seventeenth embodiments in that all pixel transistors Tr such as the reset transistor 723, the amplification transistor 724, and the selection transistor 725 are not formed in the substrate 1201.

In the eighteenth embodiment illustrated in FIG. 56, the pixel transistors Tr such as the reset transistor 723, the amplification transistor 724, and the selection transistor 725 are formed on the substrate 1211 side on a lower side in the drawing. In FIG. 56, the reset transistor 723, the amplification transistor 724, and the selection transistor 725 are illustrated in the drawing, but the transfer transistor 721 is also formed in a region (not illustrated) of the substrate 1211.

An insulating film (oxide film) 1214 that also functions as a gate insulating film of a pixel transistor is formed between the substrate 1211 and the interconnection layer 1212.

Accordingly, although not illustrated in the drawing, when the pixel according to the eighteenth embodiment is viewed in a cross-sectional view corresponding to line A-A' in FIG. 11, the pixel transistor Tr formed at a pixel boundary portion in FIG. 37 is not formed in the substrate 1201.

Figure 57:
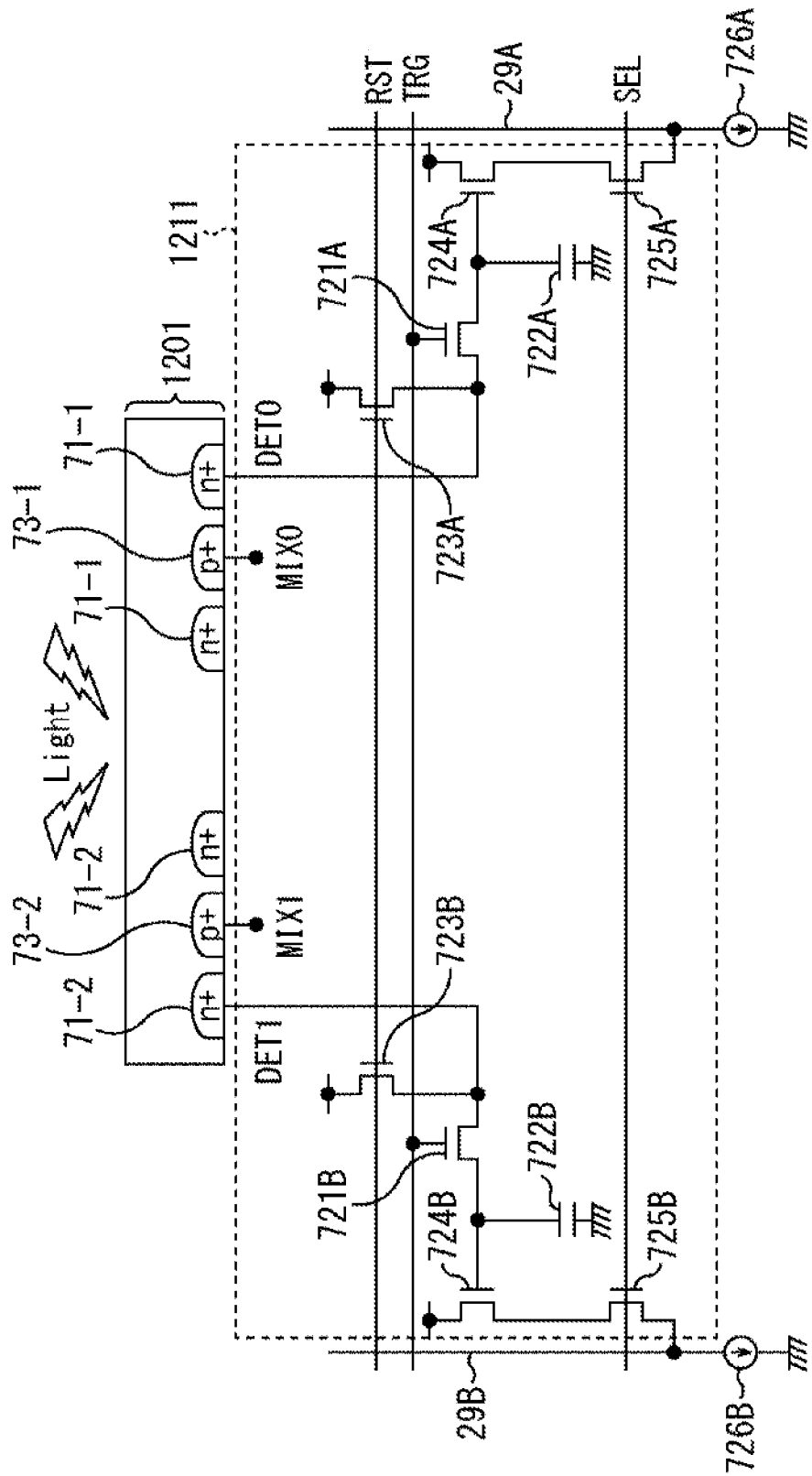
FIG. 57 is a view describing circuit sharing of two sheets of substrates.

When illustrating elements disposed in each of the substrate 1201 and the substrate 1211 by using an equivalent circuit of the pixel 51 illustrated in FIG. 31, as illustrated in FIG. 57, the P+ semiconductor region 73 as the voltage application unit and the N+ semiconductor region 71 as the charge detection unit are formed in the substrate 1201, and the transfer transistor 721, the FD 722, the reset transistor 723, the amplification transistor 724, and the selection transistor 725 are formed in the substrate 1211.

Figure 58:
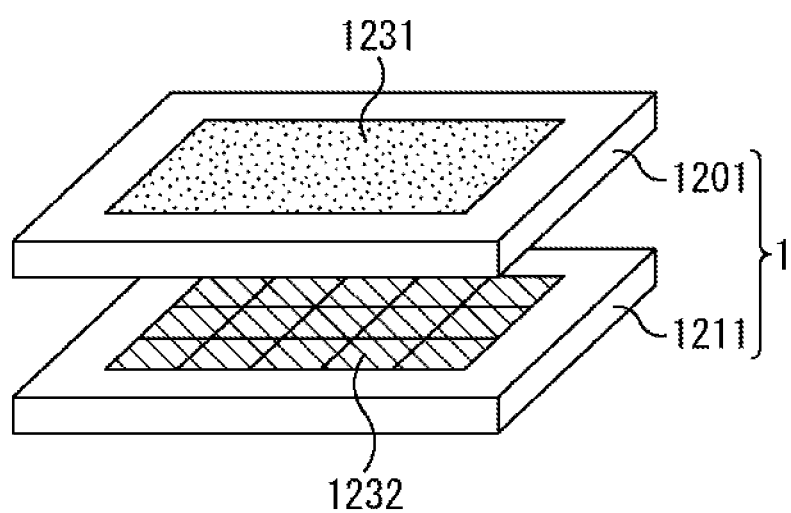
FIG. 58 is a view describing a substrate configuration according to the eighteenth embodiment.

When illustrating the light-receiving element 1 according to the eighteenth embodiment with reference to FIGS. 47A to 47C, as illustrated in FIG. 58, the light-receiving element 1 is constituted by laminating the substrate 1201 and the substrate 1211.

A portion excluding the transfer transistor 721, the FD 722, the reset transistor 723, the amplification transistor 724, and the selection transistor 725 from the pixel array region 951 illustrated in FIG. 47C is formed in a pixel array region 1231 of the substrate 1201.

In addition to the area control circuit 954 illustrated in FIG. 47C, the transfer transistor 721, the FD 722, the reset transistor 723, the amplification transistor 724, and the selection transistor 725 of each pixel of the pixel array unit 20 are formed in an area control circuit 1232 of the substrate 1211. The tap drive unit 21, the vertical drive unit 22, the column processing unit 23, the horizontal drive unit 24, the system control unit 25, the signal processing unit 31, and the data storage unit 32 illustrated in FIG. 1 are also formed in the substrate 1211.

Figure 59:
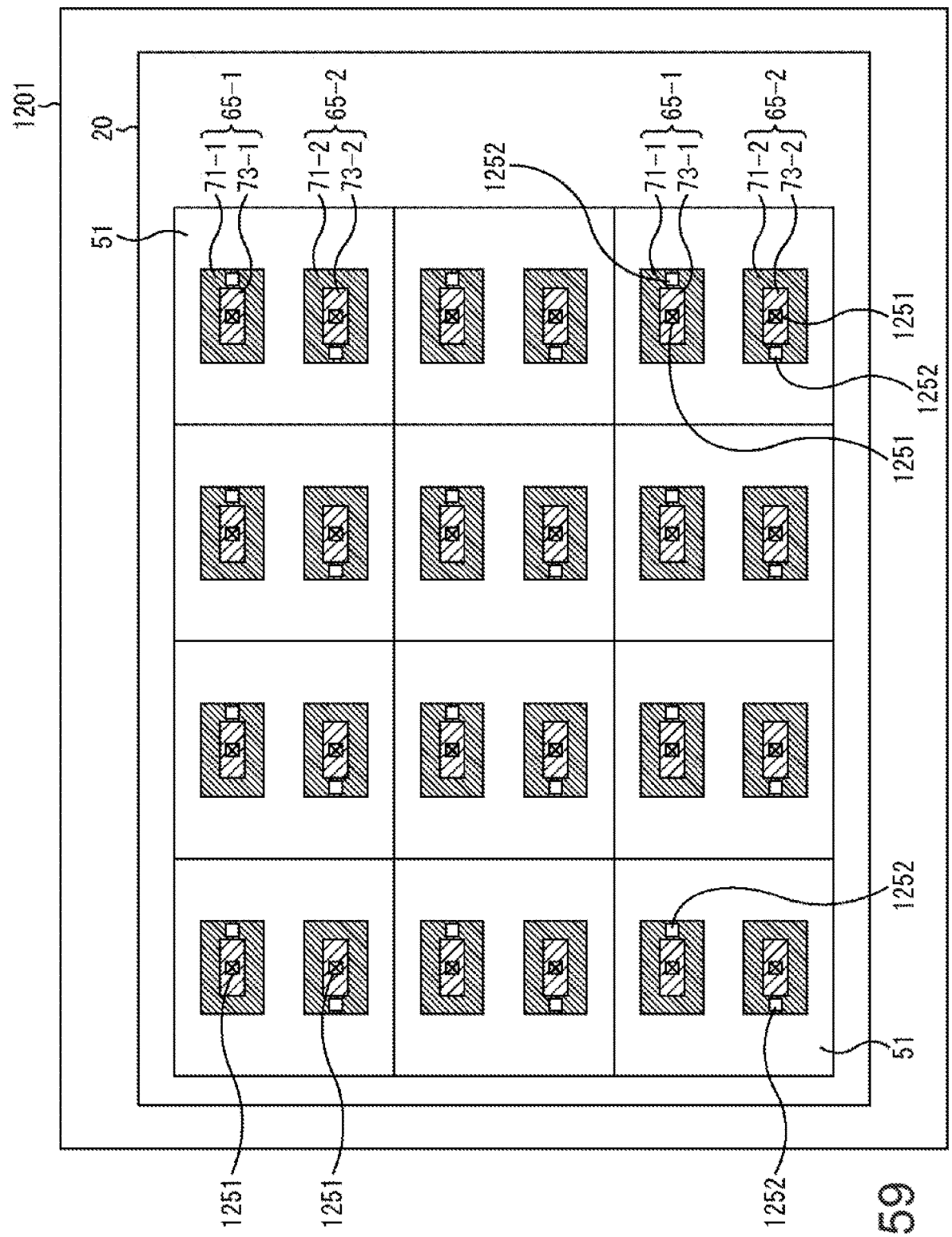
FIG. 59 is a plan view illustrating an arrangement of a MIX bonding portion and a DET bonding portion.

FIG. 59 is a plan view illustrating a MIX bonding portion that is an electrical bonding portion between the substrate 1201 and the substrate 1211 which transmit and receive the voltage MIX, and a DET bonding portion that is an electrical bonding portion between the substrate 1201 and the substrate 1211 which transmit and receive the signal charge DET. It should be noted that in FIG. 59, parts of the reference numerals of a MIX bonding portion 1251 and a DET bonding portion 1252 are omitted to prevent complication of the drawing.

As illustrated in FIG. 59, the MIX bonding portion 1251 for supplying the voltage MIX and the DET bonding portion 1252 for acquiring the signal charge DET are provided, for example, for every pixel 51. In this case, the voltage MIX and the signal charge DET are transmitted and received between the substrate 1201 and the substrate 1211 in a pixel unit.

Figure 60:
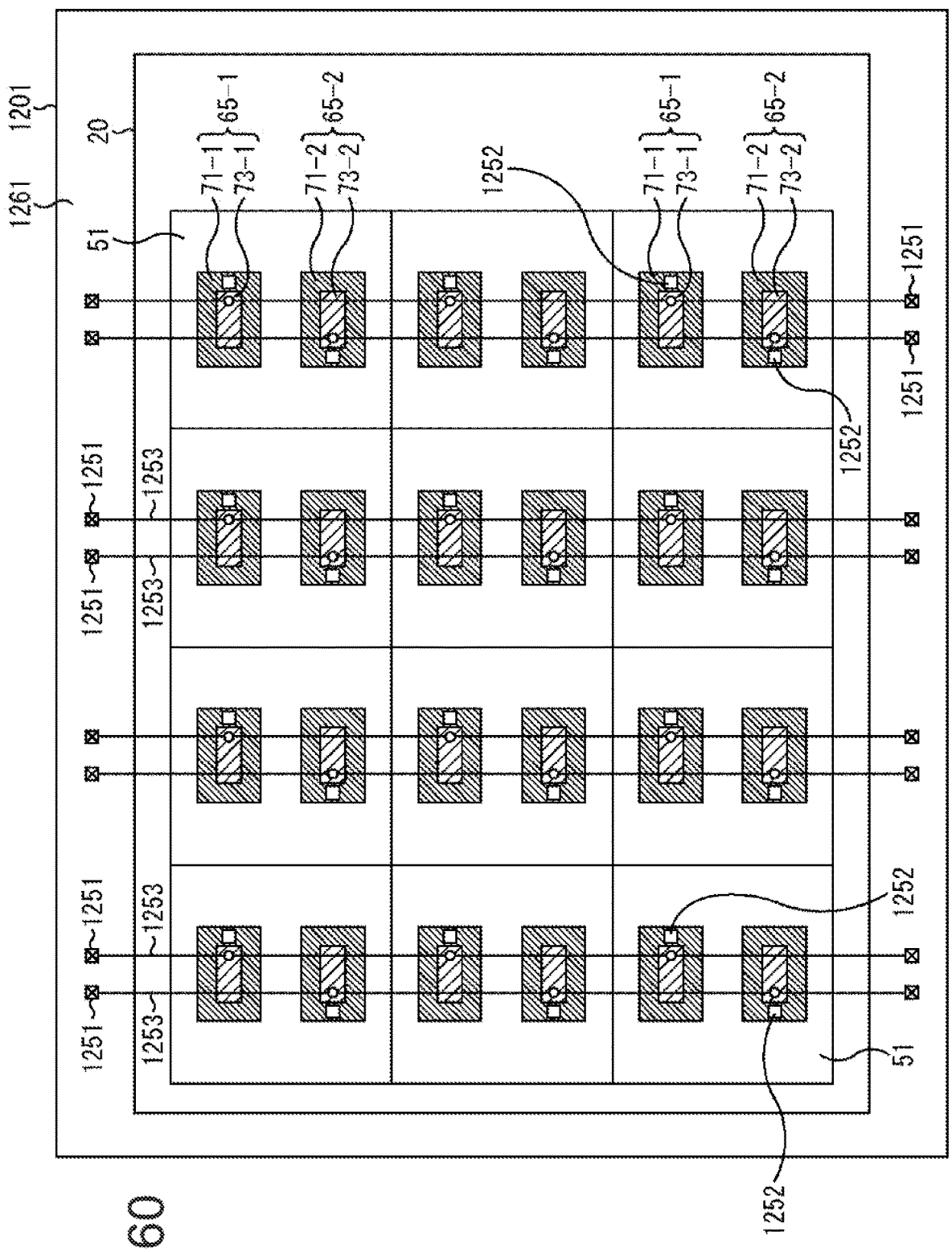
FIG. 60 is a plan view illustrating an arrangement of the MIX bonding portion and the DET bonding portion.

Alternatively, as illustrated in FIG. 60, the DET bonding portion 1252 for acquiring the signal charge DET is provided in a pixel region in a pixel unit, but the MIX bonding portion 1251 for supplying the voltage MIX may be formed in a peripheral portion 1261 on an outer side of the pixel array unit 20. In the peripheral portion 1261, the voltage MIX that is supplied from the substrate 1211 is supplied to the P+ semiconductor region 73 that is the voltage application unit of the pixel 51 through a voltage supply line 1253 that is wired in a vertical direction in the substrate 1201. As described above, the MIX bonding portion 1251 that supplies the voltage MIX is set to be common to multiple pixels, and thus it is possible to reduce the number of the MIX bonding portions 1251 in the entirety of the substrate, and a reduction in a pixel size or a chip size becomes easy.

It should be noted that the example in FIG. 60 is an example in which the voltage supply line 1253 is wired in the vertical direction and is set to be common in a pixel column, but the voltage supply line 1253 may be wired in a horizontal direction, and may be set to be common in a pixel row.

In addition, in the eighteenth embodiment, description has been given of an example in which electrical bonding between the substrate 1201 and the substrate 1211 is set to electrical connection by the Cu—Cu bonding, but the other electrical connection methods, for example, through chip via (TCV), bump bonding that uses microbump, and the like may be used.

In accordance with the eighteenth embodiment, the light-receiving element 1 is constituted by a lamination structure of the substrate 1201 and the substrate 1211, and all pixel transistors which perform an operation of reading out the signal charge DET of the N+ semiconductor region 71 as the charge detection unit, that is, the transfer transistor 721, the reset transistor 723, the amplification transistor 724, and the selection transistor 725 are disposed in the substrate 1211 different from the substrate 1201 including the P-type semiconductor region 1204 as the photoelectric conversion region. Accordingly, it is possible to solve the problem described with reference to FIG. 55.

That is, an area of the pixel 51 can be reduced regardless of an area of the pixel transistor interconnection region 831, and it is possible to realize high resolution without changing an optical size. In addition, an increase in current from the signal extraction unit 65 to the pixel transistor interconnection region 831 is avoided, and thus it is possible to reduce current consumption.

Nineteenth Embodiment

Next, a nineteenth embodiment will be described.

Figure 61:
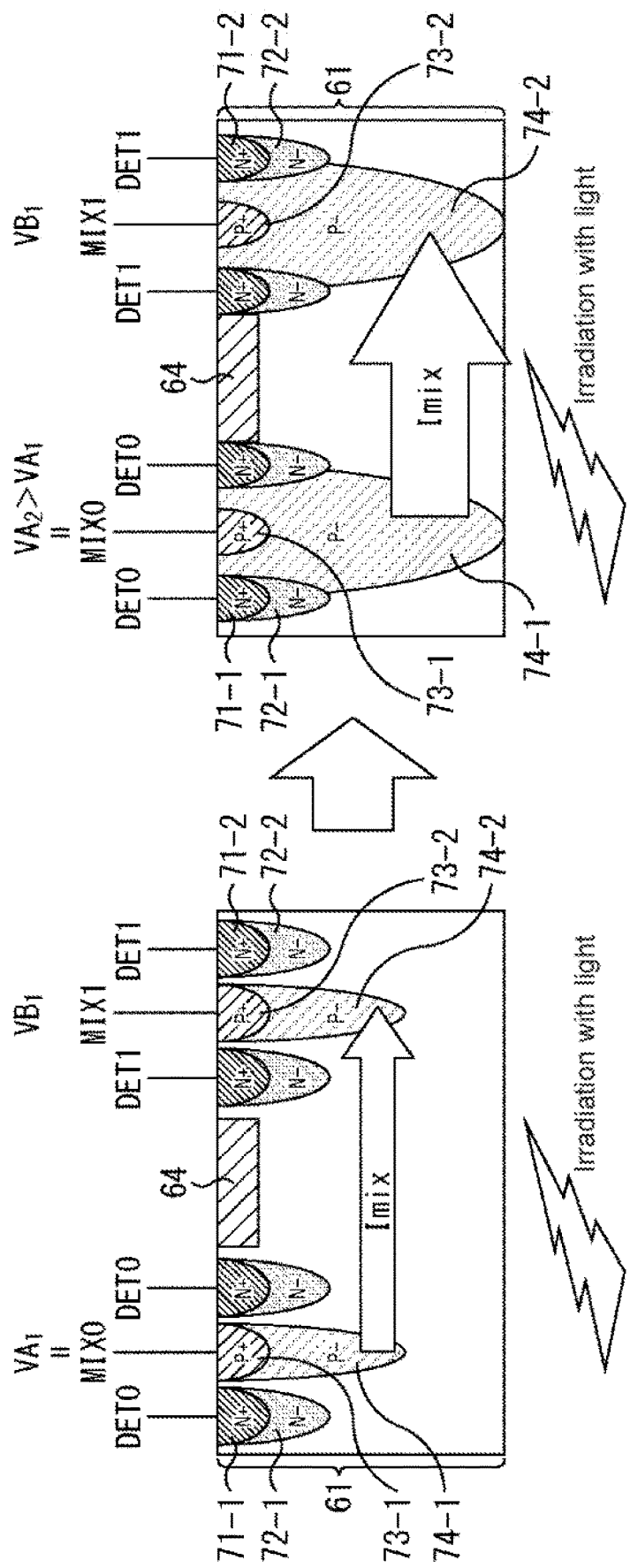
FIG. 61 is a view describing a problem of an increase in current consumption.

It is necessary to strengthen a potential of the P+ semiconductor region 73 or the P− semiconductor region 74 as the voltage application unit to enhance the charge separation efficiency Cmod of the CAPD sensor. Particularly, in a case where it is necessary to detect long-wavelength light such as infrared light with high sensitivity, as illustrated in FIG. 61, it is necessary to broaden the P− semiconductor region 74 up to a deep position of a semiconductor layer, or to raise a positive voltage that is applied to a voltage $VA_2$ higher than a voltage $VA_1$. In this case, a current Imix is likely to flow due to low resistance between voltage application units, and thus an increase in current consumption becomes a problem. In addition, in a case where a pixel size is miniaturized to raise resolution, a distance between the voltage application units is shortened, and thus resistance decreases. Accordingly, an increase in current consumption becomes a problem.

<First Configuration Example of Nineteenth Embodiment>

FIG. 62A is a plan view of a pixel according to a first configuration example of the nineteenth embodiment, and FIG. 62B is a cross-sectional view of the pixel according to the first configuration example of the nineteenth embodiment.

FIG. 62A is a plan view taken along line B-B' in FIG. 62B, and FIG. 62B is a cross-sectional view taken along line A-A' in FIG. 62A.

It should be noted that in FIGS. 62A and 62B, only portions formed in the substrate 61 of the pixel 51 are illustrated, and for example, the on-chip lens 62 formed on a light incident surface side, the multilayer interconnection layer 811 formed on a side opposite to the light incident surface, and the like are omitted in the drawings. The portions which are not illustrated can be constituted in a similar manner as in the above-described embodiments. For example, the reflection member 631 or the light-shielding member 631' can be provided in the multilayer interconnection layer 811 opposite to the light incident surface.

In the first configuration example of the nineteenth embodiment, an electrode unit 1311-1 functioning as a voltage application unit that applies a predetermined voltage MIX0 and an electrode unit 1311-2 functioning as a voltage application unit that applies a predetermined voltage MIX1 are formed at a predetermined position of a P-type semiconductor region 1301.

The electrode unit 1311-1 includes an embedded portion 1311A-1 that is embedded into the P-type semiconductor region 1301 of the substrate 61, and a protruding portion 1311B-1 that protrudes to an upper side of a first surface 1321 of the substrate 61.

Similarly, the electrode unit 1311-2 includes an embedded portion 1311A-2 that is embedded into the P-type semiconductor region 1301 of the substrate 61, and a protruding portion 1311B-2 that protrudes to an upper side of the first surface 1321 of the substrate 61. For example, the electrode units 1311-1 and 1311-2 are formed from a metallic material such as tungsten (W), aluminum (Al), and copper (Cu), silicon, or a conductive material such as polysilicon.

As illustrated in FIG. 62A, the electrode unit 1311-1 (embedded portion 1311A-1 thereof) and the electrode unit 1311-2 (embedded portion 1311A-2 thereof) of which a planar shape is a circular shape are disposed in point symmetry with the central point of a pixel set as a symmetry point.

An N+ semiconductor region 1312-1 that functions as a charge detection unit is formed at the outer periphery (periphery) of the electrode unit 1311-1, and an insulating film 1313-1 and a hole concentration strengthening layer 1314-1 are inserted between the electrode unit 1311-1 and the N+ semiconductor region 1312-1.

Similarly, an N+ semiconductor region 1312-2 that functions as a charge detection unit is formed at the outer periphery (periphery) of the electrode unit 1311-2, and an insulating film 1313-2 and a hole concentration strengthening layer 1314-2 are inserted between the electrode unit 1311-2 and the N+ semiconductor region 1312-2.

The electrode unit 1311-1 and the N+ semiconductor region 1312-1 constitute the signal extraction unit 65-1, and the electrode unit 1311-2 and the N+ semiconductor region 1312-2 constitute the signal extraction unit 65-2.

At the inside of the substrate 61, as illustrated in FIG. 62B, the electrode unit 1311-1 is covered with the insulating film 1313-1, and the insulating film 1313-1 is covered with the hole concentration strengthening layer 1314-1. This is true of a relationship between the electrode unit 1311-2, the insulating film 1313-2, and the hole concentration strengthening layer 1314-2.

For example, the insulating films 1313-1 and 1313-2 are constituted by an oxide film ($SiO_2$), and is formed in the same process as in an insulating film 1322 formed on the first surface 1321 of the substrate 61. It should be noted that the insulating film 1332 is also formed on a second surface 1331 opposite to the first surface 1321 of the substrate 61.

The hole concentration strengthening layers 1314-1 and 1314-2 are constituted by a P-type semiconductor region, and can be formed, for example, by an ion implantation method, a solid-phase diffusion method, a plasma doping method, or the like.

Hereinafter, in a case where it is not necessary to particularly distinguish the electrode unit 1311-1 and the electrode unit 1311-2, the units are also referred to simply as an electrode unit 1311, and in a case where it is not necessary to particularly distinguish the N+ semiconductor region 1312-1 and the N+ semiconductor region 1312-2, the regions are also referred to simply as an N+ semiconductor region 1312.

In addition, in a case where it is not necessary to particularly distinguish the hole concentration strengthening layer 1314-1 and the hole concentration strengthening layer 1314-2, the layers are referred to simply as a hole concentration strengthening layer 1314, and in a case where it is not particularly distinguish the insulating film 1313-1 and the insulating film 1313-2, the layers are also referred to simply as an insulating film 1313.

The electrode unit 1311, the insulating film 1313, and the hole concentration strengthening layer 1314 can be formed in the following procedure. First, the P-type semiconductor region 1301 of the substrate 61 is etched from the first surface 1321 side to form a trench up to a predetermined depth. Next, the hole concentration strengthening layer 1314 is formed on an inner periphery of the formed trench by the ion implantation method, the solid phase diffusion method, the plasma doping method, or the like, and then the insulating film 1313 is formed. Next, a conductive material is embedded into the insulating film 1313 to form the embedded portion 1311A. Then, a conductive material such as a metallic material is formed on the entire surface of the first surface 1321 of the substrate 61, and only an upper portion of the electrode unit 1311 is left through etching, thereby forming the protruding portion 1311B-1.

The depth of electrode unit 1311 is set to be deeper at least in comparison to the N+ semiconductor region 1312 that is a charge detection unit, and it is desirable to set the depth to be deeper than approximately the half of the thickness of the substrate 61.

In accordance with the pixel 51 according to the first configuration example of the nineteenth embodiment, the trench is formed in a depth direction of the substrate 61, and the conductive material is embedded into the trench to form the electrode unit 1311. Due to the electrode unit 1311, a charge distribution effect is obtained with respect to charges which are photoelectrically converted in a wide region in the depth direction of the substrate 61, and thus it is possible to enhance the charge separation efficiency Cmod with respect to long-wavelength light.

In addition, a current flowing between voltage application units is suppressed due to a structure in which the outer peripheral portion of the electrode unit 1311 is covered with the insulating film 1313, and thus it is possible to reduce current consumption. In addition, in the case of comparison at the same current consumption, it is possible to apply a high voltage to the voltage application units. In addition, even when shortening a distance between the voltage application units, it is possible to suppress current consumption, and thus it is possible to realize high resolution by reducing a pixel size and by increasing the number of pixels.

It should be noted that in the first configuration example of the nineteenth embodiment, the protruding portion 1311B of the electrode unit 1311 may be omitted, but when the protruding portion 1311B is provided, an electric field in a direction perpendicular to the substrate 61 becomes strong and thus it is easy to collect charges.

In addition, in the case of desiring to raise the degree of modulation by an application voltage, and of desiring to enhance the charge separation efficiency Cmod, the hole concentration strengthening layer 1314 may be omitted. In a case where the hole concentration strengthening layer 1314 is provided, it is possible to suppress electron generation due to damages or contaminants when performing etching to form the trench.

In the first configuration example of the nineteenth embodiment, either the first surface 1321 or the second surface 1331 of the substrate 61 may be set as a light incident surface, and either the back-illuminated type or the front-illuminated type is possible, but the back-illuminated type is more desirable.

<Second Configuration Example of Nineteenth Embodiment>

FIG. 63A is a plan view of a pixel according to a second configuration example of the nineteenth embodiment, and FIG. 63B is a cross-sectional view of the pixel according to the second configuration example of the nineteenth embodiment.

FIG. 63A is a plan view taken along line B-B' in FIG. 63B, and FIG. 63B is a cross-sectional view taken along line A-A' in FIG. 63A.

It should be noted that in the second configuration example in FIGS. 63A and 63B, the same reference numeral will be given to a portion corresponding to FIG. 62, and description will be made with focus given to a portion different from the first configuration example in FIGS. 62A and 62B, and description of a common portion will be appropriately omitted.

A difference of the second configuration example in FIGS. 63A and 63B is in that the embedded portion 1311A of the electrode unit 1311 penetrates through the substrate 61 that is a semiconductor layer, and the other configurations are common. The embedded portion 1311A of the electrode unit 1311 is formed in a range from the first surface 1321 to the second surface 1331 of the substrate 61, and the insulating film 1313 and the hole concentration strengthening layer 1314 are also formed at the outer peripheral portion of the electrode unit 1311. With regard to the second surface 1331 on a side in which the N+ semiconductor region 1312 as a charge detection unit is not formed, an entire surface thereof is covered with the insulating film 1332.

As in the second configuration example, the embedded portion 1311A of the electrode unit 1311 as a voltage application unit may be configured to penetrate through the substrate 61. Even in this case, a charge distribution effect is obtained with respect to charges which are photoelectrically converted in a wide region in the depth direction of the substrate 61, and thus it is possible to enhance the charge separation efficiency Cmod with respect to long-wavelength light.

In addition, a current flowing between voltage application units is suppressed due to a structure in which the outer peripheral portion of the electrode unit 1311 is covered with the insulating film 1313, and thus it is possible to reduce current consumption. In addition, in the case of comparison at the same current consumption, it is possible to apply a high voltage to the voltage application units. In addition, even when shortening a distance between the voltage application units, it is possible to suppress current consumption, and thus it is possible to realize high resolution by reducing a pixel size and by increasing the number of pixels.

In the second configuration example of the nineteenth embodiment, either the first surface 1321 or the second surface 1331 of the substrate 61 may be set as a light incident surface, and either the back-illuminated type or the front-illuminated type is possible, but the back-illuminated type is more desirable.

<Other Examples of Planar Shape>

In the first configuration example and the second configuration example of the nineteenth embodiment, a planar shape of the electrode unit 1311 that is a voltage application unit and the N+ semiconductor region 1312 that is a charge detection unit is set to a circular shape.

However, the planar shape of the electrode unit 1311 and the N+ semiconductor region 1312 is not limited to the circular shape, and may be a shape such as the octagonal shape illustrated in FIG. 11, the rectangular shape illustrated in FIG. 12, and a square shape. In addition, the number of the signal extraction units 65 (taps) disposed in one pixel is not limited to two, and may be four as illustrated in FIG. 17, or the like.

Figure 64A:
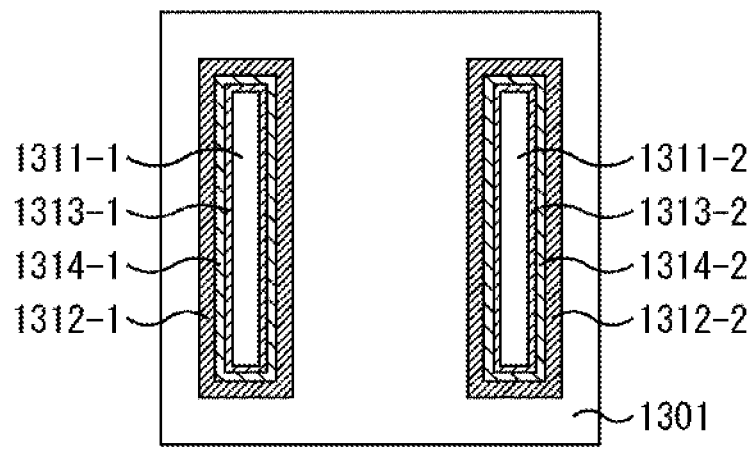
FIGS. 64A to 64C are views illustrating other planar shapes of the first configuration example and the second configuration example of the nineteenth embodiment.
Figure 64B:
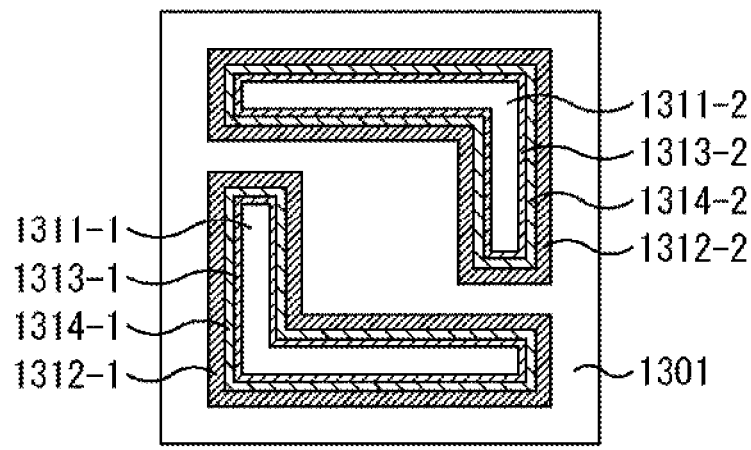
Figure 64C:
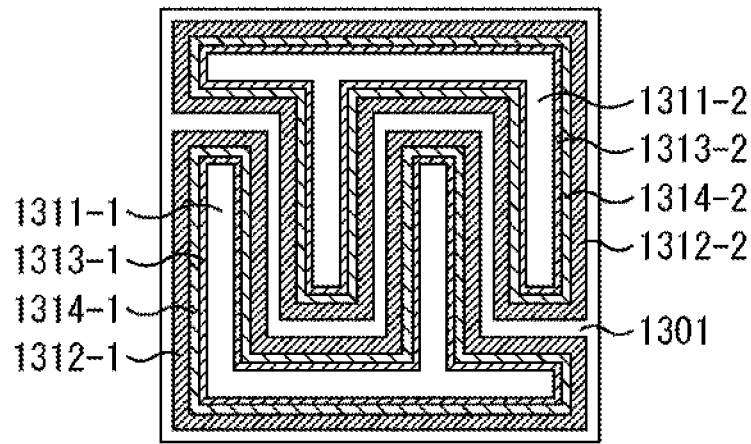

FIGS. 64A to 64C are plan views corresponding to line B-B' in FIG. 62B, and illustrate an example in which the number of the signal extraction units 65 is two, and a planar shape of the electrode unit 1311 and the N+ semiconductor region 1312 which constitute each of the signal extraction units 65 is set to a shape other than the circular shape.

FIG. 64A illustrates an example in which the planar shape of the electrode unit 1311 and the N+ semiconductor region 1312 is a vertically elongated rectangular shape that is elongated in a vertical direction.

In FIG. 64A, the electrode unit 1311-1 and the electrode unit 1311-2 are disposed in point symmetry with the central point of a pixel set as a symmetry point. In addition, the electrode unit 1311-1 and the electrode unit 1311-2 are disposed to be opposite to each other. A shape and positional relationship of the insulating film 1313, the hole concentration strengthening layer 1314, and the N+ semiconductor region 1312 which are formed at the outer periphery of the electrode unit 1311 are also similar to those of the electrode unit 1311.

FIG. 64B illustrates an example in which the planar shape of the electrode unit 1311 and the N+ semiconductor region 1312 is an L-shape.

FIG. 64C illustrates an example in which the planar shape of the electrode unit 1311 and the N+ semiconductor region 1312 is a comb shape.

In FIGS. 64B and 64C, the electrode unit 1311-1 and the electrode unit 1311-2 are disposed in point symmetry with the central point of a pixel set as a symmetry point. In addition, the electrode unit 1311-1 and the electrode unit 1311-2 are disposed to be opposite to each other. A shape and positional relationship of the insulating film 1313, the hole concentration strengthening layer 1314, and the N+ semiconductor region 1312 which are formed at the outer periphery of the electrode unit 1311 are also similar to those of the electrode unit 1311.

Figure 65A:
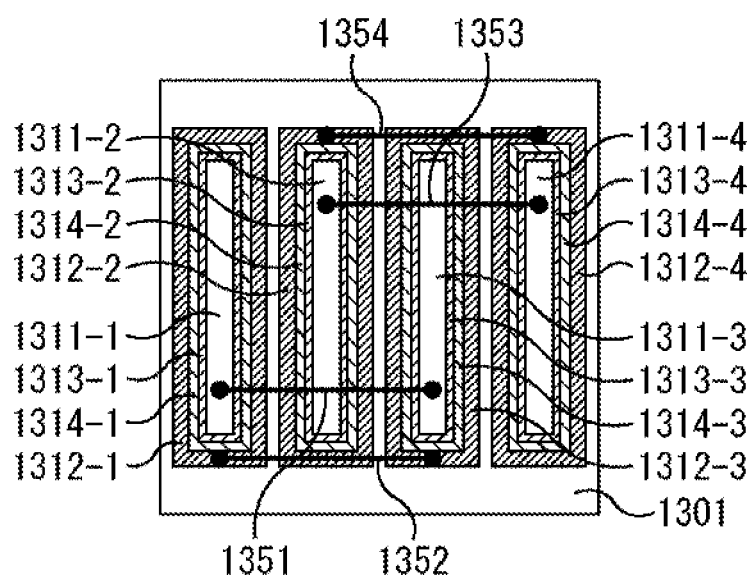
FIGS. 65A to 65C are views illustrating other planar shapes of the first configuration example and the second configuration example of the nineteenth embodiment.
Figure 65B:
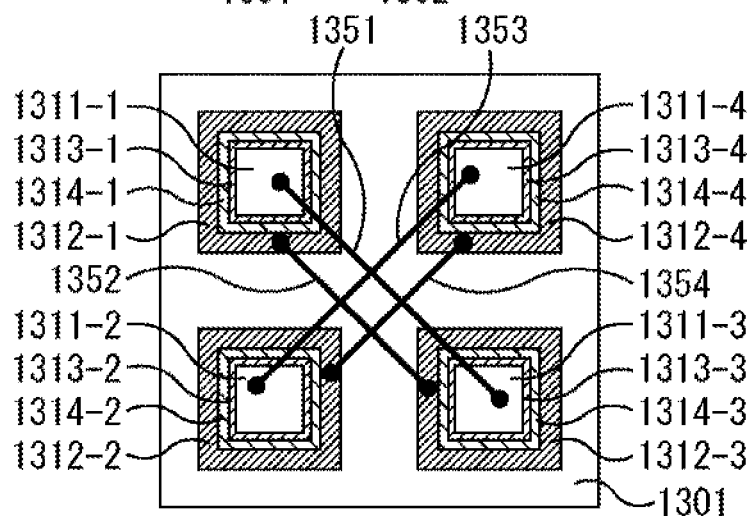
Figure 65C:
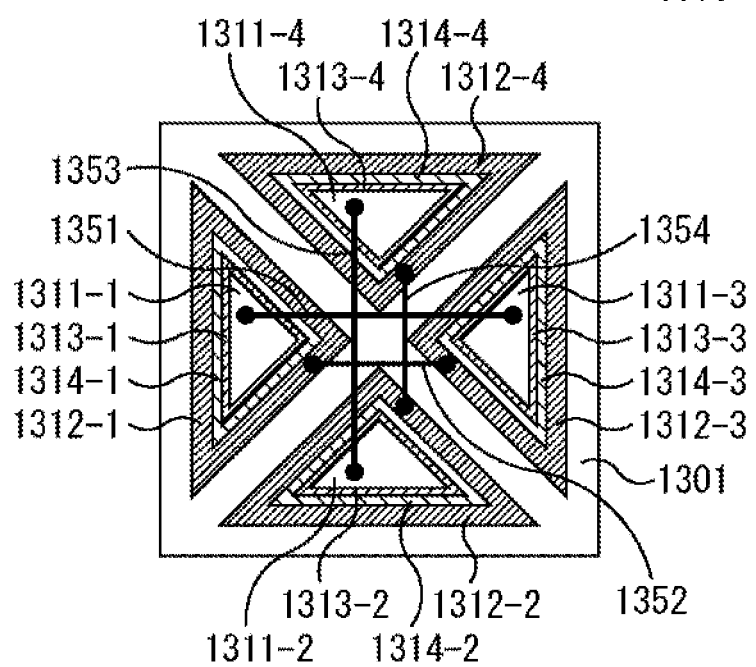

FIGS. 65A to 65C are plan views corresponding to line B-B' in FIG. 62B, and illustrate an example in which the number of the signal extraction units 65 is four, and the planar shape of the electrode unit 1311 and the N+ semiconductor region 1312 which constitute each of the signal extraction units 65 is set to a shape other than the circular shape.

FIG. 65A illustrates an example in which the planar shape of the electrode unit 1311 and the N+ semiconductor region 1312 is a vertically elongated rectangular shape that is elongated in a vertical direction.

In FIG. 65A, the vertically elongated electrode units 1311-1 to 1311-4 are disposed with predetermined intervals in a horizontal direction, and are disposed in point symmetry with the central point of a pixel set as a symmetry point. In addition, the electrode units 1311-1 and 1311-2, and the electrode units 1311-3 and 1311-4 are disposed to be opposite to each other.

The electrode unit 1311-1 and the electrode unit 1311-3 are electrically connected to each other by an interconnection 1351, and constitute, for example, a voltage application unit of the signal extraction unit 65-1 (first tap TA) to which the voltage MIX0 is applied. An N+ semiconductor region 1312-1 and an N+ semiconductor region 1312-3 are electrically connected to each other by an interconnection 1352 and constitute a charge detection unit of the signal extraction unit 65-1 (first tap TA) that detects the signal charge DET1.

The electrode unit 1311-2 and the electrode unit 1311-4 are electrically connected to each other by an interconnection 1353, and constitute, for example, a voltage application unit of the signal extraction unit 65-2 (second tap TB) to which the voltage MIX1 is applied. An N+ semiconductor region 1312-2 and an N+ semiconductor region 1312-4 are electrically connected to each other by an interconnection 1354 and constitute a charge detection unit of the signal extraction unit 65-2 (second tap TB) that detects the signal charge DET2.

Accordingly, in other words, in the arrangement in FIG. 65A, a set of the voltage application unit and the charge detection unit of the signal extraction unit 65-1 of which the planar shape is a rectangular shape, and a set of the voltage application unit and the charge detection unit of the signal extraction unit 65-2 of which the planar shape is a rectangular shape are alternately disposed in a horizontal direction.

A shape and a positional relationship of the insulating film 1313 and the hole concentration strengthening layer 1314 which are formed at the outer periphery of the electrode unit 1311 are similar to the above-described shape and positional relationship.

FIG. 65B illustrates an example in which the planar shape of the electrode unit 1311 and the N+ semiconductor region 1312 is a square shape.

In an arrangement in FIG. 65B, a set of the voltage application unit and the charge detection unit of the signal extraction unit 65-1 of which the planar shape is a rectangular shape are disposed to be opposite to each other in a diagonal direction of the pixel 51, and a set of the voltage application unit and the charge detection unit of the signal extraction unit 65-2 of which the planar shape is a rectangular shape are disposed to be opposite to each other in a diagonal direction different from the diagonal direction in the signal extraction unit 65-1.

FIG. 65C illustrates an example in which the planar shape of the electrode unit 1311 and the N+ semiconductor region 1312 is a triangular shape.

In an arrangement in FIG. 65C, a set of the voltage application unit and the charge detection unit of the signal extraction unit 65-1 of which the planar shape is a triangular shape are disposed to be opposite to each other in a first direction (horizontal direction) of the pixel 51, and a set of the voltage application unit and the charge detection unit of the signal extraction unit 65-2 of which the planar shape is a triangular shape are disposed to be opposite to each other in a second direction (vertical direction) that is perpendicular to the first direction and is different from the direction in the signal extraction unit 65-1.

Even in FIGS. 65B and 65C, a configuration in which the four electrode units 1311-1 to 1311-4 are disposed in point symmetry with the central point of a pixel set as a symmetry point, a configuration in which the electrode unit 1311-1 and the electrode unit 1311-3 are electrically connected to each other by the interconnection 1351, a configuration in which the N+ semiconductor region 1312-1 and the N+ semiconductor region 1312-3 are electrically connected to each other by the interconnection 1352, a configuration in which the electrode unit 1311-2 and the electrode unit 1311-4 are electrically connected to each other by the interconnection 1353, and a configuration in which the N+ semiconductor region 1312-2 and the N+ semiconductor region 1312-4 are electrically connected to each other by the interconnection 1354 are similar to those in FIG. 65A. A shape and a positional relationship of the insulating film 1313 and the hole concentration strengthening layer 1314 which are formed at the outer periphery of the electrode unit 1311 are similar to those in the electrode unit 1311.

<Third Configuration Example of Nineteenth Embodiment>

FIG. 66A is a plan view of a pixel according to a third configuration example of the nineteenth embodiment, and FIG. 66B is a cross-sectional view of the pixel according to the third configuration example of the nineteenth embodiment.

FIG. 66A is a plan view taken along line B-B' in FIG. 66B, and FIG. 66B is a cross-sectional view taken along line A-A' in FIG. 66A.

It should be noted that in the third configuration example in FIGS. 66A and 66B, the same reference numeral will be given to a portion corresponding to the first configuration example in FIGS. 62A and 62B, and description will be made with focus given to a portion different from the first configuration example in FIGS. 62A and 62B, and description of a common portion will be appropriately omitted.

In the first configuration example in FIGS. 62A and 62B, and the second configuration example in FIGS. 63A and 63B, the electrode unit 1311 that is a voltage application unit, and the N+ semiconductor region 1312 that is a charge detection unit are disposed on the same plane side of the substrate 61, that is, at the periphery (in the vicinity) of the first surface 1321 side.

In contrast, in the third configuration example in FIGS. 66A and 66B, the electrode unit 1311 that is a voltage application unit is disposed on a plane side opposite to the first surface 1321 of the substrate 61 in which N+ semiconductor region 1312 that is a charge detection unit is formed, that is, on the second surface 1331 side. The protruding portion 1311B of the electrode unit 1311 is formed on an upper portion of the second surface 1331 of the substrate 61.

In addition, the electrode unit 1311 is disposed at a position at which the central position thereof overlaps the central position of the N+ semiconductor region 1312 in a plan view. The example illustrated in FIGS. 66A and 66B is an example in which circular planar regions of the electrode unit 1311 and the N+ semiconductor region 1312 completely match each other. However, it is not necessary for the planar regions to completely match each other, and a planar region of any one side may be greater as long as the central positions overlap each other. In addition, the central positions may not completely match each other, and may match each other in a certain extent capable of being regarded as approximate matching.

The third configuration example is similar to the first configuration example except for the positional relationship between the electrode unit 1311 and the N+ semiconductor region 1312. As in the third configuration example, the embedded portion 1311A of the electrode unit 1311 as a voltage application unit is formed up to a deep position in the vicinity of the N+ semiconductor region 1312 that is a charge detection unit formed in the first surface 1321 opposite to the second surface 1331 in which the electrode unit 1311 is formed. Even in this case, a charge distribution effect is obtained with respect to charges which are photoelectrically converted in a wide region in the depth direction of the substrate 61, and thus it is possible to enhance the charge separation efficiency Cmod with respect to long-wavelength light.

In addition, a current flowing between voltage application units is suppressed due to a structure in which the outer peripheral portion of the electrode unit 1311 is covered with the insulating film 1313, and thus it is possible to reduce current consumption. In addition, in the case of comparison at the same current consumption, it is possible to apply a high voltage to the voltage application units. In addition, even when shortening a distance between the voltage application units, it is possible to suppress current consumption, and thus it is possible to realize high resolution by reducing a pixel size and by increasing the number of pixels.

In the third configuration example of the nineteenth embodiment, either the first surface 1321 or the second surface 1331 of the substrate 61 may be set as a light incident surface, and either the back-illuminated type or the front-illuminated type is possible, but the back-illuminated type is more desirable. For example, in a case where the third configuration example is configured as the back-illuminated type, the second surface 1331 becomes a surface on a side in which the on-chip lens 62 is formed. For example, as illustrated in FIG. 60, the voltage supply line 1253 that supplies an application voltage to the electrode unit 1311 is set to be wired in a vertical direction of the pixel array unit 20, and can be connected to an interconnection on a front surface side by a through-electrode that penetrates through the substrate 61 at the peripheral portion 1261 on an outer side of the pixel array unit 20.

<Other Examples of Planar Shape>

In the third configuration example of the nineteenth embodiment, a planar shape of the electrode unit 1311 that is a voltage application unit and the N+ semiconductor region 1312 that is a charge detection unit is set to a circular shape.

However, the planar shape of the electrode unit 1311 and the N+ semiconductor region 1312 is not limited to the circular shape, and may be a shape such as the octagonal shape illustrated in FIG. 11, the rectangular shape illustrated in FIG. 12, and a square shape. In addition, the number of the signal extraction units 65 (taps) which are disposed in one pixel is not limited to two, and may be four as illustrated in FIG. 17, or the like.

Figure 67A:
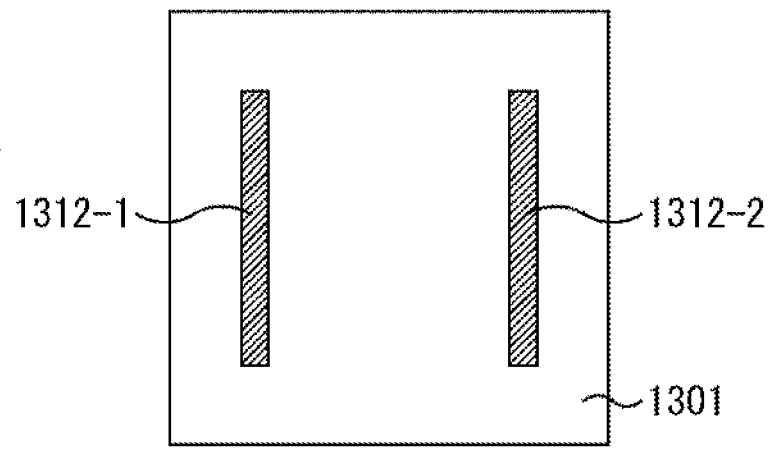
FIGS. 67A to 67C are views illustrating other planar shape of the third configuration example of the nineteenth embodiment.
Figure 67B:
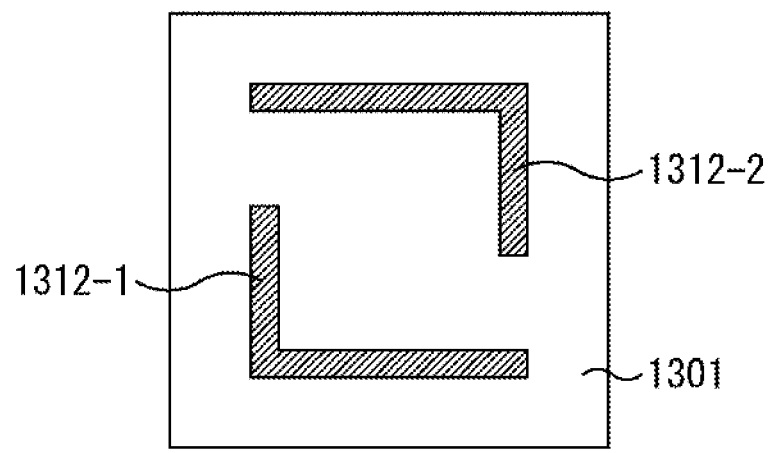
Figure 67C:
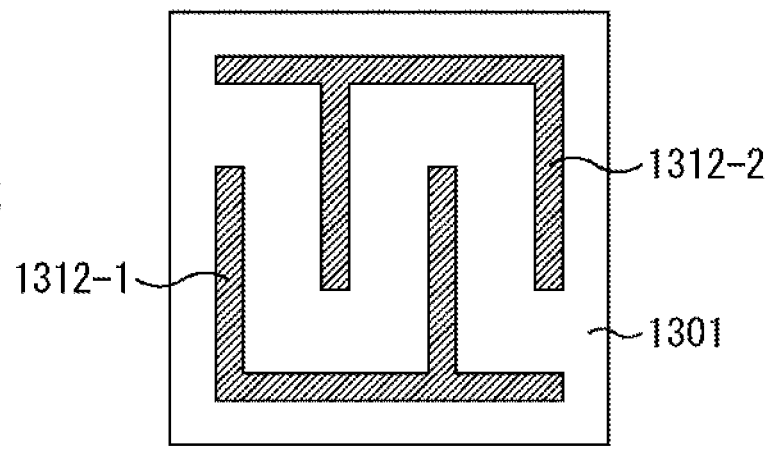

FIGS. 67A to 67C are plan views corresponding to line B-B' in FIG. 66B, and illustrate an example in which the number of the signal extraction units 65 is two, and a planar shape of the electrode unit 1311 and the N+ semiconductor region 1312 which constitute each of the signal extraction units 65 is set to a shape other than the circular shape.

FIG. 67A illustrates an example in which the planar shape of the electrode unit 1311 and the N+ semiconductor region 1312 is a vertically elongated rectangular shape that is elongated in a vertical direction.

In FIG. 67A, the N+ semiconductor region 1312-1 and the N+ semiconductor region 1312-2 which are charge detection units are disposed in point symmetry with the central point of a pixel set as a symmetry point. In addition, the N+ semiconductor region 1312-1 and the N+ semiconductor region 1312-2 are disposed to be opposite to each other. A shape and a positional relationship of the electrode unit 1311 disposed on the second surface 1331 side opposite to a surface in which the N+ semiconductor region 1312 is formed, or the insulating film 1313 and the hole concentration strengthening layer 1314 which are formed at the outer periphery of the electrode unit 1311 is also similar to those in the N+ semiconductor region 1312.

FIG. 67B illustrates an example in which the planar shape of the electrode unit 1311 and the N+ semiconductor region 1312 is an L-shape.

FIG. 67C illustrates an example in which the planar shape of the electrode unit 1311 and the N+ semiconductor region 1312 is a comb shape.

Even in FIGS. 67B and 67C, the N+ semiconductor region 1312-1 and the N+ semiconductor region 1312-2 are disposed in point symmetry with the central point of a pixel set as a symmetry point. In addition, the N+ semiconductor region 1312-1 and the N+ semiconductor region 1312-2 are disposed to be opposite to each other. A shape and a positional relationship of the electrode unit 1311 disposed on the second surface 1331 side opposite to a surface in which the N+ semiconductor region 1312 is formed, or the insulating film 1313 and the hole concentration strengthening layer 1314 which are formed at the outer periphery of the electrode unit 1311 is also similar to those in the N+ semiconductor region 1312.

Figure 68A:
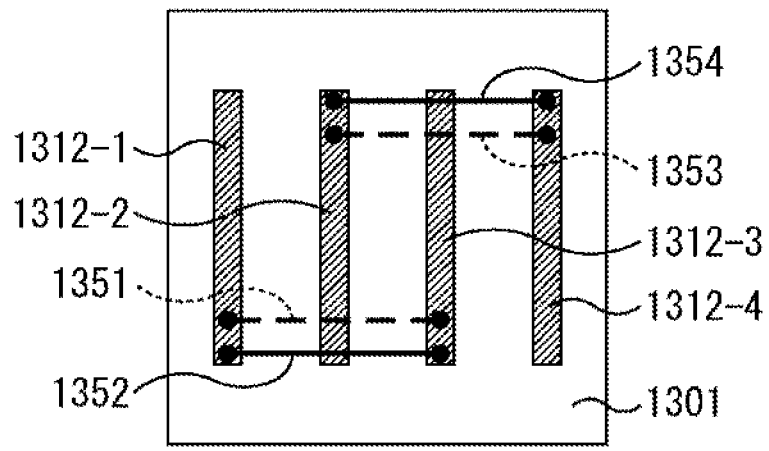
FIGS. 68A to 68C are views illustrating other planar shapes of the third configuration example of the nineteenth embodiment.
Figure 68B:
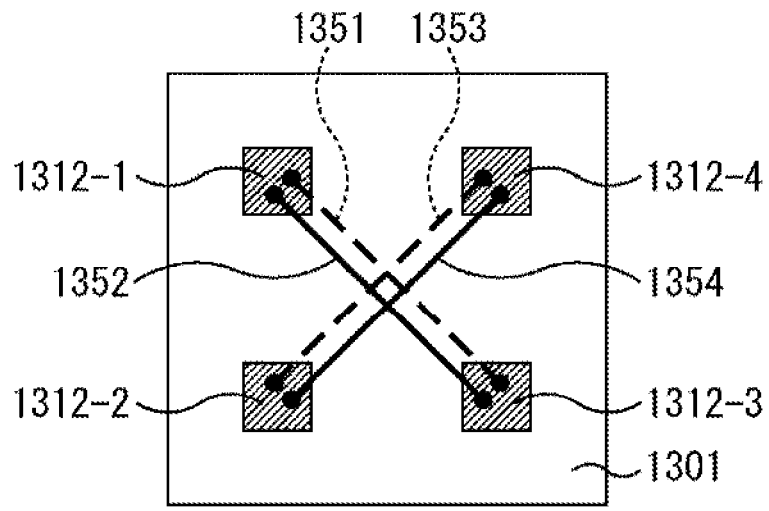
Figure 68C:
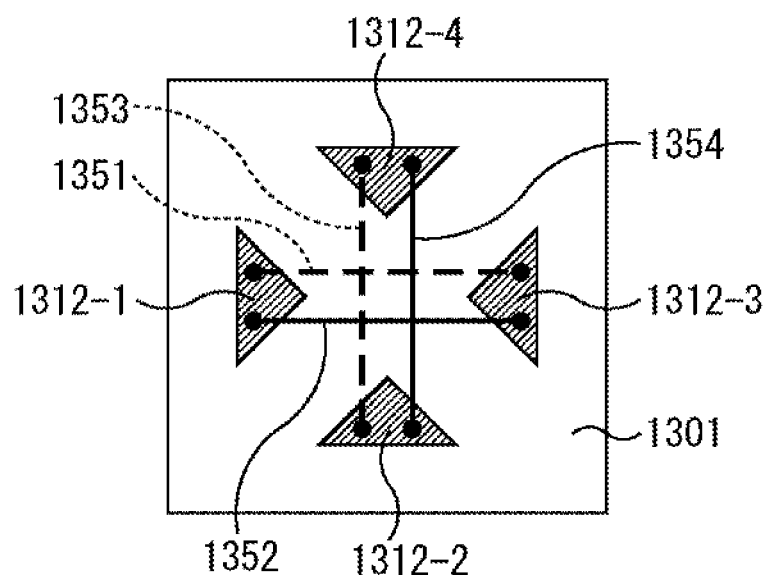

FIGS. 68A to 68C are plan views corresponding to line B-B' in FIG. 66B, and illustrate an example in which the number of the signal extraction units 65 is four, and a planar shape of the electrode unit 1311 and the N+ semiconductor region 1312 which constitute each of the signal extraction units 65 is set to a shape other than the circular shape.

FIG. 68A illustrates an example in which the planar shape of the electrode unit 1311 and the N+ semiconductor region 1312 is a vertically elongated rectangular shape that is elongated in a vertical direction.

In FIG. 68A, the vertically elongated N+ semiconductor regions 1312-1 to 1312-4 are disposed with a predetermined interval in a horizontal direction, and are disposed in point symmetry with the central point of a pixel set as a symmetry point. In addition, the N+ semiconductor regions 1312-1 and 1312-2, and the N+ semiconductor regions 1312-3 and 1312-4 are disposed to be opposite to each other.

The electrode unit 1311-1 and the electrode unit 1311-3 (not illustrated) which are formed on the second surface 1331 side are electrically connected to each other by an interconnection 1351, and constitute, for example, a voltage application unit of the signal extraction unit 65-1 (first tap TA) to which the voltage MIX0 is applied. An N+ semiconductor region 1312-1 and an N+ semiconductor region 1312-3 are electrically connected to each other by an interconnection 1352 and constitute a charge detection unit of the signal extraction unit 65-1 (first tap TA) that detects the signal charge DET1.

The electrode unit 1311-2 and the electrode unit 1311-4 (not illustrated) which are formed on the second surface 1331 side are electrically connected to each other by an interconnection 1353, and constitute, for example, a voltage application unit of the signal extraction unit 65-2 (second tap TB) to which the voltage MIX1 is applied. An N+ semiconductor region 1312-2 and an N+ semiconductor region 1312-4 are electrically connected to each other by an interconnection 1354 and constitute a charge detection unit of the signal extraction unit 65-2 (second tap TB) that detects the signal charge DET2.

Accordingly, in other words, in an arrangement in FIG. 68A, a set of the voltage application unit and the charge detection unit of the signal extraction unit 65-1 of which the planar shape is a rectangular shape, and a set of the voltage application unit and the charge detection unit of the signal extraction unit 65-2 of which the planar shape is a rectangular shape are alternately disposed in a horizontal direction.

A shape and a positional relationship of the insulating film 1313 and the hole concentration strengthening layer 1314 which are formed at the outer periphery of the electrode unit 1311 are similar to the above-described shape and positional relationship.

FIG. 68B illustrates an example in which the planar shape of the electrode unit 1311 and the N+ semiconductor region 1312 is a square shape.

In an arrangement in FIG. 68B, a set of the voltage application unit and the charge detection unit of the signal extraction unit 65-1 of which the planar shape is a rectangular shape are disposed to be opposite to each other in a diagonal direction of the pixel 51, and a set of the voltage application unit and the charge detection unit of the signal extraction unit 65-2 of which the planar shape is a rectangular shape are disposed to be opposite to each other in a diagonal direction different from the diagonal direction in the signal extraction unit 65-1.

FIG. 68C illustrates an example in which the planar shape of the electrode unit 1311 and the N+ semiconductor region 1312 is a triangular shape.

In an arrangement in FIG. 68C, a set of the voltage application unit and the charge detection unit of the signal extraction unit 65-1 of which the planar shape is a triangular shape are disposed to be opposite to each other in a first direction (horizontal direction) of the pixel 51, and a set of the voltage application unit and the charge detection unit of the signal extraction unit 65-2 of which the planar shape is a triangular shape are disposed to be opposite to each other in a second direction (vertical direction) that is perpendicular to the first direction and is different from the direction in the signal extraction unit 65-1.

Even in FIGS. 68B and 68C, a configuration in which the four electrode units 1311-1 to 1311-4 are disposed in point symmetry with the central point of a pixel set as a symmetry point, a configuration in which the electrode unit 1311-1 and the electrode unit 1311-3 are electrically connected to each other by the interconnection 1351, a configuration in which the N+ semiconductor region 1312-1 and the N+ semiconductor region 1312-3 are electrically connected to each other by the interconnection 1352, a configuration in which the electrode unit 1311-2 and the electrode unit 1311-4 are electrically connected to each other by the interconnection 1353, and a configuration in which the N+ semiconductor region 1312-2 and the N+ semiconductor region 1312-4 are electrically connected to each other by the interconnection 1354 are similar. A shape and a positional relationship of the insulating film 1313 and the hole concentration strengthening layer 1314 which are formed at the outer periphery of the electrode unit 1311 are similar to those in the electrode unit 1311.

<Other Examples of Interconnection Arrangement>

In the pixel circuit in FIG. 31 and FIG. 32, or in the example of the metal film M3 in FIGS. 42A to 42C, description has been given of a configuration in which two pieces of the vertical signal lines 29 are disposed in one pixel column in correspondence with the two pieces of the signal extraction units 65 (two pieces of the taps TA and TB).

However, for example, it is possible to employ a configuration in which four pieces of the vertical signal lines 29 are disposed in one pixel column, and pixel signals of a total of four taps of two pixels adjacent to each other in a vertical direction are simultaneously output.

Figure 69:
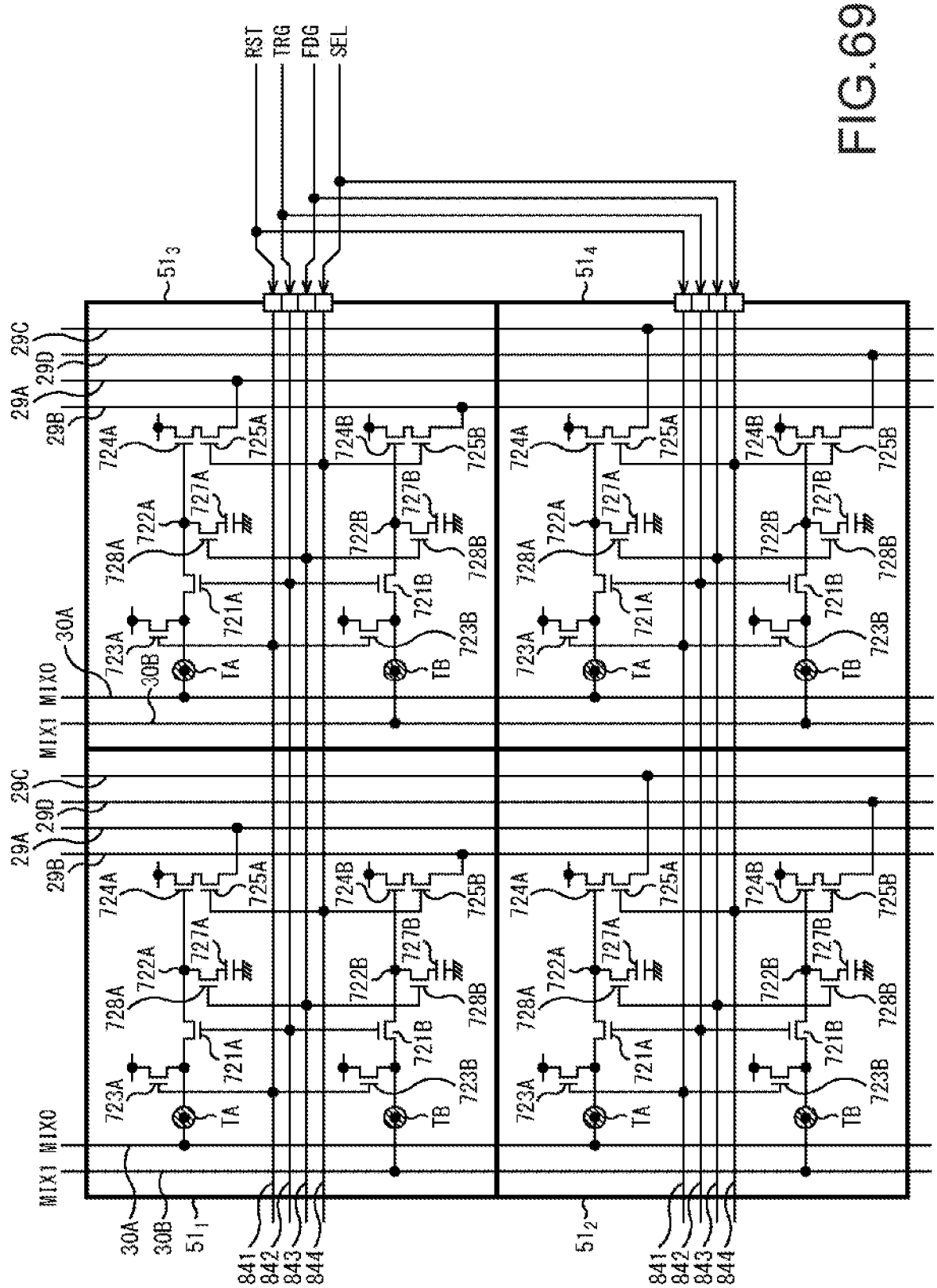
FIG. 69 is a view illustrating a circuit configuration example of a pixel array unit in a case where four-tap pixel signals are simultaneously output.

FIG. 69 illustrates a circuit configuration example of the pixel array unit 20 in the case of simultaneously outputting pixel signals of a total of four taps of two pixels adjacent to each other in a vertical direction.

FIG. 69 illustrates a circuit configuration of four pixels (2×2) among multiple pixels 51 which are tow-dimensionally arranged in a matrix shape in the pixel array unit 20. It should be noted that in the case of distinguishing the four pixels 51 (2×2) in FIG. 69, the pixels 51 are illustrated as pixels $51_1$ to $51_4$.

The circuit configuration of each of the pixels 51 is a circuit configuration including the additional capacitor 727 and the switching transistor 728 that controls connection of the additional capacitor 727 as described above with reference to FIG. 32. Description of the circuit configuration is repeated, and is omitted.

In one pixel column of the pixel array unit 20, voltage supply lines 30A and 30B are wired in a vertical direction. The predetermined voltage MIX0 is supplied to the first tap TA of the multiple pixels 51 arranged in the vertical direction through the vertical supply line 30A, and the predetermined voltage MIX1 is supplied to the second tap TB through the voltage supply line 30B.

In addition, in one pixel row of the pixel array unit 20, four vertical signal lines 29A to 29D are wired in the vertical direction.

In a pixel column of a pixel $51_1$ and a pixel $51_2$, for example, the vertical signal line 29A transfers a pixel signal of a first tap TA of the pixel $51_1$ to the column processing unit 23 (FIG. 1), the vertical signal line 29B transfers a pixel signal of a second tap TB of the pixel $51_1$ to the column processing unit 23, the vertical signal line 29C transfers a pixel signal of a first tap TA of the pixel $51_2$ adjacent to the pixel $51_1$ in the same column to the column processing unit 23, and the vertical signal line 29D transfers a pixel signal of a second tap TB of the pixel $51_2$ to the column processing unit 23.

In a pixel column of a pixel $51_3$ and a pixel $51_4$, for example, the vertical signal line 29A transfers a pixel signal of a first tap TA of the pixel $51_3$ to the column processing unit 23 (FIG. 1), the vertical signal line 29B transfers a pixel signal of a second tap TB of the pixel $51_3$ to the column processing unit 23, the vertical signal line 29C transfers a pixel signal of a first tap TA of the pixel $51_4$ adjacent to the pixel $51_1$ in the same column to the column processing unit 23, and the vertical signal line 29D transfers a pixel signal of a second tap TB of the pixel $51_4$ to the column processing unit 23.

On the other hand, in a horizontal direction of the pixel array unit 20, the control line 841 that transfers the drive signal RST to the reset transistor 723, the control line 842 that transfers the drive signal TRG to the transfer transistor 721, the control line 843 that transfers the drive signal FDG to the switching transistor 728, and the control line 844 that transfers the selection signal SEL to the selection transistor 725 are disposed a pixel row unit.

With regard to the drive signal RST, the drive signal FDG, the drive signal TRG, and the selection signal SEL, the same signal is supplied from the vertical drive unit 22 to respective pixels 51 in two rows adjacent to each other in the vertical direction.

As described above, in the pixel array unit 20, four pieces of the vertical signal lines 29A to 29D are disposed in one pixel column, and thus it is possible to simultaneously read out pixel signals in two-row unit.

Figure 70:
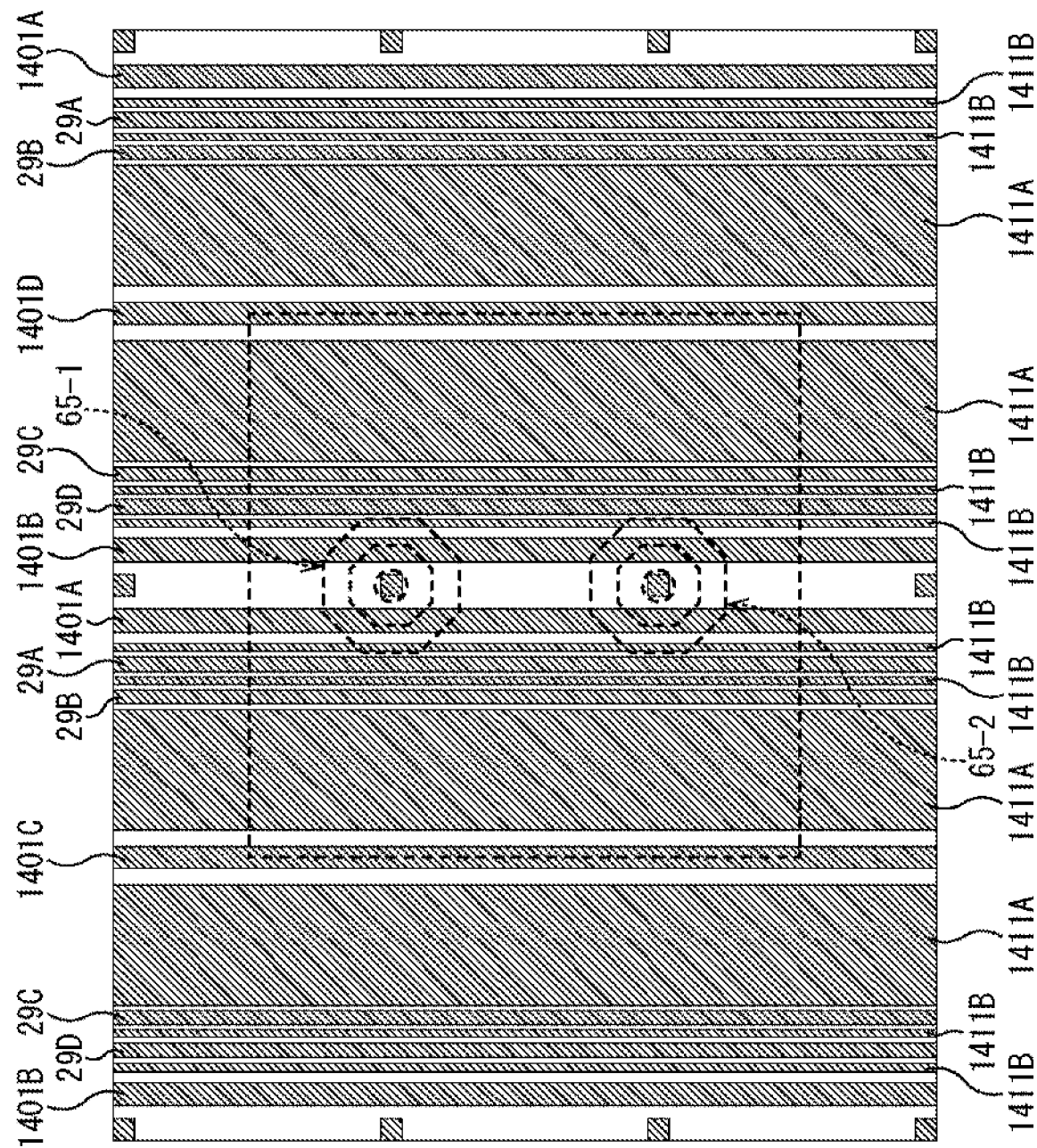
FIG. 70 is a view illustrating an interconnection layout in which four vertical signal lines are disposed.

FIG. 70 illustrates a layout of the third-layer metal film M3 of the multilayer interconnection layer 811 in a case where the four pieces of vertical signal lines 29A to 29D are disposed in one pixel column.

In other words, FIG. 70 is a modification example of the layout of the metal film M3 illustrated in FIG. 42C.

In the layout of the metal film M3 in FIG. 70, the four pieces of vertical signal lines 29A to 29D are disposed in one pixel column. In addition, four pieces of power supply lines 1401A to 1401D which supply a power supply voltage VDD to the one pixel column are disposed in the one pixel column.

It should be noted that in FIG. 70, a region of the pixel 51 and a region of the signal extraction units 65-1 and 65-2 having an octagonal shape illustrated in FIG. 11 are indicated by a broken line for reference. This is also true of FIG. 71 to FIG. 76 to be described later.

In the layout of the metal film M3 illustrated in FIG. 70, a VSS interconnection (ground interconnection) 1411 of a GND potential is disposed near each of the vertical signal lines 29A to 29D, and the power supply lines 1401A to 1401D. The VSS interconnection 1411 includes a VSS interconnection 1411B that is disposed near each of the vertical signal lines 29A to 29D and has a narrow line width, and a VSS interconnection 1411A that is disposed between the vertical signal line 29B and the power supply line 1401C at a pixel boundary portion and between the vertical signal line 29C and the power supply line 1401D at the pixel boundary portion and has a wide line width.

To enhance stability of signals, it is effective to raise the power supply voltage VDD supplied to the power supply line 1401, or to raise the voltages MIX0 and MIX1 supplied through the voltage supply lines 30A and 30B. However, on one side, currents increase and interconnection reliability deteriorates. Here, as illustrated in FIG. 70, with respect to one pixel column, the VSS interconnection 1411A having a line width wider than that of the power supply line 1401 is provided with respect to at least one VSS interconnection 1411, and thus a current density is lowered, and the interconnection reliability can be improved. FIG. 70 illustrates an example in which two pieces of the VSS interconnections 1411A are provided in symmetry at the inside of the pixel region with respect to one pixel column.

In addition, in the layout of FIG. 70, the VSS interconnection 1411 (1411A or 1411B) is disposed near each of the vertical signal lines 29A to 29D. Accordingly, the vertical signal line 29 is less susceptible to a potential fluctuation from the outside.

It should be noted that an adjacent interconnection of the signal line, the power supply line, and the control line may be set to the VSS interconnection in metal films of other layers without limitation to the third-layer metal film M3 of the multilayer interconnection layer 811 illustrated in FIG. 70. For example, with respect to the control lines 841 to 844 of the second-layer metal film M2 illustrated in FIG. 42B, the VSS interconnection may be disposed on both sides of each of the control lines 841 to 844. Accordingly, it is possible to reduce an influence of a potential fluctuation from the outside on the control lines 841 to 844.

Figure 71:
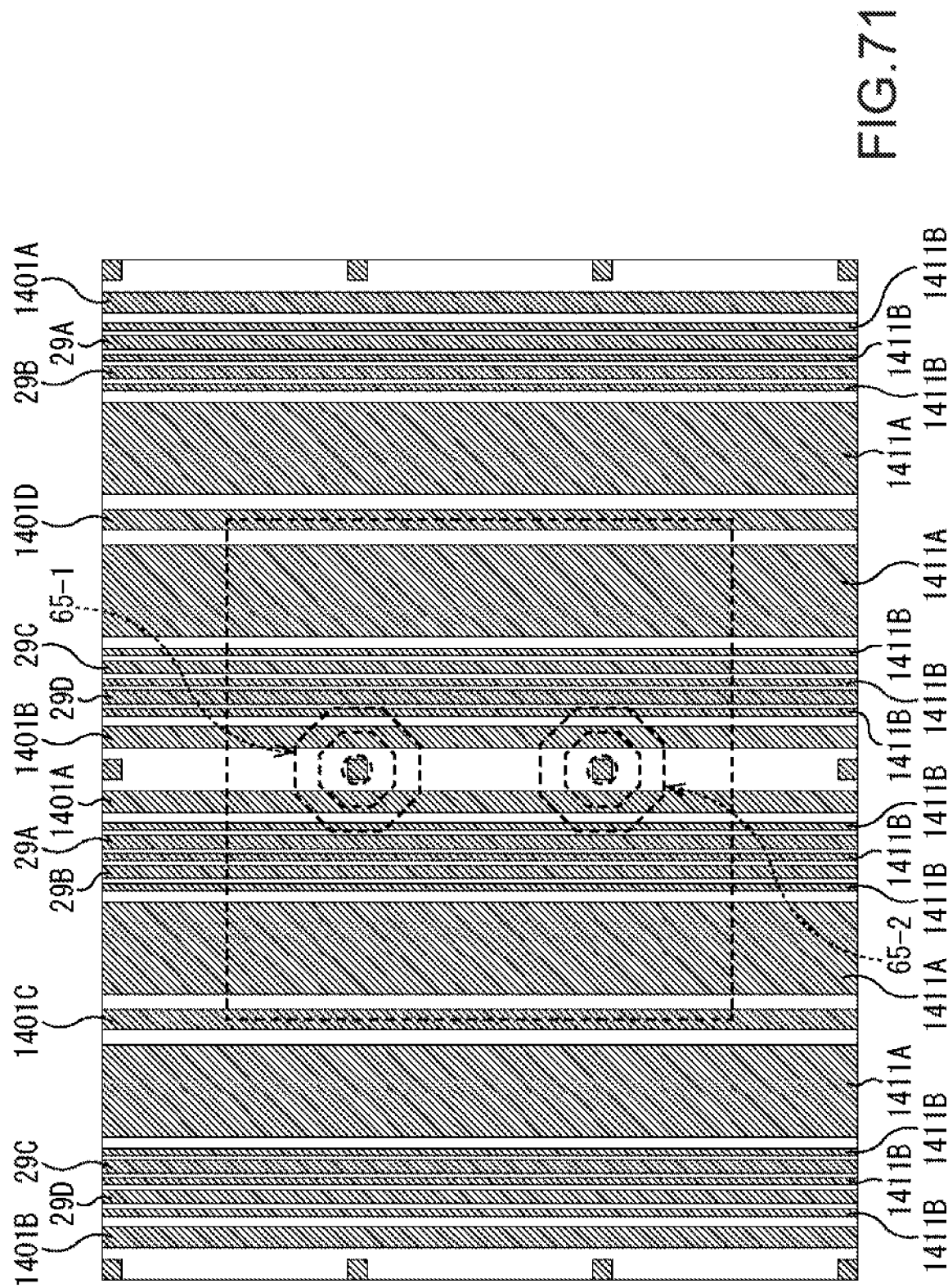
FIG. 71 is a view illustrating Modification Example 1 of the interconnection layout in which the four vertical signal lines are disposed.

FIG. 71 illustrates Modification Example 1 of the layout of the third-layer metal film M3 of the multilayer interconnection layer 811 in a case where four pieces of the vertical signal lines 29A to 29D are disposed in one pixel column.

The layout of the metal film M3 in FIG. 71 is different from the layout of the metal film M3 illustrated in FIG. 70 in that an adjacent VSS interconnection 1411 of each of the four pieces of vertical signal lines 29A to 29D is set to the same line width in each case.

More specifically, in the layout of the metal film M3 illustrated in FIG. 70, the VSS interconnection 1411A having a wide line width and the VSS interconnection 1411B having a narrow line width are disposed on both sides of the vertical signal line 29C, and the VSS interconnection 1411A having a wide line width and the VSS interconnection 1411B having a narrow line width are also disposed on both sides of the vertical signal line 29B.

In contrast, in the layout of the metal film M3 illustrated in FIG. 71, the VSS interconnection 1411B having a narrow line width is disposed on both sides of the vertical signal line 29C, and the VSS interconnection 1411B having a narrow line width is also disposed on both sides of the vertical signal line 29B. The VSS interconnection 1411B having a narrow width is also disposed on both sides of each of the other vertical signal lines 29A and 29D. The line width of the VSS interconnection 1411B on both sides of four pieces of the vertical signal lines 29A to 29D is the same in each case.

When the line width of the VSS interconnection 1411 on both sides of the vertical signal line 29 is set to the same line width, it is possible to make the degree of influence of cross-talk be uniform, and it is possible to reduce a characteristic variation.

Figure 72:
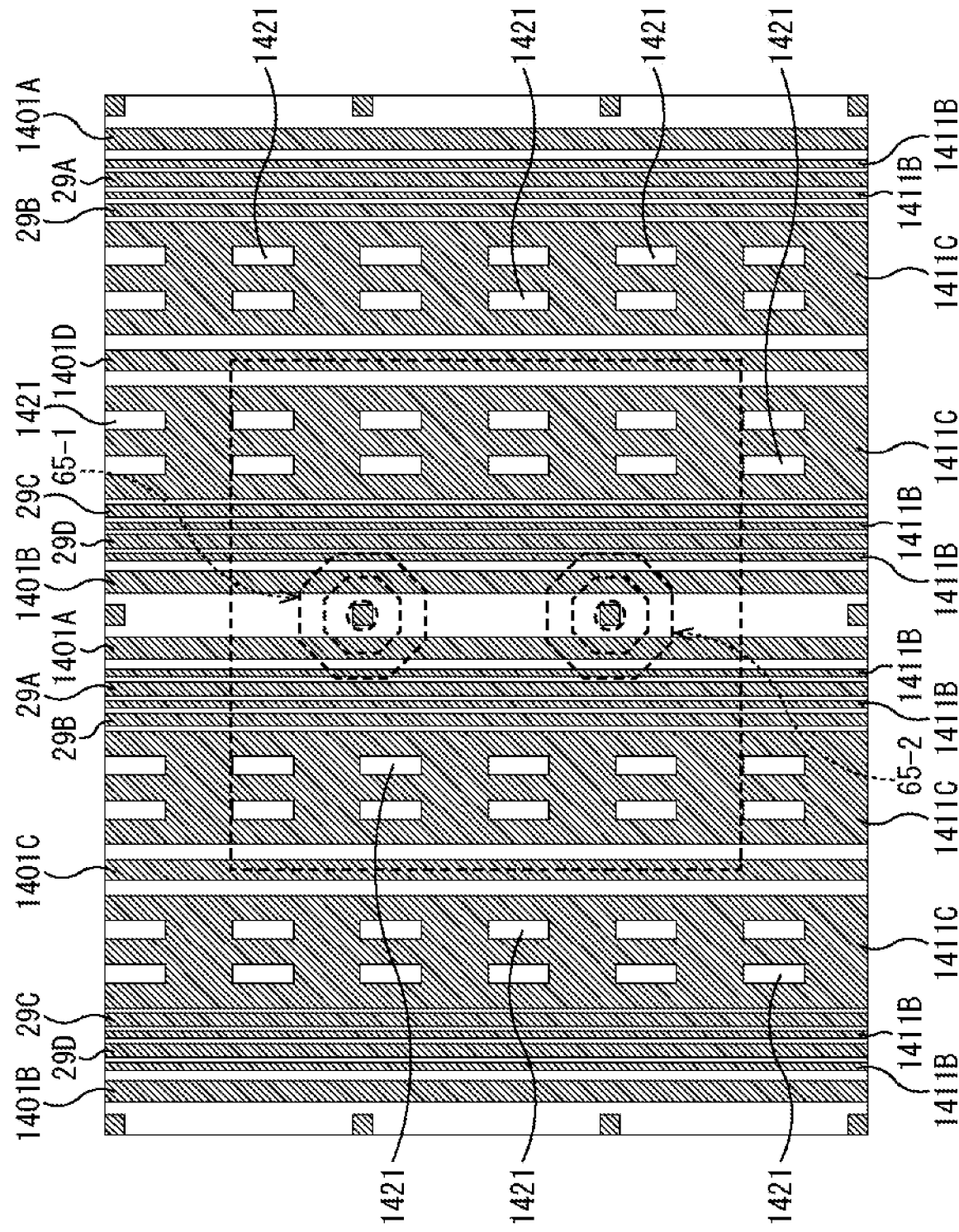
FIG. 72 is a view illustrating Modification Example 2 of the interconnection layout in which the four vertical signal lines are disposed.

FIG. 72 illustrates Modification Example 2 of the layout of the third-layer metal film M3 of the multilayer interconnection layer 811 in a case where four pieces of the vertical signal lines 29A to 29D are disposed in one pixel column.

The layout of the metal film M3 illustrated in FIG. 72 is different from the layout of the metal film M3 illustrated in FIG. 70 in that the VSS interconnection 1411A having a wide line width is substituted with a VSS interconnection 1411C in which a plurality of gaps 1421 are regularly provided on an inner side.

That is, the VSS interconnection 1411C has a line width wider than the power supply line 1401, and in the VSS interconnection 1411C, the plurality of gaps 1421 repeatedly arranged in a predetermined period in the vertical direction. In an example in FIG. 72, a shape of each of the gaps 1421 is a rectangular shape, but the shape may be a circular shape or a polygonal shape without limitation to the rectangular shape.

When the plurality of gaps 1421 are provided on an inner side of the interconnection region, it is possible to improve stability when forming (processing) the VSS interconnection 1411C having a wide width.

It should be noted that FIG. 72 illustrates a layout in which the VSS interconnection 1411A of the metal film M3 illustrated in FIG. 70 is substituted with the VSS interconnection 1411C, but the VSS interconnection 1411A of the metal film M3 illustrated in FIG. 71 may be substituted with the VSS interconnection 1411C.

<Other Layout Examples of Pixel Transistors>

Next, a modification example of the arrangement example of the pixel transistors illustrated in FIG. 44B will be described with reference to FIGS. 73A and 73B.

FIG. 73A is a view illustrating the arrangement of the pixel transistors illustrated in FIG. 44B.

On the other hands, FIG. 73B illustrates a modification example of the arrangement of the pixel transistors.

As illustrated in FIG. 73A and FIG. 44B, on the basis of the central line (not illustrated) of two pieces of the signal extraction units 65-1 and 65-2, gate electrodes of the reset transistors 723A and 723B, the transfer transistors 721A and 721B, the switching transistors 728A and 728B, the selection transistors 725A and 725B, and the amplification transistors 724A and 724B are formed in this order from a side closer to the intermediate line toward an outer side.

In the case of the arrangement of the pixel transistors, a contact 1451 of a first power supply voltage VDD (VDD_1) is disposed between the reset transistors 723A and 723B, contacts 1452 and 1453 of a second power supply voltage VDD (VDD_2) are respectively disposed on outer sides of the gate electrodes of the amplification transistors 724A and 724B.

In addition, a contact 1461 with a first VSS interconnection (VSS_A) is disposed between the gate electrodes of the selection transistor 725A and the switching transistor 728A, and a contact 1462 with a second VSS interconnection (VSS_B) is disposed between the gate electrodes of the selection transistor 725B and the switching transistor 728B.

In the case of the arrangement of the pixel transistors, as illustrated in FIG. 70 to FIG. 72, four pieces of the power supply lines 1401A to 1401D are necessary for one pixel column.

On the other hand, in FIG. 73B, on the basis of the central line (not illustrated) of two pieces of the signal extraction units 65-1 and 65-2, gate electrodes of the switching transistors 728A and 728B, the transfer transistors 721A and 721B, the reset transistors 723A and 723B, the amplification transistors 724A and 724B, and the selection transistors 725A and 725B are formed in this order from a side closer to the central line toward an outer side.

In the case of the arrangement of the pixel transistors, a contact 1471 with the first VSS interconnection (VSS_1) is disposed between the switching transistors 728A and 728B, and contacts 1472 and 1473 with the second VSS interconnection (VSS_2) are respectively disposed on outer sides of the gate electrodes of the selection transistors 725A and 725B.

In addition, a contact 1481 of the first power supply voltage VDD (VDD_A) is disposed between the gate electrodes of the amplification transistor 724A and the reset transistor 723A, and a contact 1482 of the second power supply voltage VDD (VDD_B) is disposed between the gate electrodes of the amplification transistor 724B and the reset transistor 723B.

In the case of the arrangement of the pixel transistors, it is possible to further reduce the number of contacts of the power supply voltage in comparison to the layout of the pixel transistors in FIG. 73A, and thus it is possible to simplify a circuit. In addition, it is also possible to reduce interconnections of the power supply line 1401 in the pixel array unit 20, and it is possible to construct the interconnections with two pieces of the power supply lines 1401 with respect to one pixel column.

In addition, in the pixel transistor layout illustrated in FIG. 73B, it is possible to omit the contact 1471 with the first VSS interconnection (VSS_1) between the switching transistor 728A and 728B. Accordingly, it is possible to reduce the degree of density of the pixel transistors in a vertical direction. In addition, since the number of contacts with the VSS interconnection is reduced, it is possible to reduce currents flowing between the voltage supply line 741 (FIGS. 33A and 33B and FIGS. 34A and 34B) for applying the voltage MIX0 or MIX1 and the VSS interconnection.

In the case of omitting the contact 1471 with the first VSS interconnection (VSS_1), it is possible to enlarge the amplification transistors 724A and 724B in the vertical direction. Accordingly, it is possible to reduce noise of the pixel transistors, and a signal variation is reduced.

In addition, in the layout of the pixel transistors in FIG. 73B, the contacts 1472 and 1473 with the second VSS interconnection (VSS_2) may be omitted. Accordingly, it is possible to reduce the degree of density of the pixel transistors in the vertical direction. In addition, since the number of contacts with the VSS interconnection is reduced, it is possible to reduce currents flowing between the voltage supply line 741 (FIGS. 33A and 33B and FIGS. 34A and 34B) for applying the voltage MIX0 or MIX1 and the VSS interconnection.

In the case of omitting the contacts 1472 and 1473 with the second VSS interconnection (VSS_2), it is possible to enlarge the amplification transistors 724A and 724B in the vertical direction. Accordingly, it is possible to reduce noise of the pixel transistors, and a signal variation is reduced.

Figure 74:
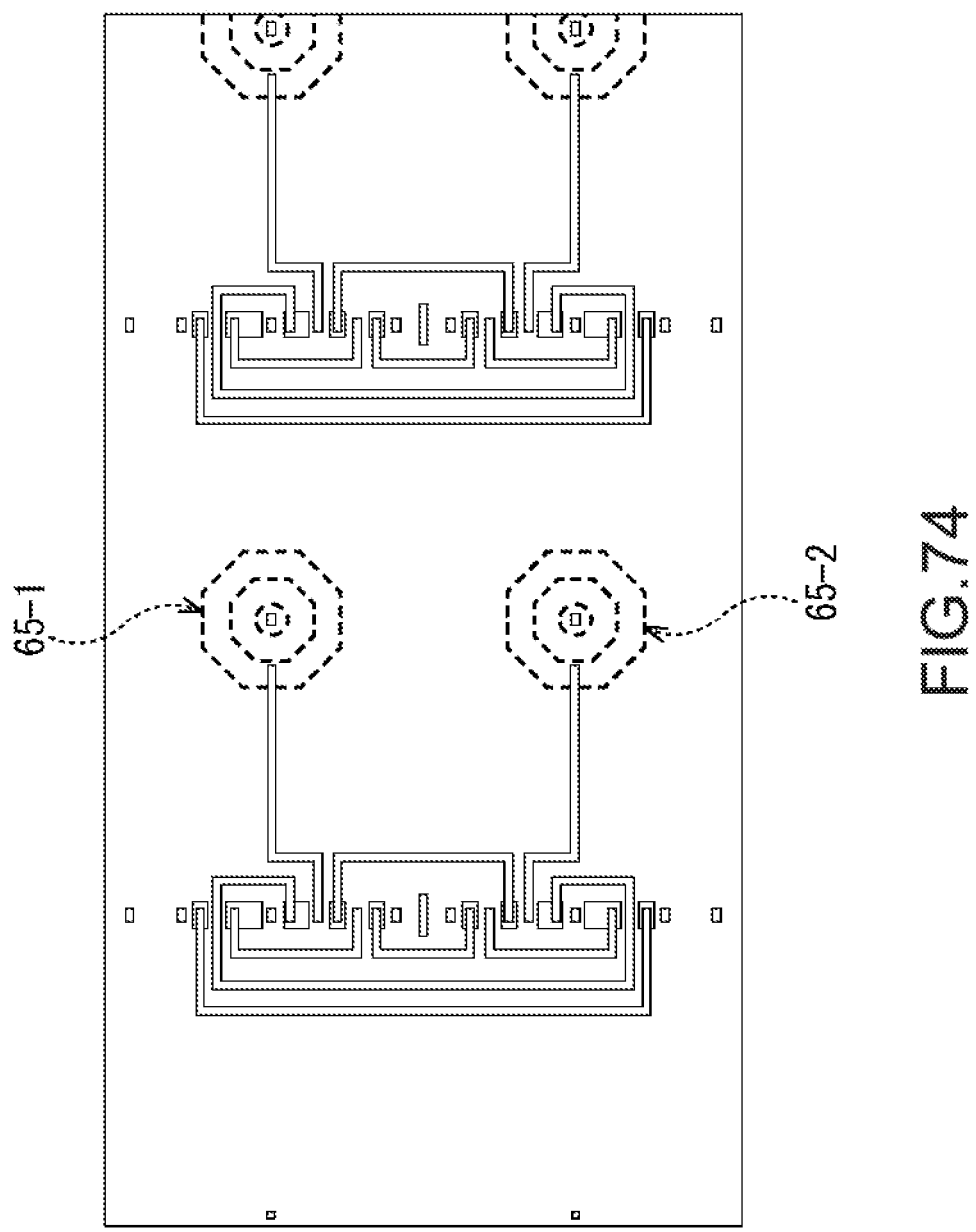
FIG. 74 is a view illustrating a connection layout in the pixel transistor layout in FIG. 73B.

FIG. 74 illustrates a layout of interconnections which connect pixel transistors Tr of the metal film M1 In the layout of the pixel transistors in FIG. 73B. FIG. 74B corresponds to interconnections which connect the pixel transistors Tr of the metal film M1 illustrated in FIG. 44C. The interconnections which connect the pixel transistors Tr may be connected in a state of climbing over other interconnection layers such as the metal films M2 and M3.

Figure 75:
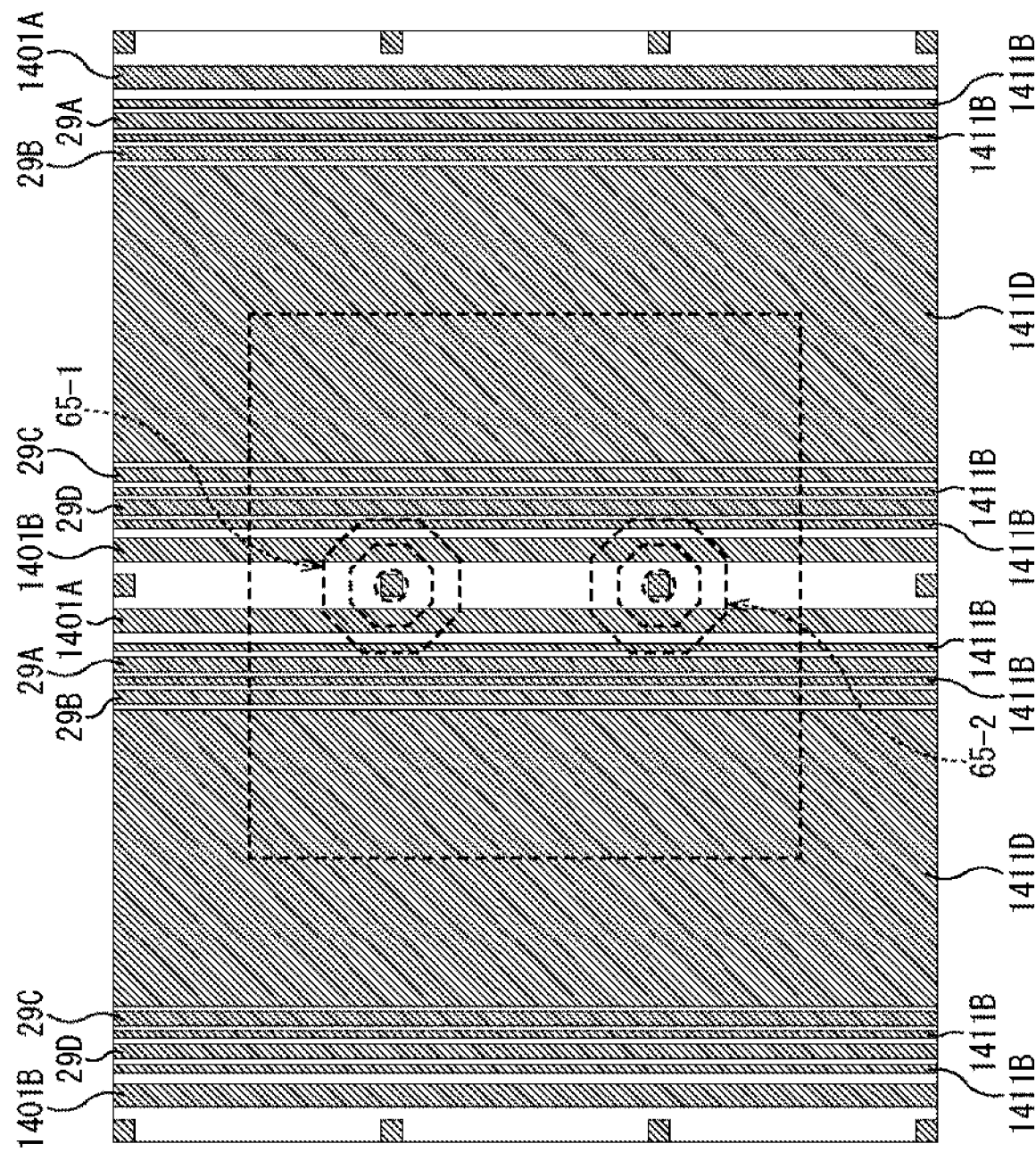
FIG. 75 is a view illustrating an interconnection layout in the pixel transistor layout in FIG. 73B.

FIG. 75 illustrates a layout of the third-layer metal film M3 of the multilayer interconnection layer 811 in a case where two pieces of the power supply lines 1401 are set to one pixel column in the layout of the pixel transistors illustrated in FIG. 73B.

In FIG. 75, the same reference numeral will be given to a portion corresponding to FIG. 70, and description thereof will be appropriately omitted.

When comparing the layout of the metal film M3 in FIG. 75 with the layout of the metal film M3 in FIG. 70, among four pieces of the power supply lines 1401A to 1401D in FIG. 70, two pieces of the power supply lines 1401C and 1401D are omitted, and the VSS interconnection 1411A having a wide line width is substituted with the VSS interconnection 1411D having a wider line width.

As described above, when enlarging the area (line width) of the VSS interconnection 1411, a current density is further lowered and interconnection reliability can be improved.

Figure 76:
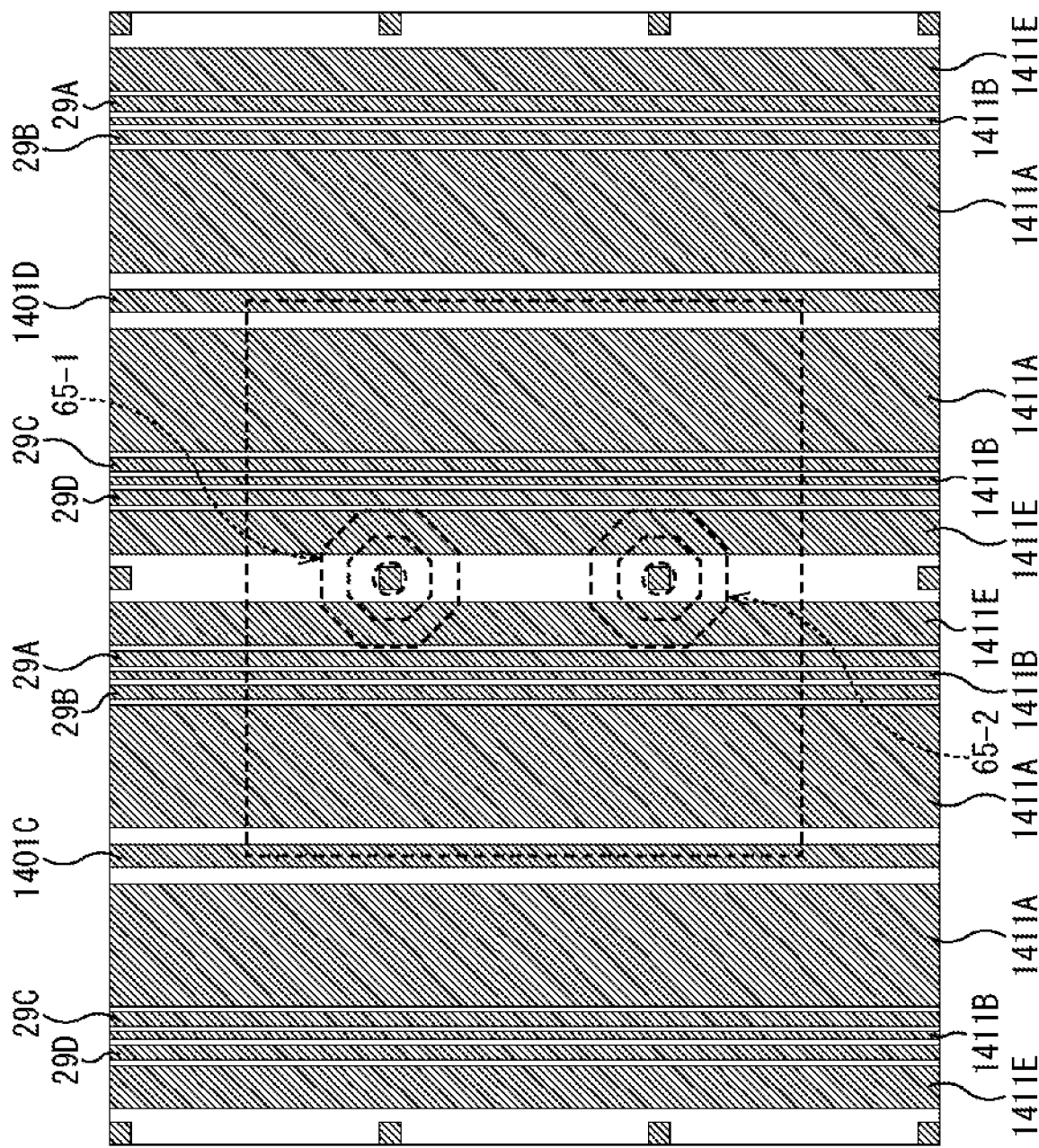
FIG. 76 is a view illustrating an interconnection layout in which two power supply lines are set in one pixel column.

FIG. 76 illustrates another layout of the third-layer metal film M3 of the multilayer interconnection layer 811 in a case where two pieces of the power supply lines 1401 are set to one pixel column in the layout of the pixel transistors illustrated in FIG. 73B.

In FIG. 76, the same reference numeral will be given to a portion corresponding to FIG. 70, and description thereof will be appropriately omitted.

When comparing the layout of the metal film M3 in FIG. 76 with the layout of the metal film M3 in FIG. 70, among four pieces of the power supply lines 1401A to 1401D in FIG. 70, two pieces of the power supply lines 1401A and 1401B are omitted, and are substituted with a VSS interconnection 1411E having a wider line width.

As described above, when enlarging the area (line width) of the VSS interconnection 1411, a current density is further lowered and interconnection reliability can be improved.

It should be noted that the layouts of the metal film M3 illustrated in FIG. 75 and FIG. 76 are examples in which the layout of the metal film M3 illustrated in FIG. 70 are changed into two pieces of power supply lines 1401, but an example in which the layout of the metal film M3 illustrated in FIG. 71 and FIG. 72 is changed into two pieces of power supply line 1401 is also possible.

That is, the configuration in which the number of the power supply lines 1401 is changed into two is also applicable to the layout of the metal film M3 illustrated in FIG. 71 in which the VSS interconnections 1411 which are respectively adjacent to the four pieces of vertical signal lines 29A to 29D are set to the same line width, and the layout of the metal film M3 illustrated in FIG. 72 which is provided with the VSS interconnection 1411C including the plurality of gaps 1421.

Accordingly, as in FIG. 71, it is possible to make the degree of influence of cross-talk be uniform, and it is possible to reduce a characteristic variation. In addition, as in FIG. 72, it is possible to attain an effect capable of improving stability when forming the VSS interconnection 1411C having a wide width.

<Wiring Example of Power Supply Line and VSS Interconnection>

Figure 77:
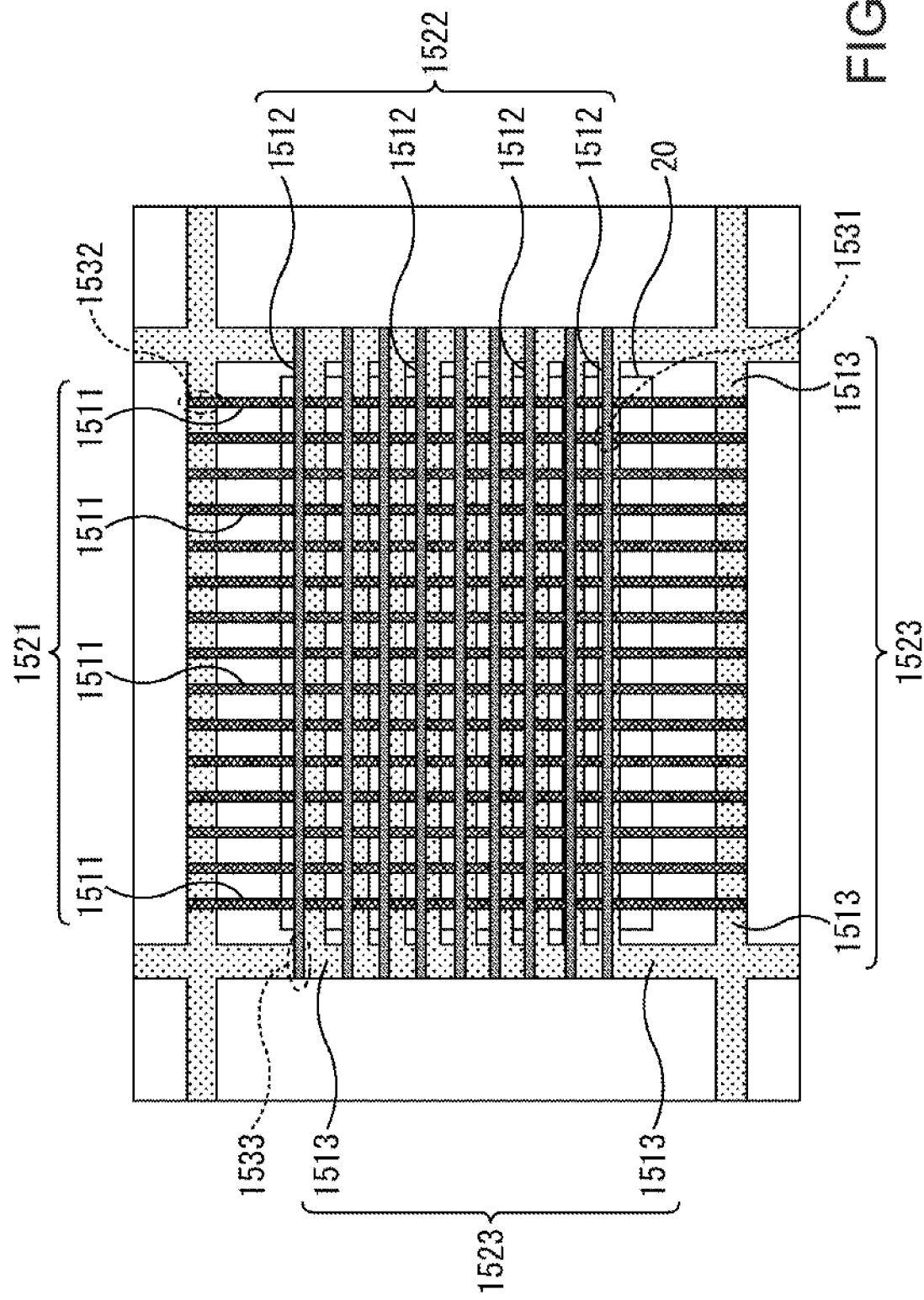
FIG. 77 is a plan view illustrating a wiring example of a VSS interconnection.

FIG. 77 is a plan view illustrating a wiring example of the VSS interconnection in the multilayer interconnection layer 811.

As illustrated in FIG. 77, in the multilayer interconnection layer 811, the VSS interconnection can be formed in a plurality of interconnection layers like a first interconnection layer 1521, a second interconnection layer 1522, and a third interconnection layer 1523.

In the first interconnection layer 1521, for example, a plurality of vertical interconnections 1511 which extend in a vertical direction in the pixel array unit 20 are arranged with predetermined intervals with respect to a horizontal direction. In the second interconnection layer 1522, for example, a plurality of horizontal interconnections 1512 which extend in the horizontal direction in the pixel array unit 20 are arranged with predetermined intervals with respect to the vertical direction. In the third interconnection layer 1523, for example, an interconnection 1513, which extends in the vertical direction or the horizontal direction to surround at least an outer side of the pixel array unit 20, is disposed with a line width wider in comparison to the vertical interconnections 1511 and the horizontal interconnection 1512, and is connected to the GND potential. The interconnection 1513 is also wired within the pixel array unit 20 to connect multiple interconnections 1513 opposite to each other in the external peripheral portion.

The vertical interconnections 1511 of the first interconnection layer 1521 and the horizontal interconnections 1512 of the second interconnection layer 1522 are connected to each other at each overlapping portion 1531 at which each of the vertical interconnections 1511 and each of the horizontal interconnections 1512 overlap each other in a plan view with a via or the like.

In addition, the vertical interconnections 1511 of the first interconnection layer 1521, and the interconnections 1513 of the third interconnection layer 1523 are connected to each other at each overlapping portion 1532 at which each of the vertical interconnections 1511 and each of the interconnections 1513 are overlap each other in a plan view with a via or the like.

In addition, the horizontal interconnections 1512 of the second interconnection layer 1522, and the interconnections 1513 of the third interconnection layer 1523 are connected to each other at each overlapping portion 1533 at which each of the horizontal interconnections 1512 and each of the interconnections 1513 overlap each other in a plan view with a via or the like.

It should be noted that in FIG. 77, with regard to the overlapping portions 1531 to 1533, a reference numeral is given to only one site to prevent complication of the drawing.

As described above, the VSS interconnection is formed in a plurality of interconnection layers of the multilayer interconnection layer 811, and the vertical interconnections 1511 and the horizontal interconnections 1512 can be wired in a lattice shape in a plan view at the inside of the pixel array unit 20. Accordingly, propagation delay at the inside of the pixel array unit 20 is reduced and a characteristic variation can be suppressed.

Figure 78:
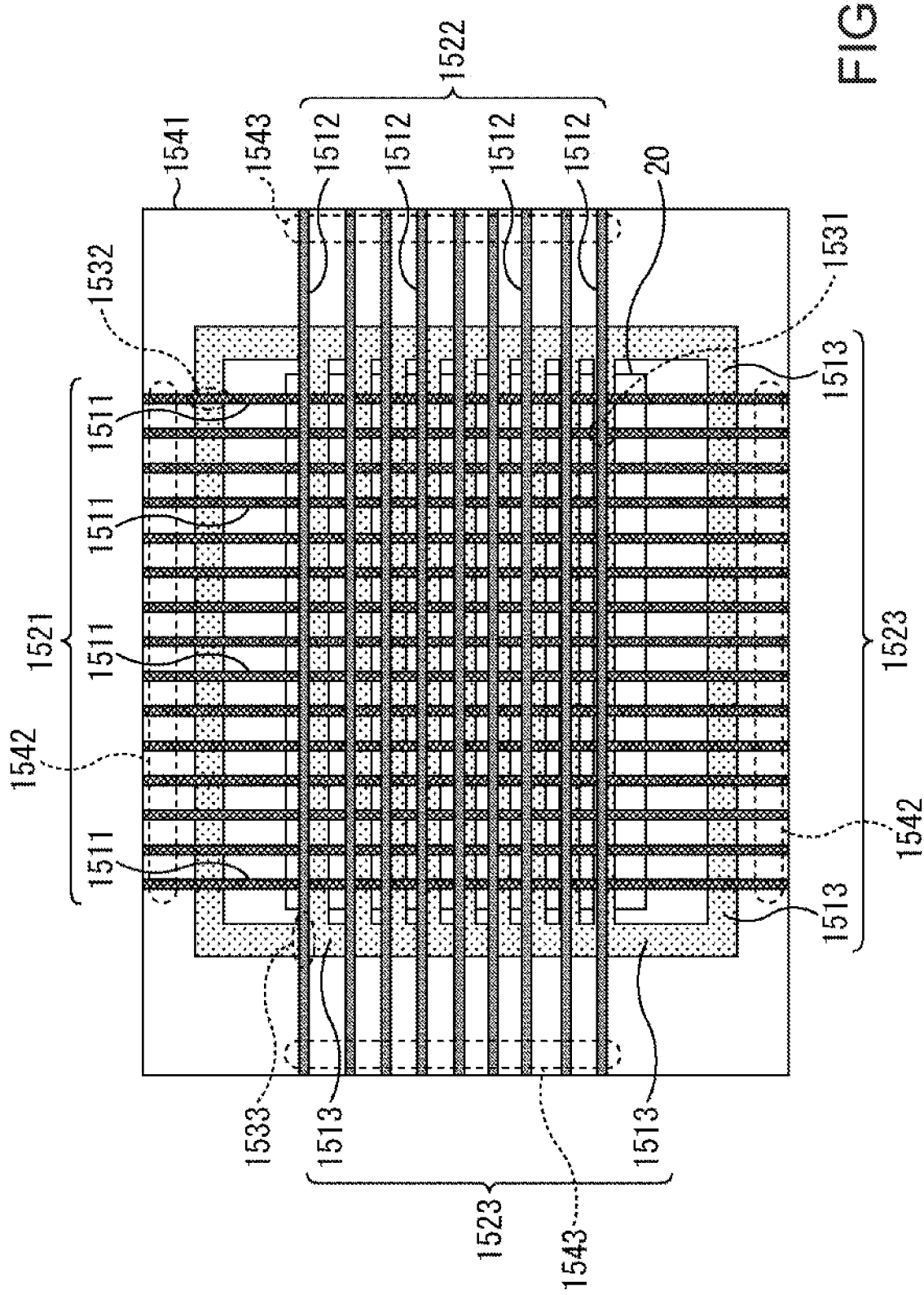
FIG. 78 is a plan view illustrating a wiring example of the VSS interconnection.

FIG. 78 is a plan view illustrating another wiring example of the VSS interconnection in the multilayer interconnection layer 811.

In FIG. 78, the same reference numeral will be given to a portion corresponding to FIG. 77, and description thereof will be appropriately omitted.

In FIG. 77, the vertical interconnections 1511 of the first interconnection layer 1521 and the horizontal interconnections 1512 of the second interconnection layer 1522 are not formed on an outer side of the interconnection 1513 that is formed at an outer periphery of the pixel array unit 20. However, in FIG. 78, the vertical interconnections 1511 and the horizontal interconnections 1512 are formed to extend up to the outer side of the interconnection 1513 formed at the outer periphery of the pixel array unit 20. In addition, each of the vertical interconnections 1511 is connected to the GND potential at an outer peripheral portion 1542 of a substrate 1541 on an outer side of the pixel array unit 20, and each of the horizontal interconnections 1512 is connected to the GND potential at an outer peripheral portion 1543 of the substrate 1541 on the outer side of the pixel array unit 20.

In other words, in FIG. 77, the vertical interconnections 1511 of the first interconnection layer 1521 and the horizontal interconnections 1512 of the second interconnection layer 1522 are connected to the GND potential through the interconnection 1513 located at the outer periphery. However, in FIG. 78, the vertical interconnections 1511 and the horizontal interconnections 1512 are also directly connected to the GND potential in addition to the connection through the interconnection 1513. It should be noted that regions in which the vertical interconnections 1511 and the horizontal interconnections 1512 are connected to the GND potential may be four sides of the substrate 1541 like the outer peripheral portions 1542 and 1543 in FIG. 78, or a predetermined one side, predetermined two sides, or predetermined three sides.

As described above, the VSS interconnection is formed in multiple interconnection layers of the multilayer interconnection layer 811, and can be wired in a lattice shape in a plan view at the inside of the pixel array unit 20. Accordingly, propagation delay at the inside of the pixel array unit 20 is reduced and a characteristic variation can be suppressed.

It should be noted that in FIG. 77 and FIG. 78, description has been given of the wiring example of the VSS interconnection, but the power supply line can be wired in a similar manner.

The VSS interconnection 1411 and the power supply line 1401 described in FIG. 70 to FIG. 76 can be arranged in the plurality of interconnection layers of the multilayer interconnection layer 811 as in the VSS interconnection and the power supply line illustrated in FIG. 77 and FIG. 78. The VSS interconnection 1411 and the power supply line 1401 described in FIG. 70 to FIG. 76 are also applicable to any embodiment described in this specification.

<First Method of Pupil Correction>

Next, a first method of pupil correction in the light-receiving element 1 will be described.

As in an image sensor, the light-receiving element 1 that is a CAPD sensor can perform pupil correction in which the on-chip lens 62 or the interpixel light-shielding film 63 is shifted toward a plane center of the pixel array unit 20 in correspondence with a difference of an incident angle of a main light beam corresponding to an in-plane position of the pixel array unit 20.

Figure 79:
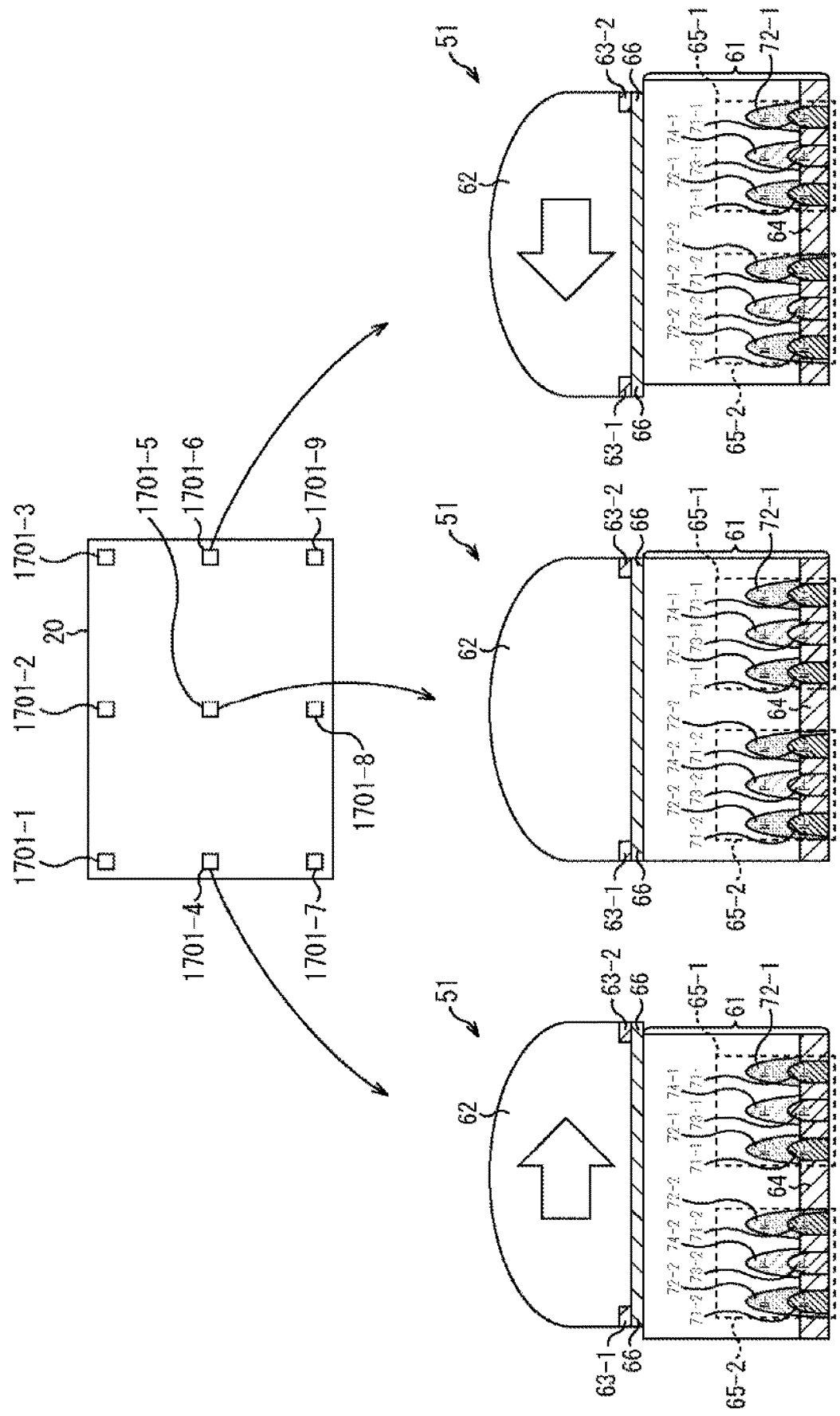
FIG. 79 is a view describing a first method of pupil correction.

Specifically, as illustrated in FIG. 79, in a pixel 51 located at a position 1701-5 of the central portion of the pixel array unit 20 among respective positions 1701-1 to 1701-9 of the pixel array unit 20, the center of the on-chip lens 62 matches the center between the signal extraction units 65-1 and 65-2 formed in the substrate 61, but in pixels 51 located at positions 1701-1 to 1701-4, 1701-6, and 1701-9 of peripheral portions of the pixel array unit 20, the center of the on-chip lens 62 is disposed to be shifted to a plane center side of the pixel array unit 20. The interpixel light-shielding films 63-1 and 63-2 are disposed to be shifted to the plane center side of the pixel array unit 20 as in the on-chip lens 62.

Figure 80:
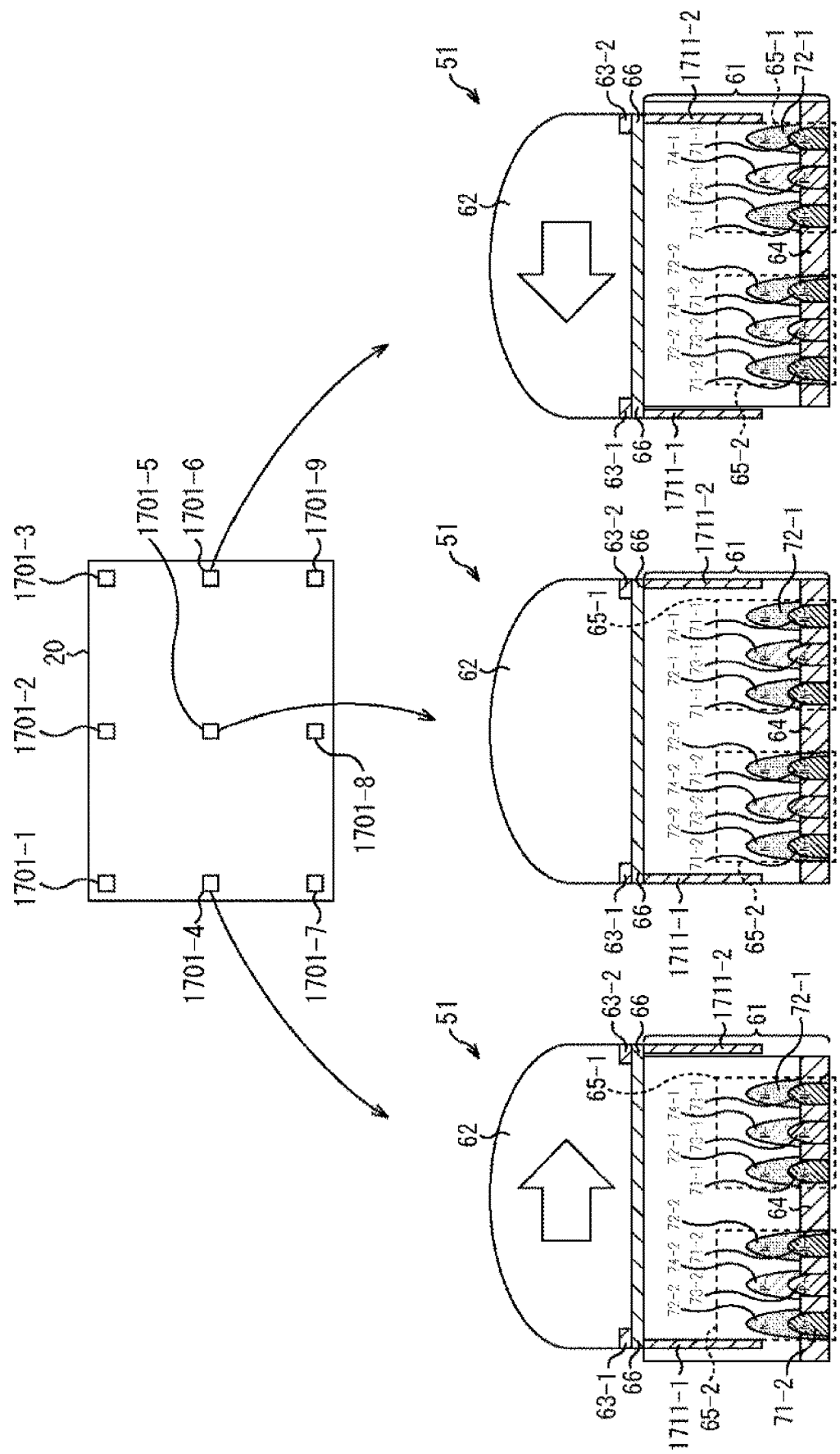
FIG. 80 is a view describing the first method of the pupil correction.

In addition, as illustrated in FIG. 80, in the pixels 51, in a case where DTIs 1711-1 and 1711-2, in which a trench is formed up to a predetermined depth in a substrate depth direction, are formed at pixel boundary portions on the rear-surface side of the substrate 61 that is the on-chip lens 62 side to prevent incidence of incident light into adjacent pixels, in the pixels 51 located at the positions 1701-1 to 1701-4, 1701-6, and 1701-9 of the peripheral portions of the pixel array unit 20, in addition to the on-chip lens 62 and the interpixel light-shielding films 63-1 and 63-2, the DTIs 1711-1 and 1711-2 are also disposed to be shifted to the plane center side of the pixel array unit 20.

Figure 81:
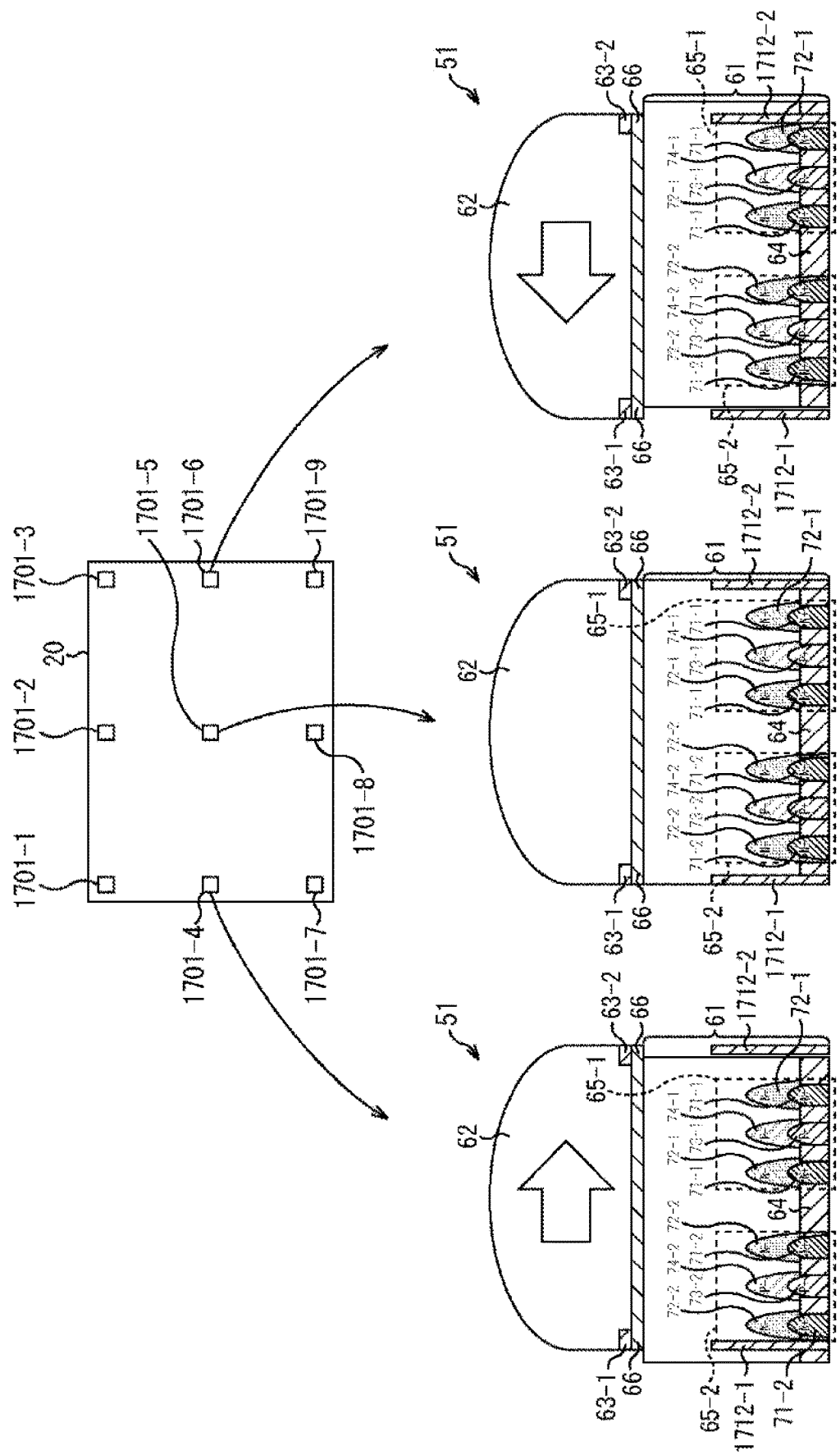
FIG. 81 is a view describing the first method of the pupil correction.

Alternatively, as illustrated in FIG. 81, in the pixels 51, in a case where DTIs 1712-1 and 1712-2, in which a trench is formed up to a predetermined depth in a substrate depth direction, are formed at pixel boundary portions on the front-surface side of the substrate that is the multilayer interconnection layer 811 side to prevent incidence of incident light into adjacent pixels, in the pixels 51 located at the positions 1701-1 to 1701-4, 1701-6, and 1701-9 of the peripheral portions of the pixel array unit 20, in addition to the on-chip lens 62 and the interpixel light-shielding films 63-1 and 63-2, the DTIs 1712-1 and 1712-2 are also disposed to be shifted to the plane center side of the pixel array unit 20.

It should be noted that as a pixel isolation portion that isolates the substrates 61 of adjacent pixels to prevent incident of incident light into adjacent pixels, it is possible to employ a configuration in which a through-isolation portion that penetrates through the substrates 61 and isolates the adjacent pixels instead of the DTIs 1711-1, 1711-2, 1712-1, and 1712-2. Even in this case, at the pixels 51 located at the positions 1701-1 to 1701-4, 1701-6, and 1701-9 of the peripheral portions of the pixel array unit 20, the through-isolation portion is disposed to be shifted to the plane center side of the pixel array unit 20.

As illustrated in FIG. 79 to FIG. 81, when the on-chip lens 62 is shifted to the plane center side of the pixel array unit 20 in combination with the interpixel light-shielding film 63 or the like, the main light beam can match the center in each of the pixels. However, in the light-receiving element 1 that is the CAPD sensor, modulation is performed by applying a voltage between two pieces of the signal extraction units 65 (taps) to allow a current to flow, and thus optimal incident positions in the respective pixels are different from each other. Accordingly, in the light-receiving element 1, there is a demand for a pupil correction technology that is optimal to distance measurement differently from the optical pupil correction that is performed in the image sensor.

Description will be given of a difference between the pupil correction that is performed in the light-receiving element 1 that is the CAPD sensor, and the pupil correction that is performed in the image sensor with reference to FIGS. 82A to 82C.

Figure 82:
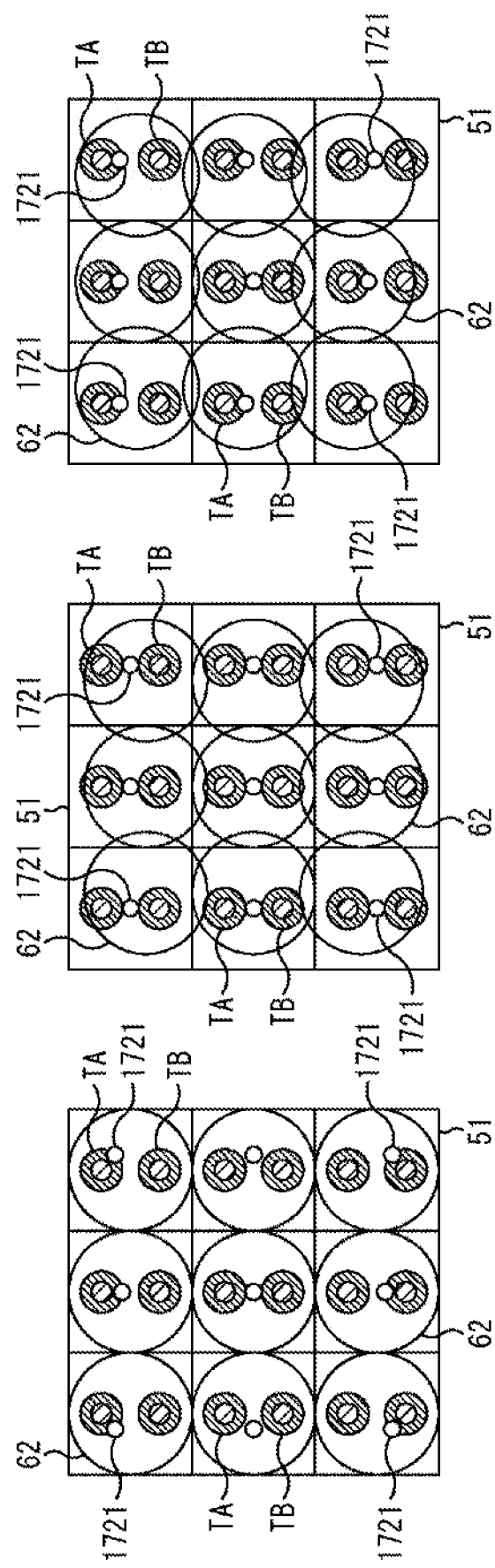
FIGS. 82A to 82C are views describing the first method of the pupil correction.

Furthermore, in FIGS. 82A to 82C, nine pixels 51 (3×3) illustrates pixels 51 corresponding to the positions 1701-1 to 1701-9 of the pixel array unit 20 in FIG. 79 to FIG. 81.

FIG. 82A illustrates a position of the on-chip lens 62 in a case where the pupil correction is not made, and a position 1721 of the main light beam on a substrate front-surface side.

In a case where the pupil correction is not made, a pixel 51 at any of the positions 1701-1 to 1701-9 inside the pixel array unit 20, the center of the on-chip lens 62 is disposed to match the center of two taps inside the pixel, that is, the center between the first tap TA (signal extraction unit 65-1) and the second tap TB (signal extraction unit 65-2). In this case, as illustrated in FIG. 82A, multiple positions 1721 of the main light beam on the substrate front-surface side become different from each other in accordance with the positions 1701-1 to 1701-9 inside the pixel array unit 20.

In the pupil correction that is performed in the image sensor, as illustrated in FIG. 82B, the on-chip lens 62 is disposed so that each of the positions 1721 of the main light beam matches the center between the first tap TA and the second tap TB in the pixel 51 at any of the positions 1701-1 to 1701-9 inside the pixel array unit 20. More specifically, as illustrated in FIG. 79 to FIG. 81, the on-chip lens 62 is disposed to be shifted to the plane center side of the pixel array unit 20.

In contrast, in the pupil correction that is performed in the light-receiving element 1, as illustrated in FIG. 82C, the on-chip lens 62 is disposed on a further first tap TA side from the position of the on-chip lens 62 at which the position 1721 of the main light beam becomes the central position between the first tap TA and the second tap TB as illustrated in FIG. 82B. A shift amount of the position 1721 of the main light beam between FIG. 82B and FIG. 82C increases as it goes from the central position of the pixel array unit 20 to an outer peripheral portion.

Figure 83:
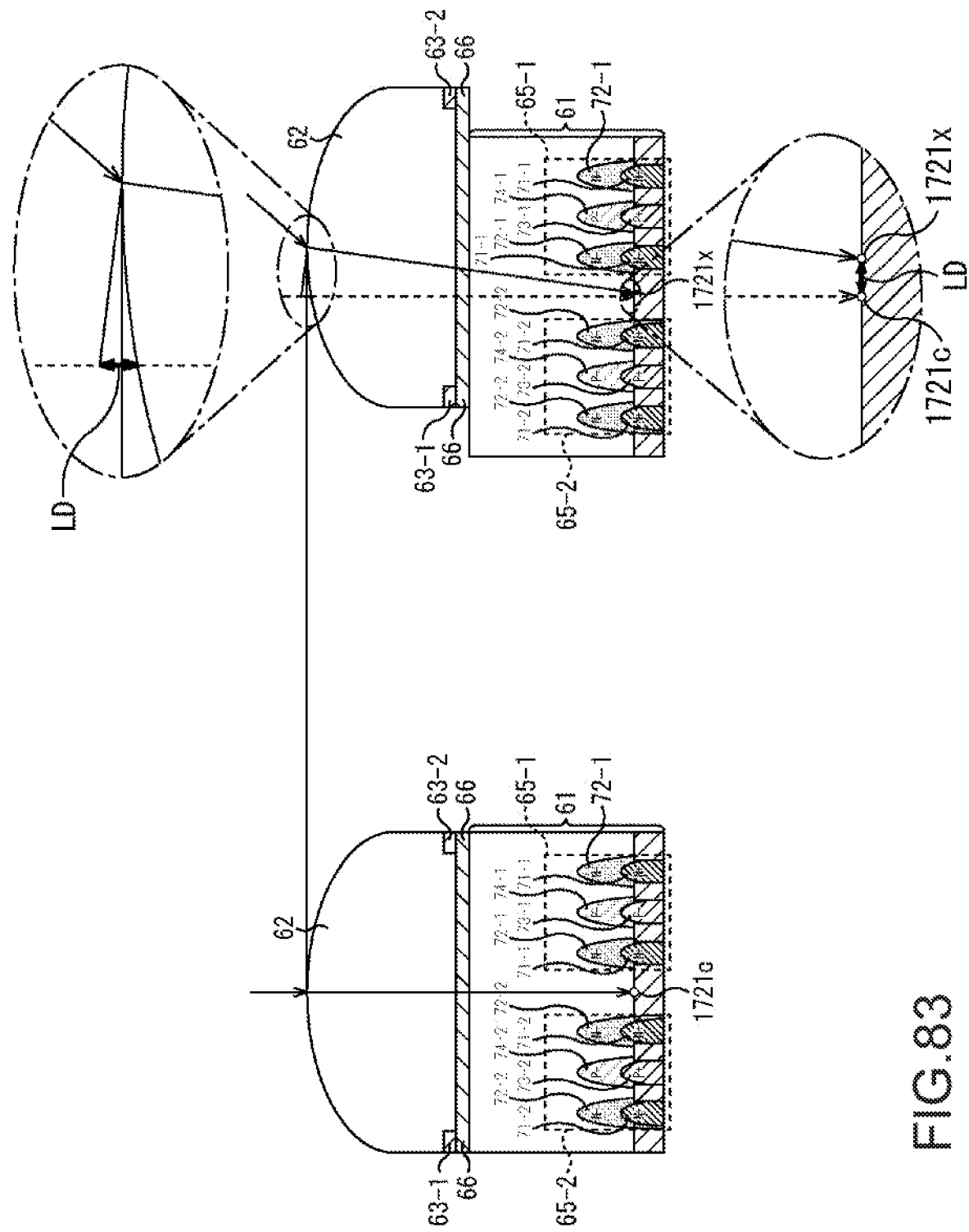
FIG. 83 is a view describing a shift amount of the on-chip lens in the first method of the pupil correction.

FIG. 83 is a view illustrating the shift amount of the on-chip lens 62 when the position 1721 of the main light beam is shifted to the first tap TA side.

For example, a shift amount LD between a position 1721*c* of the main light beam at the position 1701-5 of the central portion of the pixel array unit 20, and a position 1721X of the main light beam at the position 1701-4 of the peripheral portion of the pixel array unit 20 is the same as an optical path difference LD with respect to pupil correction at the position 1701-4 of the peripheral portion of the pixel array unit 20.

In other words, shift from the central position between the first tap TA (signal extraction unit 65-1) and the second tap TB (signal extraction unit 65-2) to the first tap TA side occurs so that an optical path length of the main light beams becomes the same in each pixel of the pixel array unit 20.

Here, the shift to the first tap TA side is performed because the following method is assumed to be employed. In the method, a light-receiving timing is set to four phases, and a phase shift (phase) that corresponds to a delay time $\Delta T$ corresponding to a distance up to an object is calculated by using only an output value of the first tap TA.

Figure 84:
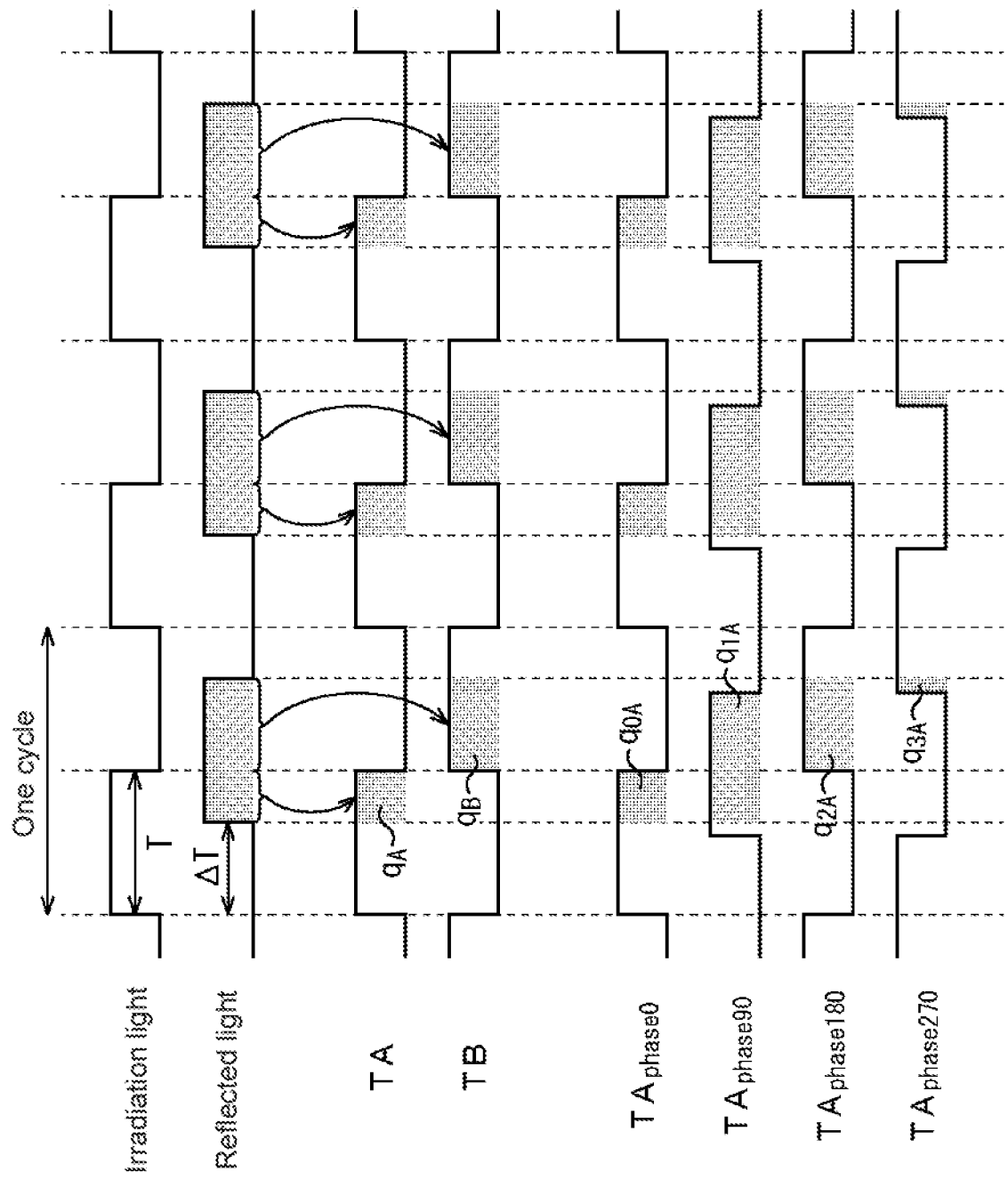
FIG. 84 is a view describing a two-phase method and a four-phase method.

FIG. 84 is a timing chart illustrating a detection method (two-phase method) by two phases and a detection method (four-phase method) by four phases in a ToF sensor using an indirect ToF method.

Irradiation light that is modulated to repeat irradiation ON/OFF at an irradiation time T (one cycle=2 T) is output from a predetermined light source, and in the light-receiving element 1, reflected light is received in a state of being delayed by the delay time $\Delta T$ corresponding to a distance up to an object.

In the two-phase method, the light-receiving element 1 receives light at the first tap TA and the second tap TB at a timing at which a phase is shifted by 180°. A phase shift amount $\theta$ corresponding to the delay time $\Delta T$ can be detected with a distribution ratio between a signal value $q_A$ received at the first tap TA and a signal value $q_B$ received at the second tap TB.

In contrast, in the four-phase method, light is received at four timings of the same phase (that is, phase 0) as in the irradiation light, a phase (phase 90) that is shifted by 90° from the irradiation light, a phase (phase 180) that is shifted by 180° from the irradiation light, and a phase (phase 270) that is shifted by 270° from the irradiation light. In this case, a signal value $TA_{phase\ 180}$ detected at the phase shifted by 180° becomes the same as the signal value $q_B$ received by the second tap TB in the two-phase method. Accordingly, in detection at four phases, it is possible to detect the phase shift amount $\theta$ corresponding to the delay time $\Delta T$ with a signal value of only one of the first tap TA and the second tap TB. In the four-phase method, a tap that detects the phase shift amount $\theta$ is referred to as a phase shift detection tap.

Here, in a case where the first tap TA between the first tap TA and the second tap TB is set as the phase shift detection tap that detects the phase shift amount $\theta$, in the pupil correction, shift is performed to the first tap TA side so that the optical path length of the main light beam becomes approximately the same in each pixel of the pixel array unit 20.

When signal values detected at the phase 0, the phase 90, the phase 180, and the phase 270 of the first tap TA in the four-phase method are set as $q_{0A}$, $q_{1A}$, $q_{2A}$, and $q_{3A}$, respectively, the phase shift amount $\theta_A$ that is detection in the first tap TA is calculated in accordance with the following Expression (2).

[Math. 1]

$$\theta_A = \tan^{-1} \frac{q_{1A} - q_{3A}}{q_{0A} - q_{2A}} \quad (2)$$

In addition, $Cmod_A$ of the four-phase method in a case where detection is performed in the first tap TA is calculated in accordance with the following Expression (3).

[Math. 2]

$$Cmod_A = \text{Max}\left(\frac{q_{0A} - q_{2A}}{q_{0A} + q_{2A}}, \frac{q_{1A} - q_{3A}}{q_{1A} + q_{3A}}\right) \quad (3)$$

As illustrated in Expression (3), $Cmod_A$ in the four-phase method becomes a greater value between $(q_{0A}-q_{2A})/(q_{0A}+q_{2A})$ and $(q_{1A}-q_{3A})/(q_{1A}+q_{3A})$.

As described above, the light-receiving element 1 performs the pupil correction so that the optical path length of the main light beam becomes approximately the same in each pixel in a plane of the pixel array unit 20 by changing the position of the on-chip lens 62 and the interpixel light-shielding film 63. In other words, the light-receiving element 1 performs the pupil correction so that the phase shift amount $\theta_A$ in the first tap TA that is a phase shift detection tap of each pixel in a plane of the pixel array unit 20 becomes approximately the same in each case. Accordingly, it is possible to remove in-plane dependency of a chip, and distance measurement accuracy can be improved. Here, "approximately matching" or "approximately the same" as described above represent "equivalent" in a predetermined range capable of being regarded as the same in addition to "completely matching" or "completely the same". The first method of the pupil correction is applicable to any embodiment described in this specification.

<Second Method of Pupil Correction>

Next, a second method of the pupil correction in the light-receiving element 1 will be described.

The first method of the pupil correction is suitable for a case where it is determined to use a signal of the first tap TA between the first tap TA and the second tap TB in calculation of the phase shift (phase), but it may be difficult to determine which tap is to be used. In this case, the pupil correction can be performed by the following second method.

In the second method of the pupil correction, the positions of the on-chip lens 62 and the interpixel light-shielding film 63 are disposed to be shifted to the plane center side so that DC contrast $DC_A$ of the first tap TA and DC contrast $DC_B$ of the second tap TB become approximately the same in each pixel in a plane of the pixel array unit 20. The DTI 1711 formed from the on-chip lens 62 side in the substrate 61, and the DTI 1712 formed from the front-surface side are formed, positions thereof are disposed to be shifted as in the first method.

The DC contrast $DC_A$ of the first tap TA and the DC contrast $DC_B$ of the second tap TB are calculated in accordance with the following Expressions (4) and (5).

[Math. 3]

$$DC_A = \frac{A_H - B_L}{A_H + B_L} \quad (4)$$

$$DC_B = \frac{B_H - A_L}{B_H + A_L} \quad (5)$$

In Expression (4), $A_H$ represents a signal value that is detected in the first tap TA to which a positive voltage is applied after irradiating the light-receiving element 1 directly with continuous light that is continuously emitted without intermittency, and $B_L$ represents a signal value that is detected by the second tap TB to which a zero or negative voltage is applied. In Expression (5), $B_H$ represents a signal value that is detected in the first tap TB to which a positive voltage is applied after irradiating the light-receiving element 1 directly with continuous light that is continuously emitted without intermittency, and $A_L$ represents a signal value that is detected by the first tap TA to which a zero or negative voltage is applied.

It is desirable that the DC contrast $DC_A$ of the first tap TA and the DC contrast $DC_B$ of the second tap TB are the same as each other, and the DC contrast $DC_A$ of the first tap TA and the DC contrast $DC_B$ of the second tap TB approximately match each other in any position in a plane of the pixel array unit 20. However, in a case where the DC contrast $DC_A$ of the first tap TA and the DC contrast $DC_B$ of the second tap TB are different from each other in accordance with positions in a plane of the pixel array unit 20, positions of the on-chip lens 62, the interpixel light-shielding film 63, and the like are disposed to be shifted to the plane center side so that a shift amount of the DC contrast $DC_A$ of the first tap TA between the central portion and the outer peripheral portion of the pixel array unit 20, and a shift amount of the DC contrast $DC_B$ of the second tap TB between the central portion and the outer peripheral portion of the pixel array unit 20 approximately match each other.

As described above, the light-receiving element 1 performs the pupil correction so that the DC contrast $DC_A$ of the first tap TA and the DC contrast $DC_B$ of the second tap TB approximately match each other in each pixel in a plane of the pixel array unit 20 by changing positions of the on-chip lens 62 and the interpixel light-shielding film 63. Accordingly, it is possible to remove in-plane dependency of a chip, and distance measurement accuracy can be improved. Here, "approximately matching" or "approximately the same" as described above represent "equivalent" in a predetermined range capable of being regarded as the same in addition to "completely matching" or "completely the same". The second method of the pupil correction is applicable to any embodiment described in this specification.

It should be noted that light-receiving timings of first tap TA and the second tap TB as illustrated in FIG. 84 are controlled by the voltage MIX0 and the voltage MIX1 which are supplied from the tap drive unit 21 through the voltage supply line 30. The voltage supply line 30 is wired in common to one pixel column in the vertical direction of the pixel array unit 20, and thus delay due to an RC component occurs as a distance from the tap drive unit 21 is long.

Figure 85:
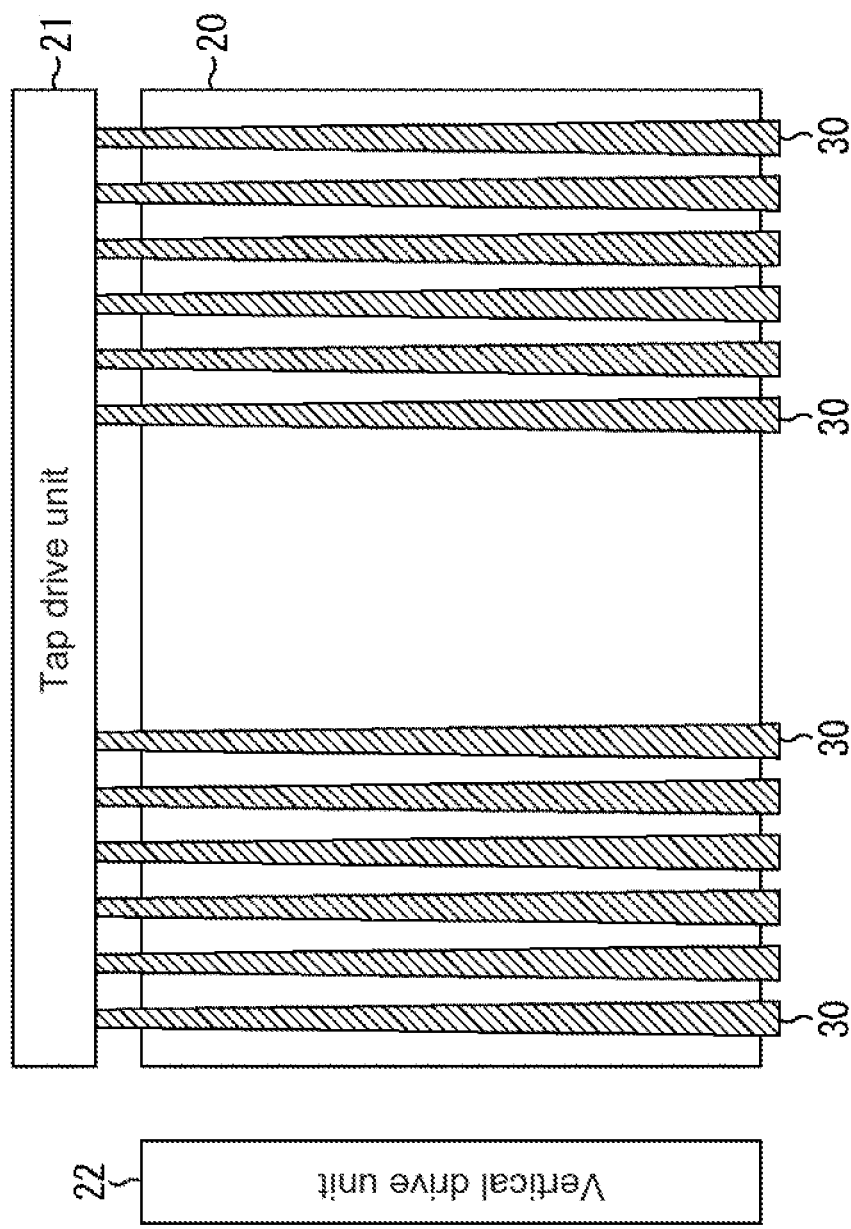
FIG. 85 is a view describing a wiring example of a voltage supply line.

Here, as illustrated in FIG. 85, in correspondence with a distance from the tap drive unit 21, resistance and capacitance of the voltage supply line 30 are changed to make drive capability of each pixel 51 be approximately uniform. Accordingly, it is possible to make a correction so that the phase shift (phase) or the DC contrast DC becomes approximately uniform in a plane of the pixel array unit 20. Specifically, the voltage supply lines 30 are arranged so that the line width becomes wider in correspondence with a distance from the tap drive unit 21.

Twentieth Embodiment

In twentieth to twenty second embodiments to be described below, description will be given of a configuration example of the light-receiving element 1 capable of acquiring auxiliary information other than the distance measurement information obtained from a distribution ratio of signals between the first tap TA and the second tap TB.

First, description will be given of a configuration example of the light-receiving element 1 capable of acquiring phase difference information as the auxiliary information other than the distance measurement information obtained from the distribution ratio of signals between the first tap TA and the second tap TB.

<First Configuration Example of Twentieth Embodiment>

Figure 86A:
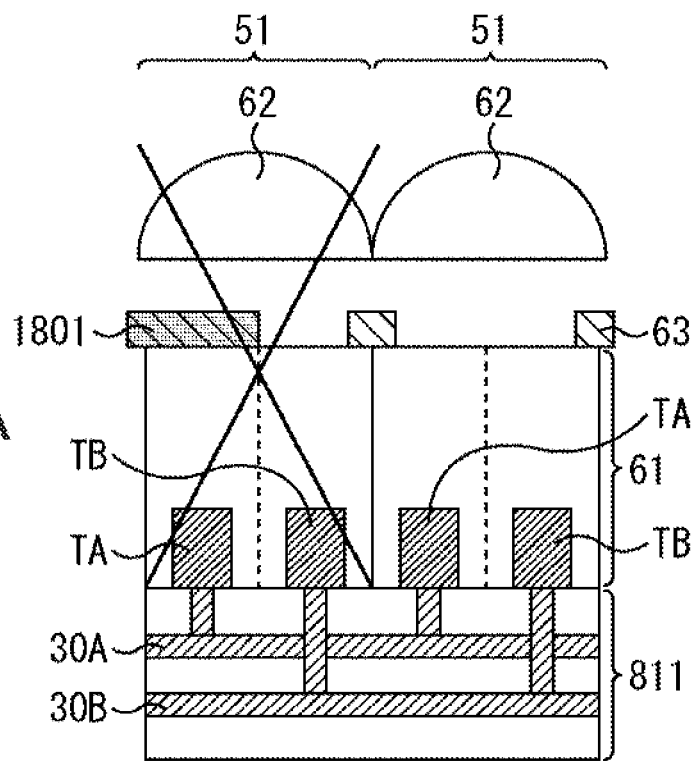
FIGS. 86A to 86C are a cross-sectional view and plan views of a first configuration example of a twentieth embodiment.
Figure 86B:
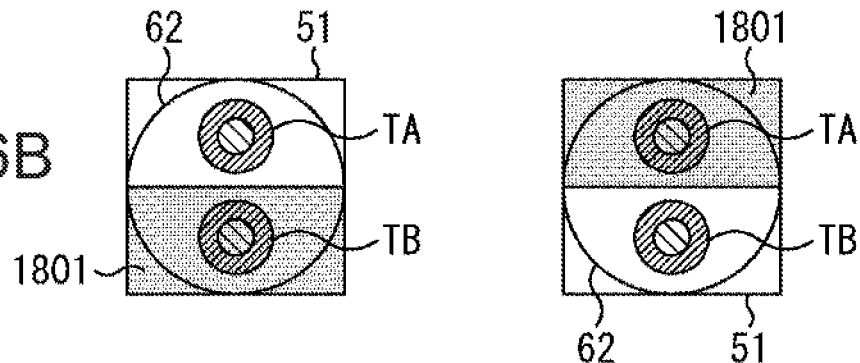
Figure 86C:
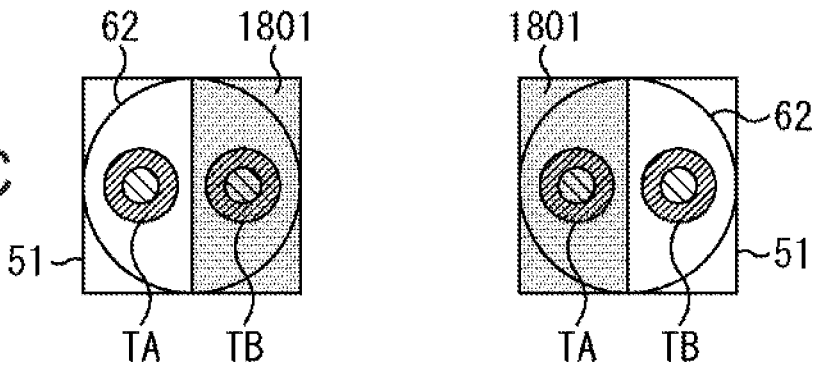

FIG. 86A is a cross-sectional view of a pixel according to a first configuration example of the twentieth embodiment, and FIGS. 86B and 86C are plan views of the pixel according to the first configuration example of the twentieth embodiment.

In the cross-sectional view of FIG. 86A, the same reference numeral will be given of a portion corresponding to the above-described other embodiments, and description thereof will be appropriately omitted.

In FIGS. 86A to 86C, a phase-difference light-shielding film 1801 for phase difference detection is newly provided in partial pixels 51 on a part of an upper surface of the substrate 61 which is a surface on the on-chip lens 62 side. For example, as illustrated in FIGS. 86B and 86C, the phase-difference light-shielding film 1801 shields an approximately one-side half of a pixel region on one side between the first tap TA side and the second tap TB side. FIG. 86B is an example of pixels 51 in which the first tap TA and the second tap TB are arranged in an upper and lower direction (a vertical direction), and FIG. 86C is an example of pixels 51 in which the first tap TA and the second tap TB are arranged in a right and left direction (horizontal direction).

The pixels 51 according to the first configuration example of the twentieth embodiment can be arranged in the pixel array unit 20 as illustrated in any one of FIG. 87A to 87F.

Figure 87A:
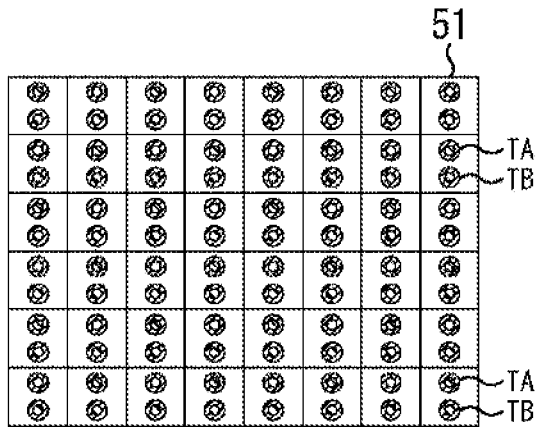
FIGS. 87A to 87F are views illustrating an arrangement example of first and second taps.

FIG. 87A illustrates an arrangement example of pixels 51 in which pixels 51 including the first tap TA and the second tap TB lined up in the upper and lower direction are arranged in a matrix shape.

Figure 87B:
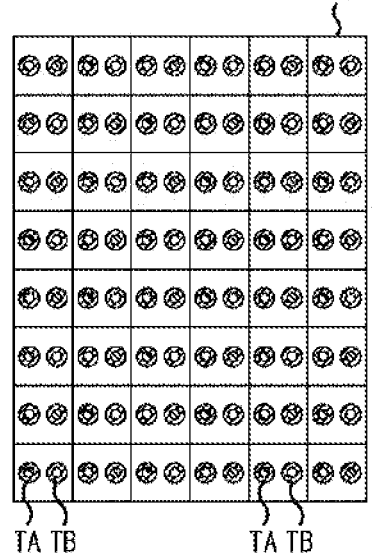

FIG. 87B illustrates an arrangement example of pixels 51 in which the pixels 51 including the first tap TA and the second tap TB lined up in the right and left direction are arranged in a matrix shape.

Figure 87C:
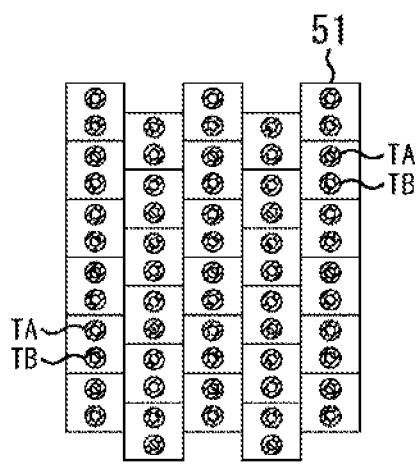

FIG. 87C illustrates an arrangement example of pixels 51 in which pixels 51 including the first tap TA and the second tap TB lined up in the upper and lower direction are arranged in a matrix shape, and a pixel position at an adjacent column is shifted by a half pixel in the upper and lower direction.

Figure 87D:
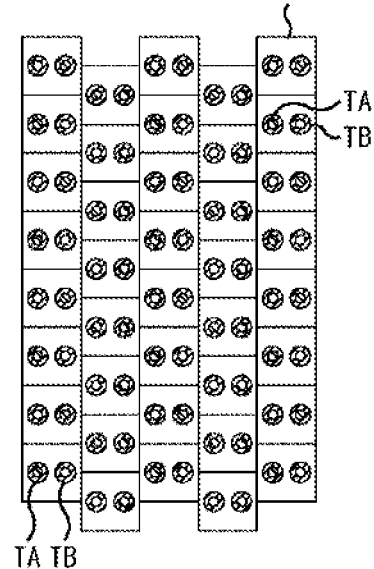

FIG. 87D illustrates an arrangement example of pixels 51 in which pixels 51 including the first tap TA and the second tap TB lined up in the right and left direction are arranged in a matrix shape, and a pixel position at an adjacent column is shifted by a half pixel in the upper and lower direction.

Figure 87E:
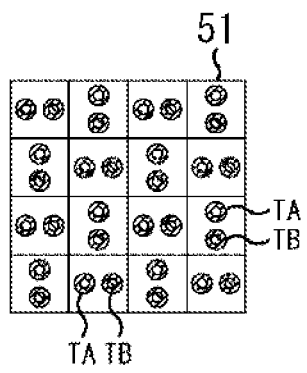

FIG. 87E illustrates an armament example of pixels 51 in which pixels 51 including the first tap TA and the second tap TB lined up in the upper and lower direction, and pixels 51 including the first tap TA and the second tap TB lined up in the right and left direction are alternately arranged in a row direction and a column direction.

Figure 87F:
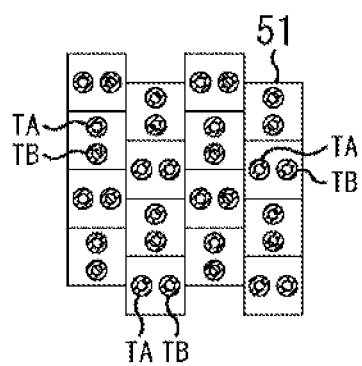

FIG. 87F illustrates an arrangement example of pixels 51 in which pixels 51 including the first tap TA and the second tap TB lined up in the upper and lower direction, and pixels 51 including the first tap TA and the second tap TB lined up in the right and left direction are alternately arranged in the row direction and the column, and a pixel position at an adjacent column is shifted by a half pixel in the upper and lower direction.

The pixels 51 in FIGS. 86A to 86C are arranged in any one arrangement among FIGS. 87A to 87F, and in the pixel array unit 20, as illustrated in FIGS. 86B and 86C, a pixel 51 of which a one-side half on the first tap TA side is shielded and a pixel 51 of which a one-side half on the second tap TB side is shielded are disposed at nearby positions. In addition, a plurality of sets of the pixel 51 of which the one-side half on the first tap TA side is shielded and the pixel 51 of which the one-side half on the second tap TB side is shielded are arranged in a scattered manner in the pixel array unit 20.

For example, the first configuration example of the twentieth embodiment has a configuration similar to that of the first embodiment illustrated in FIG. 2, the fourteenth embodiment described in FIG. 36, or the fifteenth embodiment except that the phase-difference light-shielding film 1801 is provided in partial pixels 51, but in FIGS. 86A to 86C, the other configurations are illustrated in a simplified manner.

When briefly describing configurations other than the phase-difference light-shielding film 1801 illustrated in FIGS. 86A to 86C, each of the pixels 51 includes the substrate 61 constituted by a P-type semiconductor layer and an on-chip lens 62 formed on the substrate 61. The interpixel light-shielding film 63 and the phase-difference light-shielding film 1801 are formed between the on-chip lens 62 and the substrate 61. In the pixel 51 in which the phase-difference light-shielding film 1801 is formed, the interpixel light-shielding film 63 adjacent to the phase-difference light-shielding film 1801 is formed to be continuous (integrally) to the phase-difference light-shielding film 1801. Although not illustrated in the drawings, the fixed charge film 66 is also formed on a lower surface of the interpixel light-shielding film 63 and the phase-difference light-shielding film 1801 as illustrated in FIG. 2.

The first tap TA and the second tap TB are formed on a surface opposite to a light incident surface side of the substrate 61 on which the on-chip lens 62 is formed. The first tap TA corresponds to the signal extraction unit 65-1, and the second tap TB corresponds to the signal extraction unit 65-2. The predetermined voltage MIX0 is supplied to the first tap TA from the tap drive unit 21 (FIG. 1) through the voltage supply line 30A formed in the multilayer interconnection layer 811, and the predetermined voltage MIX1 is supplied to the second tap TB through the voltage supply line 30B.

FIG. 88 is a table in which drive modes when the tap drive unit 21 drives the first tap TA and the second tap TB in the first configuration example of the twentieth embodiment are collected.

In the pixel 51 including the phase-difference light-shielding film 1801, it is possible to detect a phase difference by five kinds of drive methods of Mode 1 to Mode 5 as illustrated in FIG. 88.

Drive in Mode 1 is the same as in the pixel 51 that does not include the phase-difference light-shielding film 180. In Mode 1, the tap drive unit 21 applies a positive voltage (for example, 1.5 V) to the first tap TA set as an active tap, and applies a voltage of 0 V to the second tap TB set as an inactive tap in a predetermined light-receiving period. In a next light-receiving period, the tap drive unit 21 applies a positive voltage (for example, 1.5 V) to the second tap TB set as the active tap, and applies a voltage of 0 V to the first tap TA set as the inactive tap. 0 V (VSS potential) is applied to the pixel transistors Tr (FIG. 37) such as the transfer transistor 721 and the reset transistor 723 which are formed at a pixel boundary region of the substrate 61 in the multilayer interconnection layer 811.

In Mode 1, it is possible to detect a phase difference from a signal when the second tap TB is set as the active tap in the pixel 51 of which a one-side half on the first tap TA side is shielded and a signal when the first tap TA is set as the active tap in the pixel 51 of which a one-side half on the second tap TB side is shielded.

In Mode 2, the tap drive unit 21 applies a positive voltage (for example, 1.5 V) to both the first tap TA and the second tap TB. 0 V (VSS potential) is applied to the pixel transistors Tr which are formed in a pixel boundary region of the substrate 61 in the multilayer interconnection layer 811.

In Mode 2, it is possible to evenly detect signals on both sides of the first tap TA and the second tap TB, and thus it is possible to detect a phase difference from a signal of the pixel 51 of which the one-side half on the first tap TA side is shielded and a signal of the pixel 51 of which the one-side half on the second tap TB side is shielded.

Mode 3 relates to drive in which weighting corresponding to an image height in the pixel array unit 20 is applied to an application voltage of the first tap TA and the second tap TB in the drive of Mode 2. More specifically, as the image height (a distance from an optical center) in the pixel array unit 20 increases, a potential difference is provided in voltages which are applied to the first tap TA and the second tap TB. In other words, as the image height in the pixel array unit 20 increases, drive is performed so that an application voltage on a tap side at the inside (central portion side) of the pixel array unit 20 increases. Accordingly, it is possible to perform the pupil correction by the potential difference in the voltage applied to the tap.

Mode 4 is a mode in which a negative bias (for example, −1.5 V) instead of 0 V (VSS potential) is applied to the pixel transistors Tr formed in the pixel boundary region of the substrate 61 in the drive in Mode 2. When the negative bias is applied to the pixel transistors Tr formed in the pixel boundary region, it is possible to strengthen an electric field from the pixel transistors Tr to the first tap TA and the second tap TB, and thus it is possible to easily inject electrons as signal charges into the tap.

Mode 5 is a mode in which a negative bias (for example, −1.5 V) instead of 0 V (VSS potential) is applied to the pixel transistors Tr formed in the pixel boundary region of the substrate 61 in the drive in Mode 3. Accordingly, it is possible to strengthen an electric field from the pixel transistors Tr to the first tap TA and the second tap TB, and thus it is possible to easily inject electrons as signal charges into the tap.

In any of the five kinds of drive methods in Mode 1 to Mode 5, in the pixel 51 of which the one-side half on the first tap TA side is shielded and the pixel 51 of which the one-side half on the second tap TB side is shielded, a phase difference (a phase shift) occurs in a read-out signal due to a difference in a light-shielding region, and thus it is possible to detect the phase difference.

In accordance with the first configuration example of the twentieth embodiment configured as described above, in the light-receiving element 1, partial pixels 51 of the pixel array unit 20, in which multiple pixels 51 including the first tap TA and the second tap TB are arranged, include the pixel 51 of which the one-side half on the first tap TA side is shielded by the phase-difference light-shielding film 1801 and the pixel 51 of which the one-side half on the second tap TB side is shielded by the phase-difference light-shielding film 1801. Accordingly, it is possible to acquire phase difference information as auxiliary information other than the distance measurement information obtained from a distribution ratio of signals between the first tap TA and the second tap TB. On the basis of the phase difference information that is detected, a focus position can be calculated and accuracy in the depth direction can be improved.

<Second Configuration Example of Twentieth Embodiment>

Figure 89:
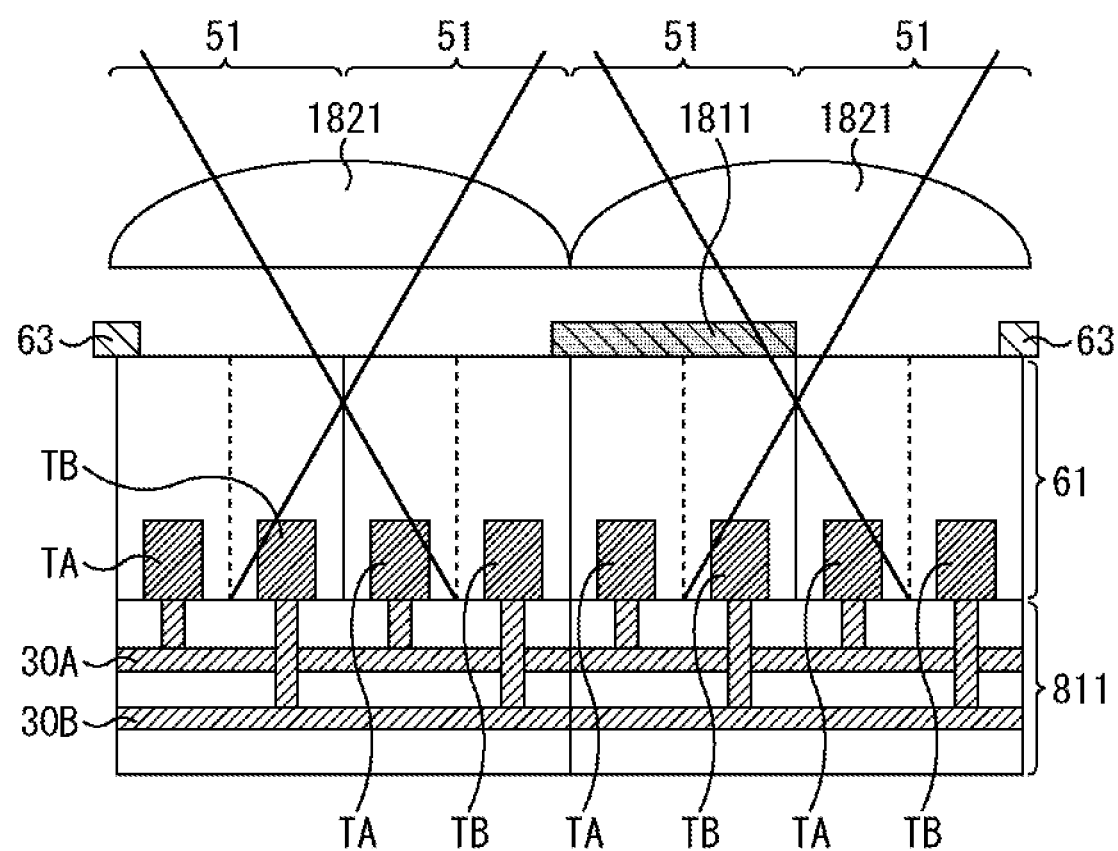
FIG. 89 is a cross-sectional view and a plan view of a pixel according to a second configuration example of the twentieth embodiment.

FIG. 89 illustrates a cross-sectional view of pixels according to a second configuration example of the twentieth embodiment.

In the cross-sectional view of FIG. 89, the same reference numeral will be given of a portion corresponding to the first configuration example of the twentieth embodiment, and description thereof will be appropriately omitted.

In the first configuration example illustrated in FIGS. 86A to 86C, the on-chip lens 62 is formed in a one-pixel unit, but in the second configuration example in FIG. 89, one piece of on-chip lens 1821 is formed with respect to multiple pixels 51. A phase-difference light-shielding film 1811 for phase difference detection is newly provided in partial pixels 51 on a part of an upper surface of the substrate 61 which is a surface on the on-chip lens 1821 side. The phase-difference light-shielding film 1811 is formed in a predetermined pixel 51 among the multiple pixels 51 which share the same on-chip lens 1821. A configuration in which the interpixel light-shielding film 63 adjacent to the phase-difference light-shielding film 1811 is formed to be continuous (integrally) to the phase-difference light-shielding film 1811 is similar as in the first configuration example.

FIGS. 90A to 90F are plan views illustrating an arrangement of the phase-difference light-shielding film 1811 and the on-chip lens 1821 which are employed in the second configuration example of the twentieth embodiment.

FIG. 90A illustrates a first arrangement example of the phase-difference light-shielding film 1811 and the on-chip lens 1821.

A pixel set 1831 illustrated in FIG. 90A includes two pieces of the pixels 51 arranged in an upper and lower direction (vertical direction), and in the pixel set 1831, one piece of the on-chip lens 1821 is disposed with respect to the two pieces of pixels 51 arranged in the upper and lower direction. In addition, arrangements of the first tap TA and the second tap TB in the two pieces of pixels 51 sharing the one piece of on-chip lens 1821 are the same as each other. A phase difference is detected by using two pieces of pixels 51, in which the phase-difference light-shielding film 1811 is not formed, in two pixel sets 1831 in which formation positions of the phase-difference light-shielding film 1811 are in symmetry.

FIG. 90B illustrates a second arrangement example of the phase-difference light-shielding film 1811 and the on-chip lens 1821.

A pixel set 1831 illustrated in FIG. 90B includes two pieces of the pixels 51 arranged in the upper and lower direction, and one piece of the on-chip lens 1821 is disposed with respect to the two pieces of pixels 51 arranged in the upper and lower direction. In addition, arrangements of the first tap TA and the second tap TB in the two pieces of pixels 51 sharing the one piece of on-chip lens 1821 are opposite to each other. A phase difference is detected by using two pieces of pixels 51, in which the phase-difference light-shielding film 1811 is not formed, in two pixel sets 1831 in which formation positions of the phase-difference light-shielding film 1811 are in symmetry.

FIG. 90C illustrates a third arrangement example of the phase-difference light-shielding film 1811 and the on-chip lens 1821.

A pixel set 1831 illustrated in FIG. 90C includes two pieces of the pixels 51 arranged in right and left direction (horizontal direction), and one piece of the on-chip lens 1821 is disposed with respect to the two pieces of pixels 51 arranged in the right and left direction. In addition, arrangements of the first tap TA and the second tap TB in the two pieces of pixels 51 sharing the one piece of on-chip lens 1821 are the same as each other. A phase difference is detected by using two pieces of pixels 51, in which the phase-difference light-shielding film 1811 is not formed, in two pixel sets 1831 in which formation positions of the phase-difference light-shielding film 1811 are in symmetry.

FIG. 90D illustrates a fourth arrangement example of the phase-difference light-shielding film 1811 and the on-chip lens 1821.

A pixel set 1831 illustrated in FIG. 90D includes two pieces of the pixels 51 arranged in the right and left direction (horizontal direction), and one piece of the on-chip lens 1821 is disposed with respect to the two pieces of pixels 51 arranged in the right and left direction. In addition, arrangements of the first tap TA and the second tap TB in the two pieces of pixels 51 sharing the one piece of on-chip lens 1821 are opposite to each other. A phase difference is detected by using two pieces of pixels 51, in which the phase-difference light-shielding film 1811 is not formed, in two pixel sets 1831 in which formation positions of the phase-difference light-shielding film 1811 are in symmetry.

FIG. 90E illustrates a fifth arrangement example of the phase-difference light-shielding film 1811 and the on-chip lens 1821.

A pixel set 1831 illustrated in FIG. 90E includes four pieces of the pixels 51 arranged in two-by-two, and one piece of the on-chip lens 1821 is disposed with respect to the four pieces of pixels 51. In addition, arrangements of the first tap TA and the second tap TB in the four pieces of pixels 51 sharing the one piece of on-chip lens 1821 are the same as each other. A phase difference is detected by using four pieces of pixels 51, in which the phase-difference light-shielding film 1811 is not formed, in two pixel sets 1831 in which formation positions of the phase-difference light-shielding film 1811 are in symmetry.

FIG. 90F illustrates a sixth arrangement example of the phase-difference light-shielding film 1811 and the on-chip lens 1821.

A pixel set 1831 illustrated in FIG. 90F includes four pieces of the pixels 51 arranged in two-by-two, and one piece of the on-chip lens 1821 is disposed with respect to the four pieces of pixels 51. In addition, arrangements of the first tap TA and the second tap TB in the four pieces of pixels 51 sharing the one piece of on-chip lens 1821 are opposite to each other in right and left pixels. A phase difference is detected by using four pieces of pixels 51, in which the phase-difference light-shielding film 1811 is not formed, in two pixel sets 1831 in which formation positions of the phase-difference light-shielding film 1811 are in symmetry.

As described above, as an arrangement in the case of forming one piece of the on-chip lens 1821 with respect to multiple pixels 51, it is possible to employ any of an arrangement in which the one piece of on-chip lens 1821 is disposed with respect to two pixels or an arrangement in which the one piece of on-chip lens 1821 is disposed with respect to four pixels. The phase-difference light-shielding film 1811 shields multiple pixels corresponding to a one-side half below the one piece of on-chip lens 1821.

As a drive mode in the second configuration example, the five kinds of drive methods including Mode 1 to Mode 5 described with reference to FIG. 88 can be employed.

Accordingly, according to the second configuration example of the twentieth embodiment, in partial pixels 51 of the pixel array unit 20 in which multiple pixels 51 including the first tap TA and the second tap TB are arranged, the two pixel sets 1831 in which formation positions of the phase-difference light-shielding film 1811 are in symmetry are included. Accordingly, it is possible to acquire phase difference information as auxiliary information other than the distance measurement information obtained from a distribution ration of signals between the first tap TA and the second tap TB. On the basis of the phase difference information that is detected, a focus position can be calculated and accuracy in the depth direction can be improved.

It should be noted that as the multiple pixels 51 which constitute the pixel array unit 20, the pixels 51 in the first configuration example of the twentieth embodiment and the pixels 51 in the second configuration example of the twentieth embodiment may be mixed in.

<Modification Example without Phase-Difference Light-Shielding Film>

In the first configuration example and the second configuration example of the twentieth embodiment, description has been given of a configuration in which the phase-difference light-shielding film 1801 or 1811 is provided between the on-chip lens 62 and the substrate 61.

However, even in a pixel 51 that does not include the phase-difference light-shielding film 1801 or 1811, it is possible to acquire the phase difference information when using the drive in Mode 2 to Mode 5 in which a positive voltage is simultaneously applied to the first tap TA and the second tap TB among the five kinds of drive methods in Mode 1 to Mode 5. For example, it is possible to acquire the phase difference information by driving one-side half pixels 51 among multiple pixels below one piece of the on-chip lens 1821 in Mode 2 to Mode 5. Even in a configuration in which one piece of the on-chip lens 62 is disposed with respect to one pixel, it is possible to acquire the phase difference information by driving the pixel in Mode 2 to Mode 5.

Accordingly, in a pixel 51 that does not include the phase-difference light-shielding film 1801 or 1811, the phase difference information may be acquired by performing drive in Mode 2 to Mode 5. Even in this case, on the basis of the phase difference information that is detected, a focus position can be calculated and accuracy in the depth direction can be improved.

It should be noted that in a pixel 51 that does not include the phase-difference light-shielding film 1801 or 1811, in the case of desiring to acquire the phase difference information by using drive in Mode 1, when irradiation light emitted from a light source is set to continuous light that is continuously emitted without intermittency, it is possible to acquire the phase difference information.

Twenty First Embodiment

Next, description will be given of a configuration example of the light-receiving element 1 capable of acquiring degree-of-polarization information as auxiliary information other than the distance measurement information obtained from a distribution ratio of signals between the first tap TA and the second tap TB.

Figure 91:
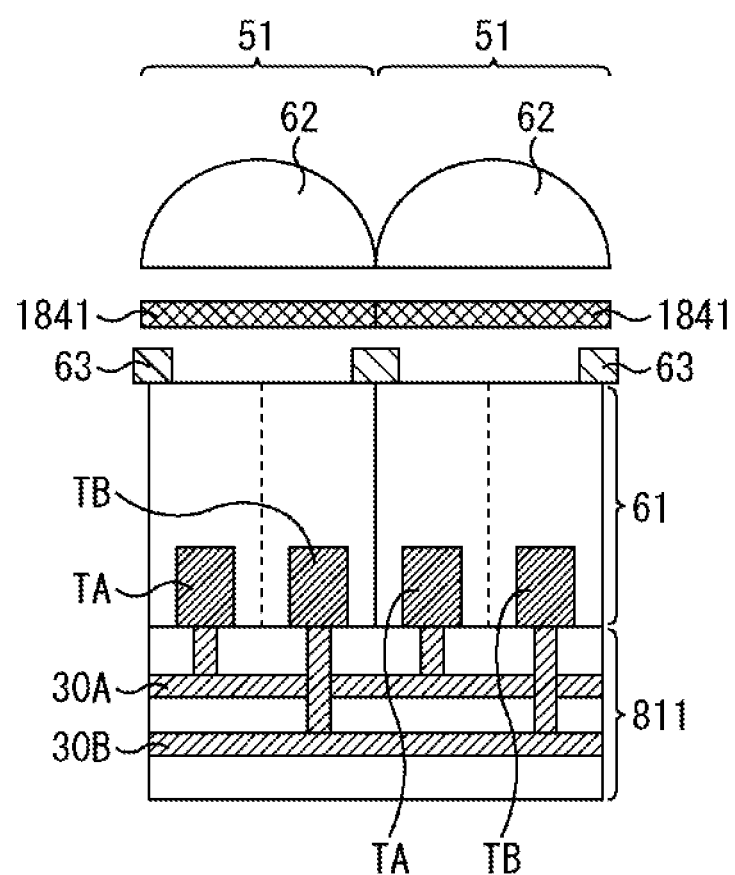
FIG. 91 is a cross-sectional view of a pixel according to twenty first embodiment.

FIG. 91 illustrates a cross-sectional view of a pixel according to a twenty first embodiment.

In FIG. 91, the same reference numeral will be given of a portion corresponding to the twentieth embodiments, and description thereof will be appropriately omitted.

In the twenty first embodiment in FIG. 91, a polarizer filter 1841 is provided between the on-chip lens 62 and the substrate 61. For example, the pixel 51 according to the twenty first embodiment has a configuration similar to that of the first embodiment illustrated in FIG. 2, the fourteenth embodiment described in FIG. 36, or the fifteenth embodiment except that the polarizer filter 1841 is provided.

Figure 92A:
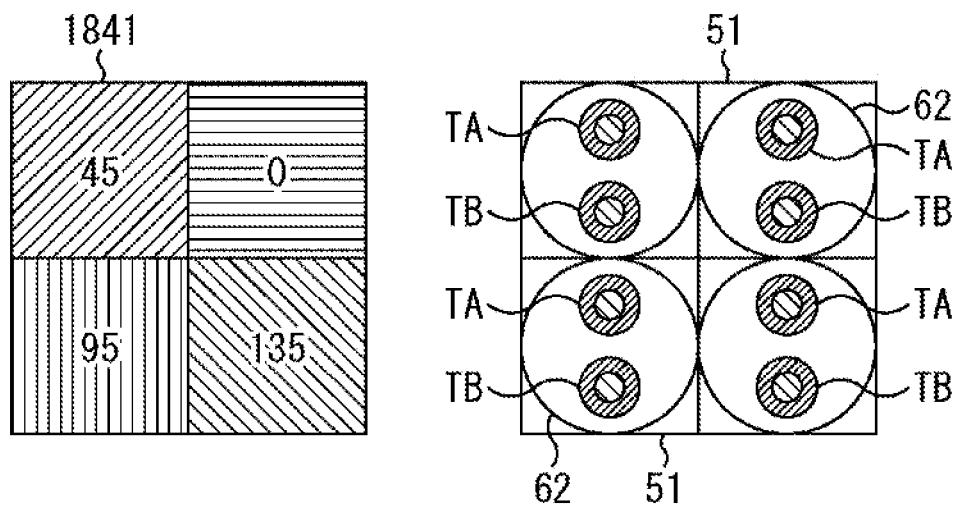
FIGS. 92A and 92B are plan views of the pixel according to the twenty first embodiment.
Figure 92B:
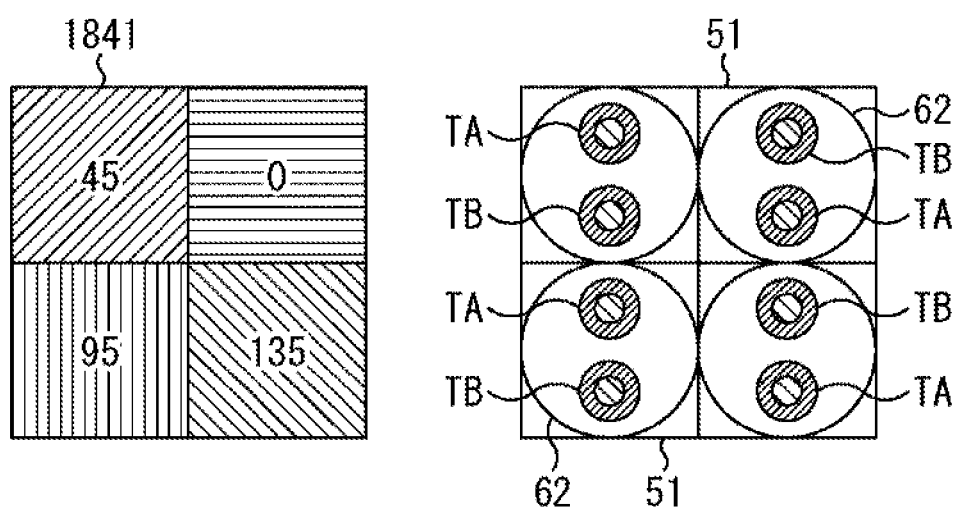

The polarizer filter 1841, the on-chip lens 62, the first tap TA, and the second tap TB are set to any one arrangement in FIG. 92A or FIG. 92B.

FIG. 92A is a plan view illustrating a first arrangement example of the polarizer filter 1841, the on-chip lens 62, the first tap TA, and the second tap TB in the twenty first embodiment.

As illustrated in FIG. 92A, the polarizer filter 1841 has any one polarization direction among 0°, 45°, 90°, and 135°, and four kinds of the polarizer filters 1841 in which the polarization direction is different by 90° are formed in predetermined pixels 51 in the pixel array unit 20 at a four-pixel unit (2×2).

The on-chip lens 62 is provided in a pixel unit, and positional relationships between the first tap TA and the second tap TB are the same as each other in the entirety of pixels.

FIG. 92B is a plan view illustrating a second arrangement example of the polarizer filter 1841, the on-chip lens 62, the first tap TA, and the second tap TB in the twenty first embodiment.

As illustrated in FIG. 92B, the polarizer filter 1841 has any one polarization direction among 0°, 45°, 90°, and 135°, and four kinds of the polarizer filters 1841 in which the polarization direction is different by 45° are formed in predetermined pixels 51 in the pixel array unit 20 at a four-pixel unit (2×2).

The on-chip lens 62 is provided in a pixel unit, and positional relationships between the first tap TA and the second tap TB are opposite to each other between adjacent pixels in the horizontal direction. In other words, pixels columns in which the arrangements of the first tap TA and the second tap TB are opposite to each other are alternately arranged in a horizontal direction.

As a drive method of the pixel 51 including the polarizer filter 1841, the five kinds of drive methods in Mode 1 to Mode 5 described with reference to FIG. 88 in the twentieth embodiment are possible.

In the twenty first embodiment, among multiple pixels 51 arranged in the pixel array unit 20, a plurality of partial pixels 51 include the polarizer filter 1841 as illustrated in FIG. 91 and FIGS. 92A and 92B.

When the pixels 51 including the polarizer filter 1841 are driven by any one of Mode 1 to Mode 5, it is possible to acquire degree-of-polarization information. On the basis of the degree-of-polarization information that is acquired, it is possible to acquire information related to a surface state (unevenness) and a relative distance difference of an object surface that is a subject, it is possible to calculate a reflection direction, or it is possible to acquire distance measurement information of a transparent object such as glass, and distance measurement information up to an object before the transparent object.

In addition, when a frequency of irradiation light emitted from a light source is set to a plurality of kinds, and a polarization direction is set to be different for every frequency, multiple-frequency parallel distance measurement be performed. For example, four kinds of irradiation light of 20 MHz, 40 MHz, 60 MHz, and 100 MHz are simultaneously emitted, and polarization directions thereof are set to 0°, 45°, 90°, and 135° in conformity to the polarization direction of the polarizer filter 1841, it is possible to acquire distance measurement information by simultaneously receiving reflected light beams of four kinds of irradiation light.

It should be noted that the entirety of pixels 51 in the pixel array unit 20 of the light-receiving element 1 may be set to pixels 51 including the polarizer filter 1841.

Twenty Second Embodiment

Next, description will be given of a configuration example of the light-receiving element 1 capable of acquiring sensitivity information for every wavelength of RGB as auxiliary information other than the distance measurement information obtained from a distribution ratio of signals between the first tap TA and the second tap TB.

FIGS. 93A and 93B illustrate cross-sectional views of pixels according to the twenty second embodiment.

In the twenty second embodiment, the light-receiving element 1 includes at least partial pixels 51 in FIG. 93A or FIG. 93B as partial pixels 51 in the pixel array unit 20.

In FIGS. 93A and 93B, the same reference numeral will be given to a portion corresponding to the twentieth embodiment, and description thereof will be appropriately omitted.

In pixels 51 illustrated in FIG. 93A, a color filter 1861 that allows any one wavelength among R (red), G (green), and B (blue) to be transmitted is formed between the on-chip lens 62 and the substrate 61. For example, the pixels 51 illustrated in FIG. 93A have a configuration similar to that of the first embodiment illustrated in FIG. 2, the fourteenth embodiment described in FIG. 36, or the fifteenth embodiment except that the color filter 1861 is provided.

On the other hands, in FIG. 93B, a pixel 51 in which an IR cutter filter 1871 that cuts out infrared light, and a color filter 1872 are formed through lamination between the on-chip lens 62 and the substrate 61, and a pixel 51 in which the IR cutter filter 1871 and the color filter 1872 are not formed are disposed to be adjacent to each other. In addition, a photodiode 1881 instead of the first tap TA and the second tap TB is formed in the substrate 61 of the pixel 51 in which the IR cutter filter 1871 and the color filter 1872 are formed. In addition, a pixel isolation portion 1882 that isolates an adjacent pixel and the substrate 61 is formed at a pixel boundary portion of the pixel 51 in which the photodiode 1881 is formed. For example, the pixel isolation portion 1882 is formed in an aspect of covering an outer periphery of a metallic material such as tungsten (W), aluminum (Al), and copper (Cu), or a conductive material such as polysilicon with an insulating film. Migration of electrons between adjacent pixels is limited due to the pixel isolation portion 1882. The pixel 51 including the photodiode 1881 is driven through a control interconnection different from that of the pixel 51 including the first tap TA and the second tap TB. For example, the other configurations are similar to those in the first embodiment illustrated in FIG. 2 or the fourteenth embodiment illustrated in FIG. 36.

Figure 94A:
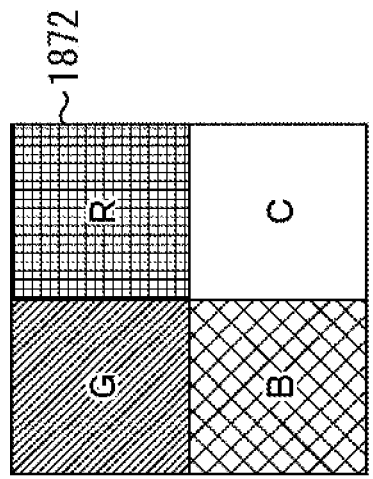
FIGS. 94A to 94D are plan views illustrating the pixel according to the twenty second embodiment.

FIG. 94A is a plan view illustrating an arrangement of the color filter 1861 in four-pixel region in which the pixels 51 illustrated in FIG. 93A are arranged in two-by-two.

With respect to the four (2×2)-pixel region, the color filter 1861 has a configuration in which four kinds of filters including a filter through which G is transmitted, a filter through which R is transmitted, a filter through which B is transmitted, and a filter through which IR is transmitted are arranged in two-by-two.

Figure 94D:
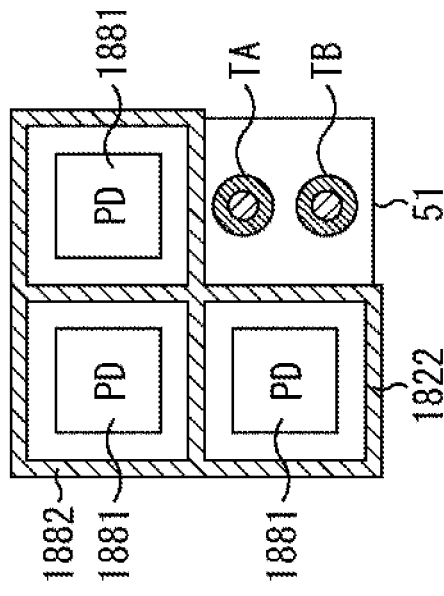
Figure 94B:
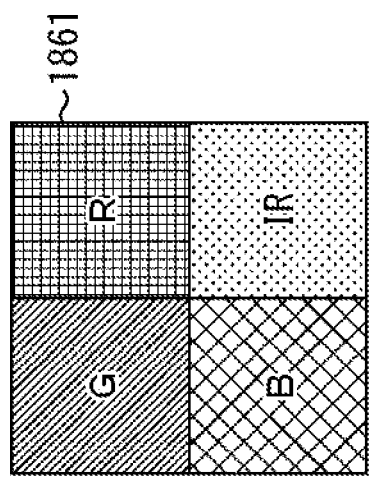

FIG. 94B is a plan view that relates to the four-pixel region in which the pixels 51 illustrated in FIG. 93A are arranged in two-by-two and is taken along line A-A' in FIG. 93A.

In the pixels 51 illustrated in FIG. 93A, the first tap TA and the second tap TB are disposed in a pixel unit.

Figure 94C:
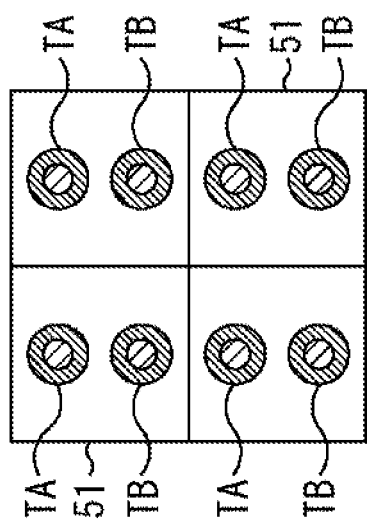

FIG. 94C is a plan view illustrating an arrangement of the color filter 1872 in four-pixel region in which the pixels 51 illustrated in FIG. 93B are arranged in two-by-two.

With respect to the four (2×2)-pixel region, the color filter 1872 has a configuration in which four kinds of filters including a filter through which G is transmitted, a filter through which R is transmitted, a filter through which B is transmitted, and air (without filter) are arranged in two-by-two. It should be noted that a clear filter through which all wavelengths (R, G, B, and IR) are transmitted may be disposed instead of air.

In the color filter 187, as illustrated in FIG. 93B, the IR cutter filter 1871 is disposed on an upper layer of the filter through which G is transmitted, the filter through which R is transmitted, and the filter through which B is transmitted.

FIG. 94D is a plan view that relates to the four-pixel region in which the pixels 51 illustrated in FIG. 93B are arranged in two-by-two and is taken along line B-B' in FIG. 93B.

With regard to a portion of the substrate 61 in four (2×2)-pixel region, in the pixel 51 including the filter through which G, R, or B is transmitted, the photodiode 1881 is formed, and in the pixel 51 including air (without filter), the first tap TA and the second tap TB are formed in the portion of the substrate 61. In addition, the pixel isolation portion 1882 that isolates an adjacent pixel and the substrate 61 is formed at a pixel boundary portion of the pixel 51 in which the photodiode 1881 is formed.

As described above, the pixels 51 illustrated in FIG. 93A have a combination of the color filter 1861 illustrated in FIG. 94A and a photoelectric conversion region illustrated in FIG. 94B, and the pixels 51 illustrated in FIG. 93B have a combination of the color filter 1872 illustrated in FIG. 94C and a photoelectric conversion region illustrated in FIG. 94D.

However, combinations of the color filters in FIGS. 94A and 94C, and the photoelectric conversion regions in FIGS. 94B and 94d may be substituted with each other. That is, the configuration of the pixels 51 in the twenty second embodiment may be set to a configuration in combination of the color filter 1861 illustrated in FIG. 94A and the photoelectric conversion region illustrated in FIG. 94D, or a configuration in combination of the color filter 1872 illustrated in FIG. 94C and the photoelectric conversion region illustrated in FIG. 94B.

The pixels 51 including the first tap TA and the second tap TB may be driven by the five kinds of drive methods in Mode 1 to Mode 5.

Drive of the pixels 51 including the photodiode 1881 is different from drive of the pixel 51 including the first tap TA and the second tap TB, and is performed in a similar manner as in pixels of a typical image sensor.

In accordance with the twenty second embodiment, the light-receiving element 1 can include the pixels 51 provided with the color filter 1861 on a light incident surface side of the substrate 61 in which the first tap TA and the second tap TB are formed as illustrated in FIG. 93A as a part of the pixel array unit 20 in which multiple pixels 51 provided with the first tap TA and the second tap TB are arranged. Accordingly, it is possible to acquire a signal for every wavelength of each of G, R, B, and IR, and it is possible to improve object identification capability.

In addition, according to the twenty second embodiment, the light-receiving element 1 can include the pixels 51 provided with the photodiode 1881 at the inside of the substrate 61 and the color filter 1872 on the light incident surface side instead of the first tap TA and the second tap TB as illustrated in FIG. 93B as a part of the pixel array unit 20 in which multiple pixels 51 provided with the first tap TA and the second tap TB are arranged. Accordingly, it is possible to acquire a G signal, an R signal, and a B signal which are the same as in the image sensor, and it is possible to improve object identification capability.

In addition, both of the pixels 51 provided with the first tap TA and the second tap TB and the color filter 1861 as illustrated in FIG. 93A, and the pixels 51 provided with the photodiode 1881 and the color filter 1872 as illustrated in FIG. 93B may be formed in the pixel array unit 20.

In addition, all pixels 51 in the pixel array unit 20 of the light-receiving element 1 may be configured as at least one kind among pixels in combination of FIGS. 94A and 94B, pixels in combination of FIGS. 94C and 94D, pixels in combination of FIGS. 94A and 94D, and pixels in combination of FIGS. 94C and 94B.

<Configuration Example of Distance Measurement Module>

Figure 95:
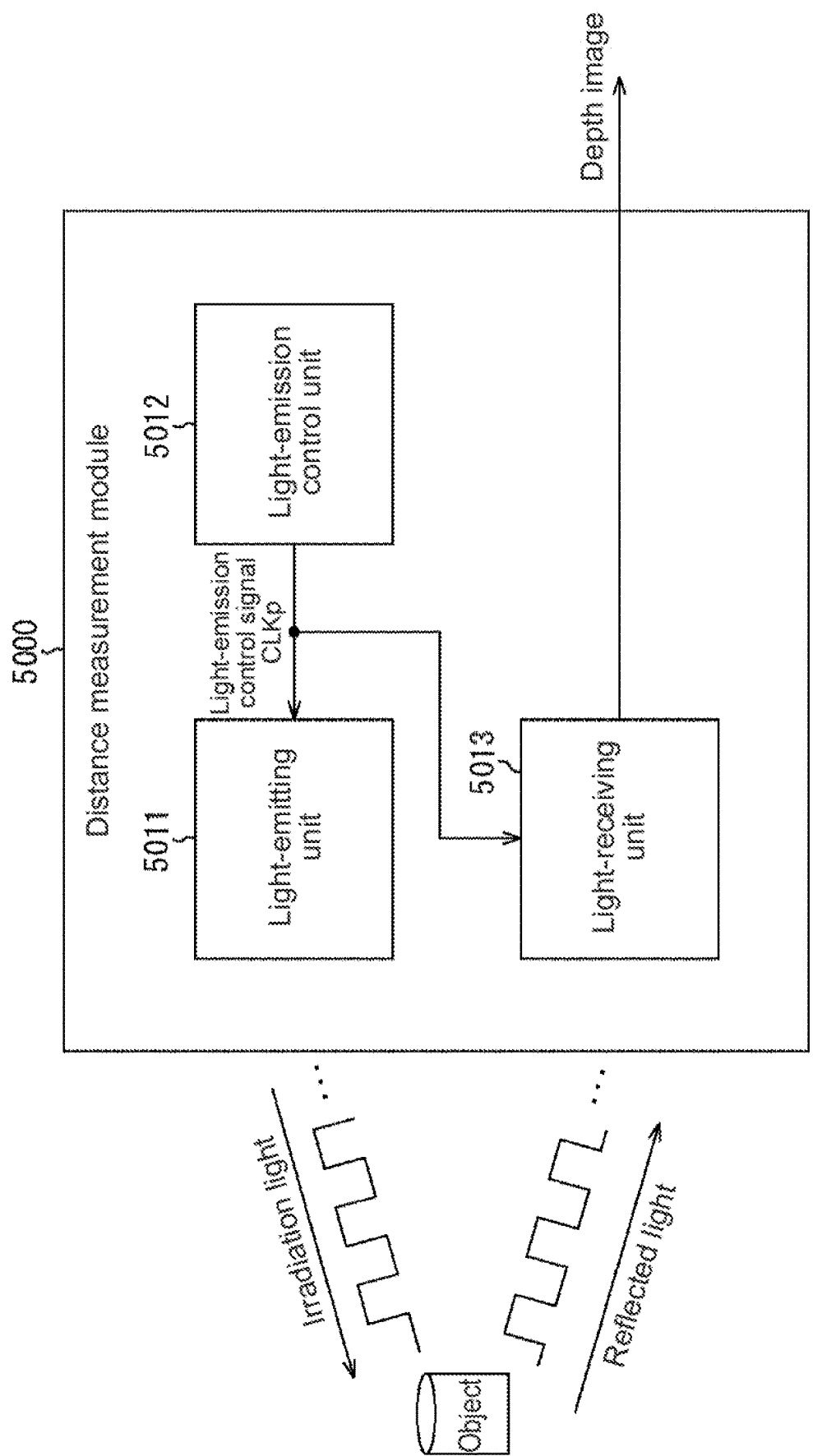
FIG. 95 is a block diagram illustrating a configuration example of a distance measurement module.

FIG. 95 is a block diagram illustrating a configuration example of a distance measurement module that outputs distance measurement information by using the light-receiving element 1 in FIG. 1.

A distance measurement module 5000 includes a light-emitting unit 5011, a light-emission control unit 5012, and a light-receiving unit 5013.

The light-emitting unit 5011 includes a light source that emits light of a predetermined wavelength, and emits irradiation light of which brightness periodically fluctuates to irradiate an object with the irradiation light. For example, the light-emitting unit 5011 includes a light-emitting diode that emits infrared light of a wavelength in a range of 780 nm to 1000 nm as a light source, and emits irradiation light in synchronization with a light-emission control signal CLKp that is a rectangular wave supplied form the light-emission control unit 5012.

It should be noted that the light-emission control signal CLKp is not limited to the rectangular wave as long as the light-emission control signal CLKp is a periodic signal. For example, the light-emission control signal CLKp may be a sinusoidal wave.

After supplying the light-emission control signal CLKp to the light-emitting unit 5011 and the light-receiving unit 5013, the light-emission control unit 5012 controls an irradiation timing of irradiation light. For example, a frequency of the light-emission control signal CLKp is 20 megahertz (MHz). It should be noted that the frequency of the light-emission control signal CLKp is not limited to 20 megahertz (MHz) and may be 5 megahertz (MHz), or the like.

The light-receiving unit 5013 receives reflected light that is reflected from an object, calculates distance information for every pixel in correspondence with a light-reception result, generates a depth image that expresses a distance up to an object by a gradation value for every pixel, and outputs the depth image.

As the light-receiving unit 5013, the above-described light-receiving element 1 is used, and the light-receiving element 1 as the light-receiving unit 5013 calculates distance information for every pixel from signal intensity detected by the charge detection unit (N+ semiconductor region 71) of each the signal extraction units 65-1 and 65-2 of each of the pixels 51 in the pixel array unit 20, for example, on the basis of the light-emission control signal CLKp.

As described above, as the light-receiving unit 5013 of the distance measurement module 5000 that obtains distance information up to a subject by the indirect ToF method, and outputs the distance information, the light-receiving element 1 in FIG. 1 can be combined. As the light-receiving unit 5013 of the distance measurement module 5000, when employing the light-receiving element 1 in the above-described respective embodiments, specifically, the light-receiving element that is set as a back-illuminated type and improves pixel sensitivity, it is possible to improve distance measurement characteristics as the distance measurement module 5000.

<Application Example to Moving Body>

The technology (the present technology) according to the present disclosure is applicable to various products. For example, the technology according to the present disclosure can be realized as a device that is mounted on a moving body any one kind among an automobile, an electric vehicle, a hybrid electric vehicle, a motorcycle, a bicycle, a personal mobility, an airplane, a drone, a ship, a robot, and the like.

Figure 96:
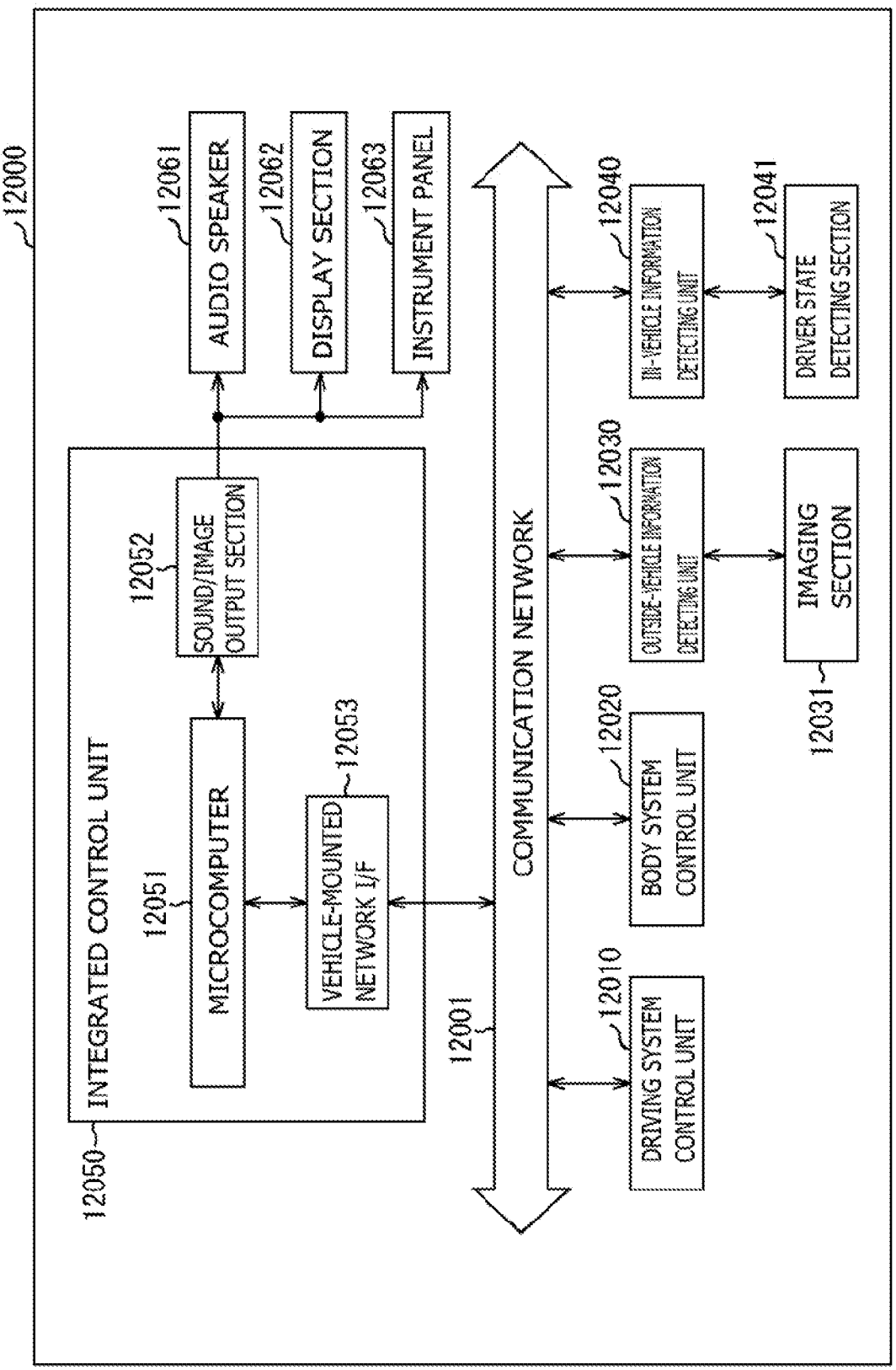
FIG. 96 is a block diagram depicting an example of schematic configuration of a vehicle control system.

FIG. 96 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 96, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 96, an audio speaker 12061, a display section 12062, and an instrument panel 12063 are illustrated as the output device. The display section 12062 may, for example, include at least one of an on-board display and a head-up display.

Figure 97:
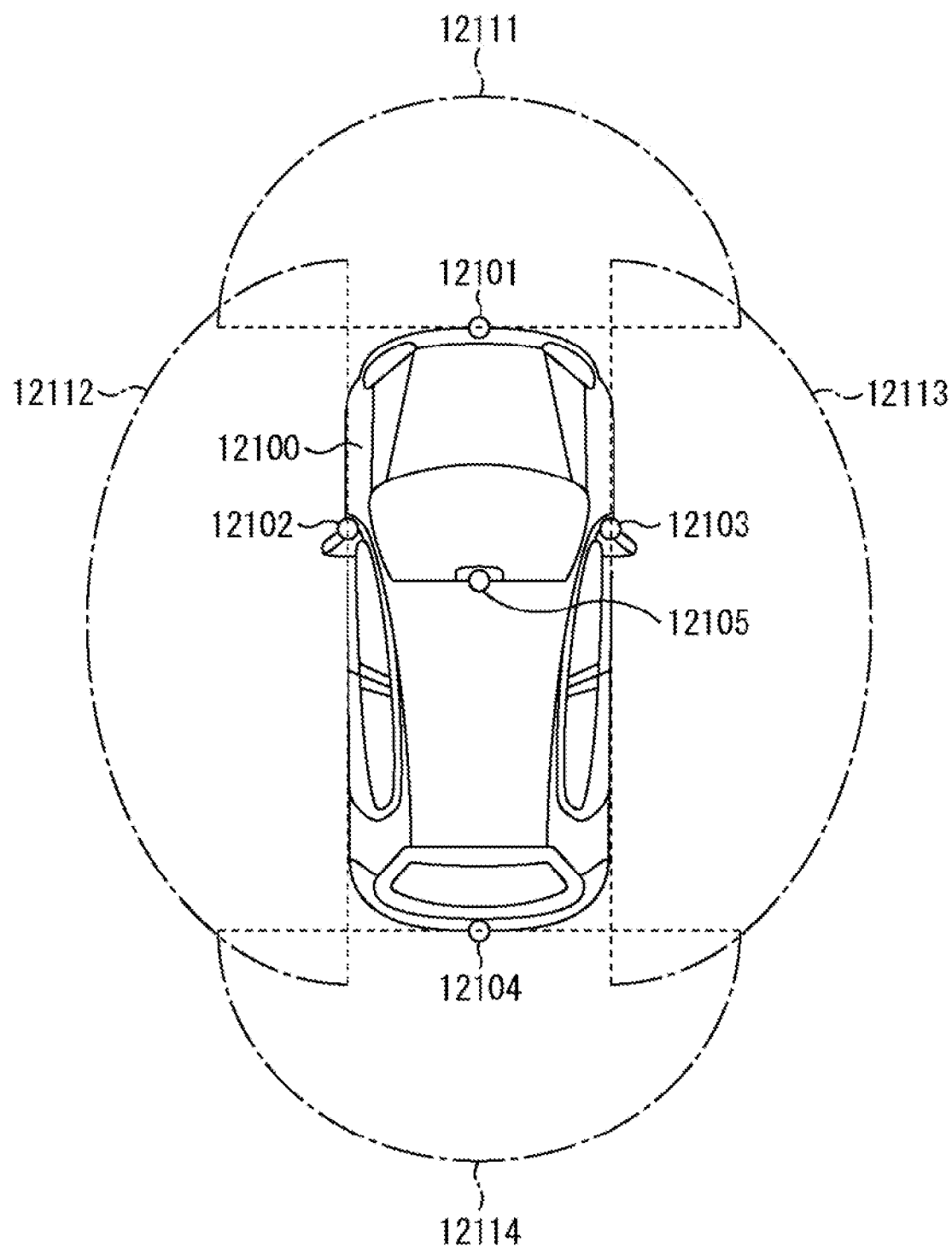
FIG. 97 is a diagram of assistance in explaining an example of installation positions of an outside-vehicle information detecting section and an imaging section.

FIG. 97 is a diagram depicting an example of the installation position of the imaging section 12031.

In FIG. 97, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 97 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Hereinbefore, description has been given of an example of the vehicle control system to which the present technology relating to the present disclosure is applicable. The technology according to the present disclosure is also applicable to the imaging section 12031 among the above-described configurations. Specifically, for example, when the light-receiving element 1 illustrated in FIG. 1 is applied to the imaging section 12031, it is possible to improve characteristics such as sensitivity.

Embodiments of the present technology are not limited to the above-described embodiments, and various modifications can be made in a range not departing from the gist of the present technology.

For example, the above-described two or more embodiments can be appropriately combined with each other. That is, for example, the number of signal extraction units provided in a pixel or an arrangement position thereof, an shape of the signal extraction units or whether or not to employ a sharing structure, presence or absence of an on-chip lens, presence or absence of interpixel light-shielding portion, presence or absence of an isolation region, the thickness of the on-chip lens or a substrate, the kind of the substrate or film design, presence or absence of a bias to a light incident surface, presence or absence of a reflection member, and the like can be appropriately selected in correspondence with a priority given to any characteristic such as pixel sensitivity.

In addition, in the above-described embodiments, description has been given of an example in which electrons are used as signal carriers, but hole generated in photoelectric conversion may be used as the signal carriers. In this case, the charge detection unit that detects the signal carriers may be constituted by a P+ semiconductor region, and the voltage application unit that generates an electric field inside a substrate may be constituted by an N+ semiconductor region so that holes are detected as the signal carriers in the charge detection unit provided in the signal extraction unit.

In accordance with the present technology, when the CAPD sensor is set to a configuration of the back-illuminated type light-receiving element, it is possible to improve distance measurement characteristics.

It should be noted that the above-described embodiments are described as a drive method in which a voltage is directly applied to the P+ semiconductor region 73 formed in the substrate 61, and photoelectrically converted charges are migrated by an electric field that occurs, but the present technology is not limited to the drive method and is also applicable to another drive method. For example, it is possible to employ a drive method in which first and second transfer transistors and first and second floating diffusion regions which are formed in the substrate 61 are used, and a predetermined voltage is applied to gates of the first and second transfer transistors to distribute and accumulate photoelectrically converted charges to the first floating diffusion region through the first transfer transistor, or the second floating diffusion region through the second transfer transistor. In this case, the first and second transfer transistors formed in the substrate 61 respectively function as first and second voltage application unit in which a predetermined voltage is applied to gates thereof, and the first and second floating diffusion regions formed in the substrate 61 respectively functions as first and second charge detection units which detect charges generated due to photoelectric conversion.

In addition, in other words, in the drive method in which a voltage is directly applied to the P+ semiconductor region 73 formed in the substrate 61, and photoelectrically converted charges are migrated by an electric field that occurs, two pieces of the P+ semiconductor regions 73 set as the first and second voltage application units are control nodes to which a predetermined voltage is applied, and two pieces of the N+ semiconductor regions 71 set as the first and second charge detection units are detection nodes which detect charges. In the drive method in which a predetermined voltage is applied to gates of the first and second transfer transistors, and photoelectrically converted charges are accumulated across the first floating diffusion region or the second floating diffusion region, gates of the first and second transfer transistors are control nodes to which a predetermined voltage is applied, and the first and second floating diffusion regions formed in the substrate 61 are detection nodes which detect charges.

In addition, effects described in this specification are illustrative only and are not limited thereto, and other effects may be exhibited.

It should be noted that the present technology can employ the following configurations.

(1) A light-receiving element including:
   an on-chip lens;
   an interconnection layer; and
   a semiconductor layer that is disposed between the on-chip lens and the interconnection layer, in which
   the semiconductor layer includes
   a first voltage application unit to which a first voltage is applied,
   a second voltage application unit to which a second voltage different from the first voltage is applied,
   a first charge detection unit that is disposed at the periphery of the first voltage application unit,
   a second charge detection unit that is disposed at the periphery of the second voltage application unit, and
   a charge discharge region that is provided on an outer side of an effective pixel region.

(2) The light-receiving element according to (1), in which
   the interconnection layer includes at least one layer including a reflection member, and
   the reflection member is provided to overlap the first charge detection unit or the second charge detection unit in a plan view.

(3) The light-receiving element according to (1) or (2), in which
   the interconnection layer includes at least one layer including a light-shielding member, and
   the light-shielding member is provided to overlap the first charge detection unit or the second charge detection unit in a plan view.

(4) The light-receiving element according to any one of (1) to (3), in which
   the charge discharge region includes an opening pixel that is driven.

(5) The light-receiving element according to any one of (1) to (4), in which
   the charge discharge region includes a light-shielding pixel that is driven.

(6) The light-receiving element according to any one of (1) to (5), in which
   the charge discharge region includes a high-concentration N-type region to which a zero or positive voltage is applied.

(7) The light-receiving element according to any one of (1) to (6), further including
   a P-well region, which is in contact with an insulating film at the periphery of the first and second charge detection units, at a boundary portion of pixels.

(8) The light-receiving element according to (7), in which
   the P-well region has an impurity concentration higher than an impurity concentration of a photoelectric conversion region.

(9) The light-receiving element according to any one of (1) to (6), further including
   an N-type diffusion layer, to which a zero or positive voltage is applied, in a gap region between a P-well region in which a pixel transistor is formed and an insulating film at the periphery of the first and second charge detection units.

(10) The light-receiving element according to (9), in which
   the N-type diffusion layer is disposed to be shared by a pixel column inside an effective pixel region.

(11) The light-receiving element according to (9), in which
   the N-type diffusion layer is disposed in a pixel outside the effective pixel region.

(12) The light-receiving element according to (9), in which
   the N-type diffusion layer is disposed in each pixel inside the effective pixel region.

(13) The light-receiving element according to any one of (1) to (12), in which
the first and second voltage application units are constituted by first and second P-type semiconductor regions each formed in the semiconductor layer.

(14) The light-receiving element according to any one of (1) to (12), in which
the first and second voltage application units are constituted by first and second transfer transistors each formed in the semiconductor layer.

(15) A distance measurement module including:
a light-receiving element including an on-chip lens, an interconnection layer, and a semiconductor layer that is disposed between the on-chip lens and the interconnection layer, the semiconductor layer including a first voltage application unit to which a first voltage is applied, a second voltage application unit to which a second voltage different from the first voltage is applied, a first charge detection unit that is disposed at the periphery of the first voltage application unit, a second charge detection unit that is disposed at the periphery of the second voltage application unit, and a charge discharge region that is provided on an outer side of an effective pixel region;
a light source that emits irradiation light of which brightness periodically fluctuates; and
a light-emission control unit that controls an irradiation timing of the irradiation light.

It should be understood by those skilled in the art that various modifications, combinations, sub-combinations and alterations may occur depending on design requirements and other factors insofar as they are with in the scope of the appended claims or the equivalents thereof.

What is claimed is:

1. A light-receiving element, comprising:
an on-chip lens;
an interconnection layer; and
a semiconductor layer that is disposed between the on-chip lens and the interconnection layer, wherein the semiconductor layer includes:
   a first voltage application unit to which a first voltage is applied;
   a second voltage application unit to which a second voltage different from the first voltage is applied;
   a first charge detection unit that is disposed at a periphery of the first voltage application unit;
   a second charge detection unit that is disposed at a periphery of the second voltage application unit; and
   a charge discharge region that is provided on an outer side of an effective pixel region, wherein the charge discharge region includes a light-shielding pixel that is driven.

2. The light-receiving element according to claim 1, wherein
the interconnection layer includes at least one layer including a reflection member, and
the reflection member is provided to overlap the first charge detection unit or the second charge detection unit in a plan view.

3. The light-receiving element according to claim 1, wherein
the interconnection layer includes at least one layer including a light-shielding member, and
the light-shielding member is provided to overlap the first charge detection unit or the second charge detection unit in a plan view.

4. The light-receiving element according to claim 1, wherein
the charge discharge region includes an opening pixel that is driven.

5. The light-receiving element according to claim 1, wherein
the charge discharge region includes a high-concentration N-type region to which a zero or positive voltage is applied.

6. The light-receiving element according to claim 1, further comprising
a P-well region, which is in contact with an insulating film at the periphery of the first and second charge detection units, at a boundary portion of pixels.

7. The light-receiving element according to claim 6, wherein
the P-well region has an impurity concentration higher than an impurity concentration of a photoelectric conversion region.

8. The light-receiving element according to claim 1, further comprising
an N-type diffusion layer, to which a zero or positive voltage is applied, in a gap region between a P-well region in which a pixel transistor is formed and an insulating film at the periphery of the first and second charge detection units.

9. The light-receiving element according to claim 8, wherein
the N-type diffusion layer is disposed to be shared by a pixel column inside the effective pixel region.

10. The light-receiving element according to claim 8, wherein
the N-type diffusion layer is disposed in a pixel outside the effective pixel region.

11. The light-receiving element according to claim 8, wherein
the N-type diffusion layer is disposed in each pixel inside the effective pixel region.

12. The light-receiving element according to claim 1, wherein
the first and second voltage application units are constituted by first and second P-type semiconductor regions each formed in the semiconductor layer.

13. The light-receiving element according to claim 1, wherein
the first and second voltage application units are constituted by first and second transfer transistors each formed in the semiconductor layer.

14. A distance measurement module, comprising:
a light-receiving element including an on-chip lens, an interconnection layer, and a semiconductor layer that is disposed between the on-chip lens and the interconnection layer, the semiconductor layer including a first voltage application unit to which a first voltage is applied, a second voltage application unit to which a second voltage different from the first voltage is applied, a first charge detection unit that is disposed at a periphery of the first voltage application unit, a second charge detection unit that is disposed at a periphery of the second voltage application unit, and a charge discharge region that is provided on an outer side of an effective pixel region, wherein the charge discharge region includes a light-shielding pixel that is driven;
a light source that emits irradiation light of which brightness periodically fluctuates; and
a light-emission control unit that controls an irradiation timing of the irradiation light.

* * * * *